(12) United States Patent
Yamazaki et al.

(10) Patent No.: US 9,653,613 B2
(45) Date of Patent: May 16, 2017

(54) SEMICONDUCTOR DEVICE AND MANUFACTURING METHOD THEREOF

(71) Applicant: Semiconductor Energy Laboratory Co., Ltd., Atsugi-shi, Kanagawa-ken (JP)

(72) Inventors: Shunpei Yamazaki, Tokyo (JP); Tetsuhiro Tanaka, Tokyo (JP); Akihisa Shimomura, Kanagawa (JP); Ryo Tokumaru, Kanagawa (JP); Yasumasa Yamane, Kanagawa (JP); Yuhei Sato, Kanagawa (JP); Naoki Okuno, Kanagawa (JP); Motoki Nakashima, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/047,940

(22) Filed: Feb. 19, 2016

(65) Prior Publication Data

US 2016/0254386 A1    Sep. 1, 2016

(30) Foreign Application Priority Data

Feb. 27, 2015   (JP) ................................. 2015-039085

(51) Int. Cl.
*H01L 29/786* (2006.01)
*H01L 29/51* (2006.01)
*H01L 29/06* (2006.01)

(52) U.S. Cl.
CPC ...... *H01L 29/7869* (2013.01); *H01L 29/0607* (2013.01); *H01L 29/513* (2013.01); *H01L 29/517* (2013.01)

(58) Field of Classification Search
CPC . H01L 29/517; H01L 29/513; H01L 29/0607; H01L 29/7869
(Continued)

(56) References Cited

U.S. PATENT DOCUMENTS 5,528,032 A   6/1996  Uchiyama
5,731,856 A   3/1998  Kim et al.
(Continued)

FOREIGN PATENT DOCUMENTS

EP   1737044 A   12/2006
EP   2226847 A    9/2010
(Continued)

OTHER PUBLICATIONS

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
(Continued)

*Primary Examiner* — Earl Taylor
(74) *Attorney, Agent, or Firm* — Fish & Richardson P.C.

(57) ABSTRACT

Provided is a transistor with stable electrical characteristics. Provided is a semiconductor device including an oxide semiconductor over a substrate, a first conductor in contact with a top surface of the oxide semiconductor, a second conductor in contact with the top surface of the oxide semiconductor, a first insulator over the first and second conductors and in contact with the top surface of the oxide semiconductor, a second insulator over the first insulator, a third conductor over the second insulator, and a third insulator over the third conductor. The third conductor overlaps with the first conductor with the first and second insulators positioned therebetween, and overlaps with the second conductor with the first and second insulators positioned therebetween. The first insulator contains oxygen. The second
(Continued)

insulator transmits less oxygen than the first insulator. The third insulator transmits less oxygen than the first insulator.

23 Claims, 55 Drawing Sheets

(58) Field of Classification Search
USPC .......................................................... 257/43
See application file for complete search history.

(56) References Cited

U.S. PATENT DOCUMENTS

| | | | |
|---|---|---|---|
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,253,061 B2* | 8/2007 | Peng ................. | H01L 21/02241 257/E21.207 |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 7,977,254 B2* | 7/2011 | Peng ................. | H01L 21/02241 257/E21.082 |
| 8,654,566 B2* | 2/2014 | Nagatsuka ............ | G11C 11/403 365/149 |
| 8,981,367 B2* | 3/2015 | Yoneda ................. | H01L 29/78 257/43 |
| 9,040,984 B2* | 5/2015 | Watanabe ........... | H01L 29/4908 257/43 |
| 9,231,475 B2* | 1/2016 | Takahashi ............... | H05B 37/02 |
| 9,293,602 B2* | 3/2016 | Yamazaki | |
| 9,294,096 B2* | 3/2016 | Takemura ........... | H01L 29/7869 |
| 9,318,506 B2* | 4/2016 | Endo ................. | H01L 27/1225 |
| 9,318,618 B2* | 4/2016 | Endo ................. | H01L 29/7869 |
| 9,378,776 B2* | 6/2016 | Koyama ................ | G11C 5/063 |
| 9,397,153 B2* | 7/2016 | Tanaka ................ | H01L 29/0607 |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0121700 A1* | 6/2006 | Peng ................. | H01L 21/02241 438/483 |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2012/0040495 A1* | 2/2012 | Noda ................... | H01L 29/4908 438/104 |
| 2013/0140569 A1* | 6/2013 | Yoneda ................... | H01L 29/78 257/57 |
| 2013/0153890 A1* | 6/2013 | Yoneda ............... | H01L 27/1225 257/43 |
| 2013/0187152 A1* | 7/2013 | Yamazaki ......... | H01L 29/78693 257/43 |
| 2013/0334533 A1* | 12/2013 | Yamazaki ........... | H01L 29/7869 257/57 |
| 2014/0008647 A1* | 1/2014 | Yamazaki ........... | H01L 29/7869 257/43 |
| 2014/0042437 A1* | 2/2014 | Yamazaki ......... | H01L 29/78693 257/43 |
| 2014/0131701 A1* | 5/2014 | Watanabe ........... | H01L 29/7869 257/43 |
| 2014/0152932 A1* | 6/2014 | Miyake ............. | G02F 1/136213 349/42 |
| 2014/0319514 A1* | 10/2014 | Noda ................... | H01L 29/7869 257/43 |
| 2015/0028330 A1* | 1/2015 | Yamazaki ......... | H01L 29/42384 257/43 |
| 2015/0041803 A1* | 2/2015 | Endo ................. | H01L 21/31155 257/43 |
| 2015/0060845 A1* | 3/2015 | Shishido ........... | H01L 29/78648 257/43 |

(56) References Cited

U.S. PATENT DOCUMENTS

| | | | |
|---|---|---|---|
| 2015/0084046 A1* | 3/2015 | Kato | H01L 27/0688 257/43 |
| 2015/0155387 A1* | 6/2015 | Yamazaki | H01L 29/7869 257/43 |
| 2015/0179803 A1* | 6/2015 | Yamazaki | H01L 29/7869 257/43 |
| 2015/0179806 A1* | 6/2015 | Yoneda | H01L 29/78 257/43 |
| 2015/0187951 A1* | 7/2015 | Endo | H01L 29/7869 257/43 |
| 2015/0221679 A1* | 8/2015 | Yamazaki | H01L 27/1255 257/43 |
| 2015/0221775 A1* | 8/2015 | Yamazaki | H01L 29/7869 257/43 |
| 2015/0243332 A1* | 8/2015 | Koyama | G11C 5/063 365/72 |
| 2015/0249385 A1* | 9/2015 | Takahashi | H05B 37/02 315/291 |
| 2015/0270403 A1* | 9/2015 | Katayama | H01L 29/7869 345/173 |
| 2015/0280715 A1* | 10/2015 | Takemura | H01L 29/7869 326/47 |
| 2015/0311346 A1* | 10/2015 | Koezuka | H01L 29/7869 257/43 |
| 2016/0035865 A1* | 2/2016 | Nagamatsu | H01L 21/8221 438/104 |
| 2016/0071840 A1* | 3/2016 | Yamamoto | H01L 21/8258 257/43 |
| 2016/0172500 A1* | 6/2016 | Yamazaki | H01L 29/7869 257/43 |
| 2016/0211381 A1* | 7/2016 | Kurokawa | H01L 27/0207 |
| 2016/0218225 A1* | 7/2016 | Yamazaki | H01L 29/78696 |
| 2016/0233235 A1* | 8/2016 | Miyairi | H01L 27/1225 |
| 2016/0233339 A1* | 8/2016 | Okazaki | H01L 29/7869 |
| 2016/0240683 A1* | 8/2016 | Miyake | H01L 27/124 |
| 2016/0240684 A1* | 8/2016 | Yamazaki | H01L 29/7869 |
| 2016/0254386 A1* | 9/2016 | Yamazaki | H01L 29/7869 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-239117 A | 10/1988 |
| JP | 63-265818 A | 11/1988 |
| JP | 05-251705 A | 9/1993 |
| JP | 06-275697 A | 9/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | WO-2004/114391 | 12/2004 |

OTHER PUBLICATIONS

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Lee.H et al., "Current Status of, Challenges to, and Perspective View of AM-OLED", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Park.S et al., "Challenge to Future Displays: Transparent AM-OLED Driven by Peald Grown ZnO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Miyasaka.M, "SUFTLA Flexible Microelectronics on Their Way to Business", SID Digest '07: SID International Symposium Digest of Technical Papers, 2007, vol. 38, pp. 1673-1676.

Kurokawa.Y et al., "UHF RFCPUS on Flexible and Glass Substrates for Secure RFID Systems", Journal of Solid-State Circuits, 2008, vol. 43, No. 1, pp. 292-299.

Jeong.J et al., "3.1: Distinguished Paper: 12.1-Inch WXGA AMOLED Display Driven by Indium-Gallium-Zinc Oxide TFTs

(56) References Cited

OTHER PUBLICATIONS

Array", SID Digest '08 : SID International Symposium Digest of Technical Papers, May 20, 2008, vol. 39, No. 1, pp. 1-4.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.
Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Kikuchi.H et al., "39.1: Invited Paper:Optically Isotropic Nano-Structured Liquid Crystal Composites for Display Applications", SID Digest '09 : SID International Symposium Digest of Technical Papers, May 31, 2009, pp. 578-581.
Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.
Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Park.J et al., "High performance amorphous oxide thin film transistors with self-aligned top-gate structure", IEDM 09: Technical Digest of International Electron Devices Meeting, Dec. 7, 2009, pp. 191-194.
Nakamura.M, "Synthesis of Homologous Compound with New Long-Period Structure", Nirim Newsletter, Mar. 1, 1995, vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Orita.M et al., "Amorphous transparent conductive oxide InGaO3(ZnO)m (m<4):a Zn4s conductor", Philosophical Magazine, 2001 vol. 81, No. 5, pp. 501-515.
Janotti.A et al., "Oxygen Vacancies in ZnO", Appl. Phys. Lett. (Applied Physics Letters) , 2005, vol. 87, pp. 122102-1-122102-3.
Clark.S et al., "First Principles Methods Using CASTEP", Zeitschrift fur Kristallographie, 2005, vol. 220, pp. 567-570.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Janotti.A et al., "Native Point Defects in ZnO", Phys. Rev. B (Physical Review. B), Oct. 4, 2007, vol. 76, No. 16, pp. 165202-1-165202-22.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.
Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Oba.F et al., "Defect energetics in ZnO: A hybrid Hartree-Fock density functional study", Phys. Rev. B (Physical Review. B), 2008, vol. 77, pp. 245202-1-245202-6.
Kim.S et al., "High-Performance oxide thin film transistors passivated by various gas plasmas", 214th ECS Meeting, 2008, No. 2317, ECS.
Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Mo.Y et al., "Amorphous Oxide TFT Backplanes for Large Size AMOLED Displays", IDW '08 : Proceedings of the 6th International Display Workshops, Dec. 3, 2008, pp. 581-584.
Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(56) References Cited

OTHER PUBLICATIONS

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

\* cited by examiner

FIG. 25A
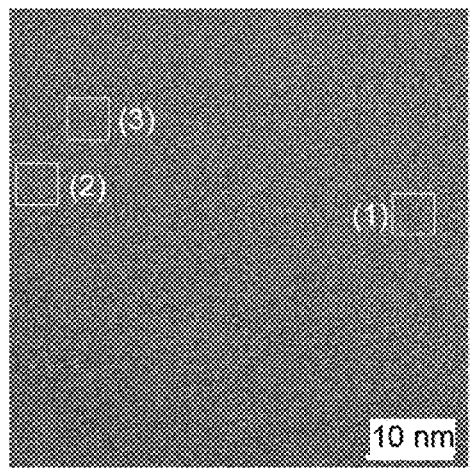
FIG. 25B  FIG. 25C  FIG. 25D
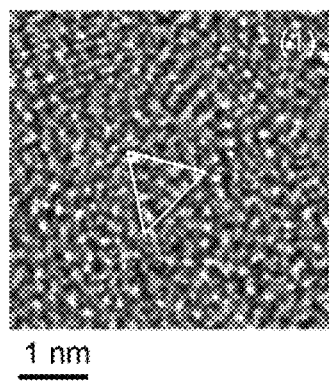 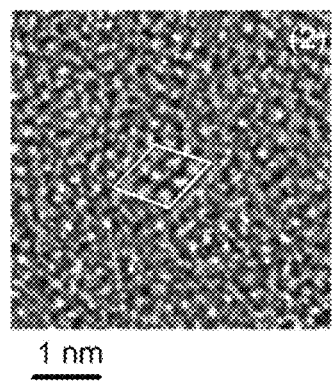 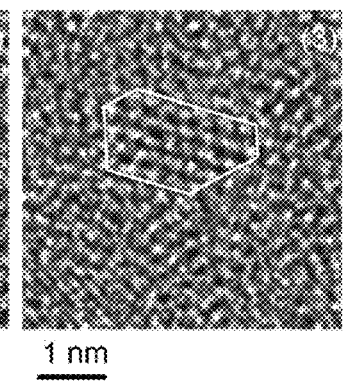

FIG. 27A
FIG. 27B
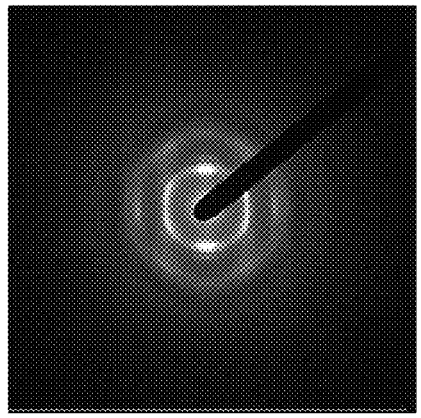
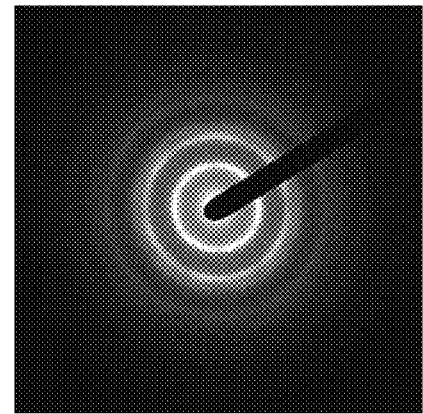

FIG. 43A1
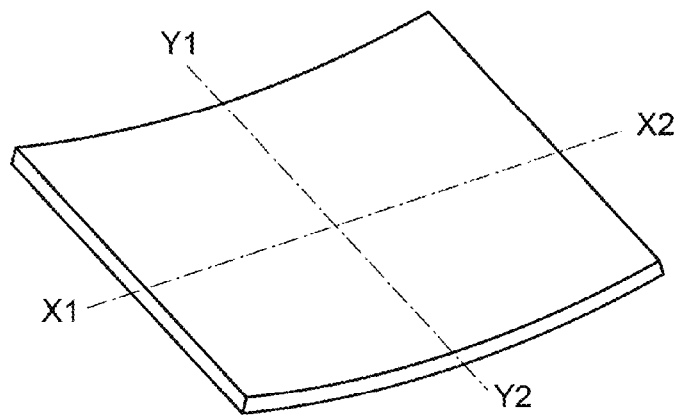
FIG. 43A2
FIG. 43A3
FIG. 43B1
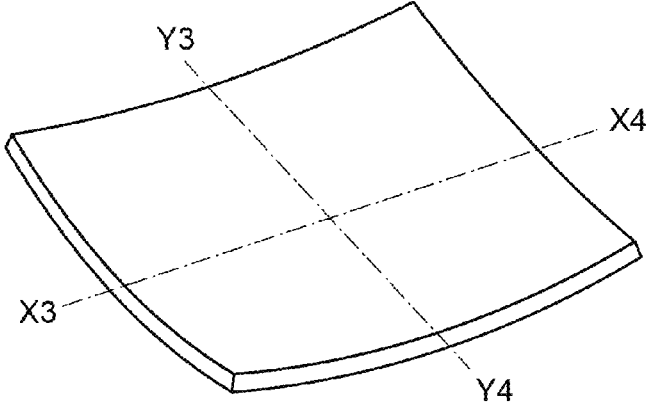
FIG. 43B2
FIG. 43B3

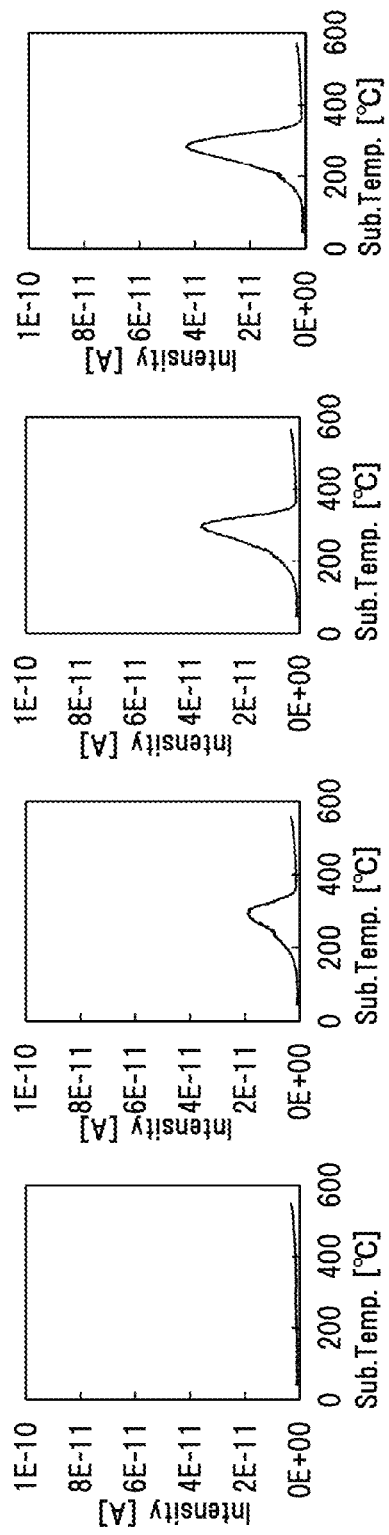

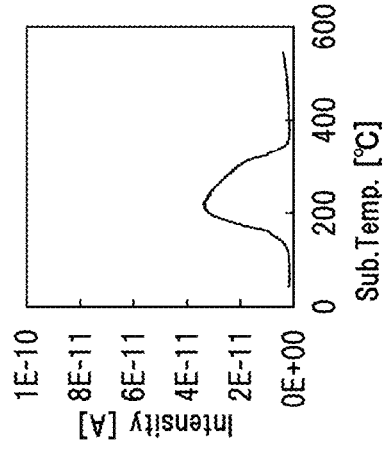
FIG. 51A  FIG. 51B  FIG. 51C
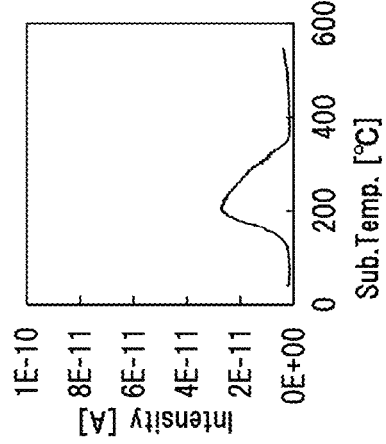
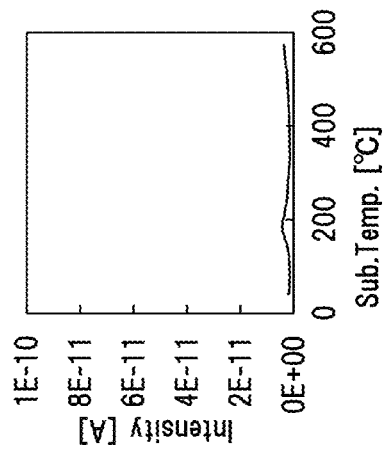
FIG. 51D  FIG. 51E  FIG. 51F

US 9,653,613 B2

SEMICONDUCTOR DEVICE AND MANUFACTURING METHOD THEREOF

BACKGROUND OF THE INVENTION

1. Field of the Invention

The present invention relates to, for example, a transistor or a semiconductor device. The present invention relates to, for example, a method for manufacturing a transistor or a semiconductor device. The present invention relates to, for example, a display device, a light-emitting device, a lighting device, a power storage device, a memory device, a processor, or an electronic device. The present invention relates to a method for manufacturing a display device, a liquid crystal display device, a light-emitting device, a memory device, or an electronic device. The present invention relates to a driving method of a display device, a liquid crystal display device, a light-emitting device, a memory device, or an electronic device.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter.

In this specification and the like, a semiconductor device generally means a device that can function by utilizing semiconductor characteristics. A display device, a light-emitting device, a lighting device, an electro-optical device, a semiconductor circuit, and an electronic device include a semiconductor device in some cases.

2. Description of the Related Art

A technique for forming a transistor by using a semiconductor over a substrate having an insulating surface has attracted attention. The transistor is applied to a wide range of semiconductor devices such as an integrated circuit and a display device. Silicon is known as a semiconductor applicable to a transistor.

As silicon which is used as a semiconductor of a transistor, either amorphous silicon or polycrystalline silicon is used depending on the purpose. For example, in the case of a transistor included in a large display device, it is preferable to use amorphous silicon, which can be used to form a film on a large substrate with the established technique. On the other hand, in the case of a transistor included in a high-performance display device where driver circuits are formed over the same substrate, it is preferred to use polycrystalline silicon, which can form a transistor having high field-effect mobility. As a method for forming polycrystalline silicon, high-temperature heat treatment or laser light treatment which is performed on amorphous silicon has been known.

In recent years, transistors including oxide semiconductors (typically, In—Ga—Zn oxide) have been actively developed. Oxide semiconductors have been researched since early times. In 1988, it was disclosed to use a crystal In—Ga—Zn oxide for a semiconductor element (see Patent Document 1). In 1995, a transistor including an oxide semiconductor was invented, and its electrical characteristics were disclosed (see Patent Document 2).

The transistor including an oxide semiconductor has different features from a transistor including amorphous silicon or polycrystalline silicon. For example, a display device in which a transistor including an oxide semiconductor is used is known to have low power consumption. An oxide semiconductor can be formed by a sputtering method or the like, and thus can be used in a transistor included in a large display device. A transistor including an oxide semiconductor has high field-effect mobility; therefore, a high-performance display device where driver circuits are formed over the same substrate can be obtained. In addition, there is an advantage that capital investment can be reduced because part of production equipment for a transistor including amorphous silicon can be retrofitted and utilized.

REFERENCE

Patent Documents

[Patent Document 1] Japanese Published Patent Application No. S63-239117
[Patent Document 2] Japanese translation of PCT international application No. H11-505377

SUMMARY OF THE INVENTION

An object is to provide a transistor with stable electrical characteristics. Another object is to provide a transistor having a low leakage current in an off state. Another object is to provide a transistor with high frequency characteristics. Another object is to provide a transistor having a high on-state current. Another object is to provide a transistor with normally-off electrical characteristics. Another object is to provide a transistor with a small subthreshold swing value. Another object is to provide a highly reliable transistor.

Another object is to provide a semiconductor device including the transistor. Another object is to provide a module including the semiconductor device. Another object is to provide an electronic device including the semiconductor device or the module. Another object is to provide a novel semiconductor device. Another object is to provide a novel module. Another object is to provide a novel electronic device.

Note that the descriptions of these objects do not preclude the existence of other objects. In one embodiment of the present invention, there is no need to achieve all the objects. Other objects will be apparent from and can be derived from the description of the specification, the drawings, the claims, and the like.

(1) One embodiment of the present invention is a semiconductor device including an oxide semiconductor over a substrate, a first conductor in contact with at least part of a top surface of the oxide semiconductor, a second conductor in contact with at least part of the top surface of the oxide semiconductor, a first insulator over the first conductor and the second conductor and in contact with at least part of the top surface of the oxide semiconductor, a second insulator over the first insulator, a third conductor over the second insulator, and a third insulator over the third conductor. The third conductor overlaps with at least part of the first conductor with the first insulator and the second insulator positioned therebetween and overlaps with at least part of the second conductor with the first insulator and the second insulator positioned therebetween. The first insulator contains oxygen. The second insulator transmits less oxygen than the first insulator. The third insulator transmits less oxygen than the first insulator.

In the semiconductor device described in (1), the second insulator preferably contains gallium and oxygen. The third insulator preferably contains aluminum and oxygen. The third insulator is preferably deposited by a sputtering method in an atmosphere containing oxygen. The first insulator preferably contains silicon and oxygen.

(2) Another embodiment of the present invention is a semiconductor device including a first insulator over a substrate, an oxide insulator over the first insulator, an oxide semiconductor in contact with at least part of a top surface of the oxide insulator, a first conductor in contact with at least part of a top surface of the oxide semiconductor, a second conductor in contact with at least part of the top surface of the oxide semiconductor, a second insulator over the first conductor and the second conductor and in contact with at least part of the top surface of the oxide semiconductor, a third insulator over the second insulator, a third conductor over the third insulator, a fourth insulator over the third conductor and in contact with at least part of the first insulator or the second insulator, and a fifth insulator on the fourth insulator. The third conductor overlaps with at least part of the first conductor with the second insulator and the third insulator positioned therebetween and overlaps with at least part of the second conductor with the second insulator and the third insulator positioned therebetween. A conduction band minimum of the oxide insulator is closer to a vacuum level than a conduction band minimum of the oxide semiconductor is. The first insulator, the second insulator, and the fourth insulator contain oxygen. The third insulator transmits less oxygen than the second insulator. The fifth insulator transmits less oxygen than the fourth insulator.

(3) Another embodiment of the present invention is a semiconductor device including a first insulator over a substrate, a first oxide insulator over the first insulator, an oxide semiconductor in contact with at least part of a top surface of the first oxide insulator, a first conductor in contact with at least part of a top surface of the oxide semiconductor, a second conductor in contact with at least part of the top surface of the oxide semiconductor, a second oxide insulator over the first conductor and the second conductor and in contact with at least part of the top surface of the oxide semiconductor, a second insulator over the second oxide insulator, a third insulator over the second insulator, a third conductor over the third insulator, a fourth insulator over the third conductor and in contact with at least part of the first insulator or the second insulator, and a fifth insulator on the fourth insulator. The third conductor overlaps with at least part of the first conductor with the second insulator and the third insulator positioned therebetween and overlaps with at least part of the second conductor with the second insulator and the third insulator positioned therebetween. A conduction band minimum of the first oxide insulator is closer to a vacuum level than a conduction band minimum of the oxide semiconductor is. A conduction band minimum of the second oxide insulator is closer to the vacuum level than the conduction band minimum of the oxide semiconductor is. The first insulator, the second insulator, and the fourth insulator contain oxygen. The third insulator transmits less oxygen than the second insulator. The fifth insulator transmits less oxygen than the fourth insulator.

In the semiconductor device described in (2) or (3), the third insulator preferably contains gallium and oxygen. The fifth insulator preferably contains aluminum and oxygen. The fifth insulator is preferably deposited by a sputtering method in an atmosphere containing oxygen. The first insulator, the second insulator, and the fourth insulator preferably contain silicon and oxygen.

(4) Another embodiment of the present invention is a semiconductor device including a first insulator over a substrate, an oxide insulator over the first insulator, an oxide semiconductor in contact with at least part of a top surface of the oxide insulator, a first conductor in contact with at least part of a top surface of the oxide semiconductor, a second insulator on the first conductor, a second conductor in contact with at least part of the top surface of the oxide semiconductor, a third insulator on the second conductor, a fourth insulator in contact with at least part of top surfaces of the second insulator and the third insulator and in contact with at least part of the top surface of the oxide semiconductor, a fifth insulator over the fourth insulator, a third conductor over the fifth insulator, and a sixth insulator over the third conductor. The third conductor overlaps with at least part of the first conductor with the second insulator, the fourth insulator, and the fifth insulator positioned therebetween and overlaps with at least part of the second conductor with the third insulator, the fourth insulator, and the fifth insulator positioned therebetween. A conduction band minimum of the oxide insulator is closer to a vacuum level than a conduction band minimum of the oxide semiconductor is. The sixth insulator is in contact with part of a top surface of the first insulator, part of the top surface of the second insulator, and part of the top surface of the third insulator. The first insulator, the second insulator, the third insulator, and the fourth insulator contain oxygen. The fifth insulator transmits less oxygen than the fourth insulator. The sixth insulator transmits less oxygen than the first insulator, the second insulator, the third insulator, and the fourth insulator.

In the semiconductor device described in (4), the fifth insulator preferably contains gallium and oxygen. The sixth insulator preferably contains aluminum and oxygen. The sixth insulator is preferably deposited by a sputtering method in an atmosphere containing oxygen. The first insulator, the second insulator, the third insulator, and the fourth insulator preferably contain silicon and oxygen.

In the semiconductor device described in any of (1) to (4), the oxide semiconductor preferably contains indium, an element M (Ti, Ga, Y, Zr, La, Ce, Nd, Sn, or Hf), zinc, and oxygen.

A transistor with stable electrical characteristics can be provided. A transistor having a low leakage current in an off state can be provided. A transistor with high frequency characteristics can be provided. A transistor having a high on-state current can be provided. A transistor with normally-off electrical characteristics can be provided. A transistor with a small subthreshold swing value can be provided. A highly reliable transistor can be provided.

A semiconductor device including the transistor can be provided. A module including the semiconductor device can be provided. An electronic device including the semiconductor device or the module can be provided. A novel semiconductor device can be provided. A novel module can be provided. A novel electronic device can be provided.

Note that the description of these effects does not preclude the existence of other effects. One embodiment of the present invention does not necessarily achieve all the effects listed above. Other effects will be apparent from and can be derived from the description of the specification, the drawings, the claims, and the like.

BRIEF DESCRIPTION OF THE DRAWINGS

FIGS. 25A to 25D are Cs-corrected high-resolution TEM images of a plane of a CAAC-OS.

FIGS. 27A and 27B show electron diffraction patterns of a CAAC-OS.

FIGS. 43A1, 43A2, 43A3, 43B1, 43B2, and 43B3 are perspective views and cross-sectional views illustrating semiconductor devices of embodiments of the present invention.

FIGS. 50A to 50G are graphs showing TDS analysis results in Example.

FIGS. 51A to 51F are graphs showing TDS analysis results in Example.

DETAILED DESCRIPTION OF THE INVENTION

Figure 1A:
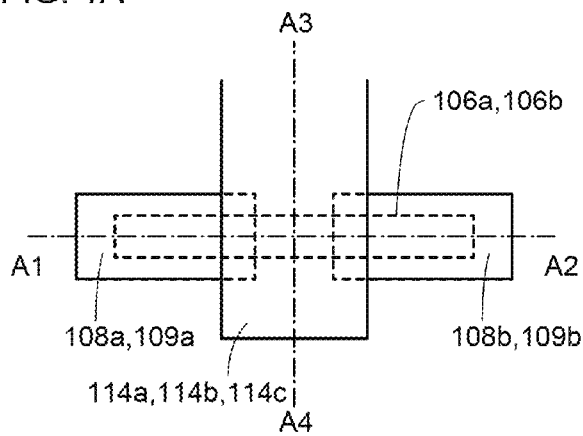
FIGS. 1A to 1C are a top view and cross-sectional views illustrating a transistor of one embodiment of the present invention.

Hereinafter, embodiments and examples of the present invention will be described in detail with the reference to the drawings. However, the present invention is not limited to the description below, and it is easily understood by those skilled in the art that modes and details disclosed herein can be modified in various ways. Furthermore, the present invention is not construed as being limited to description of the embodiments. In describing structures of the present invention with reference to the drawings, common reference numerals are used for the same portions in different drawings. Note that the same hatched pattern is applied to similar parts, and the similar parts are not denoted by reference numerals in some cases.

A structure in one of the following embodiments can be appropriately applied to, combined with, or replaced with another structure in another embodiment, for example, and the resulting structure is also one embodiment of the present invention.

Note that the size, the thickness of films (layers), or regions in drawings is sometimes exaggerated for simplicity.

In this specification, the terms "film" and "layer" can be interchanged with each other.

A voltage usually refers to a potential difference between a given potential and a reference potential (e.g., a source potential or a ground potential (GND)). A voltage can be referred to as a potential. Note that in general, a potential (a voltage) is relative and is determined depending on the amount relative to a reference potential. Therefore, a potential that is represented as a "ground potential" or the like is not always 0 V. For example, the lowest potential in a circuit may be represented as a "ground potential." Alternatively, a substantially intermediate potential in a circuit may be represented as a "ground potential." In these cases, a positive potential and a negative potential are set using the potential as a reference.

Note that the ordinal numbers such as "first" and "second" are used for convenience and do not denote the order of steps or the stacking order of layers. Therefore, for example, the term "first" can be replaced with the term "second," "third," or the like as appropriate. In addition, the ordinal numbers in this specification and the like do not correspond to the ordinal numbers which specify one embodiment of the present invention in some cases.

Note that impurities in a semiconductor refer to, for example, elements other than the main components of the semiconductor. For example, an element with a concentration of lower than 0.1 atomic % is an impurity. When an impurity is contained, the density of states (DOS) may be formed in a semiconductor, the carrier mobility may be decreased, or the crystallinity may be decreased. In the case where the semiconductor is an oxide semiconductor, examples of an impurity which changes characteristics of the semiconductor include Group 1 elements, Group 2 elements, Group 13 elements, Group 14 elements, Group 15 elements, and transition metals other than the main components; specifically, there are hydrogen (included in water), lithium, sodium, silicon, boron, phosphorus, carbon, and nitrogen, for example. In the case of an oxide semiconductor, oxygen vacancies may be formed by entry of impurities such as hydrogen. In the case where the semiconductor is silicon, examples of an impurity which changes characteristics of the semiconductor include oxygen, Group 1 elements except hydrogen, Group 2 elements, Group 13 elements, and Group 15 elements.

Note that the channel length refers to, for example, the distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate electrode overlap with each other, or a region where a channel is formed. In one transistor, channel widths in all regions are not necessarily the same. In other words, the channel width of one transistor is not limited to one value in some cases. Therefore, in this specification, the channel width is any one of values, the maximum value, the minimum value, or the average value in a region where a channel is formed.

Note that depending on a transistor structure, a channel width in a region where a channel is formed actually (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is high in some cases. In that case, an effective channel width obtained when a channel is actually formed is greater than an apparent channel width shown in the top view.

In a transistor having a three-dimensional structure, an effective channel width is difficult to measure in some cases. For example, to estimate an effective channel width from a design value, it is necessary to assume that the shape of a semiconductor is known. Therefore, in the case where the shape of a semiconductor is not known accurately, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as a surrounded channel width (SCW) in some cases. Furthermore, in this specification, in the case where the term "channel width" is simply used, it may denote a surrounded channel width and an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where field-effect mobility, a current value per channel width, and the like of a transistor are obtained by calculation, a surrounded channel width may be used for the calculation. In that case, the values might be different from those calculated by using an effective channel width.

In this specification, the term "parallel" indicates that the angle formed between two straight lines is greater than or equal to −10° and less than or equal to 10°, and accordingly also includes the case where the angle is greater than or equal to −5° and less than or equal to 5°. A term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly also includes the case where the angle is greater than or equal to 85° and less than or equal to 95°. A term "substantially perpendicular" indicates that the angle formed between two straight lines is greater than or equal to 60° and less than or equal to 120°.

In this specification, trigonal and rhombohedral crystal systems are included in a hexagonal crystal system.

(Embodiment 1)

In this embodiment, structures of semiconductor devices of embodiments of the present invention will be described with reference to FIGS. 1A to 1C, FIGS. 2A and 2B, FIGS. 3A to 3D, FIGS. 4A to 4D, FIGS. 5A and 5B, FIGS. 6A to 6C, FIGS. 7A to 7D, and FIGS. 8A to 8C.

<Structure of Transistor>

Structures of transistors, which are examples of the semiconductor devices of embodiments of the present invention, will be described below.

Figure 1B:
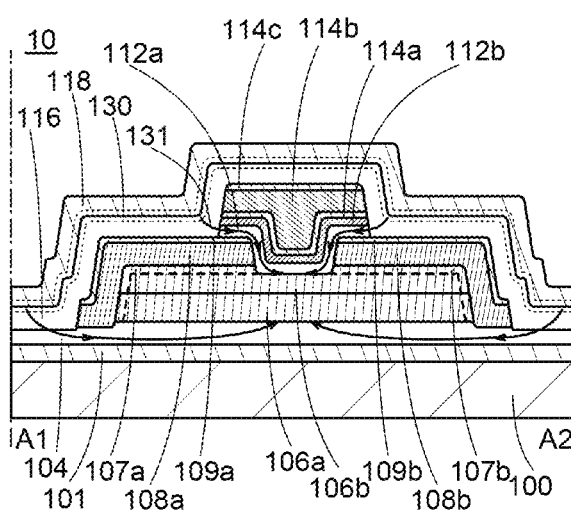
Figure 1C:
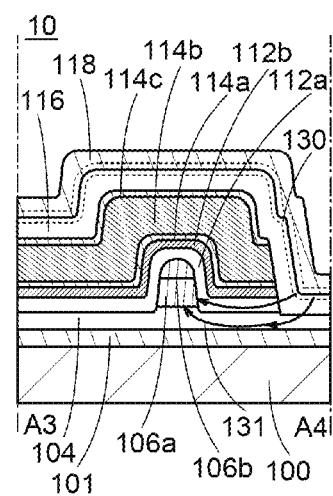

A structure of a transistor 10 will be described with reference to FIGS. 1A to 1C. FIG. 1A is a top view of the transistor 10. FIG. 1B is a cross-sectional view taken along dashed-dotted line A1-A2 in FIG. 1A. FIG. 1C is a cross-sectional view taken along dashed-dotted line A3-A4 in FIG. 1A. A region along dashed-dotted line A1-A2 shows a structure of the transistor 10 in the channel length direction, and a region along dashed-dotted line A3-A4 shows a structure of the transistor 10 in the channel width direction. The channel length direction of a transistor refers to a direction in which carriers move between a source (source region or source electrode) and a drain (drain region or drain electrode). The channel width direction refers to a direction perpendicular to the channel length direction in a plane parallel to a substrate. Note that in FIG. 1A, some components (e.g., an insulating film functioning as a protective insulating film) of the transistor 10 are not illustrated to avoid complexity. As in FIG. 1A, some components are not illustrated in some cases in top views of transistors described below.

The transistor 10 includes a semiconductor 106b over a substrate 100, a conductor 108a in contact with at least part of the top surface of the semiconductor 106b, a conductor 108b in contact with at least part of the top surface of the semiconductor 106b, an insulator 112a over the conductors 108a and 108b and in contact with at least part of the top surface of the semiconductor 106b, an insulator 112b over the insulator 112a, a conductor 114b over the insulator 112b, and an insulator 118 over the conductor 114b. The conductor 114b overlaps with at least part of the conductor 108a with the insulator 112a and the insulator 112b positioned therebetween and overlaps with at least part of the conductor 108b with the insulator 112a and the insulator 112b positioned therebetween.

As illustrated in FIGS. 1A to 1C, the transistor 10 includes, for example, an insulator 101 and an insulator 104 over the substrate 100; an insulator 106a and the semiconductor 106b over the insulator 104; the conductor 108a, the conductor 108b, a conductor 109a, and a conductor 109b over the semiconductor 106b; the insulator 112a and the insulator 112b over the semiconductor 106b; a conductor 114a, a conductor 114b, and a conductor 114c over the insulator 112b; and an insulator 116 and the insulator 118 over the conductor 114c.

Each of the insulators 101, 104, 106a, 112a, 112b, 116, and 118 can also be referred to as an insulating film or an insulating layer. Each of the conductors 108a, 108b, 109a, 109b, 114a, 114b, and 114c can also be referred to as a conductive film or a conductive layer. The semiconductor 106b can also be referred to as a semiconductor film or a semiconductor layer.

The insulator 104 is over the insulator 101 over the substrate 100. The insulator 106a is over the insulator 104, and the semiconductor 106b is in contact with at least part of the top surface of the insulator 106a. The insulator 106a and the semiconductor 106b are preferably formed using an oxide semiconductor. The insulator 104 is preferably formed using an insulator containing oxygen. A low-resistance region 107a or a low-resistance region 107b might be formed in a region (shown by dotted lines in FIG. 1B) where the insulator 106a, the semiconductor 106b, or the like is in contact with the conductor 108a or the conductor 108b. As illustrated in FIG. 1B, the semiconductor 106b might have, between the conductor 108a and the conductor 108b, a region thinner than regions overlapping with the conductor 108a and the conductor 108b.

The conductor 108a and the conductor 108b are in contact with at least part of the top surface of the semiconductor 106b. The conductor 108a and the conductor 108b are spaced from each other, and are preferably opposed to each other with the conductors 114a to 114c positioned therebetween as illustrated in FIGS. 1A and 1B. As illustrated in FIG. 1B, the conductor 109a and the conductor 109b may be formed on the conductor 108a and the conductor 108b, respectively, to obtain stacked conductors. The conductor 108a and the conductor 109a function as one of a source electrode and a drain electrode of the transistor 10. The conductor 108b and the conductor 109b function as the other of the source electrode and the drain electrode of the transistor 10. One or both of the conductors 109a and 109b are not necessarily provided.

In the structure illustrated in FIG. 1B, the bottom surfaces of the conductors 108a and 108b are in contact with parts of side surfaces of the insulator 106a and the semiconductor 106b and part of the top surface of the insulator 104. Such a structure can have large contact areas of the conductors 108a and 108b functioning as the source and drain electrodes with the insulator 106a and the semiconductor 106b; thus, current that flows while the transistor 10 is turned on (on-state current) can be increased. Note that the structure of the semiconductor device described in this embodiment is not limited thereto. For example, a structure may be employed in which the bottom surfaces of the conductors 108a and 108b are only in contact with the top surface of the semiconductor 106b. In such a structure, end portions of the conductors 108a and 108b are aligned with or positioned inward from end portions of the semiconductor 106b.

The insulator 112a is over the semiconductor 106b, and the insulator 112b is over the insulator 112a. Note that the insulators 112a and 112b function as a gate insulating film of the transistor 10. The insulator 112a is formed using an insulator containing oxygen, and the insulator 112b is formed using an insulator that transmits less oxygen than the insulator 112a. Although end portions of the insulators 112a and 112b and the conductors 114a to 114c are aligned with each other in the structure illustrated in FIGS. 1A to 1C, the structure described in this embodiment is not limited thereto.

The conductors 114a to 114c are provided over the insulator 112b to overlap with a region between the conductor 108a and the conductor 108b. The conductor 114a, the conductor 114b, and the conductor 114c are stacked in this order. The conductors 114a to 114c overlap with at least part of the conductor 108a with the insulator 112a and the insulator 112b positioned therebetween and overlap with at least part of the conductor 108b with the insulator 112a and the insulator 112b positioned therebetween. Note that the conductors 114a to 114c function as a gate electrode of the transistor 10. One or both of the conductors 114a and 114c are not necessarily provided.

The insulator 116 is over the conductors 114a to 114c and the insulator 104. The insulator 116 is preferably in contact with at least part of the insulator 112a and part of the insulator 104. The insulator 118 is on the insulator 116. Note that the insulators 116 and 118 function as a protective insulating film of the transistor 10. The insulator 116 is formed using an insulator containing oxygen, and the insulator 118 is formed using an insulator that transmits less oxygen than the insulator 116.

A mixed region 130 might be formed in a region in the vicinity of the interface between the insulator 116 and the insulator 118 (shown by dotted lines in FIGS. 1B and 1C). The mixed region 130 contains both a component of the insulator 116 and a component of the insulator 118. Although the mixed region 130 is formed in both the insulator 116 and the insulator 118 in FIGS. 1B and 1C, the semiconductor device described in this embodiment is not limited thereto. For example, the mixed region 130 may be formed mainly in the insulator 116 or in the insulator 118. In the case where the mixed region 130 is formed mainly in the insulator 118, for example, the amount of the component of the insulator 118 is larger than the amount of the component of the insulator 116 in the mixed region.

As described above, the conductor 108a has a region (hereinafter, also referred to as an overlap region) overlapping with the conductors 114a to 114c with the insulators 112a and 112b positioned therebetween. The conductor 108b also has an overlap region. Owing to the overlap regions, a region (hereinafter, also referred to as an offset region) where the semiconductor 106b between the conductor 108a and the conductor 108b does not overlap with the conductors 114a to 114c is not formed. If an offset region is formed in a transistor, the offset region functions as resistance when voltage is applied to a gate electrode to form a channel; as a result, an on-state current is decreased. However, since the overlap region is formed and the offset region is not formed in the semiconductor device described in this embodiment, a transistor with large on-state current can be fabricated.

<Semiconductor>

A detailed structure of the semiconductor 106b will be described below.

In this section, a detailed structure of the insulator 106a will be described in addition to that of the semiconductor 106b.

The semiconductor 106b is an oxide semiconductor containing indium, for example. The semiconductor 106b can have high carrier mobility (electron mobility) by containing indium, for example. The semiconductor 106b preferably contains an element M. The element M is preferably Ti, Ga, Y, Zr, La, Ce, Nd, Sn, or Hf. Note that two or more of the above elements may be used in combination as the element M in some cases. The element M is an element having high bonding energy with oxygen, for example. The element M is an element whose bonding energy with oxygen is higher than that of indium, for example. The element M is an element that can increase the energy gap of the oxide semiconductor, for example. Furthermore, the semiconductor 106b preferably contains zinc. When the oxide semiconductor contains zinc, the oxide semiconductor is easily crystallized, in some cases.

Note that the semiconductor 106b is not limited to the oxide semiconductor containing indium. The semiconductor 106b may be, for example, an oxide semiconductor which does not contain indium and contains zinc, an oxide semiconductor which does not contain indium and contains gallium, or an oxide semiconductor which does not contain indium and contains tin, e.g., a zinc tin oxide or a gallium tin oxide.

The insulator 106a includes one or more elements, or two or more elements other than oxygen included in the semiconductor 106b. Since the insulator 106a includes one or more elements, or two or more elements other than oxygen included in the semiconductor 106b, a defect state is less likely to be formed at the interface between the insulator 106a and the semiconductor 106b.

The insulator 106a and the semiconductor 106b preferably contain at least indium. In the case of using an In-M-Zn oxide as the insulator 106a, when the summation of In and M is assumed to be 100 atomic %, the proportions of In and M are preferably set to be less than 50 atomic % and greater than 50 atomic %, respectively, and further preferably less than 25 atomic % and greater than 75 atomic %, respectively. In the case of using an In-M-Zn oxide as the semiconductor 106b, when the summation of In and M is assumed to be 100 atomic %, the proportions of In and M are preferably set to be greater than 25 atomic % and less than 75 atomic %, respectively, and further preferably greater than 34 atomic % and less than 66 atomic %, respectively. Note that the insulator 106a does not necessarily contain indium in some cases. For example, the insulator 106a may be gallium oxide or a Ga—Zn oxide. Note that the atomic ratio between the elements included in the insulator 106a and the semiconductor 106b is not necessarily a simple integer ratio.

In the case of deposition using a sputtering method, typical examples of the atomic ratio between the metal elements of a target that is used for the insulator 106a include In:M:Zn=1:2:4, In:M:Zn=1:3:2, In:M:Zn=1:3:4, In:M:Zn=1:3:6, In:M:Zn=1:3:8, In:M:Zn=1:4:3, In:M:Zn=1:4:4, In:M:Zn=1:4:5, In:M:Zn=1:4:6, In:M:Zn=1:6:3, In:M:Zn=1:6:4, In:M:Zn=1:6:5, In:M:Zn=1:6:6, In:M:Zn=1:6:7, In:M:Zn=1:6:8, and In:M:Zn=1:6:9. The atomic ratio between the metal elements of the target that is used for the insulator 106a may be M:Zn=10:1.

In the case of deposition using a sputtering method, typical examples of the atomic ratio between the metal elements of a target that is used for the semiconductor 106b include In:M:Zn=1:1:1, In:M:Zn=1:1:1.2, In:M:Zn=2:1:1.5, In:M:Zn=2:1:2.3, In:M:Zn=2:1:3, In:M:Zn=3:1:2, and In:M:Zn=4:2:4.1. In particular, when a sputtering target containing In, Ga, and Zn at an atomic ratio of 4:2:4.1 is used, the deposited semiconductor 106b may contain In, Ga, and Zn at an atomic ratio of around 4:2:3.

For the semiconductor 106b, an oxide with a wide energy gap may be used, for example. For example, the energy gap of the semiconductor 106b is greater than or equal to 2.5 eV and less than or equal to 4.2 eV, preferably greater than or equal to 2.8 eV and less than or equal to 3.8 eV, further preferably greater than or equal to 3 eV and less than or equal to 3.5 eV. Here, the energy gap of the insulator 106a is larger than that of the semiconductor 106b.

As the semiconductor 106b, an oxide having an electron affinity larger than that of the insulator 106a is used. For example, as the semiconductor 106b, an oxide having an electron affinity larger than that of the insulator 106a by 0.07 eV or higher and 1.3 eV or lower, preferably 0.1 eV or higher and 0.7 eV or lower, and further preferably 0.15 eV or higher and 0.4 eV or lower is used. Note that the electron affinity refers to an energy difference between the vacuum level and the conduction band minimum. In other words, the conduction band minimum of the insulator 106a is closer to the vacuum level than that of the semiconductor 106b is.

In such a case, gate voltage application results in channel formation not in the insulator 106a but in the semiconductor 106b having a high electron affinity.

The insulator 106a is formed using a substance that can function as a conductor, a semiconductor, or an insulator when it is used alone. However, when the transistor is formed using a stack including the insulator 106a and the semiconductor 106b, electrons flow in the semiconductor 106b and at and in the vicinity of the interface between the semiconductor 106b and the insulator 106a; thus, the insulator 106a has a region not functioning as a channel of the transistor. For that reason, in this specification and the like, the insulator 106a is not referred to as a semiconductor but an insulator. Note that the reason why the insulator 106a is referred to as an insulator is because it is closer to an insulator than the semiconductor 106b is in terms of its function in the transistor; thus, a substance that can be used for the semiconductor 106b is used for the insulator 106a in some cases.

Here, in some cases, there is a mixed region of the insulator 106a and the semiconductor 106b between the insulator 106a and the semiconductor 106b. The mixed region has a low density of defect states. For that reason, the stack including the insulator 106a and the semiconductor 106b has a band structure where energy is changed continuously at and in the vicinity of the interface between the insulator 106a and the semiconductor 106b (continuous junction). Note that the boundary between the insulator 106a and the semiconductor 106b is not clear in some cases.

At this time, electrons move mainly in the semiconductor 106b, not in the insulator 106a. As described above, when the density of defect states at the interface between the insulator 106a and the semiconductor 106b is decreased, electron movement in the semiconductor 106b is less likely to be inhibited and the on-state current of the transistor can be increased.

As factors in inhibiting electron movement are decreased, the on-state current of the transistor can be increased. For example, in the case where there is no factor in inhibiting electron movement, electrons are assumed to be efficiently moved. Electron movement is inhibited, for example, in the case where physical unevenness of the channel formation region is large.

To increase the on-state current of the transistor, for example, root mean square (RMS) roughness with a measurement area of 1 μm×1 μm of the top or bottom surface of the semiconductor 106b (a formation surface; here, the top surface of the insulator 106a) is less than 1 nm, preferably less than 0.6 nm, further preferably less than 0.5 nm, still further preferably less than 0.4 nm. The average surface roughness (also referred to as Ra) with the measurement area of 1 μm×1 μm is less than 1 nm, preferably less than 0.6 nm, further preferably less than 0.5 nm, still further preferably less than 0.4 nm. The maximum difference (P–V) with the measurement area of 1 μm×1 μm is less than 10 nm, preferably less than 9 nm, further preferably less than 8 nm, still further preferably less than 7 nm. RMS roughness, Ra, and P–V can be measured using a scanning probe microscope SPA-500 manufactured by SII Nano Technology Inc.

To improve reliability, the insulator 106a is preferably thick. For example, the insulator 106a includes a region with a thickness of, for example, greater than or equal to 10 nm, preferably greater than or equal to 20 nm, further preferably greater than or equal to 40 nm, still further preferably greater than or equal to 60 nm. When the thickness of the insulator 106a is made large, a distance from the interface between the adjacent insulator and the insulator 106a to the semiconductor 106b in which a channel is formed can be large. Since the productivity of the semiconductor device might be decreased, the insulator 106a has a region with a thickness of, for example, less than or equal to 200 nm, preferably less than or equal to 120 nm, further preferably less than or equal to 80 nm.

Silicon in the oxide semiconductor might serve as a carrier trap or a carrier generation source, for example. Thus, the silicon concentration in the semiconductor 106b is preferably as low as possible. It is preferable that a region with a silicon concentration measured by secondary ion mass spectrometry (SIMS) of higher than or equal to $1\times10^{16}$ atoms/cm$^3$ and lower than or equal to $1\times10^{19}$ atoms/cm$^3$, preferably higher than or equal to $1\times10^{16}$ atoms/cm$^3$ and lower than or equal to $5\times10^{18}$ atoms/cm$^3$, and further preferably higher than or equal to $1\times10^{16}$ atoms/cm$^3$ and lower than or equal to $2\times10^{18}$ atoms/cm$^3$ be provided between the semiconductor 106b and the insulator 106a, for example.

It is preferable to reduce the hydrogen concentration in the insulator 106a in order to reduce the hydrogen concentration in the semiconductor 106b. The insulator 106a includes a region with a hydrogen concentration measured by SIMS of higher than or equal to $1\times10^{16}$ atoms/cm$^3$ and lower than or equal to $2\times10^{20}$ atoms/cm$^3$, preferably higher than or equal to $1\times10^{16}$ atoms/cm$^3$ and lower than or equal to $5\times10^{19}$ atoms/cm$^3$, further preferably higher than or equal to $1\times10^{16}$ atoms/cm$^3$ and lower than or equal to $1\times10^{19}$ atoms/cm$^3$, and still further preferably higher than or equal to $1\times10^{16}$ atoms/cm$^3$ and lower than or equal to $5\times10^{18}$ atoms/cm$^3$. It is preferable to reduce the nitrogen concentration in the insulator 106a in order to reduce the nitrogen concentration in the semiconductor 106b. The insulator 106a includes a region with a nitrogen concentration measured by SIMS of higher than or equal to $1\times10^{15}$ atoms/cm$^3$ and lower than or equal to $5\times10^{19}$ atoms/cm$^3$, preferably higher than or equal to $1\times10^{15}$ atoms/cm$^3$ and lower than or equal to $5\times10^{18}$ atoms/cm$^3$, further preferably higher than or equal to $1\times10^{15}$ atoms/cm$^3$ and lower than or equal to $1\times10^{18}$ atoms/cm$^3$, and still further preferably higher than or equal to $1\times10^{15}$ atoms/cm$^3$ and lower than or equal to $5\times10^{17}$ atoms/cm$^3$.

The low-resistance region 107a and the low-resistance region 107b illustrated in FIG. 1B are mainly formed when oxygen is extracted by the conductor 108a and the conductor 108b that are in contact with the insulator 106a or the semiconductor 106b. Alternatively, the low-resistance region 107a and the low-resistance region 107b are formed when a conductive material contained in the conductor 108a and the conductor 108b is bonded to an element in the insulator 106a or the semiconductor 106b. Owing to the low-resistance region 107a and the low-resistance region 107b, contact resistance between the insulator 106a or the semiconductor 106b and the conductors 108a and 108b can be reduced, whereby the on-state current of the transistor 10 can be increased.

As illustrated in FIG. 1B, the semiconductor 106b might have, between the conductor 108a and the conductor 108b, a region thinner than regions overlapping with the conductor 108a and the conductor 108b. The thin region is formed because part of the top surface of the semiconductor 106b is removed during formation of the conductor 108a and the conductor 108b. In deposition of a conductor to be the conductors 108a and 108b, a region with low resistance like the low-resistance regions 107a and 107b might be formed on the top surface of the semiconductor 106b. The removal of the region that is on the top surface of the semiconductor 106b and between the conductor 108a and the conductor 108b can prevent a channel from being formed in the low-resistance region on the top surface of the semiconductor 106b.

The two-layer structure including the insulator 106a and the semiconductor 106b is an example. A single-layer structure without the insulator 106a may be employed, for example. Alternatively, a three-layer structure in which any one of the insulator, semiconductor, and conductor described as examples of the insulator 106a is added over the semiconductor 106b may be employed. Further alternatively, an n-layer structure (n is an integer of 5 or more) may be employed in which any one of the insulator, semiconductor, and conductor described as examples of the insulator 106a or the semiconductor 106b is provided at two or more of the following positions: below the insulator 106a, over the insulator 106a, and over the semiconductor 106b.

Each of the insulator 106a and the semiconductor 106b described in this embodiment, particularly the semiconductor 106b, is an oxide semiconductor with a low impurity concentration and a low density of defect states (a small number of oxygen vacancies) and thus can be referred to as a highly purified intrinsic or substantially highly purified intrinsic oxide semiconductor. Since a highly purified intrinsic or substantially highly purified intrinsic oxide semiconductor has few carrier generation sources, the carrier density can be low. Thus, a transistor in which a channel region is formed in the oxide semiconductor rarely has a negative threshold voltage (is rarely normally on). A highly purified intrinsic or substantially highly purified intrinsic oxide semiconductor has a low density of defect states and accordingly has a low density of trap states in some cases. Furthermore, a highly purified intrinsic or substantially highly purified intrinsic oxide semiconductor has an extremely low off-state current; the off-state current can be less than or equal to the measurement limit of a semiconductor parameter analyzer, i.e., less than or equal to $1 \times 10^{-13}$ A, at a voltage (drain voltage) between a source electrode and a drain electrode of from 1 V to 10 V even when an element has a channel width (W) of $1 \times 10^6$ μm and a channel length (L) of 10 μm.

Accordingly, the transistor in which the channel region is formed in the highly purified intrinsic or substantially highly purified intrinsic oxide semiconductor can have a small change in electrical characteristics and high reliability. Charges trapped by the trap states in the oxide semiconductor take a long time to be released and may behave like fixed charges. Thus, the transistor whose channel region is formed in the oxide semiconductor having a high density of trap states has unstable electrical characteristics in some cases. Examples of impurities are hydrogen, nitrogen, alkali metal, and alkaline earth metal.

Hydrogen contained in the insulator 106a and the semiconductor 106b reacts with oxygen bonded to a metal atom to be water, and also causes an oxygen vacancy in a lattice from which oxygen is released (or a portion from which oxygen is released). Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Hydrogen trapped by an oxygen vacancy might form a shallow donor level in a band structure of a semiconductor. Thus, a transistor including an oxide semiconductor that contains hydrogen is likely to be normally on. For this reason, it is preferable that hydrogen be reduced as much as possible in the insulator 106a and the semiconductor 106b. Specifically, the hydrogen concentration in the insulator 106a and the semiconductor 106b, which is measured by SIMS, is lower than or equal to $2 \times 10^{20}$ atoms/cm$^3$, preferably lower than or equal to $5 \times 10^{19}$ atoms/cm$^3$, further preferably lower than or equal to $1 \times 10^{19}$ atoms/cm$^3$, still further preferably lower than or equal to $5 \times 10^{18}$ atoms/cm$^3$, yet further preferably lower than or equal to $1 \times 10^{18}$ atoms/cm$^3$, even further preferably lower than or equal to $5 \times 10^{17}$ atoms/cm$^3$, and further preferably lower than or equal to $1 \times 10^{16}$ atoms/cm$^3$.

When the insulator 106a and the semiconductor 106b contain silicon or carbon, which is one of elements belonging to Group 14, oxygen vacancies in the insulator 106a and the semiconductor 106b are increased, which makes the insulator 106a and the semiconductor 106b n-type. Thus, the concentration of silicon or carbon (measured by SIMS) in the insulator 106a and the semiconductor 106b or the concentration of silicon or carbon (measured by SIMS) in the vicinity of the interface with the insulator 106a or the semiconductor 106b is set to be lower than or equal to $2 \times 10^{18}$ atoms/cm$^3$, preferably lower than or equal to $2 \times 10^{17}$ atoms/cm$^3$.

In addition, the concentration of an alkali metal or alkaline earth metal in the insulator 106a and the semiconductor 106b, which is measured by SIMS, is set to be lower than or equal to $1 \times 10^{18}$ atoms/cm$^3$, preferably lower than or equal to $2 \times 10^{16}$ atoms/cm$^3$. An alkali metal and an alkaline earth metal might generate carriers when bonded to an oxide semiconductor, in which case the off-state current of the transistor might be increased. Thus, it is preferable to reduce the concentration of an alkali metal or alkaline earth metal in the insulator 106a and the semiconductor 106b.

Furthermore, when containing nitrogen, the insulator 106a and the semiconductor 106b easily become n-type by generation of electrons serving as carriers and an increase of carrier density. Thus, a transistor including an oxide semiconductor film which contains nitrogen is likely to have normally-on characteristics. For this reason, nitrogen in the oxide semiconductor film is preferably reduced as much as possible; the concentration of nitrogen which is measured by SIMS is preferably set to be, for example, lower than or equal to $5 \times 10^{18}$ atoms/cm$^3$.

Note that an oxide semiconductor that can be used for the insulator 106a and the semiconductor 106b will be described in detail in Embodiment 3.

<Substrate, Insulator, Conductor>

Components other than the semiconductor of the transistor 10 will be described in detail below.

As the substrate 100, an insulator substrate, a semiconductor substrate, or a conductor substrate may be used, for example. As the insulator substrate, a glass substrate, a quartz substrate, a sapphire substrate, a stabilized zirconia substrate (e.g., an yttria-stabilized zirconia substrate), or a resin substrate is used, for example. As the semiconductor substrate, a single material semiconductor substrate formed using silicon, germanium, or the like or a semiconductor substrate formed using silicon carbide, silicon germanium, gallium arsenide, indium phosphide, zinc oxide, gallium oxide, or the like is used, for example. A semiconductor substrate in which an insulator region is provided in the above semiconductor substrate, e.g., a silicon on insulator (SOI) substrate or the like is used. As the conductor substrate, a graphite substrate, a metal substrate, an alloy substrate, a conductive resin substrate, or the like is used. A substrate including a metal nitride, a substrate including a metal oxide, or the like is used. An insulator substrate provided with a conductor or a semiconductor, a semiconductor substrate provided with a conductor or an insulator, a conductor substrate provided with a semiconductor or an insulator, or the like is used. Alternatively, any of these substrates over which an element is provided may be used. As the element provided over the substrate, a capacitor, a resistor, a switching element, a light-emitting element, a memory element, or the like is used.

Alternatively, a flexible substrate resistant to heat treatment performed in manufacture of the transistor may be used as the substrate 100. As a method for providing the transistor over a flexible substrate, there is a method in which the transistor is formed over a non-flexible substrate and then the transistor is separated and transferred to the substrate 100 which is a flexible substrate. In that case, a separation layer is preferably provided between the non-flexible substrate and the transistor. As the substrate 100, a sheet, a film, or a foil containing a fiber may be used. The substrate 100 may have elasticity. The substrate 100 may have a property of returning to its original shape when bending or pulling is stopped. Alternatively, the substrate 100 may have a property of not returning to its original shape. The thickness of the substrate 100 is, for example, greater than or equal to 5 μm and less than or equal to 700 μm, preferably greater than or equal to 10 μm and less than or equal to 500 μm, and further preferably greater than or equal to 15 μm and less than or equal to 300 μm. When the substrate 100 has a small thickness, the weight of the semiconductor device can be reduced. When the substrate 100 has a small thickness, even in the case of using glass or the like, the substrate 100 may have elasticity or a property of returning to its original shape when bending or pulling is stopped. Therefore, an impact applied to the semiconductor device over the substrate 100, which is caused by dropping or the like, can be reduced. That is, a durable semiconductor device can be provided.

For the substrate 100 which is a flexible substrate, metal, an alloy, resin, glass, or fiber thereof can be used, for example. The flexible substrate 100 preferably has a lower coefficient of linear expansion because deformation due to an environment is suppressed. The flexible substrate 100 is formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon or aramid), polyimide, polycarbonate, and acrylic. In particular, aramid is preferably used for the flexible substrate 100 because of its low coefficient of linear expansion.

As the insulator 101, an insulator having a function of blocking hydrogen or water is used. Hydrogen or water in the insulator provided near the insulator 106a and the semiconductor 106b is one of the factors of carrier generation in the insulator 106a and the semiconductor 106b containing an oxide semiconductor. Because of this, the reliability of the transistor 10 might be decreased. When a substrate provided with a silicon-based semiconductor element such as a switching element is used as the substrate 100, hydrogen might be used to terminate a dangling bond in the semiconductor element and then be diffused into the transistor 10. However, if such a structure includes the insulator 101 having a function of blocking hydrogen or water, diffusion of hydrogen or water from below the transistor 10 can be inhibited, leading to an improvement in the reliability of the transistor 10.

The insulator 101 preferably has a function of blocking oxygen. If oxygen diffused from the insulator 104 can be blocked by the insulator 101, oxygen can be effectively supplied from the insulator 104 to the insulator 106a and the semiconductor 106b.

The insulator 101 can be formed using, for example, aluminum oxide, aluminum oxynitride, gallium oxide, gallium oxynitride, yttrium oxide, yttrium oxynitride, hafnium oxide, or hafnium oxynitride. The use of such a material enables the insulator 101 to function as an insulating film blocking diffusion of oxygen, hydrogen, or water. The insulator 101 can be formed using, for example, silicon nitride or silicon nitride oxide. The use of such a material enables the insulator 101 to function as an insulating film blocking diffusion of hydrogen or water. Note that silicon nitride oxide means a substance that contains more nitrogen than oxygen and silicon oxynitride means a substance that contains more oxygen than nitrogen in this specification and the like.

The insulator 104 contains oxygen and preferably contains excess oxygen. Furthermore, the insulator 104 preferably transmits more oxygen than the insulator 101. Such insulator 104 makes it possible to supply oxygen from the insulator 104 to the insulator 106a and the semiconductor 106b. The supplied oxygen can reduce oxygen vacancies which are to be defects in the insulator 106a and the semiconductor 106b which are oxide semiconductors. Accordingly, the density of defect states in the insulator 106a and the semiconductor 106b can be reduced, whereby the semiconductor 106b can be an oxide semiconductor with stable characteristics.

In this specification and the like, excess oxygen refers to oxygen in excess of the stoichiometric composition, for example. Alternatively, excess oxygen refers to oxygen released from a film or layer containing oxygen by heating, for example. Excess oxygen can move inside a film or a layer. Excess oxygen moves between atoms in a film or a layer, or replaces oxygen that is a constituent of a film or a layer and moves like a billiard ball, for example.

The insulator 104 may be formed to have a single-layer structure or a stacked-layer structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 104 preferably includes, for example, silicon oxide or silicon oxynitride.

The insulator 104 containing excess oxygen preferably includes a region that releases oxygen molecules, the number of which is greater than or equal to $1.0\times10^{14}$ molecules/cm$^2$ and less than or equal to $1.0\times10^{16}$ molecules/cm$^2$ and preferably greater than or equal to $1.0\times10^{15}$ molecules/cm$^2$ and less than or equal to $5.0\times10^{15}$ molecules/cm$^2$ in thermal desorption spectroscopy (TDS) analysis in the range of a surface temperature of 100° C. to 700° C. or 100° C. to 500° C.

The method for measuring the amount of released oxygen using TDS analysis will be described below.

The total amount of gas released from a measurement sample in TDS analysis is proportional to the integral value of the ion intensity of the released gas. Then, comparison with a reference sample is made, whereby the total amount of released gas can be calculated.

For example, the number of oxygen molecules ($N_{O2}$) released from a measurement sample can be calculated according to the following formula using the TDS results of a silicon substrate containing hydrogen at a predetermined density, which is a reference sample, and the TDS results of the measurement sample. Here, all gases having a mass-to-charge ratio of 32 which are obtained in the TDS analysis are assumed to originate from an oxygen molecule. Note that $CH_3OH$, which is a gas having the mass-to-charge ratio of 32, is not taken into consideration because it is unlikely to be present. Furthermore, an oxygen molecule including an oxygen atom having a mass number of 17 or 18 which is an isotope of an oxygen atom is not taken into consideration either because the proportion of such a molecule in the natural world is negligible.

$$N_{O2}=N_{H2}/S_{H2}\times S_{O2}\times \alpha$$

The value $N_{H2}$ is obtained by conversion of the number of hydrogen molecules desorbed from the standard sample into densities. The value SH2 is the integral value of ion intensity when the standard sample is subjected to the TDS analysis. Here, the reference value of the standard sample is set to $N_{H2}/S_{H2}$. $S_{O2}$ is the integral value of ion intensity when the measurement sample is analyzed by TDS. The value α is a coefficient affecting the ion intensity in the TDS analysis. Refer to Japanese Published Patent Application No. H6-275697 for details of the above formula. The amount of released oxygen was measured with a thermal desorption spectroscopy apparatus produced by ESCO Ltd., EMD-WA1000S/W, using a silicon substrate containing a certain amount of hydrogen atoms as the reference sample.

Furthermore, in the TDS analysis, oxygen is partly detected as an oxygen atom. The ratio between oxygen molecules and oxygen atoms can be calculated from the ionization rate of the oxygen molecules. Note that since the above α includes the ionization rate of the oxygen molecules, the number of the released oxygen atoms can also be estimated through the measurement of the number of the released oxygen molecules.

Note that $N_{O2}$ is the number of the released oxygen molecules. The number of released oxygen in the case of being converted into oxygen atoms is twice the number of the released oxygen molecules.

Furthermore, the insulator 104 containing excess oxygen may contain a peroxide radical. Specifically, the spin density attributed to the peroxide radical is greater than or equal to $5\times 10^{17}$ spins/cm$^3$. Note that the insulator containing a peroxide radical may have an asymmetric signal with a g factor of approximately 2.01 in electron spin resonance (ESR).

The insulator 104 may have a function of preventing diffusion of impurities from the substrate 100. The insulator 104 may be an insulator that has a hydrogen trap.

As described above, the top surface or the bottom surface of the semiconductor 106b preferably has high planarity. Thus, to improve the planarity, the top surface of the insulator 104 may be subjected to planarization treatment performed by a chemical mechanical polishing (CMP) method or the like.

The conductors 108a and 108b function as a source electrode and a drain electrode of the transistor 10.

The conductors 108a and 108b may be formed to have a single-layer structure or a stacked-layer structure using a conductor containing, for example, one or more of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound of the above element may be used, for example, and a conductor containing aluminum, a conductor containing copper and titanium, a conductor containing copper and manganese, a conductor containing indium, tin, and oxygen, a conductor containing titanium and nitrogen, or the like may be used.

The conductors 109a and 109b are preferably formed using a substance with high Gibbs free energy for oxidation. Such conductors 109a and 109b can prevent oxygen extraction at the top surfaces of the conductors 108a and 108b from a film in contact with the conductors 108a and 108b. Accordingly, the conductors 108a and 108b can be prevented from being partly oxidized to have increased resistivity, and oxygen can be effectively supplied to the insulator 106a and the semiconductor 106b.

The conductor 109a and the conductor 109b may be formed to have a single-layer structure or a stacked-layer structure using a metal or an oxide containing at least one element selected from silver, copper, ruthenium, iridium, platinum, and gold, for example. Note that in the case where the conductor 109a and the conductor 109b are formed using an oxide, an oxide including ruthenium or iridium is preferably used because of its high conductivity. As examples of an oxide including ruthenium or iridium, $RuO_X$ (X is greater than or equal to 0.5 and less than or equal to 3), $IrO_X$ (X is greater than or equal to 0.5 and less than or equal to 3), and $SrRuO_X$ (X is greater than or equal to 1 and less than or equal to 5) can be given.

Alternatively, the conductor 109a and the conductor 109b may be formed to have a single-layer structure or a stacked-layer structure including conductive nitride such as titanium nitride, tungsten nitride, or tantalum nitride, for example. Such a conductor is less likely to transmit oxygen; thus, oxygen extraction at the top surfaces of the conductors 108a and 108b from a film in contact with the conductors 108a and 108b can be prevented. Accordingly, the conductor 108a and the conductor 108b can be prevented from being partly oxidized to have increased resistivity, and oxygen can be effectively supplied to the insulator 106a and the semiconductor 106b.

Although the conductor 109a and the conductor 109b are formed over the conductor 108a and the conductor 108b in FIG. 1B, the structure of the semiconductor device described in this embodiment is not limited to this example. For example, a structure not including the conductor 109a and the conductor 109b but including the conductor 108a and the conductor 108b or a structure not including the conductor 108a and the conductor 108b but including the conductor 109a and the conductor 109b may be employed. The conductor 109a and the conductor 109b may be provided under the conductor 108a and the conductor 108b.

In the case where the conductor 108a and the conductor 108b function as the source electrode and the drain electrode, an insulator that transmits less oxygen than the insulator 112a or 116 may be provided instead of the conductor 109a and the conductor 109b. For the insulator, an insulator that can be used for the insulator 112b described later can be used. With such a structure, the conductor 108a and the conductor 108b can be prevented from being partly oxidized to have increased resistivity, and oxygen can be effectively supplied to the insulator 106a and the semiconductor 106b.

The insulator 112a and the insulator 112b function as the gate insulating film of the transistor 10. The insulator 112a contains oxygen and preferably contains excess oxygen. Furthermore, the insulator 112a preferably transmits more oxygen than the insulator 112b. Such insulator 112a makes it possible to supply oxygen from the insulator 112a to the insulator 106a and the semiconductor 106b. The supplied oxygen can reduce oxygen vacancies which are to be defects in the insulator 106a and the semiconductor 106b containing an oxide semiconductor. Accordingly, the density of defect states in the insulator 106a and the semiconductor 106b can be reduced, whereby the semiconductor 106b can be an oxide semiconductor with stable characteristics.

The insulator 112a is preferably formed using an insulator containing oxygen and silicon, e.g., silicon oxide ($SiO_x$) or silicon oxynitride. The insulator 112a may be formed to have a single-layer structure or a stacked-layer structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum.

The insulator 112b transmits less oxygen than the insulator 112a, and preferably has a function of blocking oxygen. Owing to the insulator 112b, oxidation of the conductors 114a to 114c, or oxygen extraction from the insulator 112a by the conductors 114a to 114c can be prevented. Accordingly, oxygen can be effectively supplied from the insulator 112a to the insulator 106a and the semiconductor 106b.

The insulator 112b is preferably formed using an insulator containing oxygen and gallium, e.g., gallium oxide ($GaO_x$). For the insulator 112b, for example, an oxide or a nitride containing boron, aluminum, silicon, scandium, titanium, gallium, yttrium, zirconium, indium, lanthanum, cerium, neodymium, hafnium, or thallium may be used.

Alternatively, the insulator 112b can be formed using the above-described oxide that can be used for the insulator 106a.

The insulator 112b is preferably deposited by a sputtering method in an atmosphere containing oxygen, in which case oxygen can be added to the insulator 112a during the deposition of the insulator 112b, as in the case of the deposition of the insulator 118 described later where oxygen can be added to the insulator 116. In addition, the insulator 112b has a function of blocking oxygen; thus, oxygen added to the insulator 112a can be prevented from being diffused above and thus can be effectively supplied to the insulator 106a and the semiconductor 106b.

With the insulator 112b in addition to the insulator 112a, the gate-source distance and the gate-drain distance in regions overlapping with the overlap regions can be larger by the thickness of the insulator 112b. As a result, parasitic capacitance in the overlap regions can be reduced. The reduction in the parasitic capacitance enables the switching speed of the transistor to be improved; thus, a transistor with high frequency characteristics can be provided.

The conductors 114a to 114c function as the gate electrode of the transistor 10. For the conductors 114a and 114c, the conductor that can be used for the conductors 109a and 109b can be used. For the conductor 114b, the conductor that can be used for the conductors 108a and 108b can be used. With such a structure, oxygen extraction at the top and bottom surfaces of the conductor 114b from a film in contact with the conductor 114b can be prevented. Accordingly, the conductor 114b can be prevented from being partly oxidized to have increased resistivity, and oxygen can be effectively supplied to the insulator 106a and the semiconductor 106b.

Here, as illustrated in FIG. 1B, the semiconductor 106b can be electrically surrounded by an electric field of the conductors 114a to 114c (a structure in which a semiconductor is electrically surrounded by an electric field of a conductor is referred to as a surrounded channel (s-channel) structure). Thus, a channel is formed in the entire semiconductor 106b in some cases. In the s-channel structure, a large amount of current can flow between a source and a drain of the transistor, so that a high on-state current can be obtained.

In the case where the transistor has the s-channel structure, a channel is formed also in the side surface of the semiconductor 106b. Thus, as the semiconductor 106b has a larger thickness, the channel region becomes larger. In other words, the thicker the semiconductor 106b is, the larger the on-state current of the transistor is. In addition, when the semiconductor 106b is thicker, the proportion of the region with a high carrier controllability increases, leading to a smaller subthreshold swing value. For example, the semiconductor 106b has a region with a thickness greater than or equal to 10 nm, preferably greater than or equal to 20 nm, further preferably greater than or equal to 40 nm, and still further preferably greater than or equal to 60 nm. Since the productivity of the semiconductor device might be decreased, the semiconductor 106b has a region with a thickness of, for example, less than or equal to 300 nm, preferably less than or equal to 200 nm, and further preferably less than or equal to 150 nm. In some cases, when the channel formation region is reduced in size, electrical characteristics of the transistor with a smaller thickness of the semiconductor 106b may be improved. Thus, the semiconductor 106b may have a thickness less than 10 nm.

The s-channel structure is suitable for a miniaturized transistor because a high on-state current can be obtained. A semiconductor device including the miniaturized transistor can have a high integration degree and high density. For example, the transistor includes a region having a channel length of preferably less than or equal to 40 nm, further preferably less than or equal to 30 nm, and still further preferably less than or equal to 20 nm and a region having a channel width of preferably less than or equal to 40 nm, further preferably less than or equal to 30 nm, and still further preferably less than or equal to 20 nm.

The insulator 116 and the insulator 118 function as the protective insulating film of the transistor 10. The insulator 116 contains oxygen and preferably contains excess oxygen. Furthermore, the insulator 116 preferably transmits more oxygen than the insulator 118. Such insulator 116 makes it possible to supply oxygen from the insulator 116 to the insulator 106a and the semiconductor 106b. The supplied oxygen can reduce oxygen vacancies which are to be defects in the insulator 106a and the semiconductor 106b containing an oxide semiconductor. Accordingly, the density of defect states in the insulator 106a and the semiconductor 106b can be reduced, whereby the semiconductor 106b can be an oxide semiconductor with stable characteristics.

The insulator 116 is preferably formed using an insulator containing oxygen and silicon, e.g., silicon oxide ($SiO_x$) or silicon oxynitride. The insulator 116 may be formed to have a single-layer structure or a stacked-layer structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum.

The insulator 116 containing excess oxygen preferably includes a region that releases oxygen molecules, the number of which is greater than or equal to $1.0 \times 10^{14}$ molecules/$cm^2$ and less than or equal to $1.0 \times 10^{16}$ molecules/$cm^2$ and preferably greater than or equal to $1.0 \times 10^{15}$ molecules/$cm^2$ and less than or equal to $5.0 \times 10^{15}$ molecules/$cm^2$ in TDS analysis in the range of a surface temperature of 100° C. to 700° C. or 100° C. to 500° C.

Furthermore, the insulator 116 containing excess oxygen may contain a peroxide radical. Specifically, the spin density attributed to the peroxide radical is greater than or equal to $5 \times 10^{17}$ spins/$cm^3$. Note that the insulator containing a peroxide radical may have an asymmetric signal with a g factor of approximately 2.01 in electron spin resonance (ESR).

The insulator 118 transmits less oxygen than the insulator 116, and preferably has a function of blocking oxygen. Owing to the insulator 118, oxygen can be prevented from being externally released to above the insulator 116 at the time of supply of oxygen from the insulator 116 to the insulator 106a and the semiconductor 106b. Accordingly, oxygen can be effectively supplied from the insulator 116 to the insulator 106a and the semiconductor 106b. The thickness of the insulator 118 can be greater than or equal to 5 nm, or greater than or equal to 20 nm, for example. Although details are described later, the insulator 118 is preferably deposited by a sputtering method in an atmosphere containing oxygen.

The insulator 118 is preferably formed using an insulator containing oxygen and aluminum, e.g., aluminum oxide ($AlO_x$). Aluminum oxide is suitable for the insulator 118 because it is highly effective in preventing transmission of both oxygen and impurities such as hydrogen and moisture.

The insulator 118 may be formed to have a single-layer structure or a stacked-layer structure including an insulator containing, for example, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 118 preferably has a blocking effect against oxygen, hydrogen, water, alkali metal, alkaline earth metal, and the like. As such an insulator, for example, a nitride insulating film can be used. As examples of the nitride insulating film, a silicon nitride film, a silicon nitride oxide film, an aluminum nitride film, an aluminum nitride oxide film, and the like can be given. Note that instead of the nitride insulating film, an oxide insulating film having a blocking effect against oxygen, hydrogen, water, and the like, may be provided. As examples of the oxide insulating film, an aluminum oxide film, an aluminum oxynitride film, a gallium oxide film, a gallium oxynitride film, an yttrium oxide film, an yttrium oxynitride film, a hafnium oxide film, a hafnium oxynitride film, and the like can be given.

The insulator 118 functions as at least a film that transmits less oxygen than the insulator 116, and the above-described oxide that can be used for the insulator 106a can also be used for the insulator 118. The insulator 118 is preferably formed using an oxide insulator containing In, such as an In—Al oxide, an In—Ga oxide, or an In—Ga—Zn oxide. An oxide insulator containing In is suitable for the insulator 118 because the number of particles generated at the time of the deposition by a sputtering method is small.

Here, the process in which oxygen is supplied to the insulator 106a and the semiconductor 106b through the insulator 116 will be described with reference to FIGS. 1A to 1C and enlarged views of and around the interface between the insulator 116 and the insulator 118 in FIGS. 2A and 2B. Note that in the following description, $SiO_x$ is given as a typical example of the insulator 116 (which is sometimes referred to as the insulator 116 ($SiO_x$)), and $AlO_x$ is given as a typical example of the insulator 118 (which is sometimes referred to as the insulator 118 ($AlO_x$)).

Figure 2A:
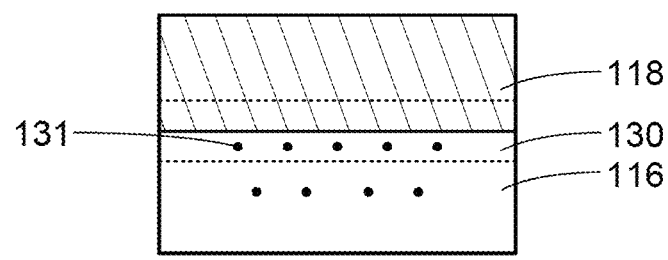
FIGS. 2A and 2B are cross-sectional views illustrating a transistor of one embodiment of the present invention.

First, the insulator 118 ($AlO_x$) is deposited over the insulator 116 ($SiO_x$) (see FIG. 2A). Here, the insulator 118 ($AlO_x$) is preferably deposited by a sputtering method, particularly by a sputtering method in an atmosphere containing oxygen. When the insulator 118 ($AlO_x$) is deposited by a sputtering method, oxygen 131 is added to a surface of the insulator 116 ($SiO_x$) (interface between the insulator 116 ($SiO_x$) and the insulator 118 ($AlO_x$), after the deposition of the insulator 118 ($AlO_x$)) and the vicinity thereof during the deposition. Although the oxygen 131 is added to the insulator 116 ($SiO_x$) as an oxygen radical here, for example, the state of the oxygen 131 at the time of being added is not limited thereto. The oxygen 131 may be added to the insulator 116 ($SiO_x$) as an oxygen atom, an oxygen ion, or the like. Note that by addition of the oxygen 131, oxygen in excess of the stoichiometric composition is contained in the insulator 116 ($SiO_x$) in some cases, and the oxygen 131 in such a case can be called excess oxygen.

Bias application on the substrate over which the transistor 10 is fabricated enables the oxygen 131 to be effectively added as an oxygen ion to the insulator 116 ($SiO_x$) in some cases.

A mixed region 130 might be formed in a region where the insulator 116 ($SiO_x$) is in contact with the insulator 118 ($AlO_x$). The mixed region 130 contains both a component of the insulator 116 ($SiO_x$) and a component of the insulator 118 ($AlO_x$), and can be represented by $AlSi_xO_y$ as a typical example. Since the mixed region 130 is formed in a region in the vicinity of the interface between the insulator 116 ($SiO_x$) and the insulator 118 ($AlO_x$), the concentration of the oxygen 131 is higher in the mixed region 130 than in a layer below the mixed region 130.

Figure 2B:
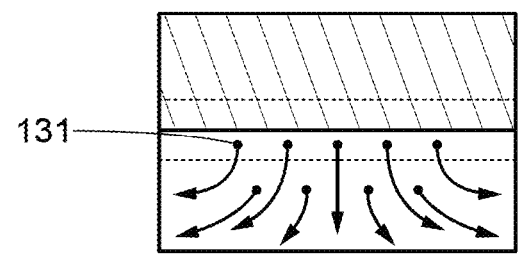

Then, heat treatment is performed so that the oxygen 131 is diffused in the insulator 116 ($SiO_x$) (see FIG. 2B). At least during the heat treatment, $SiO_x$ has a sufficiently large interatomic distance in terms of the diffusion of the oxygen 131 and can be regarded as being porous for the oxygen 131. For this reason, the oxygen 131 can be diffused very easily by the heat treatment performed on the insulator 116 ($SiO_x$). The heat treatment may be performed at a temperature higher than or equal to 250° C. and lower than or equal to 650° C. and preferably higher than or equal to 350° C. and lower than or equal to 450° C., for example. The oxygen 131 can be thus diffused in the insulator 116 ($SiO_x$), mainly in the mixed region 130, with a high concentration of the oxygen 131.

Here, the insulator 118 ($AlO_x$) is an insulator that transmits less oxygen than the insulator 116 ($SiO_x$) and functions as a barrier film that blocks oxygen. Owing to the insulator 118 ($AlO_x$) formed over the insulator 116 ($SiO_x$), the oxygen 131 diffused in the insulator 116 ($SiO_x$) is not diffused above the insulator 116 ($SiO_x$) but is diffused in the insulator 116 ($SiO_x$) mainly in the lateral direction or the downward direction.

The oxygen 131 diffused in the insulator 116 ($SiO_x$) is supplied to the semiconductor 106b through the insulator 112a (see FIGS. 1B and 1C). The insulator 112b and the conductor 114a having functions of blocking oxygen are provided between the conductor 114b and the insulator 112a, thereby preventing the oxygen 131 diffused in the insulator 112a from being extracted by the conductor 114b. Furthermore, the conductor 114c having a function of blocking oxygen is provided between the conductor 114b and the insulator 116, thereby preventing the oxygen 131 diffused in the insulator 116 from being extracted by the conductor 114b. Similarly, the conductors 109a and 109b having functions of blocking oxygen are provided between the conductors 108a and 108b and the insulators 116 ($SiO_x$) and 112a, thereby preventing the oxygen 131 from being extracted by the conductors 108a and 108b.

The oxygen 131 diffused in the insulator 116 ($SiO_x$) is supplied to the insulator 106a through the insulator 104 (see FIGS. 1B and 1C). The insulator 101 having a function of blocking oxygen is provided below the insulator 104, thereby preventing the oxygen 131 diffused in the insulator 104 from being diffused below the insulator 104.

Since the conductor 114b, the conductor 108a, and the conductor 108b do not inhibit the diffusion of the oxygen 131 into the insulator 106a and the semiconductor 106b as described above, the oxygen 131 can be effectively supplied to the insulator 106a and the semiconductor 106b, especially to a channel formation region in the semiconductor 106b.

Moreover, since the diffusion of the oxygen 131 below the insulator 104 is prevented, the oxygen 131 can be supplied even more effectively.

Hereinafter, the behavior of oxygen movement in InGaZnO$_4$, which is a typical example of an oxide semiconductor, will be described.

<1. Oxygen in InGaZnO$_4$>

First, to investigate the condition of excess oxygen in InGaZnO$_4$, calculation was performed on a model in which oxygen is added to InGaZnO$_4$. The details of the calculation are described below.

A first principle electronic state calculation package, Vienna Ab initio Simulation Package (VASP), was used for the atomic relaxation calculation. The calculation conditions are listed in Table 1.

TABLE 1

| Software | VASP |
| --- | --- |
| Calculation model | InGaZnO$_4$ crystal (112 atoms) + O atom |
| Calculation | Atomic relaxation |
| Functional | GGA/PBE |
| pseudopotential | PAW |
| Cut-off energy | 500 eV |
| K-points | 2 × 2 × 3 |

Figure 21A:
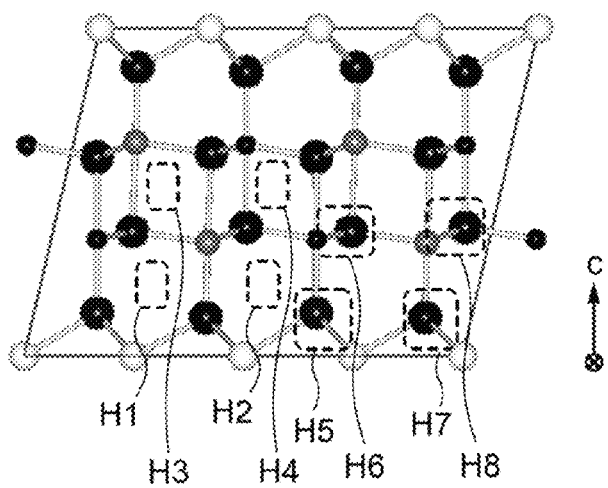
FIGS. 21A to 21C each illustrate a calculation model of $InGaZnO_4$.
Figure 21B:
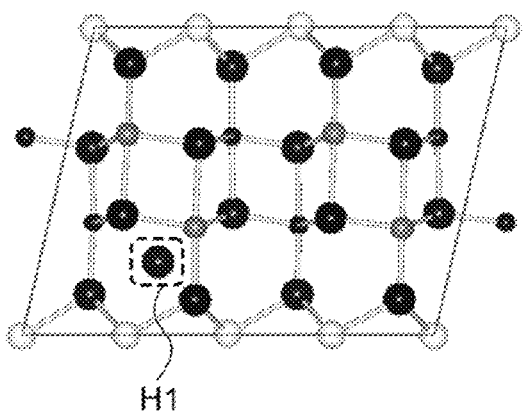
Figure 21C:
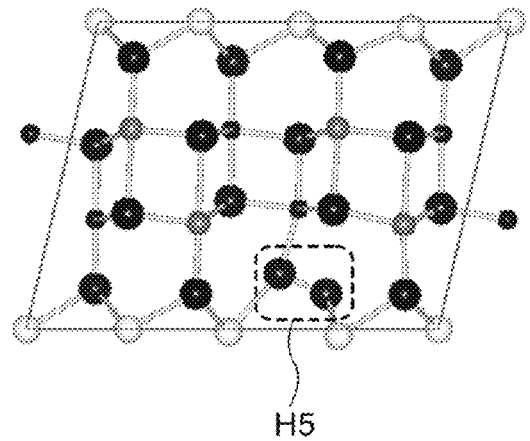

The atomic relaxation calculation was performed using an InGaZnO$_4$ crystal model (112 atoms) to which one oxygen atom (O atom) is added. FIGS. 21A to 21C each illustrate the calculation model. Positions H1 to H8 in FIG. 21A each indicate the initial position of the oxygen atom. Note that the charge of the whole model was neutral.

The positions H1 to H4 are between lattices. FIG. 21B illustrates the case where an oxygen atom is placed at the position H1 in FIG. 21A, for example.

The positions H5 to H8 are at O sites. FIG. 21C illustrates the case where an oxygen atom is placed at the position H5 in FIG. 21A, for example. Note that the placement of two oxygen atoms at an O site as in the position H5 in FIG. 21C is called split placement.

In the charge neutral state, oxygen atoms placed at the positions H5 to H8 were more stable than oxygen atoms placed at the positions H1 to H4. This means that the split placement where two oxygen atoms were placed at an O site was more stable than the state where an oxygen atom was placed between lattices.

Next, movement frequency Γ of an oxygen atom in InGaZnO$_4$ will be described.

<2. Oxygen Atom in InGaZnO$_4$>
<2-(1) Movement of Oxygen Atom>

Here, the mobility of an oxygen atom in an InGaZnO$_4$ crystal was measured in terms of an activation barrier along an oxygen movement path.

Figure 22A:
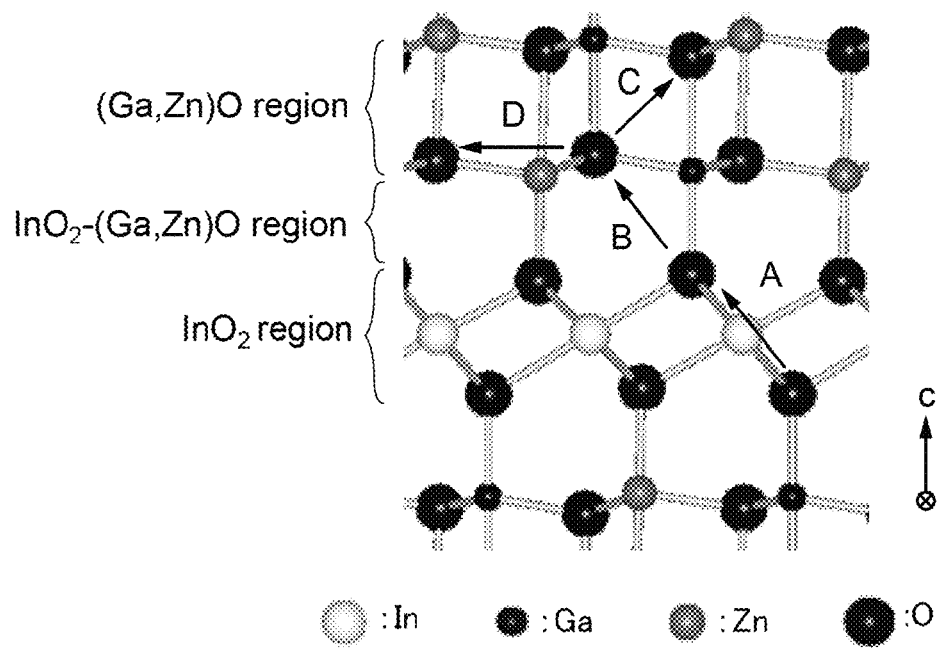
FIGS. 22A and 22B illustrate oxygen movement paths in $InGaZnO_4$.
Figure 22B:
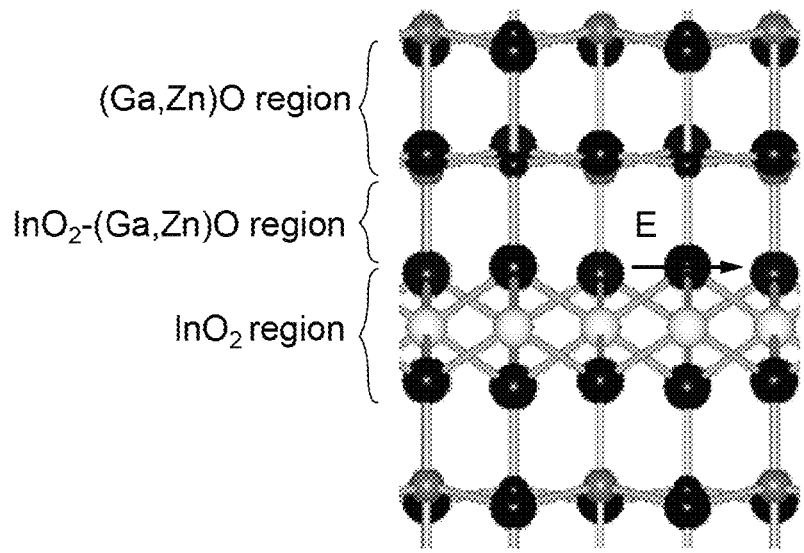

FIGS. 22A and 22B are schematic diagrams showing regions in a single crystal InGaZnO$_4$ (c-InGaZnO$_4$), in which oxygen movement paths were analyzed. Note that FIG. 22B is a schematic diagram obtained by rotating the schematic diagram in FIG. 22A around the c-axis by 90°. Here, movement of an oxygen atom through a movement path A in an InO$_2$ region, a movement path B in an InO$_2$—(Ga, Zn)O region, and a movement path C and a movement path D in a (Ga, Zn)O region shown in FIG. 22A and a movement path E in the InO$_2$ region shown in FIG. 22B was analyzed.

The activation barrier was measured by a first principle electronic state calculation package VASP, and the nudged elastic band (NEB) method for finding a chemical reaction path was used for the atomic relaxation calculation. The NEB method is a technique for determining the minimum energy path between given initial and final states.

Figure 23A:
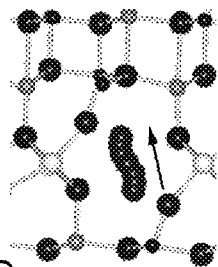
FIGS. 23A to 23J show oxygen movement paths in $InGaZnO_4$ and energy changes in the movement paths.
Figure 23B:
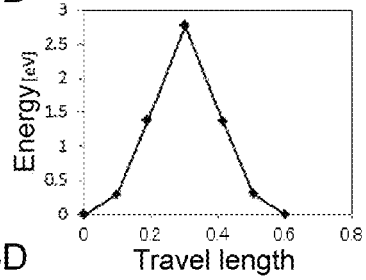

FIG. 23A and FIG. 23B show a schematic diagram showing the behavior of an oxygen atom and a calculation result, respectively, in the movement path A. FIG. 23A is a schematic diagram showing the movement path A of oxygen in the InO$_2$ region. FIG. 23B shows the energy change in the movement path A. Note that the energy of the most stable structure on the movement path was set 0.

Figure 23C:
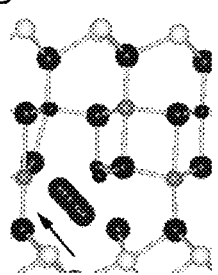
Figure 23D:
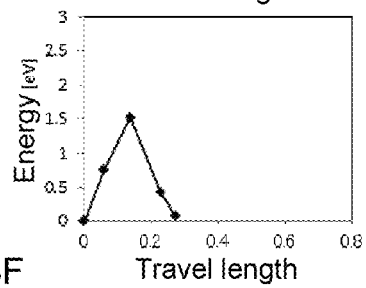

FIG. 23C and FIG. 23D show a schematic diagram showing the behavior of an oxygen atom and a calculation result, respectively, in the movement path B. FIG. 23C shows the movement path B of oxygen in the InO$_2$—(Ga, Zn)O region. FIG. 23D shows the energy change in the movement path B. Note that the energy of the most stable structure on the movement path was set 0.

Figure 23E:
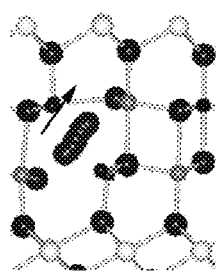
Figure 23F:
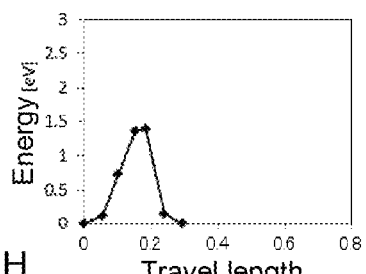

FIG. 23E and FIG. 23F show a schematic diagram showing the behavior of an oxygen atom and a calculation result, respectively, in the movement path C. FIG. 23E shows the movement path C in the (Ga, Zn)O region. FIG. 23F shows the energy change in the movement path C. Note that the energy of the most stable structure on the movement path was set 0.

Figure 23G:
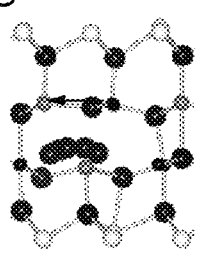
Figure 23H:
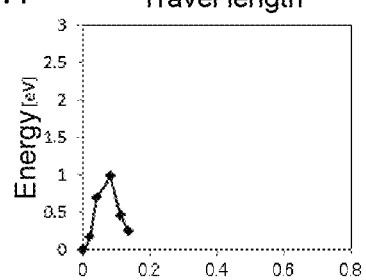

FIG. 23G and FIG. 23H show a schematic diagram showing diagonal movement and a calculation result, respectively, in the movement path D. FIG. 23G shows the movement path D of oxygen in the (Ga, Zn)O region. FIG. 23H shows the energy change in the movement path D. Note that the energy of the most stable structure on the movement path was set 0.

Figure 23I:
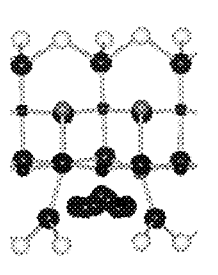
Figure 23J:
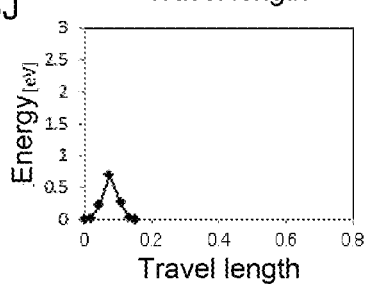

FIG. 23I and FIG. 23J show a schematic diagram showing diagonal movement and a calculation result, respectively, in the movement path E. FIG. 23I shows the movement path E in the (Ga, Zn)O region. FIG. 23J shows the energy change in the movement path E. Note that the energy of the most stable structure on the movement path was set 0.

Table 2 lists the above calculation results of the activation barriers.

TABLE 2

| Transfer path | Activation barrier (eV) |
| --- | --- |
| A | 1.85 |
| B | 0.98 |
| C | 0.69 |
| D | 1.52 |
| E | 1.39 |

Then, the movement frequencies (Γ) at room temperature, 250° C., and 350° C. were calculated with the use of the calculated activation barriers and Formula 1 below.

[Formula 1]

Note that $E_a$, $k_B$, T, and $\Gamma_0$ represent the activation barrier, the Boltzmann constant, the absolute temperature, and the frequency factor, respectively. The frequency factor $\Gamma_0$ was assumed to be $1.0 \times 10^{13}$ s$^{-1}$.

The movement frequency (Γ) calculated here is the number of times the movement occurs in one second. Accordingly, the travel length increases as the value of the movement frequency (Γ) becomes larger. Note that an oxygen atom moves approximately 0.2 nm at one time.

Table 3 lists the calculation result of the movement frequency at room temperature in the case of each movement path. The highest movement frequency (Γ) was 3.27× 10 times/sec, in the case of the movement path C. The lowest movement frequency (Γ) was 9.28×10$^{-19}$ times/sec, in the case of the movement path A.

TABLE 3

| Transfer path | Transfer frequency [times/sec] |
| --- | --- |
| A | $9.28 \times 10^{-19}$ |
| B | $3.14 \times 10^{-4}$ |
| C | $3.27 \times 10$ |
| D | $2.05 \times 10^{-13}$ |
| E | $4.84 \times 10^{-11}$ |

Table 4 lists the result of the movement frequency at 250° C. in the case of each movement path. The highest movement frequency (Γ) was $2.14 \times 10^6$ times/sec, in the case of the movement path C. The lowest movement frequency (Γ) was $1.58 \times 10^{-19}$ times/sec, in the case of the movement path A.

TABLE 4

| Transfer path | Transfer frequency [times/sec] |
| --- | --- |
| A | $1.58 \times 10^{-19}$ |
| B | $3.43 \times 10^{3}$ |
| C | $2.14 \times 10^{6}$ |
| D | $2.06 \times 10^{-2}$ |
| E | $4.23 \times 10^{-1}$ |

Table 5 lists the result of the movement frequency at 350° C. in the case of each movement path. The highest movement frequency (Γ) was $2.52 \times 10^7$ times/sec, in the case of the movement path C. The lowest movement frequency (Γ) was $1.14 \times 10^{-2}$ times/sec, in the case of the movement path A.

TABLE 5

| Transfer path | Transfer frequency [times/sec] |
| --- | --- |
| A | $1.14 \times 10^{-2}$ |
| B | $1.13 \times 10^{5}$ |
| C | $2.52 \times 10^{7}$ |
| D | $4.70 \times 10^{0}$ |
| E | $5.92 \times 10^{1}$ |

Tables 3 to 5 indicate that the activation barriers in the case of the movement through the movement path A, the movement path D, and the movement path E are higher than the activation barriers in the case of the movement through the movement path B and the movement path C. The results indicate that the movement speed of an oxygen atom through the movement path C in the (Ga, Zn)O region is high as compared to the other movement paths. The results also indicate that an oxygen atom is likely to move also through the movement path B in the $InO_2$—(Ga, Zn)O region because the activation barrier in the case of the movement path B is relatively lower than the activation barriers in the case of the movement paths A, D, and E. Meanwhile, the movement frequency in the $InO_2$ region (in the c-axis direction) is likely to be low because of the high activation barrier. Accordingly, an oxygen atom moves in a region between $InO_2$ regions in a zigzag manner in the $InGaZnO_4$ crystal.

The above calculation results show that oxygen in an $InGaZnO_4$ oxide semiconductor layer is likely to move in the direction parallel to the layer. This suggests that, as illustrated in FIG. 1C for example, oxygen easily enters the insulator 106a and the semiconductor 106b from their side surfaces and is easily diffused in the direction parallel to the layers. It is also suggested that the oxygen that has entered the insulator 106a and the semiconductor 106b is unlikely to be released from the top and bottom surfaces of the layers.

In this manner, the oxygen 131 is supplied to the insulator 106a and the semiconductor 106b illustrated in FIGS. 1A to 1C, whereby oxygen vacancies can be filled with the oxygen 131 to be reduced. Owing to a reduction of oxygen vacancies, hydrogen trapping by oxygen vacancies can be reduced; thus, it is possible to reduce formation of a shallow donor level in the semiconductor 106b. Accordingly, a highly purified intrinsic or substantially highly purified intrinsic oxide semiconductor with a low density of defect states can be obtained.

Note that the diffusion length of oxygen in silicon oxide that is subjected to heat treatment at 400° C. for one hour is estimated to be approximately 3 μm. Thus, the distance between the mixed region 130 and the insulator 106a or the semiconductor 106b is preferably less than or equal to 3 μm, and further preferably less than or equal to 1 μm.

With such a structure, a transistor with stable electrical characteristics, a transistor with high frequency characteristics, a transistor having a high on-state current, a transistor with normally-off electrical characteristics, a transistor with a small subthreshold swing value, or a highly reliable transistor can be provided.

<Modification Example of Transistor>

Modification examples of the transistor 10 will be described below with reference to FIGS. 3A to 3D, FIGS. 4A to 4D, FIGS. 5A and 5B, FIGS. 6A to 6C, FIGS. 7A to 7D, and FIGS. 8A to 8C. FIG. 3A, FIG. 3C, FIG. 4A, FIG. 4C, FIG. 7A, and FIG. 7C are cross-sectional views in the channel length direction like FIG. 1B. FIG. 3B, FIG. 3D, FIG. 4B, FIG. 4D, FIG. 7B, and FIG. 7D are cross-sectional views in the channel width direction like FIG. 1C. Note that the components in the following modification examples of the transistor 10 can be combined with each other as appropriate.

Figure 3A:
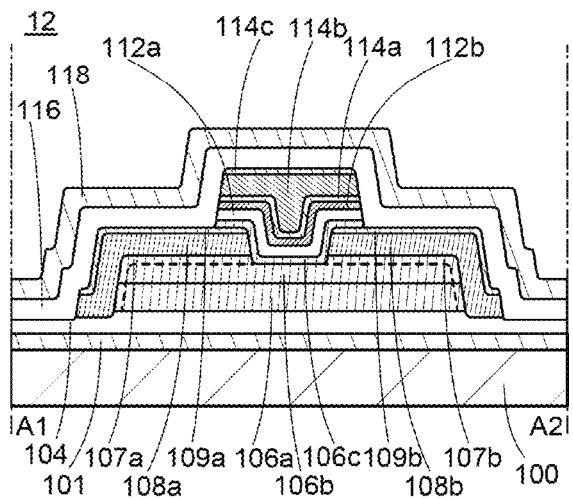
FIGS. 3A to 3D are cross-sectional views illustrating transistors of embodiments of the present invention.
Figure 3B:
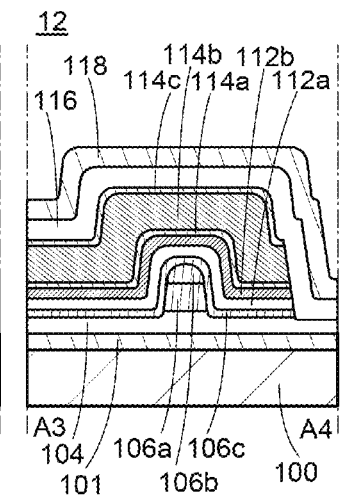

A transistor 12 illustrated in FIGS. 3A and 3B is different from the transistor 10 in that an insulator 106c is formed over the conductor 109a and the conductor 109b and in contact with at least part of the top surface of the semiconductor 106b. The transistor 12 has a structure in which the insulator 106a, the semiconductor 106b, and the insulator 106c are stacked. The insulator 112a is over the insulator 106c. The insulator 106c can be formed using a substance similar to that of the insulator 106a. That is, similarly to the insulator 106a, the insulator 106c is formed using a substance that can function as a conductor, a semiconductor, or an insulator when it is used alone. However, when the transistor is formed using a stack including the insulator 106a, the semiconductor 106b, and the insulator 106c, electrons flow in the semiconductor 106b, at and in the vicinity of the interface between the semiconductor 106b and the insulator 106a, and at and in the vicinity of the interface between the semiconductor 106b and the insulator 106c; thus, the insulator 106c has a region not functioning as a channel of the transistor. For that reason, in this specification and the like, the insulator 106c is not referred to as a semiconductor but an insulator. Note that the reason why the insulator 106c is referred to as an insulator is because it is closer to an insulator than the semiconductor 106b is in terms of its function in the transistor; thus, a substance that can be used for the semiconductor 106b is used for the insulator 106c in some cases.

The insulator 106c may be formed using an indium gallium oxide. An indium gallium oxide has low electron affinity and a high oxygen-blocking property. The fraction of gallium atoms [Ga/(In+Ga)] is, for example, higher than or equal to 70%, preferably higher than or equal to 80%, and further preferably higher than or equal to 90%.

The use of such a metal oxide with a small indium content for the insulator 106c can reduce indium diffusion from the insulator 106c into the insulator 112a functioning as a gate insulating film of the transistor 12. Indium diffusion in the insulator 112a or at the interface between the insulator 112a and the insulator 106c might cause an increase in leakage current of the transistor. However, the use of an oxide semiconductor with a small indium content for the insulator 106c can reduce indium in the insulator 112a or at the interface between the insulator 112a and the insulator 106c, in which case an increase in the leakage current can be inhibited. Owing to such a structure, the semiconductor 106b can contain a large amount of indium so that the on-state current is increased, while an increase in the leakage current is inhibited.

The thickness of the insulator 106c is preferably as small as possible to increase the on-state current of the transistor 12. The insulator 106c is preferably thinner than the insulator 106a. For example, the insulator 106c is formed to include a region having a thickness of less than 10 nm, preferably less than or equal to 5 nm, further preferably less than or equal to 3 nm. At the same time, the insulator 106c preferably has a function of blocking entry of elements other than oxygen (such as hydrogen and silicon) included in the adjacent insulator into the semiconductor 106b where a channel is formed. For this reason, it is preferable that the insulator 106c have a certain thickness. For example, the insulator 106c is formed to include a region having a thickness of greater than or equal to 0.3 nm, preferably greater than or equal to 1 nm, further preferably greater than or equal to 2 nm.

To improve reliability, the insulator 106a is preferably thick and the insulator 106c is preferably thin. For example, the insulator 106a includes a region with a thickness of, for example, greater than or equal to 10 nm, preferably greater than or equal to 20 nm, further preferably greater than or equal to 40 nm, still further preferably greater than or equal to 60 nm. When the thickness of the insulator 106a is made large, a distance from the interface between the adjacent insulator and the insulator 106a to the semiconductor 106b in which a channel is formed can be large. Since the productivity of the semiconductor device might be decreased, the insulator 106a has a region with a thickness of, for example, less than or equal to 200 nm, preferably less than or equal to 120 nm, further preferably less than or equal to 80 nm.

The energy gap of the insulator 106a is larger than that of the semiconductor 106b. Furthermore, the energy gap of the insulator 106c is larger than that of the semiconductor 106b.

As the semiconductor 106b, an oxide having an electron affinity larger than those of the insulators 106a and 106c is used. For example, as the semiconductor 106b, an oxide having an electron affinity larger than those of the insulators 106a and 106c by 0.07 eV or higher and 1.3 eV or lower, preferably 0.1 eV or higher and 0.7 eV or lower, and further preferably 0.15 eV or higher and 0.4 eV or lower is used. Note that the electron affinity refers to an energy difference between the vacuum level and the conduction band minimum. In that case, the conduction band minimum of the insulator 106a is closer to the vacuum level than that of the semiconductor 106b is, and the conduction band minimum of the insulator 106c is closer to the vacuum level than that of the semiconductor 106b is.

In such a case, gate voltage application results in channel formation not in the insulators 106a and 106c but in the semiconductor 106b having a high electron affinity.

In some cases, there are a mixed region of the insulator 106a and the semiconductor 106b between the insulator 106a and the semiconductor 106b and a mixed region of the semiconductor 106b and the insulator 106c between the semiconductor 106b and the insulator 106c. The mixed regions each have a low density of defect states. For that reason, the stack including the insulator 106a, the semiconductor 106b, and the insulator 106c has a band structure with a continuous junction at each interface and in the vicinity of the interface. Note that the boundaries of the insulator 106a, the semiconductor 106b, and the insulator 106c are not clear in some cases.

At this time, electrons move mainly in the semiconductor 106b, not in the insulator 106a and the insulator 106c. As described above, when the density of defect states at the interface between the insulator 106a and the semiconductor 106b and the density of defect states at the interface between the semiconductor 106b and the insulator 106c are decreased, electron movement in the semiconductor 106b is less likely to be inhibited and the on-state current of the transistor can be increased.

In the case where the conductor 114a is less likely to transmit oxygen, for example, the insulator 112b is not necessarily provided.

Figure 3C:
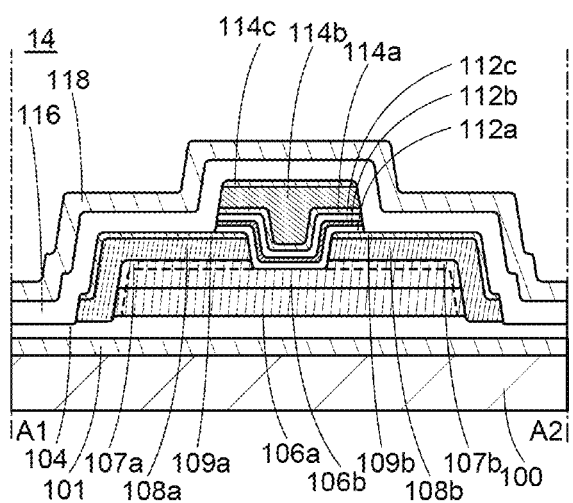
Figure 3D:
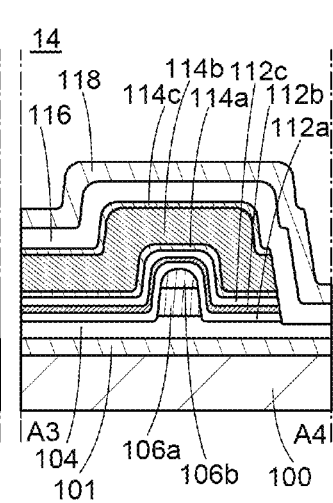

A transistor 14 illustrated in FIGS. 3C and 3D is different from the transistor 10 in that an insulator 112c is formed over the insulator 112b. In the transistor 14, the insulators 112a to 112c function as a gate insulating film. The insulator 112c can be formed using an insulator similar to the insulator 112a.

With the use of the insulators 112a to 112c as the gate insulating film, oxygen can be effectively supplied from the insulator 112a to the insulator 106a and the semiconductor 106b as described above. Furthermore, since the insulator 112c is in contact with the conductor 114a, the gate insulating film can have a sufficiently wider energy gap than a gate electrode. Accordingly, the gate insulating film can have a sufficient insulating property.

The insulator 112b of the insulators 112a to 112c preferably includes an electron trap region. The electron trap region has a function of trapping electrons. When the insulator 112a and the insulator 112c each have a function of inhibiting release of electrons, electrons trapped in the insulator 112b behave as if they are negative fixed charges. Thus, the insulator 112b functions as a floating gate. The floating gate can prevent the transistor 14 from being in an on state when low voltage (e.g., 0 V or lower) is applied to the gate electrode (conductors 114a to 114c) of the transistor 14. Thus, the electrical characteristics of the transistor 14 can be easily made normally-off characteristics.

Figure 4A:
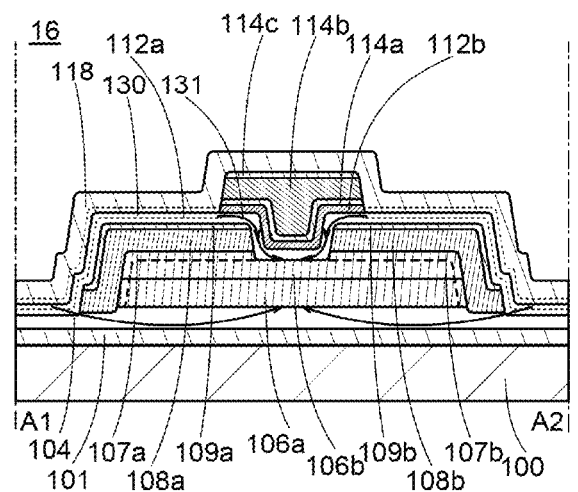
FIGS. 4A to 4D are cross-sectional views illustrating transistors of embodiments of the present invention.
Figure 4B:
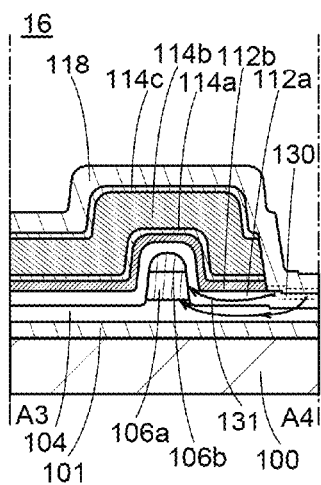

A transistor 16 illustrated in FIGS. 4A and 4B is different from the transistor 10 in that an end portion of the insulator 112a is not aligned with end portions of the conductors 114a to 114c and the insulator 112b. In the transistor 16, the insulator 112a is provided to partly cover the conductors 109a and 109b and is preferably in contact with at least part of the insulator 104. The insulator 118 is preferably formed on the insulator 112a except for a region overlapping with the conductors 114a to 114c. With such an insulator 112a, the insulator 116 is not necessarily provided because the insulator 112a has a function of the insulator 116. In that case, the insulator 112a is preferably formed using the insulator similar to the insulator 116.

In the transistor 16, unlike in the transistor 10, the oxygen 131 is added to a surface of the insulator 112*a* (interface between the insulator 112*a* and the insulator 118, after the deposition of the insulator 118) and the vicinity thereof. The mixed region 130 might be formed in a region where the insulator 112*a* is in contact with the insulator 118.

As in the case of the insulator 116, the oxygen 131 can be diffused in the insulator 112*a* by heat treatment. The oxygen 131 diffused in the insulator 112*a* is supplied to the semiconductor 106*b*. The insulator 112*b* and the conductor 114*a* having functions of blocking oxygen are provided between the conductor 114*b* and the insulator 112*a*, thereby preventing the oxygen 131 diffused in the insulator 112*a* from being extracted by the conductor 114*b*. Similarly, the conductors 109*a* and 109*b* having functions of blocking oxygen are provided between the insulator 112*a* and the conductors 108*a* and 108*b*, thereby preventing the oxygen 131 from being extracted by the conductors 108*a* and 108*b*.

The oxygen 131 diffused in the insulator 112*a* is supplied to the insulator 106*a* through the insulator 104. The insulator 101 having a function of blocking oxygen is provided below the insulator 104, thereby preventing the oxygen 131 diffused in the insulator 104 from being diffused below the insulator 104.

Since the conductor 114*b*, the conductor 108*a*, and the conductor 108*b* do not inhibit the diffusion of the oxygen 131 as described above, the oxygen 131 can be effectively supplied to the insulator 106*a* and the semiconductor 106*b*, especially to a channel formation region in the semiconductor 106*b*. Oxygen is supplied to the insulator 106*a* and the semiconductor 106*b* to reduce oxygen vacancies in this manner, whereby a highly purified intrinsic or substantially highly purified intrinsic oxide semiconductor with a low density of defect states can be obtained.

Figure 4C:
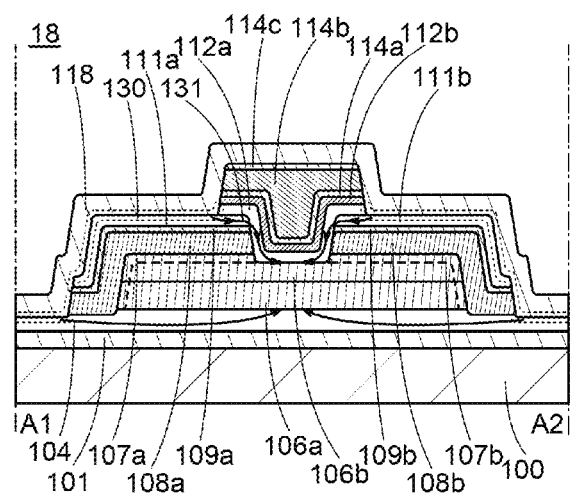
Figure 4D:
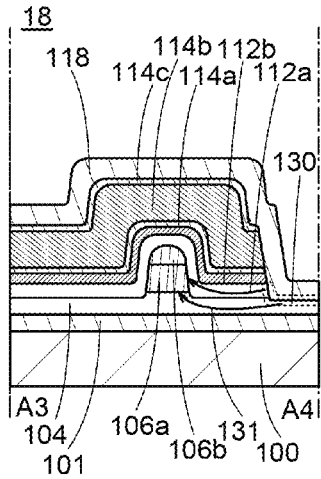

A transistor 18 illustrated in FIGS. 4C and 4D is different from the transistor 10 in that an insulator 111*a* is formed on the conductor 109*a* and an insulator 111*b* is formed on the conductor 109*b*. In the transistor 18, the insulator 112*a* is in contact with at least parts of the top surfaces of the insulators 111*a* and 111*b*. The insulator 118 is preferably formed on the insulators 111*a*, 111*b*, and 104 except for a region overlapping with the conductors 114*a* to 114*c*. With such insulators 111*a*, 111*b*, and 104, the insulator 116 is not necessarily provided because the insulators 111*a*, 111*b*, and 104 function as the insulator 116. In that case, the insulators 111*a*, 111*b*, and 104 are preferably formed using an insulator similar to the insulator 116.

In the transistor 18, the insulators 111*a*, 112*a*, and 112*b* are provided between the conductor 109*a* and the conductor 114*a*, and the insulators 111*b*, 112*a*, and 112*b* are provided between the conductor 109*b* and the conductor 114*a*. This means that the gate-source distance and the gate-drain distance in regions overlapping with the overlap regions can be larger by the thickness of the insulator 111*a* or the insulator 111*b*. As a result, parasitic capacitance in the overlap regions can be reduced. The reduction in the parasitic capacitance enables the switching speed of the transistor to be improved; thus, a transistor with high frequency characteristics can be provided.

In the transistor 18, unlike in the transistor 10, the oxygen 131 is added mainly to surfaces of the insulators 111*a*, 111*b*, and 104 (interfaces between the insulator 118 and each of the insulators 111*a*, 111*b*, and 104, after the deposition of the insulator 118) and the vicinity thereof. The mixed region 130 might be formed in regions where the insulators 111*a*, 111*b*, and 104 are in contact with the insulator 118.

As in the case of the insulator 116, the oxygen 131 can be diffused in the insulators 111*a*, 111*b*, and 104 by heat treatment. The oxygen 131 diffused in the insulator 111*a* or 111*b* is supplied to the semiconductor 106*b* through the insulator 112*a*. The insulator 112*b* and the conductor 114*a* having functions of blocking oxygen are provided between the conductor 114*b* and the insulator 112*a*, thereby preventing the oxygen 131 diffused in the insulator 112*a* from being extracted by the conductor 114*b*. Similarly, the conductors 109*a* and 109*b* having functions of blocking oxygen are provided between the conductors 108*a* and 108*b* and the insulators 111*a* and 111*b*, thereby preventing the oxygen 131 from being extracted by the conductors 108*a* and 108*b*.

The oxygen 131 diffused in the insulator 104 is supplied to the insulator 106*a*. The insulator 101 having a function of blocking oxygen is provided below the insulator 104, thereby preventing the oxygen 131 diffused in the insulator 104 from being diffused below the insulator 104.

Since the conductor 114*b*, the conductor 108*a*, and the conductor 108*b* do not inhibit the diffusion of the oxygen 131 as described above, the oxygen 131 can be effectively supplied to the insulator 106*a* and the semiconductor 106*b*, especially to a channel formation region in the semiconductor 106*b*. Oxygen is supplied to the insulator 106*a* and the semiconductor 106*b* to reduce oxygen vacancies in this manner, whereby a highly purified intrinsic or substantially highly purified intrinsic oxide semiconductor with a low density of defect states can be obtained.

Figure 5A:
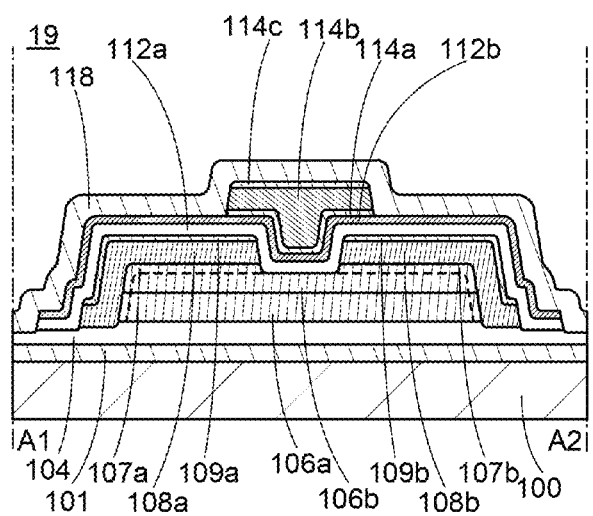
FIGS. 5A and 5B are cross-sectional views illustrating a transistor of one embodiment of the present invention.
Figure 5B:
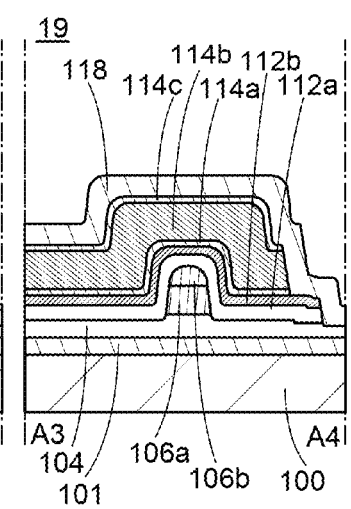

A transistor 19 illustrated in FIGS. 5A and 5B is different from the transistor 16 in that an end portion of the insulator 112*b* is not aligned with end portions of the conductors 114*a* to 114*c*. In the transistor 19, the bottom surface of the insulator 112*b* is in contact with the top surface of the insulator 112*a* also in a region where the insulator 112*a* does not overlap with the conductors 114*a* to 114*c*. As a result, a region where the bottom surface of the insulator 118 is in contact with the top surface of the insulator 112*a* is relatively reduced. Thus, it is preferable that the insulator 112*b* be deposited by a sputtering method in an atmosphere containing oxygen and oxygen be added to the insulator 112*a* as described above.

In FIGS. 5A and 5B, the insulators 112*a* and 112*b* are formed to cover the conductors 108*a* and 108*b* and the like. Furthermore, the insulators 112*a* and 112*b* are subjected to patterning to have their end portions aligned with each other. In addition, the insulator 118 is provided to cover the insulator 112*b* and is in contact with at least part of the top surface of the insulator 104. Note that the structure of the transistor 19 is not limited thereto. For example, one or both of the insulators 112*a* and 112*b* are not necessarily subjected to patterning. Alternatively, one or both of the insulators 112*a* and 112*b* may be subjected to patterning so that an end portion of one or both of the insulators 112*a* and 112*b* is aligned with an end portion of the conductor 109*a* or 109*b*. In the case where the insulator 112*b* has a function of sufficiently blocking oxygen, the insulator 118 is not necessarily provided.

Figure 6A:
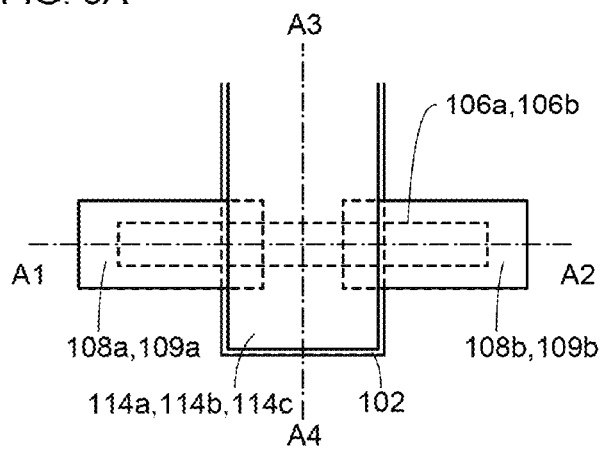
FIGS. 6A to 6C are a top view and cross-sectional views illustrating a transistor of one embodiment of the present invention.
Figure 6B:
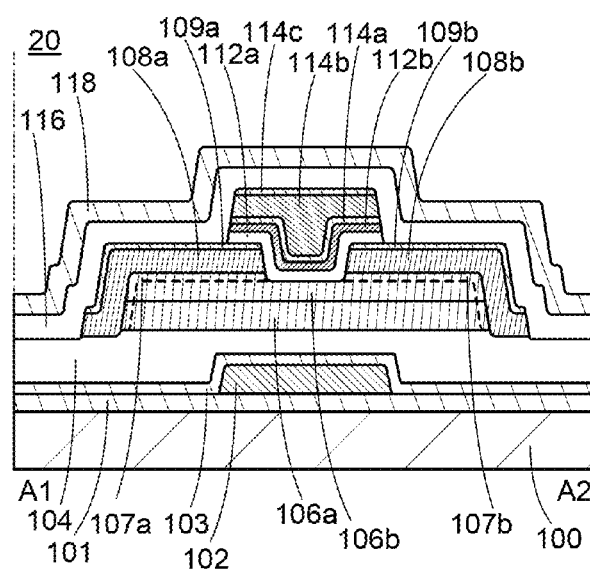
Figure 6C:
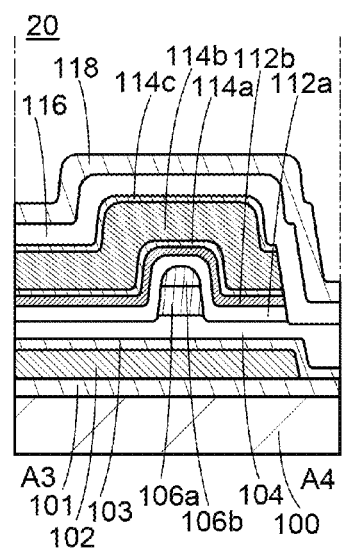

A structure of a transistor 20 will be described with reference to FIGS. 6A to 6C. FIG. 6A is a top view of the transistor 20. FIG. 6B is a cross-sectional view taken along dashed-dotted line A1-A2 in FIG. 6A. FIG. 6C is a cross-sectional view taken along dashed-dotted line A3-A4 in FIG. 6A. A region along dashed-dotted line A1-A2 shows a structure of the transistor 20 in the channel length direction, and a region along dashed-dotted line A3-A4 shows a structure of the transistor 20 in the channel width direction.

The transistor 20 illustrated in FIGS. 6A to 6C is different from the transistor 10 in that a conductor 102 is formed over the insulator 101 and an insulator 103 is formed to cover the conductor 102. The conductor 102 preferably overlaps with at least part of the semiconductor 106b in a region where the semiconductor 106b is positioned between the conductor 108a and the conductor 108b. The conductor 102 functions as a second gate electrode of the transistor 20, and the insulators 103 and 104 function as a second gate insulating film of the transistor 20. With such a structure, the threshold voltage of the transistor 20 can be controlled by the conductor 102.

For the conductor 102, the conductor that can be used for the conductor 114b can be used. For the insulator 103, the insulator that can be used for the insulator 101 can be used.

The insulator 103 is provided to cover the conductor 102. The insulator 103 preferably has a function of blocking oxygen. Owing to the insulator 103, oxidation of the conductor 102, or oxygen extraction from the insulator 104 by the conductor 102 can be prevented. Accordingly, oxygen can be effectively supplied from the insulator 104 to the insulator 106a and the semiconductor 106b. Improving the coverage with the insulator 103 can further reduce oxygen extraction from the insulator 104; thus, oxygen can be more effectively supplied from the insulator 104 to the insulator 106a and the semiconductor 106b. Although the insulator 104 illustrated in FIGS. 6B and 6C has a planarized top surface in a cross section, the semiconductor device described in this embodiment is not limited thereto.

In the case where a conductor such as a wiring is provided in the same tier as the conductor 102, the insulator 103 is preferably formed to cover the conductor.

Figure 7A:
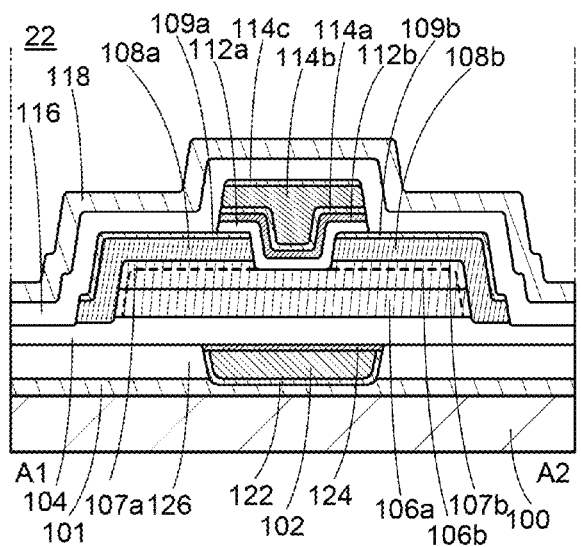
FIGS. 7A to 7D are cross-sectional views illustrating transistors of embodiments of the present invention.
Figure 7B:
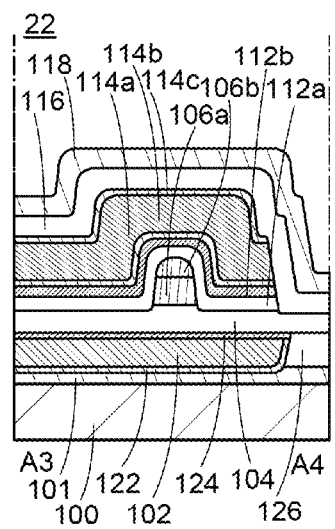

A transistor 22 illustrated in FIGS. 7A and 7B is different from the transistor 20 in that an insulator 126 is formed over the insulator 101 and a conductor 122, the conductor 102, and an insulator 124 are provided in an opening formed in the insulators 126 and 101. The conductors 122 and 102 preferably overlap with at least part of the semiconductor 106b in a region where the semiconductor 106b is positioned between the conductor 108a and the conductor 108b. The conductors 122 and 102 function as a second gate electrode of the transistor 22, and the insulators 103 and 124 function as a second gate insulating film of the transistor 22. With such a structure, the threshold voltage of the transistor 22 can be controlled by the conductors 102 and 122.

For the conductor 122, the conductor that can be used for the conductor 109a and the conductor 109b can be used. For the insulator 124, the insulator that can be used for the insulator 112b can be used. For the insulator 126, the insulator that can be used for the insulator 104.

An opening that reaches the insulator 101 is provided in the insulator 126. A bottom portion of the opening is formed in the insulator 101. The conductor 122 is formed to cover the bottom portion and side surface portion of the opening, and the conductor 102 is formed to fill a space inward from the conductor 122. The insulator 124 is formed to cover the conductors 122 and 102 and to fill the opening in the insulator 126.

In such a structure, bottom, side, and top surfaces of the conductor 102 are covered with the conductor 122 and the insulator 124 having high oxygen blocking properties; thus, oxygen extraction from the insulator 104 and the insulator 126 by the conductor 102 can be prevented. Accordingly, oxygen can be effectively supplied from the insulator 104 to the insulator 106a and the semiconductor 106b.

Figure 7C:
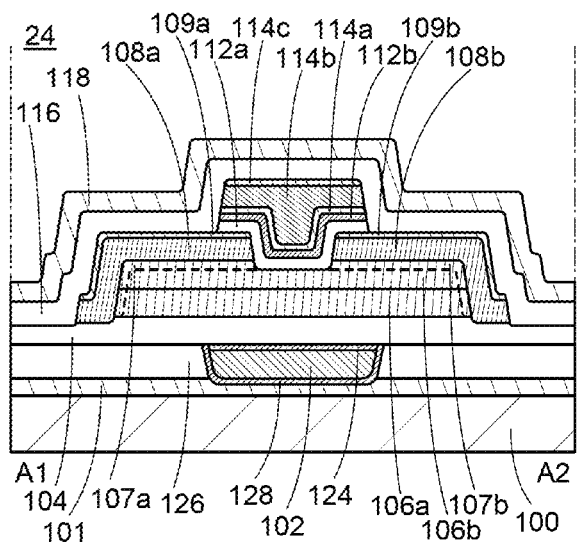
Figure 7D:
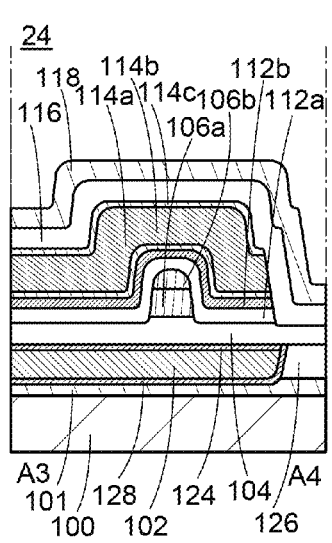

A transistor 24 illustrated in FIGS. 7C and 7D is different from the transistor 22 in that an insulator 128 is formed to cover bottom and side surface portions of an opening in the insulators 126 and 101. In the transistor 24, the conductor 102 is formed to fill a space inward from the insulator 128, and the insulator 124 is formed to cover the conductor 102 and to fill the opening in the insulator 126. For the insulator 128, the insulator that can be used for the insulator 124 can be used.

In such a structure, bottom, side, and top surfaces of the conductor 102 are surrounded by the insulator 128 and the insulator 124 with high oxygen blocking properties; thus, oxygen extraction from the insulator 104 and the insulator 126 by the conductor 102 can be prevented. Accordingly, oxygen can be effectively supplied from the insulator 104 to the insulator 106a and the semiconductor 106b.

Figure 8A:
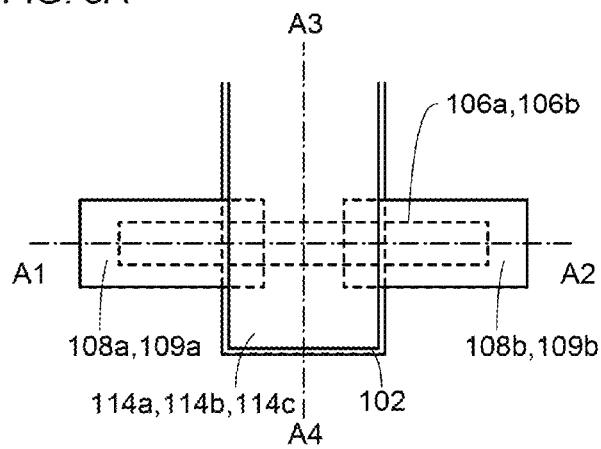
FIGS. 8A to 8C are a top view and cross-sectional views illustrating a transistor of one embodiment of the present invention.
Figure 8B:
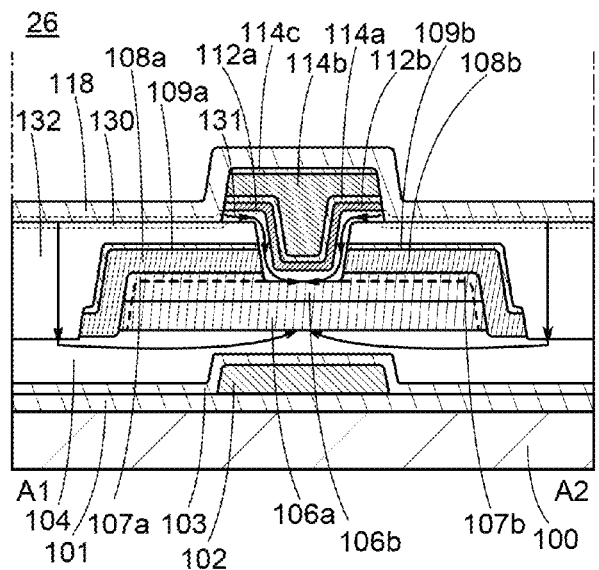
Figure 8C:
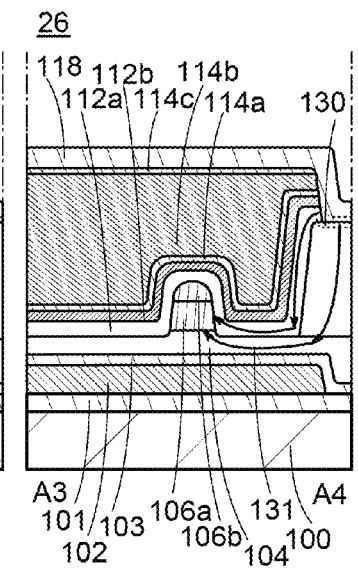

A structure of a transistor 26 will be described with reference to FIGS. 8A to 8C. FIG. 8A is a top view of the transistor 26. FIG. 8B is a cross-sectional view taken along dashed-dotted line A1-A2 in FIG. 8A. FIG. 8C is a cross-sectional view taken along dashed-dotted line A3-A4 in FIG. 8A. A region along dashed-dotted line A1-A2 shows a structure of the transistor 26 in the channel length direction, and a region along dashed-dotted line A3-A4 shows a structure of the transistor 26 in the channel width direction.

The transistor 26 illustrated in FIGS. 8A to 8C is different from the transistor 20 in that an insulator 132 is formed to cover the conductors 109a and 109b and the insulator 104, an opening that reaches the semiconductor 106b is provided in the insulator 132, and the insulators 112a and 112b and the conductors 114a to 114c are provided to fill the opening. The conductor 109a and the conductor 108a are separated from the conductor 109b and the conductor 108b, respectively, by the opening. In the transistor 26, a region functioning as a gate electrode is formed in a self-aligned manner by filling the opening formed in the insulator 132 and the like; thus, the transistor 26 can be also referred to as a trench gate self aligned (TGSA) s-channel FET.

For the insulator 132, the insulator that can be used for the insulator 104 can be used. The top surface of the insulator 132 can be made flat by chemical mechanical polishing (CMP) or the like.

In the transistor 26, the insulators 132, 112a, and 112b are provided between the conductor 109a and the conductor 114a and between the conductor 109b and the conductor 114a. This means that the gate-source distance and the gate-drain distance in regions overlapping with the overlap regions can be larger by the thickness of the insulator 132. As a result, parasitic capacitance in the overlap regions can be reduced. The reduction in the parasitic capacitance enables the switching speed of the transistor to be improved; thus, a transistor with high frequency characteristics can be provided.

In the transistor 26, unlike in the transistor 20, the oxygen 131 is added mainly to a surface of the insulator 132 (interface between the insulator 132 and the insulator 118, after the deposition of the insulator 118) and the vicinity thereof. The mixed region 130 might be formed in a region where the insulator 132 is in contact with the insulator 118.

As in the case of the insulator 116, the oxygen 131 can be diffused in the insulator 132 by heat treatment. The oxygen 131 diffused in the insulator 132 is supplied to the semiconductor 106b through the insulator 112a. The insulator 112b and the conductor 114a having a function of blocking oxygen are provided between the conductor 114b and the insulator 112a, thereby preventing the oxygen 131 diffused in the insulator 112a from being extracted by the conductor 114b. Similarly, the conductors 109a and 109b having a function of blocking oxygen are provided between the insulator 132 and the conductors 108a and 108b, thereby preventing the oxygen 131 from being extracted by the conductors 108a and 108b.

The oxygen 131 diffused in the insulator 132 is supplied to the insulator 106a through the insulator 104. The insulator 103 having a function of blocking oxygen covers the conductor 102, thereby preventing the oxygen 131 diffused in the insulator 104 from being extracted by the conductor 102.

Since the conductor 114b, the conductor 102, the conductor 108a, and the conductor 108b do not inhibit the diffusion of the oxygen 131 as described above, the oxygen 131 can be effectively supplied to the insulator 106a and the semiconductor 106b, especially to a channel formation region in the semiconductor 106b. Oxygen is supplied to the insulator 106a and the semiconductor 106b to reduce oxygen vacancies in this manner, whereby a highly purified intrinsic or substantially highly purified intrinsic oxide semiconductor with a low density of defect states can be obtained.

The structure and method described in this embodiment can be implemented by being combined as appropriate with any of the other structures and methods described in the other embodiments.

(Embodiment 2)

In this embodiment, a method for manufacturing the semiconductor device of one embodiment of the present invention will be described with reference to FIGS. 9A to 9F, FIGS. 10A to 10F, FIGS. 11A to 11D, and FIGS. 12A to 12J.

<Method for Manufacturing Transistor>

A method for manufacturing the transistor 10 will be described below with reference to FIGS. 9A to 9F, FIGS. 10A to 10F, and FIGS. 11A to 11D.

First, the substrate 100 is prepared. Any of the above-mentioned substrates can be used for the substrate 100.

Next, the insulator 101 is formed. Any of the above-mentioned insulators can be used for the insulator 101.

The insulator 101 may be formed by a sputtering method, a chemical vapor deposition (CVD) method, a molecular beam epitaxy (MBE) method, a pulsed laser deposition (PLD) method, an atomic layer deposition (ALD) method, or the like.

CVD methods can be classified into a plasma enhanced CVD (PECVD) method using plasma, a thermal CVD (TCVD) method using heat, a photo CVD method using light, and the like. Moreover, the CVD method can include a metal CVD (MCVD) method and a metal organic CVD (MOCVD) method depending on a source gas.

In the case of a PECVD method, a high quality film can be obtained at relatively low temperature. Furthermore, a TCVD method does not use plasma and thus causes less plasma damage to an object. For example, a wiring, an electrode, an element (e.g., transistor or capacitor), or the like included in a semiconductor device might be charged up by receiving electric charges from plasma. In that case, accumulated electric charges might break the wiring, electrode, element, or the like included in the semiconductor device. Such plasma damage is not caused in the case of using a TCVD method, and thus the yield of a semiconductor device can be increased. In addition, since plasma damage does not occur in the deposition by a TCVD method, a film with few defects can be obtained.

An ALD method also causes less plasma damage to an object. Thus, a film with few defects can be formed by an ALD method.

Unlike in a deposition method in which particles ejected from a target or the like are deposited, in a CVD method and an ALD method, a film is formed by reaction at a surface of an object. Thus, a CVD method and an ALD method enable favorable step coverage almost regardless of the shape of an object. In particular, an ALD method enables excellent step coverage and excellent thickness uniformity and can be favorably used for covering a surface of an opening with a high aspect ratio, for example. For that reason, a formed film is less likely to have a pinhole or the like. On the other hand, an ALD method has a relatively low deposition rate; thus, it is sometimes preferable to combine an ALD method with another deposition method with a high deposition rate such as a CVD method.

When a CVD method or an ALD method is used, composition of a film to be formed can be controlled with a flow rate ratio of the source gases. For example, by the CVD method or the ALD method, a film with a desired composition can be formed by adjusting the flow ratio of a source gas. Moreover, with a CVD method or an ALD method, by changing the flow rate ratio of the source gases while forming the film, a film whose composition is continuously changed can be formed. In the case where the film is formed while changing the flow rate ratio of the source gases, as compared to the case where the film is formed using a plurality of deposition chambers, time taken for the deposition can be reduced because time taken for transfer and pressure adjustment is omitted. Thus, semiconductor devices can be manufactured with improved productivity.

In a conventional deposition apparatus utilizing a CVD method, one or a plurality of source gases for reaction are supplied to a chamber at the same time at the time of deposition. In a deposition apparatus utilizing an ALD method, a source gas (also called precursor) for reaction and a gas serving as a reactant are alternately introduced into a chamber, and then the gas introduction is repeated. Note that the gases to be introduced can be switched using the respective switching valves (also referred to as high-speed valves).

For example, deposition is performed in the following manner. First, precursors are introduced into a chamber and adsorbed onto a substrate surface (first step). Here, the precursors are adsorbed onto the substrate surface, whereby a self-limiting mechanism of surface chemical reaction works and no more precursors are adsorbed onto a layer of the precursors over the substrate. Note that the proper range of substrate temperatures at which the self-limiting mechanism of surface chemical reaction works is also referred to as an ALD window. The ALD window depends on the temperature characteristics, vapor pressure, decomposition temperature, and the like of a precursor. Next, an inert gas (e.g., argon or nitrogen) or the like is introduced into the chamber, so that excessive precursors, a reaction product, and the like are released from the chamber (second step). Instead of introduction of an inert gas, vacuum evacuation can be performed to release excessive precursors, a reaction product, and the like from the chamber. Then, a reactant (e.g., an oxidizer such as $H_2O$ or $O_3$) is introduced into the chamber to react with the precursors adsorbed onto the substrate surface, whereby part of the precursors is removed while the molecules of the film are adsorbed onto the substrate (third step). After that, introduction of an inert gas or vacuum evacuation is performed, whereby excessive reactant, a reaction product, and the like are released from the chamber (fourth step).

A first single layer can be formed on the substrate surface in the above manner. By performing the first to fourth steps again, a second single layer can be stacked over the first single layer. With the introduction of gases controlled, the first to fourth steps are repeated plural times until a film having a desired thickness is obtained, whereby a thin film with excellent step coverage can be formed. The thickness of the thin film can be adjusted by the number of repetition times; therefore, an ALD method makes it possible to adjust a thickness accurately and thus is suitable for manufacturing a minute transistor.

In an ALD method, a film is formed through reaction of the precursor using thermal energy. An ALD method in which the reactant becomes a radical state with the use of plasma in the above-described reaction of the reactant is sometimes called a plasma ALD method. An ALD method in which reaction between the precursor and the reactant is performed using thermal energy is sometimes called a thermal ALD method.

By an ALD method, an extremely thin film can be formed to have a uniform thickness. In addition, the coverage of an uneven surface with the film is high.

When the plasma ALD method is employed, the film can be formed at a lower temperature than when the thermal ALD method is employed. With the plasma ALD method, for example, the film can be formed without decreasing the deposition rate even at 100° C. or lower. Furthermore, in the plasma ALD method, any of a variety of reactants, including a nitrogen gas, can be used without being limited to an oxidizer; therefore, it is possible to form various kinds of films of not only an oxide but also a nitride, a fluoride, a metal, and the like.

In the case where the plasma ALD method is employed, as in an inductively coupled plasma (ICP) method or the like, plasma can be generated apart from a substrate. When plasma is generated in this manner, plasma damage can be minimized.

Then, the insulator 104 is deposited. Any of the above-described insulators can be used for the insulator 104. The insulator 104 can be deposited by a sputtering method, a CVD method, an MBE method, a PLD method, an ALD method, or the like.

The top surface or the bottom surface of the semiconductor 106b to be formed later preferably has high planarity. Thus, to improve the planarity, the top surface of the insulator 104 may be subjected to planarization treatment such as chemical mechanical polishing (CMP).

Next, an insulator 136a to be the insulator 106a in a later step is deposited. For the insulator 136a, the above-described insulator, semiconductor, or conductor that can be used for the insulator 106a can be used. The insulator 136a can be deposited by a sputtering method, a CVD method, an MBE method, a PLD method, an ALD method, or the like. Description below is for a sputtering apparatus that can be used when the insulator 136a is deposited by a sputtering method.

<Sputtering Apparatus>

A parallel-plate-type sputtering apparatus and a facing-targets sputtering apparatus of one embodiment of the present invention will be described below. As will be described later, deposition using a facing-targets sputtering apparatus causes less damage to a formation surface and thus facilitates the formation of a film with high crystallinity. For this reason, a facing-targets sputtering apparatus is preferably used for the deposition of a CAAC-OS, which is described later, in some cases. The following descriptions of the sputtering apparatuses are made for easy understanding or the explanation of the operation during deposition, on the assumption that a substrate, a target, and the like are provided. Note that the substrate, the target, and the like are provided by a user; thus, the sputtering apparatus of one embodiment of the present invention does not necessarily include the substrate and the target.

Deposition using a parallel-plate-type sputtering apparatus can also be referred to as parallel electrode sputtering (PESP), and deposition using a facing-targets sputtering apparatus can also be referred to as vapor deposition sputtering (VDSP).

Figure 13A:
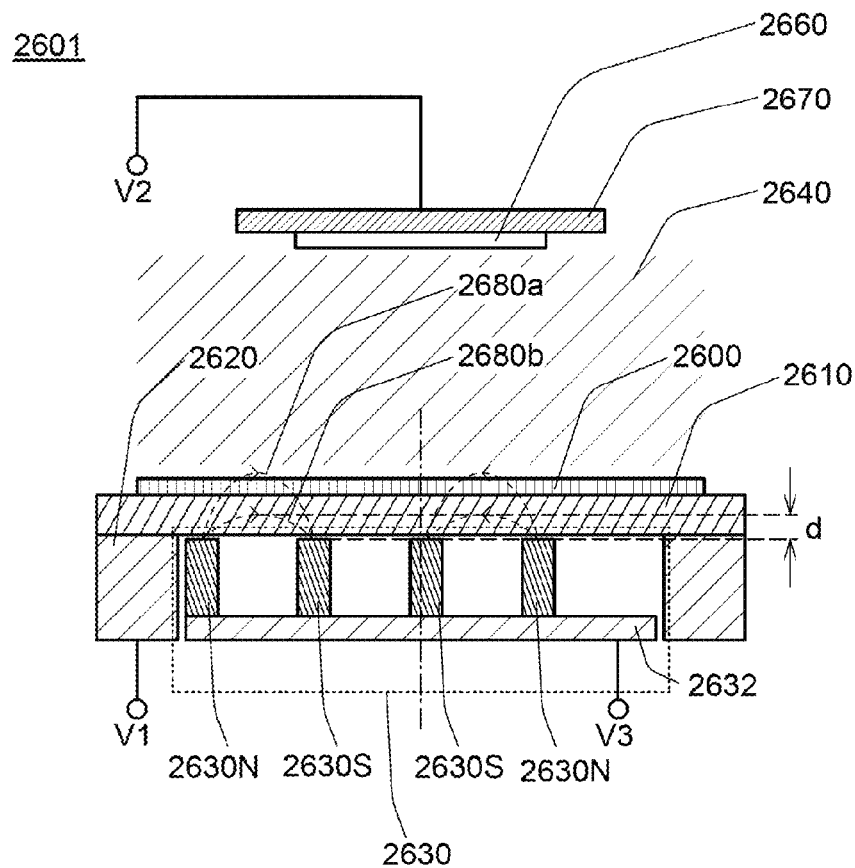
FIGS. 13A and 13B illustrate a sputtering apparatus.

FIG. 13A is a cross-sectional view of a deposition chamber 2601 of a parallel-plate-type sputtering apparatus. The deposition chamber 2601 in FIG. 13A includes a target holder 2620, a backing plate 2610, a target 2600, a magnet unit 2630, and a substrate holder 2670. Note that the target 2600 is placed over the backing plate 2610. The backing plate 2610 is placed over the target holder 2620. The magnet unit 2630 is placed under the target 2600 with the backing plate 2610 positioned therebetween. The substrate holder 2670 faces the target 2600. Note that in this specification, a magnet unit means a group of magnets. The magnet unit can be replaced with "cathode," "cathode magnet," "magnetic member," "magnetic part," or the like. The magnet unit 2630 includes a magnet 2630N, a magnet 2630S, and a magnet holder 2632. Note that in the magnet unit 2630, the magnet 2630N and the magnet 2630S are placed over the magnet holder 2632. The magnet 2630N and the magnet 2630S are spaced. When a substrate 2660 is transferred into the deposition chamber 2601, the substrate 2660 is placed on the substrate holder 2670. When potentials are applied to a terminal V1, a terminal V2, and a terminal V3, plasma 2640 is generated between the target 2600 and the substrate 2660.

The target holder 2620 and the backing plate 2610 are fixed to each other with a bolt and have the same potential. The target holder 2620 has a function of supporting the target 2600 with the backing plate 2610 positioned therebetween.

The target 2600 is fixed to the backing plate 2610. The target 2600 can be fixed to the backing plate 2610 using a bonding agent containing a low-melting-point metal such as indium, for example.

FIG. 13A illustrates a magnetic force line 2680a and a magnetic force line 2680b formed by the magnet unit 2630.

The magnetic force line 2680a is one of magnetic force lines that form a horizontal magnetic field in the vicinity of the top surface of the target 2600. The vicinity of the top surface of the target 2600 corresponds to a region in which the vertical distance from the target 2600 is, for example, greater than or equal to 0 mm and less than or equal to 10 mm, in particular, greater than or equal to 0 mm and less than or equal to 5 mm.

The magnetic force line 2680b is one of magnetic force lines that form a horizontal magnetic field in a plane apart from the top surface of the magnet unit 2630 by a vertical distance d. The vertical distance d is, for example, greater than or equal to 0 mm and less than or equal to 20 mm or greater than or equal to 5 mm and less than or equal to 15 mm.

Here, with the use of the strong magnet 2630N and the strong magnet 2630S, an intense magnetic field can be generated in the vicinity of the top surface of the substrate 2660. Specifically, the intensity of the horizontal magnetic field on the top surface of the substrate 2660 can be greater than or equal to 10 G and less than or equal to 100 G, preferably greater than or equal to 15 G and less than or equal to 60 G, further preferably greater than or equal to 20 G and less than or equal to 40 G.

Note that the intensity of the horizontal magnetic field may be measured when the intensity of the vertical magnetic field is 0 G.

By setting the intensity of the magnetic field in the deposition chamber 2601 to be in the above range, an oxide with high density and high crystallinity can be deposited. The deposited oxide hardly includes plural kinds of crystal phases and is a substantially-single crystalline phase.

Figure 13B:
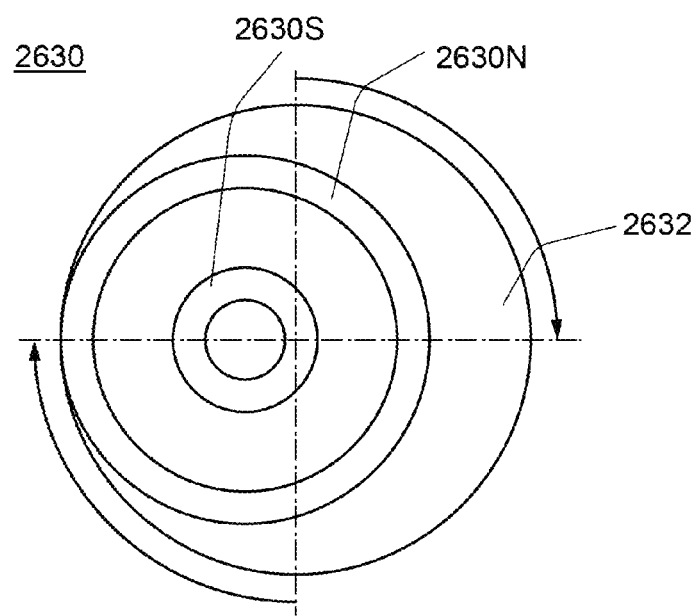

FIG. 13B is a top view of the magnet unit 2630. In the magnet unit 2630, the circular or substantially circular magnet 2630N and the circular or substantially circular magnet 2630S are fixed to the magnet holder 2632. The magnet unit 2630 can be rotated about a normal vector at the center of the top surface of the magnet unit 2630 or a normal vector substantially at the center of the top surface of the magnet unit 2630. For example, the magnet unit 2630 may be rotated with a beat (also referred to as rhythm, pulse, frequency, period, cycle, or the like) of greater than or equal to 0.1 Hz and less than or equal to 1 kHz.

Thus, a region with a high magnetic field on the target 2600 changes as the magnet unit 2630 is rotated. The region with a high magnetic field is a high-density plasma region; thus, sputtering of the target 2600 easily occurs in the vicinity of the region. For example, when the region with a high magnetic field is fixed, only a specific region of the target 2600 is used. In contrast, when the magnet unit 2630 is rotated as illustrated in FIG. 13B, the target 2600 can be uniformly used. In addition, when the magnet unit 2630 is rotated, a film with a uniform thickness and uniform quality can be deposited.

By rotating the magnet unit 2630, the direction of the magnetic force line on the top surface of the substrate 2660 can also be changed.

Although the magnet unit 2630 is rotated in this example, one embodiment of the present invention is not limited to this example. For example, the magnet unit 2630 may be oscillated vertically or horizontally. For example, the magnet unit 2630 may be oscillated with a beat of greater than or equal to 0.1 Hz and less than or equal to 1 kHz. Alternatively, the target 2600 may be rotated or moved. For example, the target 2600 may be rotated or oscillated with a beat of greater than or equal to 0.1 Hz and less than or equal to 1 kHz. Further alternatively, the direction of a magnetic force line on the top surface of the substrate 2660 may be changed relatively by rotating the substrate 2660. These methods may be combined.

The deposition chamber 2601 may have a water channel inside or under the backing plate 2610. By making fluid (air, nitrogen, a rare gas, water, oil, or the like) flow through the water channel, discharge anomaly due to an increase in the temperature of the target 2600 or damage to the deposition chamber 2601 due to deformation of a component can be prevented in the sputtering. In that case, the backing plate 2610 and the target 2600 are preferably adhered to each other with a bonding agent because the cooling capability is increased.

A gasket is preferably provided between the target holder 2620 and the backing plate 2610, in which case an impurity is less likely to enter the deposition chamber 2601 from the outside or the water channel.

In the magnet unit 2630, the magnet 2630N and the magnet 2630S are placed such that their surfaces on the target 2600 side have opposite polarities. Here, the case where the pole of the magnet 2630N on the target 2600 side is the north pole and the pole of the magnet 2630S on the target 2600 side is the south pole is described. Note that the layout of the magnets and the poles in the magnet unit 2630 are not limited to those described here or those illustrated in FIG. 13A.

In the deposition, a potential V1 applied to the terminal V1 connected to the target holder 2620 is, for example, lower than a potential V2 applied to the terminal V2 connected to the substrate holder 2670. The potential V2 applied to the terminal V2 connected to the substrate holder 2670 is, for example, the ground potential. A potential V3 applied to the terminal V3 connected to the magnet holder 2632 is, for example, the ground potential. Note that the potentials applied to the terminals V1, V2, and V3 are not limited to the above description. Not all the target holder 2620, the substrate holder 2670, and the magnet holder 2632 are necessarily supplied with potentials. For example, the substrate holder 2670 may be electrically floating. Note that although the potential V1 is applied to the terminal V1 connected to the target holder 2620 (i.e., a DC sputtering method is employed) in the example illustrated in FIG. 13A, one embodiment of the present invention is not limited thereto. For example, it is possible to employ what is called an RF sputtering method, in which case a high-frequency power supply with a frequency of 13.56 MHz or 27.12 MHz, for example, is connected to the target holder 2620.

FIG. 13A illustrates an example where the backing plate 2610 and the target holder 2620 are not electrically connected to the magnet unit 2630 and the magnet holder 2632, but electrical connection is not limited thereto. For example, the backing plate 2610 and the target holder 2620 may be electrically connected to the magnet unit 2630 and the magnet holder 2632, and the backing plate 2610, the target holder 2620, the magnet unit 2630, and the magnet holder 2632 may have the same potential.

To increase the crystallinity of the formed oxide, the temperature of the substrate 2660 may be set high. By setting the temperature of the substrate 2660 high, migration of sputtered particles at the top surface of the substrate 2660 can be promoted. Thus, an oxide with higher density and higher crystallinity can be deposited. Note that the temperature of the substrate 2660 is, for example, higher than or equal to 100° C. and lower than or equal to 450° C., preferably higher than or equal to 150° C. and lower than or equal to 400° C., more preferably higher than or equal to 170° C. and lower than or equal to 350° C.

When the partial pressure of oxygen in the deposition gas is too high, an oxide including plural kinds of crystal phases is likely to be deposited; therefore, a mixed gas of oxygen and a rare gas such as argon (other examples of the rare gas are helium, neon, krypton, and xenon) is preferably used as the deposition gas. For example, the proportion of oxygen in the whole deposition gas is less than 50 volume %, preferably less than or equal to 33 volume %, further preferably less than or equal to 20 volume %, and still further preferably less than or equal to 15 volume %.

The vertical distance between the target 2600 and the substrate 2660 is greater than or equal to 10 mm and less than or equal to 600 mm, preferably greater than or equal to 20 mm and less than or equal to 400 mm, more preferably greater than or equal to 30 mm and less than or equal to 200 mm, further more preferably greater than or equal to 40 mm and less than or equal to 100 mm. Within the above range, the vertical distance between the target 2600 and the substrate 2660 is small enough to suppress a decrease in the energy of the sputtered particles until the sputtered particles reach the substrate 2660 in some cases. Within the above range, the vertical distance between the target 2600 and the substrate 2660 is large enough to make the incident direction of the sputtered particle approximately vertical to the substrate 2660, so that damage to the substrate 2660 caused by collision of the sputtered particles can be reduced in some cases.

Figure 14A:
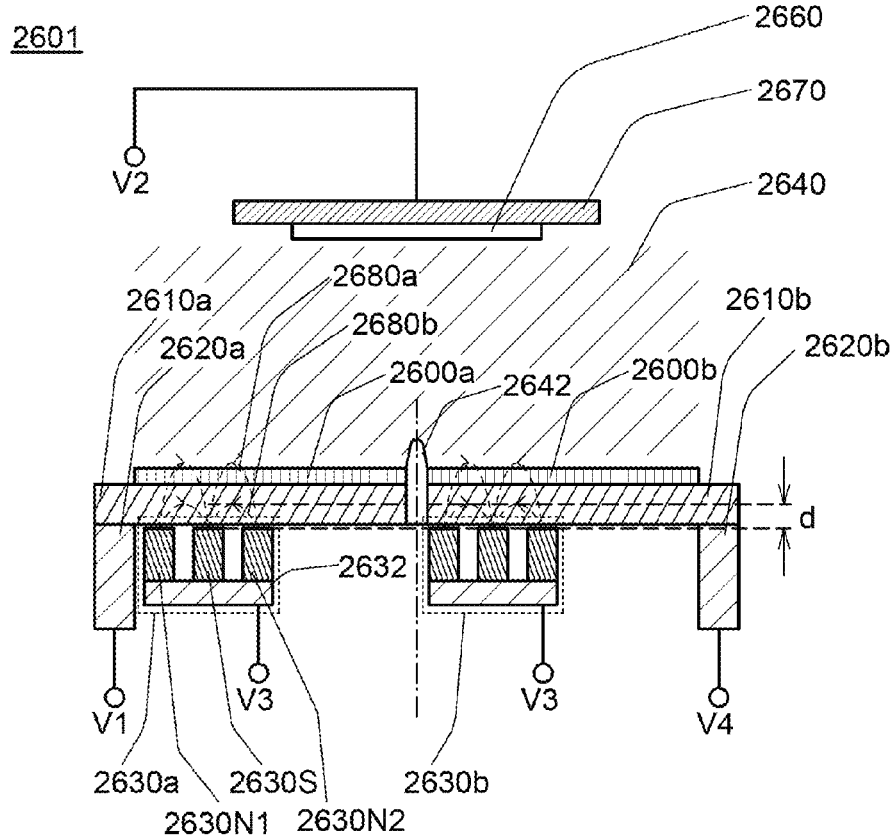
FIGS. 14A and 14B illustrate a sputtering apparatus.

FIG. 14A illustrates an example of a deposition chamber different from that in FIG. 13A.

The deposition chamber 2601 in FIG. 14A includes a target holder 2620a, a target holder 2620b, a backing plate 2610a, a backing plate 2610b, a target 2600a, a target 2600b, a magnet unit 2630a, a magnet unit 2630b, a member 2642, and the substrate holder 2670. Note that the target 2600a is placed over the backing plate 2610a. The backing plate 2610a is placed over the target holder 2620a. The magnet unit 2630a is placed under the target 2600a with the backing plate 2610a positioned therebetween. The target 2600b is placed over the backing plate 2610b. The backing plate 2610b is placed over the target holder 2620b. The magnet unit 2630b is placed under the target 2600b with the backing plate 2610b positioned therebetween.

The magnet unit 2630a includes a magnet 2630N1, a magnet 2630N2, the magnet 2630S, and the magnet holder 2632. Note that in the magnet unit 2630a, the magnet 2630N1, the magnet 2630N2, and the magnet 2630S are placed over the magnet holder 2632. The magnet 2630N1, the magnet 2630N2, and the magnet 2630S are spaced. Note that the magnet unit 2630b has a structure similar to that of the magnet unit 2630a. When the substrate 2660 is transferred into the deposition chamber 2601, the substrate 2660 is placed on the substrate holder 2670. When potentials are applied to the terminal V1, the terminal V2, the terminal V3, and a terminal V4, the plasma 2640 is generated between the substrate 2660 and the targets 2600a and 2600b.

The target 2600a, the backing plate 2610a, and the target holder 2620a are separated from the target 2600b, the backing plate 2610b, and the target holder 2620b by the member 2642. Note that the member 2642 is preferably an insulator. The member 2642 may be a conductor or a semiconductor. The member 2642 may be a conductor or a semiconductor whose surface is covered with an insulator.

The target holder 2620a and the backing plate 2610a are fixed to each other with a bolt and have the same potential. The target holder 2620a has a function of supporting the target 2600a with the backing plate 2610a positioned therebetween. The target holder 2620b and the backing plate 2610b are fixed to each other with a bolt and have the same potential. The target holder 2620b has a function of supporting the target 2600b with the backing plate 2610b positioned therebetween.

The backing plate 2610a has a function of fixing the target 2600a. The backing plate 2610b has a function of fixing the target 2600b.

FIG. 14A illustrates the magnetic force line 2680a and the magnetic force line 2680b formed by the magnet unit 2630a.

The magnetic force line 2680a is one of magnetic force lines that form a horizontal magnetic field in the vicinity of the top surface of the target 2600a. The vicinity of the top surface of the target 2600a corresponds to a region in which the vertical distance from the target 2600a is, for example, greater than or equal to 0 mm and less than or equal to 10 mm, in particular, greater than or equal to 0 mm and less than or equal to 5 mm.

The magnetic force line 2680b is one of magnetic force lines that form a horizontal magnetic field in a plane apart from the top surface of the magnet unit 2630a by a vertical distance d. The vertical distance d is, for example, greater than or equal to 0 mm and less than or equal to 20 mm or greater than or equal to 5 mm and less than or equal to 15 mm.

Here, with the use of the strong magnet 2630N1, the strong magnet 2630N2, and the strong magnet 2630S, an intense magnetic field can be generated in the vicinity of the top surface of the substrate 2660. Specifically, the intensity of the horizontal magnetic field on the top surface of the substrate 2660 can be greater than or equal to 10 G and less than or equal to 100 G, preferably greater than or equal to 15 G and less than or equal to 60 G, and further preferably greater than or equal to 20 G and less than or equal to 40 G.

By setting the intensity of the magnetic field in the deposition chamber 2601 to be in the above range, an oxide with high density and high crystallinity can be deposited. The deposited oxide hardly includes plural kinds of crystal phases and is a substantially-single crystalline phase.

Note that the magnet unit 2630b forms a magnetic force line similar to that formed by the magnet unit 2630a.

Figure 14B:
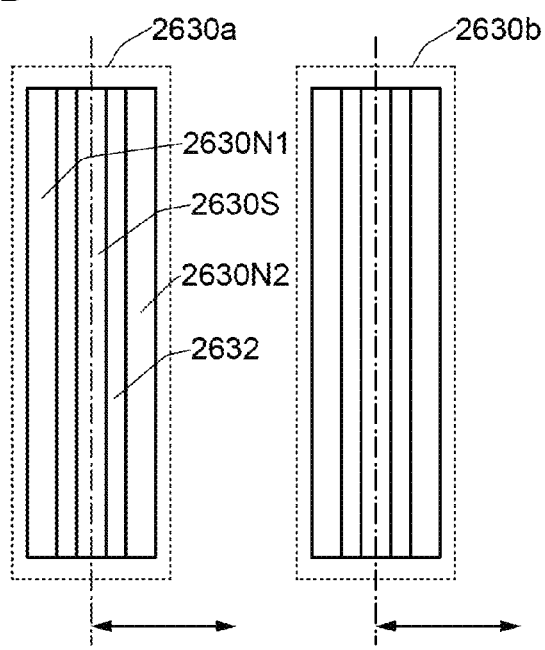

FIG. 14B is a top view of the magnet units 2630a and 2630b. In the magnet unit 2630a, the rectangular or substantially rectangular magnet 2630N1, the rectangular or substantially rectangular magnet 2630N2, and the rectangular or substantially rectangular magnet 2630S are fixed to the magnet holder 2632. The magnet unit 2630a can be oscillated horizontally as shown in FIG. 14B. For example, the magnet unit 2630a may be oscillated with a beat of greater than or equal to 0.1 Hz and less than or equal to 1 kHz.

Thus, a region where a magnetic field on the target 2600a is intense changes as the magnet unit 2630a is oscillated. The region with an intense magnetic field is a high-density plasma region; thus, sputtering of the target 2600a easily occurs in the vicinity of the region. For example, when the region with an intense magnetic field is fixed, only a specific region of the target 2600a is used. In contrast, when the magnet unit 2630a is oscillated as shown in FIG. 14B, the target 2600a can be uniformly used. By oscillating the magnet unit 2630a, a film with a uniform thickness and uniform quality can be deposited.

By oscillating the magnet unit 2630a, the state of the magnetic force line on the top surface of the substrate 2660 can also be changed. The same applies to the magnet unit 2630b.

Although the magnet unit 2630a and the magnet unit 2630b are oscillated in this example, one embodiment of the present invention is not limited to this example. For example, the magnet unit 2630a and the magnet unit 2630b may be rotated. For example, the magnet unit 2630a and the magnet unit 2630b may be rotated with a beat of greater than or equal to 0.1 Hz and less than or equal to 1 kHz. Alternatively, the target 2600 may be rotated or moved. For example, the target 2600 may be rotated or oscillated with a beat of greater than or equal to 0.1 Hz and less than or equal to 1 kHz. Further alternatively, the state of a magnetic force line on the top surface of the substrate 2660 may be changed relatively by rotating the substrate 2660. These methods may be combined.

The deposition chamber 2601 may have a water channel inside or under the backing plate 2610a and the backing plate 2610b. By making fluid (air, nitrogen, a rare gas, water, oil, or the like) flow through the water channel, discharge anomaly due to an increase in the temperature of the target 2600a and the target 2600b or damage to the deposition chamber 2601 due to deformation of a component can be prevented in the sputtering. In that case, the backing plate 2610a and the target 2600a are preferably adhered to each other with a bonding agent because the cooling capability is increased. Furthermore, the backing plate 2610b and the target 2600b are preferably adhered to each other with a bonding agent because the cooling capability is increased.

A gasket is preferably provided between the target holder 2620a and the backing plate 2610a, in which case an impurity is less likely to enter the deposition chamber 2601 from the outside or the water channel. A gasket is preferably provided between the target holder 2620b and the backing plate 2610b, in which case an impurity is less likely to enter the deposition chamber 2601 from the outside or the water channel.

In the magnet unit 2630a, the magnets 2630N1 and 2630N2 and the magnet 2630S are placed such that their surfaces on the target 2600a side have opposite polarities. Here, the case where the pole of each of the magnets 2630N1 and 2630N2 on the target 2600a side is the north pole and the pole of the magnet 2630S on the target 2600a side is the south pole is described. Note that the layout of the magnets and the poles in the magnet unit 2630a are not limited to those described here or those illustrated in FIG. 14A. The same applies to the magnet unit 2630b.

In the deposition, a potential whose level is varied between a high level and a low level is applied to the terminal V1 connected to the target holder 2620a and the terminal V4 connected to the target holder 2620b. The potential V2 applied to the terminal V2 connected to the substrate holder 2670 is, for example, the ground potential. A potential V3 applied to a terminal V3 connected to the magnet holder 2632 is, for example, the ground potential. Note that the potentials applied to the terminals V1, V2, V3, and V4 are not limited to the above description. Not all the target holder 2620a, the target holder 2620b, the substrate holder 2670, and the magnet holder 2632 are necessarily supplied with potentials. For example, the substrate holder 2670 may be electrically floating. Note that the potential whose level is varied between the high level and the low level is applied to the terminal V1 connected to the target holder 2620a and the terminal V4 connected to the target holder 2620b (i.e., an AC sputtering method is employed) in the example illustrated in FIG. 14A; however, one embodiment of the present invention is not limited thereto.

FIG. 14A illustrates an example where the backing plate 2610a and the target holder 2620a are not electrically connected to the magnet unit 2630a and the magnet holder 2632, but electrical connection is not limited thereto. For example, the backing plate 2610a and the target holder 2620a may be electrically connected to the magnet unit 2630a and the magnet holder 2632, and the backing plate 2610a, the target holder 2620a, the magnet unit 2630a, and the magnet holder 2632 may have the same potential. The backing plate 2610b and the target holder 2620b are not electrically connected to the magnet unit 2630b and the magnet holder 2632 in the example, but electrical connection is not limited thereto. For example, the backing plate 2610b and the target holder 2620b may be electrically connected to the magnet unit 2630b and the magnet holder 2632, and the backing plate 2610b, the target holder 2620b, the magnet unit 2630b, and the magnet holder 2632 may have the same potential.

To increase the crystallinity of the formed oxide, the temperature of the substrate 2660 may be set high. By setting the temperature of the substrate 2660 high, migration of sputtered particles at the top surface of the substrate 2660 can be promoted. Thus, an oxide with higher density and higher crystallinity can be deposited. Note that the temperature of the substrate 2660 is, for example, higher than or equal to 100° C. and lower than or equal to 450° C., preferably higher than or equal to 150° C. and lower than or equal to 400° C., more preferably higher than or equal to 170° C. and lower than or equal to 350° C.

When the partial pressure of oxygen in the deposition gas is too high, an oxide including plural kinds of crystal phases is likely to be deposited; therefore, a mixed gas of oxygen and a rare gas such as argon (other examples of the rare gas are helium, neon, krypton, and xenon) is preferably used as the deposition gas. For example, the proportion of oxygen in the whole deposition gas is less than 50 volume %, preferably less than or equal to 33 volume %, further preferably less than or equal to 20 volume %, and still further preferably less than or equal to 15 volume %.

The vertical distance between the target 2600a and the substrate 2660 is greater than or equal to 10 mm and less than or equal to 600 mm, preferably greater than or equal to 20 mm and less than or equal to 400 mm, more preferably greater than or equal to 30 mm and less than or equal to 200 mm, further more preferably greater than or equal to 40 mm and less than or equal to 100 mm. Within the above range, the vertical distance between the target 2600a and the substrate 2660 is small enough to suppress a decrease in the energy of the sputtered particles until the sputtered particles reach the substrate 2660 in some cases. Within the above range, the vertical distance between the target 2600a and the substrate 2660 is large enough to make the incident direction of the sputtered particle approximately vertical to the substrate 2660, so that damage to the substrate 2660 caused by collision of the sputtered particles can be reduced in some cases.

The vertical distance between the target 2600b and the substrate 2660 is greater than or equal to 10 mm and less than or equal to 600 mm, preferably greater than or equal to 20 mm and less than or equal to 400 mm, more preferably greater than or equal to 30 mm and less than or equal to 200 mm, further more preferably greater than or equal to 40 mm and less than or equal to 100 mm. Within the above range, the vertical distance between the target 2600b and the substrate 2660 is small enough to suppress a decrease in the energy of the sputtered particles until the sputtered particles reach the substrate 2660 in some cases. Within the above range, the vertical distance between the target 2600b and the substrate 2660 is large enough to make the incident direction of the sputtered particle approximately vertical to the substrate 2660, so that damage to the substrate 2660 caused by collision of the sputtered particles can be reduced in some cases.

Figure 15A:
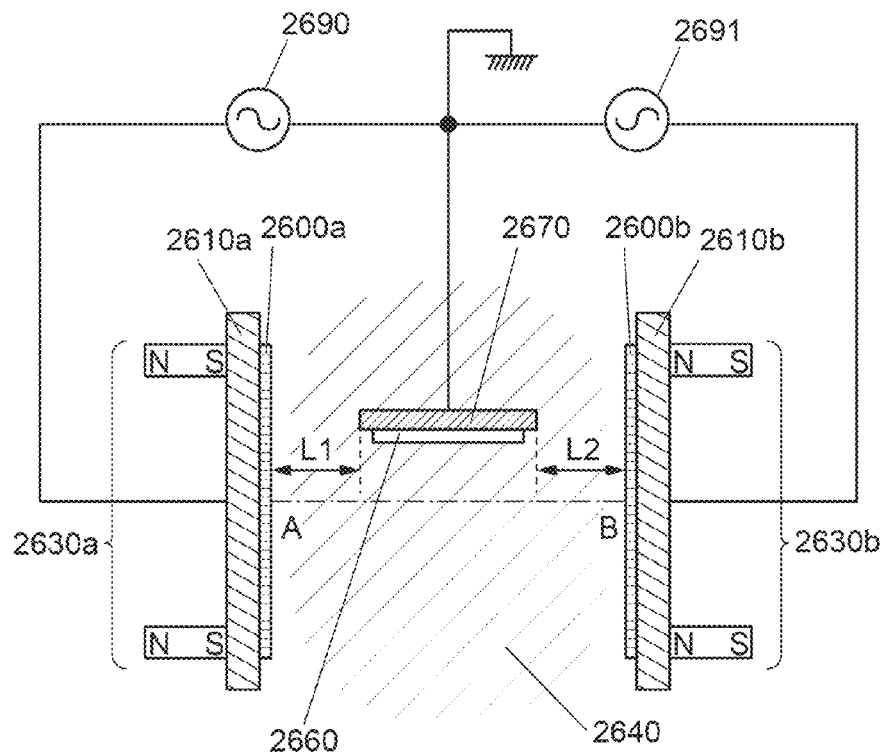
FIGS. 15A to 15C illustrate a sputtering apparatus.

FIG. 15A illustrates an example of a cross-sectional view of a deposition chamber different from those in FIG. 13A and FIG. 14A. FIG. 15A illustrates a facing-targets sputtering apparatus.

FIG. 15A is a schematic cross-sectional view of a deposition chamber of the sputtering apparatus. In the deposition chamber illustrated in FIG. 15A, the target 2600a, the target 2600b, the backing plate 2610a for holding the target 2600a, the backing plate 2610b for holding the target 2600b, the magnet unit 2630a placed on a back side of the target 2600a with the backing plate 2610a positioned therebetween, and the magnet unit 2630b placed on a back side of the target 2600b with the backing plate 2610b positioned therebetween. The substrate holder 2670 is placed between the target 2600a and the target 2600b. When the substrate 2660 is transferred into the deposition chamber, the substrate 2660 is fixed with the substrate holder 2670.

As illustrated in FIG. 15A, a power source 2690 and a power source 2691 for applying potentials are connected to the backing plates 2610a and 2610b. It is preferable to use AC power sources, which inversely apply alternate high and low potentials, as the power source 2690 connected to the backing plate 2610a and the power source 2691 connected to the backing plate 2610b. The 2640 is generated when potentials are applied to the backing plates 2610a and 2610b. Although AC power sources are used as the power sources 2690 and 2691 illustrated in FIG. 15A, one embodiment of the present invention is not limited thereto. For example, RF power sources, DC power sources, or the like can be used as the power sources 2690 and 2691. Alternatively, different kinds of power sources may be used as the power sources 2690 and 2691.

The substrate holder 2670 is preferably connected to GND. The substrate holder 2670 may be in a floating state.

Figure 15B:
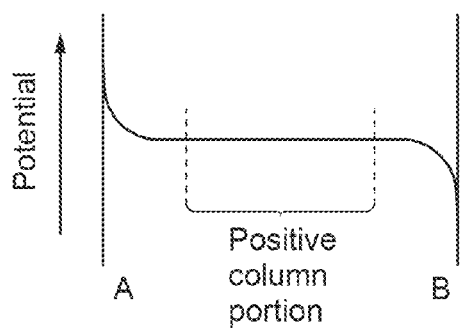
Figure 15C:
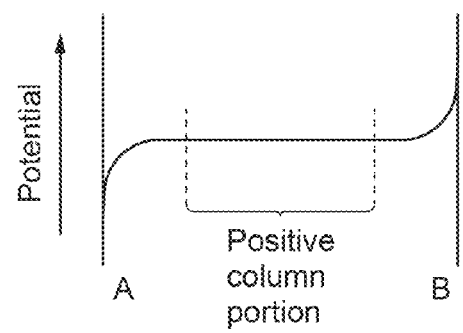

FIGS. 15B and 15C each show potential distribution of the plasma 2640 along dashed-dotted line A-B in FIG. 15A. FIG. 15B shows the potential distribution in the case where a high potential is applied to the backing plate 2610a and a low potential is applied to the backing plate 2610b. In that case, a cation is accelerated toward the target 2600b. FIG. 15C shows the potential distribution in the case where a low potential is applied to the backing plate 2610a and a high potential is applied to the backing plate 2610b. In that case, a cation is accelerated toward the target 2600a. For the deposition, the state in FIG. 15B and the state in FIG. 15C can be alternated.

The deposition is preferably performed while the plasma 2640 completely reaches the surface of the substrate 2660. For example, the substrate holder 2670 and the substrate 2660 are preferably placed in the plasma 2640 as illustrated in FIG. 15A. It is particularly preferable that the substrate holder 2670 and the substrate 2660 be placed in a positive column of the plasma 2640. The positive column of the plasma 2640 is, in each of FIGS. 15B and 15C, a region where the gradient of the potential distribution is small. When the substrate 2660 is placed in the positive column of the plasma 2640 as illustrated in FIG. 15A, the substrate 2660 is not exposed to a high electric field portion in the plasma 2640; thus, the substrate 2660 has less damage due to the plasma 2640 and has few defects.

It is preferable to place the substrate holder 2670 and the substrate 2660 in the plasma 2640 during deposition as illustrated in FIG. 15A also because utilization efficiencies of the targets 2600a and 2600b are increased.

As illustrated in FIG. 15A, the horizontal distance between the substrate holder 2670 and the target 2600a is referred to as L1 and the horizontal distance between the substrate holder 2670 and the target 2600b is referred to as L2. The distance L1 and the distance L2 are preferably the same length. In addition, it is preferable that the distances L1 and L2 be adjusted as appropriate so that the substrate 2660 is placed in the positive column of the plasma 2640 as described above. The distances L1 and L2 can each be, for example, greater than or equal to 10 mm and less than or equal to 200 mm.

In FIG. 15A, the target 2600a and the target 2600b are parallel to each other. Moreover, the magnet unit 2630a and the magnet unit 2630b are placed so that opposite poles face each other. In that case, magnetic force lines are from the magnet unit 2630b toward the magnet unit 2630a. Thus, the plasma 2640 is confined by magnetic fields formed by the magnet unit 2630a and the magnet unit 2630b during deposition. The substrate holder 2670 and the substrate 2660 are placed in a region where the target 2600a and the target 2600b face each other (region between targets). Note that although the substrate holder 2670 and the substrate 2660 are placed parallel to the direction in which the target 2600a and the target 2600b face each other in FIG. 15A, the substrate holder 2670 and the substrate 2660 may be inclined to the direction. By inclination of the substrate holder 2670 and the substrate 2660 at 30° or more and 60° or less (typified by) 45°, for example, the proportion of sputtered particles that perpendicularly reach the substrate 2660 during deposition can be increased.

Figure 16:
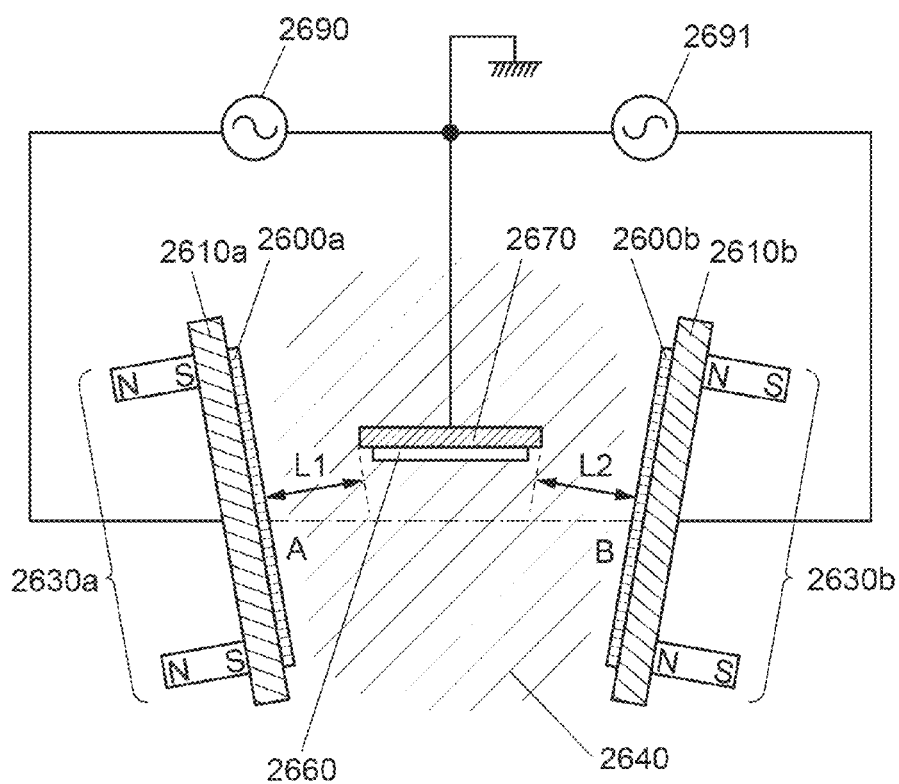
FIG. 16 illustrates a sputtering apparatus.

A structure illustrated in FIG. 16 is different from that illustrated in FIG. 15A in that the target 2600a and the target 2600b that face each other are not parallel but inclined to each other. Thus, the description for FIG. 15A is referred to for the description except for the positions of the targets. The magnet unit 2630a and the magnet unit 2630b are placed so that opposite poles face each other. The substrate holder 2670 and the substrate 2660 are placed in a region between targets. With the targets 2600a and 2600b placed as illustrated in FIG. 16, the proportion of sputtered particles that reach the substrate 2660 can be increased; accordingly, the deposition rate can be increased.

Figure 17:
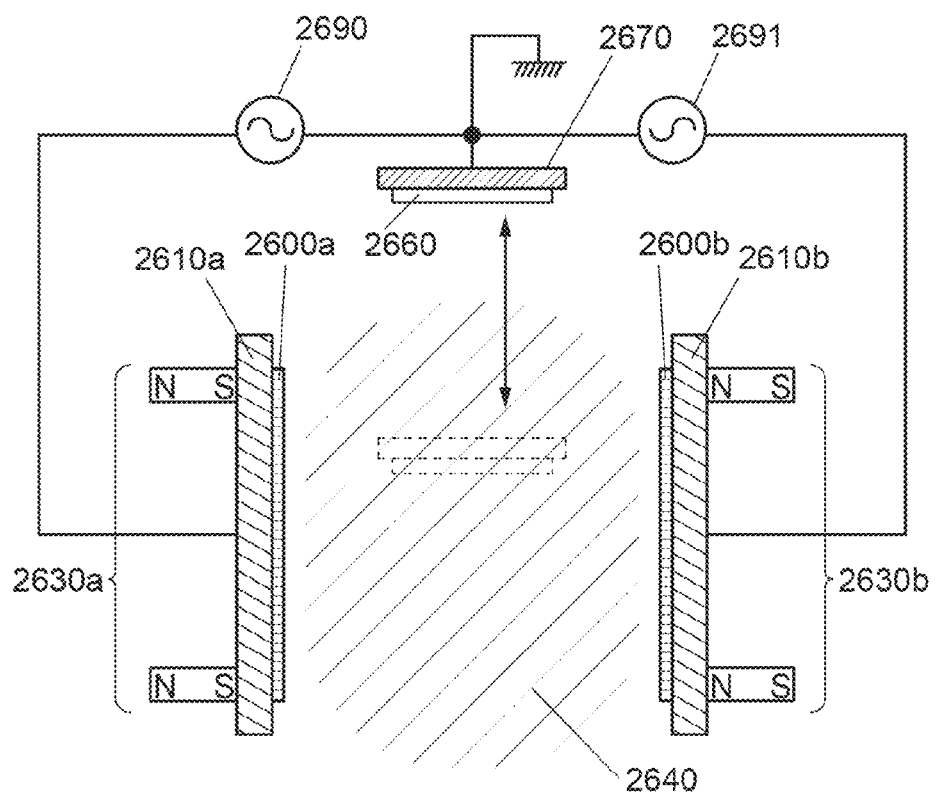
FIG. 17 illustrates a sputtering apparatus.

The positions of the substrate holder 2670 and the substrate 2660 are not limited to in the plasma 2640 as illustrated in FIG. 15A. The substrate holder 2670 and the substrate 2660 may be placed outside the plasma 2640 as illustrated in FIG. 17, for example. In that case, the substrate 2660 is not exposed to a high electric field region of the plasma 2640, leading to a reduction in damage due to the plasma 2640. Note that the utilization efficiencies of the targets 2600a and 2600b are decreased as the distance between the plasma 2640 and the substrate 2660 are increased. It is preferable that the position of the substrate holder 2670 be adjustable as illustrated in FIG. 17.

The substrate holder 2670 may be placed above a region between targets, or may be placed below the region. Alternatively, the substrate holders 2670 may be placed above and below the region. When the substrate holders 2670 are provided above and below the region, deposition on two or more substrates can be performed at once, leading to an increase in productivity. Note that the position above or below the region where the target 2600a and the target 2600b face each other can also be referred to as the side of the region where the target 2600a and the target 2600b face each other.

The facing-targets sputtering apparatus can stably generate plasma even in high vacuum. Thus, deposition can be performed at a pressure higher than or equal to 0.005 Pa and lower than or equal to 0.09 Pa, for example. As a result, the concentration of impurities contained during deposition can be reduced.

The use of the facing-targets sputtering apparatus allows deposition in high vacuum or deposition with less plasma damage and thus can provide a film with high crystallinity even when the temperature of the substrate 2660 is low (e.g., higher than or equal to 10° C. and lower than 100° C.).

Figure 18A:
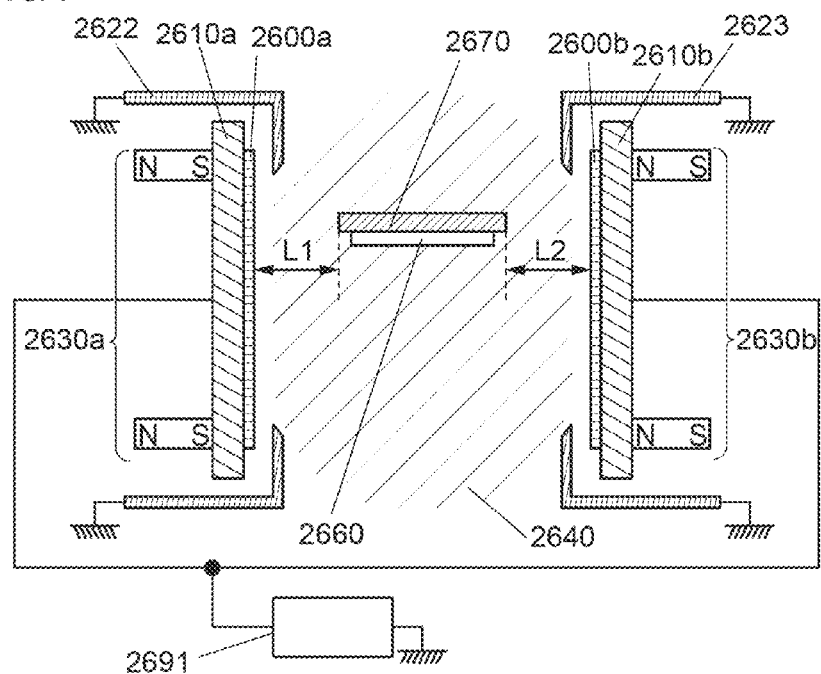
FIGS. 18A and 18B illustrate a sputtering apparatus.

FIG. 18A illustrates another example of a facing-targets sputtering apparatus.

FIG. 18A is a schematic cross-sectional view of a deposition chamber of a facing-targets sputtering apparatus. Unlike in the deposition chamber illustrated in FIG. 15A, a target shield 2622 and a target shield 2623 are provided. The power source 2691 connected to the backing plates 2610a and 2610b is also provided.

The target shields 2622 and 2623 are connected to GND as illustrated in FIG. 18A. This means that the plasma 2640 is generated by a potential difference between the backing plates 2610a and 2610b to which the potential of the power source 2691 is applied and the target shields 2622 and 2623 to which GND is applied.

The deposition is preferably performed while the plasma 2640 completely reaches the surface of the substrate 2660. For example, the substrate holder 2670 and the substrate 2660 are preferably placed in the plasma 2640 as illustrated in FIG. 18A. It is particularly preferable that the substrate holder 2670 and the substrate 2660 be placed in a positive column of the plasma 2640. The positive column of the plasma is a region where the gradient of the potential distribution is small. When the substrate 2660 is placed in the positive column of the plasma 2640 as illustrated in FIG. 18A, the substrate 2660 is not exposed to a high electric field portion in the plasma 2640; thus, damage to the substrate 2660 due to the plasma 2640 can be reduced and an oxide with a favorable film quality can be obtained.

It is preferable to place the substrate holder 2670 and the substrate 2660 in the plasma 2640 during deposition as illustrated in FIG. 18A also because utilization efficiencies of the targets 2600a and 2600b are increased.

As illustrated in FIG. 18A, the horizontal distance between the substrate holder 2670 and the target 2600a is referred to as L1 and the horizontal distance between the substrate holder 2670 and the target 2600b is referred to as L2. The distance L1 and the distance L2 are preferably the same length. In addition, it is preferable that the distances L1 and L2 be adjusted as appropriate so that the substrate 2660 is placed in the positive column of the plasma 2640 as described above.

Figure 18B:
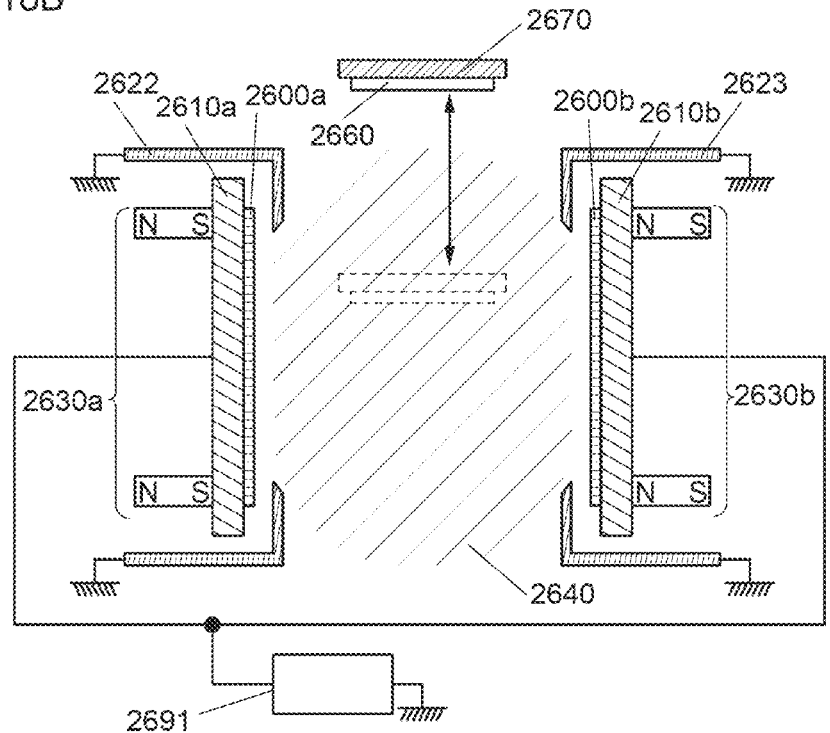

The positions of the substrate holder 2670 and the substrate 2660 are not limited to in the plasma 2640 as illustrated in FIG. 18A. The substrate holder 2670 and the substrate 2660 may be placed outside the plasma 2640 as illustrated in FIG. 18B, for example. In that case, the substrate 2660 is not exposed to a high electric field region of the plasma 2640, leading to a reduction in damage due to the plasma 2640. Note that the utilization efficiencies of the targets 2600a and 2600b are decreased as the distance between the plasma 2640 and the substrate 2660 are increased. It is preferable that the position of the substrate holder 2670 be adjustable as in FIG. 18B.

The substrate holder 2670 may be placed above a region where the target 2600a and the target 2600b face each other as illustrated in FIG. 18B, or may be placed below the region. Alternatively, the substrate holders 2670 may be placed above and below the region. Providing the substrate holders 2670 above and below the region allows deposition on two or more substrates at once, leading to an increase in productivity.

In the above-described facing-targets sputtering apparatuses, plasma is confined by magnetic fields between targets; thus, plasma damage to a substrate can be reduced. Furthermore, a deposited film can have improved step coverage because an incident angle of a sputtered particle to a substrate can be made smaller by the inclination of the target. Moreover, deposition in high vacuum enables the concentration of impurities contained in the film to be reduced.

Note that a parallel-plate-type sputtering apparatus or an ion beam sputtering apparatus may be provided in the deposition chamber.

<Deposition Apparatus>

A deposition apparatus of one embodiment of the present invention including a deposition chamber in which a sputtering target can be placed will be described below.

First, a structure of a deposition apparatus which allows the entry of few impurities into a film at the time of the deposition or the like will be described with reference to FIG. 19 and FIGS. 20A to 20C.

Figure 19:
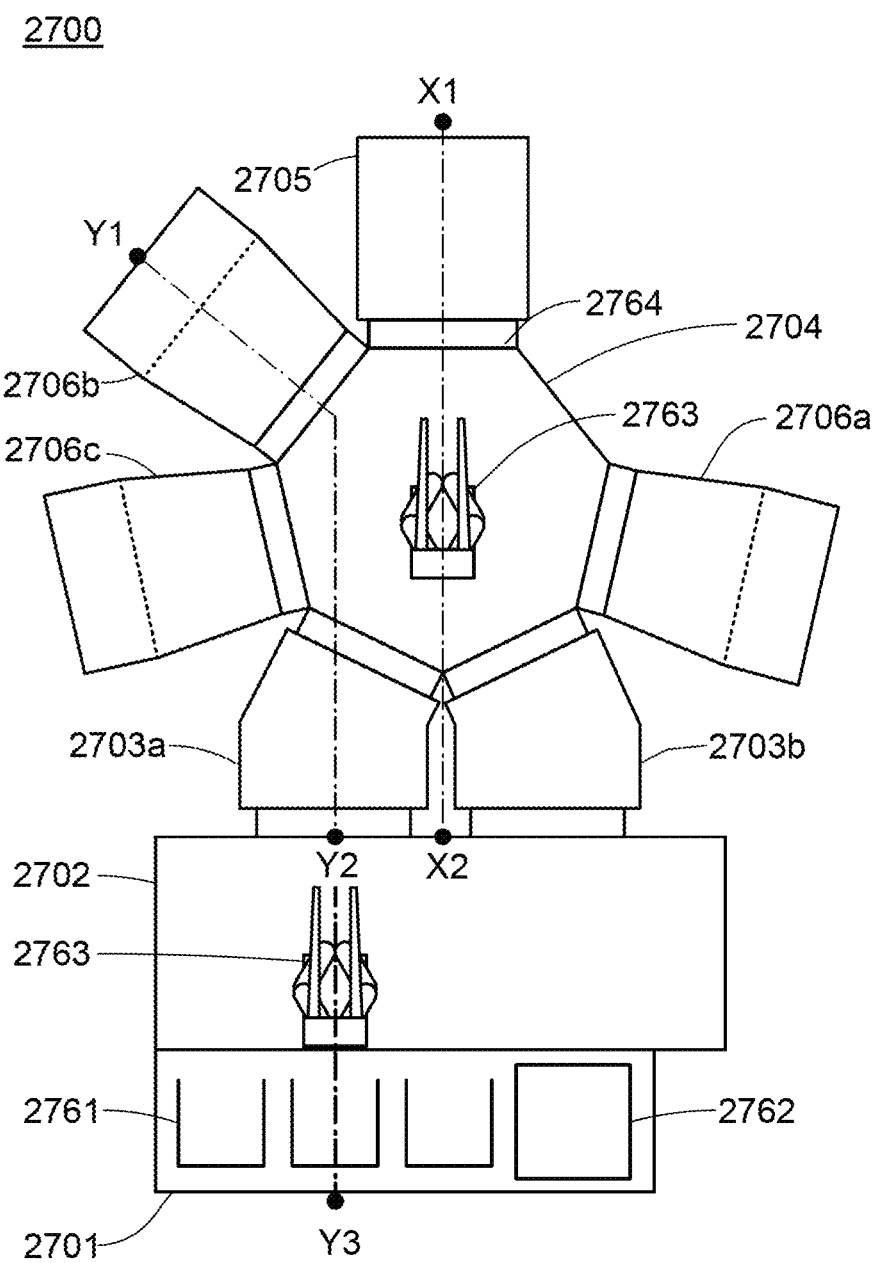
FIG. 19 is a top view illustrating an example of a deposition apparatus.

FIG. 19 is a top view schematically illustrating a single wafer multi-chamber deposition apparatus 2700. The deposition apparatus 2700 includes an atmosphere-side substrate supply chamber 2701 including a cassette port 2761 for holding a substrate and an alignment port 2762 for performing alignment of a substrate, an atmosphere-side substrate transfer chamber 2702 through which a substrate is transferred from the atmosphere-side substrate supply chamber 2701, a load lock chamber 2703a where a substrate is carried and the pressure inside the chamber is switched from atmospheric pressure to reduced pressure or from reduced pressure to atmospheric pressure, an unload lock chamber 2703b where a substrate is carried out and the pressure inside the chamber is switched from reduced pressure to atmospheric pressure or from atmospheric pressure to reduced pressure, a transfer chamber 2704 through which a substrate is transferred in a vacuum, a substrate heating chamber 2705 where a substrate is heated, and deposition chambers 2706a, 2706b, and 2706c in each of which a target is placed for deposition. Note that the deposition chambers 2706a, 2706b, and 2706c each have a structure similar to the structure of any of the above-described deposition chambers.

The atmosphere-side substrate transfer chamber 2702 is connected to the load lock chamber 2703a and the unload lock chamber 2703b, the load lock chamber 2703a and the unload lock chamber 2703b are connected to the transfer chamber 2704, and the transfer chamber 2704 is connected to the substrate heating chamber 2705 and the deposition chambers 2706a, 2706b, and 2706c.

Gate valves 2764 are provided for connecting portions between chambers so that each chamber except the atmosphere-side substrate supply chamber 2701 and the atmosphere-side substrate transfer chamber 2702 can be independently kept under vacuum. Moreover, the atmosphere-side substrate transfer chamber 2702 and the transfer chamber 2704 each include a transfer robot 2763, with which a substrate can be transferred.

Furthermore, it is preferable that the substrate heating chamber 2705 also function as a plasma treatment chamber. In the deposition apparatus 2700, it is possible to transfer a substrate without exposure to the air between treatment and treatment; therefore, adsorption of impurities on a substrate can be suppressed. In addition, the order of deposition, heat treatment, or the like can be freely determined. Note that the number of the transfer chambers, the number of the deposition chambers, the number of the load lock chambers, the number of the unload lock chambers, and the number of the substrate heating chambers are not limited to the above, and the numbers thereof can be set as appropriate depending on the space for placement or the process conditions.

Figure 20A:
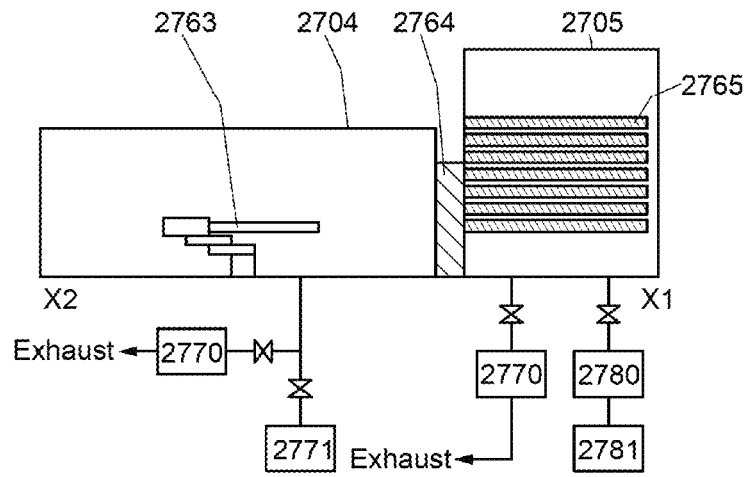
FIGS. 20A to 20C are cross-sectional views each illustrating an example of a deposition apparatus.
Figure 20B:
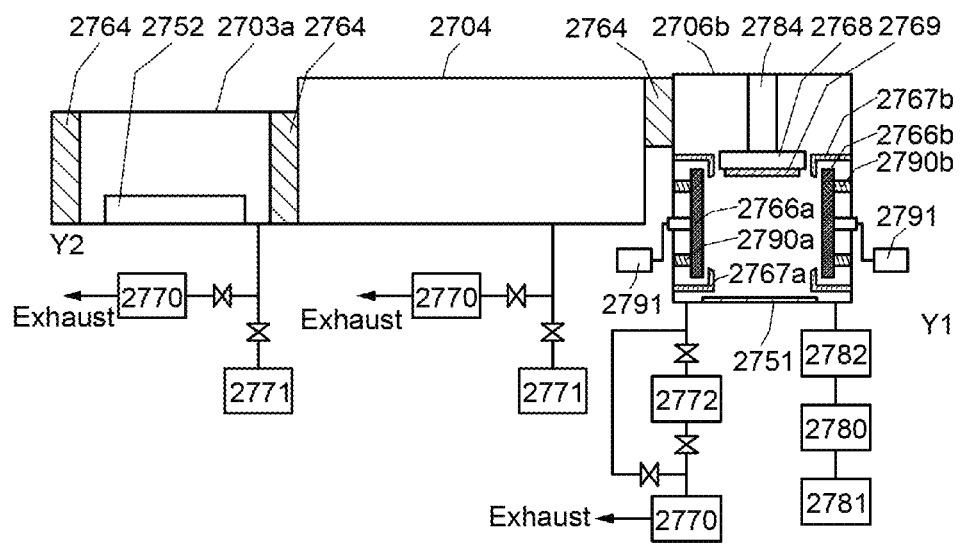
Figure 20C:
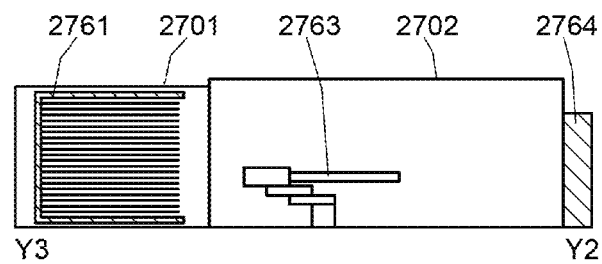

Next, FIG. 20A, FIG. 20B, and FIG. 20C are a cross-sectional view taken along dashed-dotted line X1-X2, a cross-sectional view taken along dashed-dotted line Y1-Y2, and a cross-sectional view taken along dashed-dotted line Y2-Y3, respectively, in the deposition apparatus 2700 illustrated in FIG. 19.

FIG. 20A is a cross section of the substrate heating chamber 2705 and the transfer chamber 2704, and the substrate heating chamber 2705 includes a plurality of heating stages 2765 which can hold a substrate. Furthermore, the substrate heating chamber 2705 is connected to a vacuum pump 2770 through a valve. As the vacuum pump 2770, a dry pump and a mechanical booster pump can be used, for example.

As heating mechanism which can be used for the substrate heating chamber 2705, a resistance heater may be used for heating, for example. Alternatively, heat conduction or heat radiation from a medium such as a heated gas may be used as the heating mechanism. For example, rapid thermal annealing (RTA) such as gas rapid thermal annealing (GRTA) or lamp rapid thermal annealing (LRTA) can be used. The LRTA is a method for heating an object by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. In the GRTA, heat treatment is performed using a high-temperature gas. An inert gas is used as the gas.

Moreover, the substrate heating chamber 2705 is connected to a refiner 2781 through a mass flow controller 2780. Note that although the mass flow controller 2780 and the refiner 2781 can be provided for each of a plurality of kinds of gases, only one mass flow controller 2780 and one refiner 2781 are provided for easy understanding. As the gas introduced to the substrate heating chamber 2705, a gas whose dew point is −80° C. or lower, preferably −100° C. or lower can be used; for example, an oxygen gas, a nitrogen gas, and a rare gas (e.g., an argon gas) are used.

The transfer chamber 2704 includes the transfer robot 2763. The transfer robot 2763 can transfer a substrate to each chamber. Furthermore, the transfer chamber 2704 is connected to the vacuum pump 2770 and a cryopump 2771 through valves. Owing to such a structure, exhaust is performed using the vacuum pump 2770 until the pressure inside the transfer chamber 2704 becomes in the range of atmospheric pressure to low or medium vacuum (approximately 0.1 Pa to several hundred pascals) and then the valves are switched so that exhaust is performed using the cryopump 2771 until the pressure inside the transfer chamber 2704 becomes in the range of middle vacuum to high or ultra-high vacuum (0.1 Pa to $1 \times 10^{-7}$ Pa).

Alternatively, two or more cryopumps 2771 may be connected in parallel to the transfer chamber 2704. With such a structure, even when one of the cryopumps is in regeneration, exhaust can be performed using any of the other cryopumps. Note that the above regeneration refers to treatment for discharging molecules (or atoms) entrapped in the cryopump. When molecules (or atoms) are entrapped too much in a cryopump, the exhaust capability of the cryopump is lowered; therefore, regeneration is performed regularly.

FIG. 20B is a cross section of the deposition chamber 2706b, the transfer chamber 2704, and the load lock chamber 2703a.

Here, the details of the deposition chamber (sputtering chamber) are described with reference to FIG. 20B. The deposition chamber 2706b illustrated in FIG. 20B includes a target 2766a, a target 2766b, a target shield 2767a, a target shield 2767b, a magnet unit 2790a, a magnet unit 2790b, a substrate holder 2768, and power sources 2791. Although not illustrated, each of the target 2766a and the target 2766b is fixed to a target holder with a backing plate provided therebetween. The power source 2791 is electrically connected to each of the target 2766a and the target 2766b. The magnet unit 2790a is placed on a back side of the target 2766a and the magnet unit 2790b is placed on a back side of the target 2766b. The target shield 2767a is provided to surround an end portion of the target 2766a and the target shield 2767b is provided to surround an end portion of target 2766b. Note that here, a substrate 2769 is supported by the substrate holder 2768. The substrate holder 2768 is fixed to the deposition chamber 2706b by an adjustment member 2784. Owing to the adjustment member 2784, the substrate holder 2768 can move to a region between the target 2766a and the target 2766b (region between targets). Providing the substrate holder 2768 supporting the substrate 2769 in the region between targets can reduce damage due to plasma in some cases, for example. Although not illustrated, the substrate holder 2768 may include a substrate holding mechanism which holds the substrate 2769, a heater which heats the substrate 2769 from the back side, or the like.

The target shields 2767 can suppress deposition of a particle which is sputtered from the target 2766 on a region where deposition is not needed. Moreover, the target shields 2767 are preferably processed to prevent accumulated sputtered particles from being separated. For example, blasting treatment which increases surface roughness may be performed, or roughness may be formed on the surfaces of the target shields 2767.

The deposition chamber 2706b is connected to the mass flow controller 2780 through a gas heating mechanism 2782, and the gas heating mechanism 2782 is connected to the refiner 2781 through the mass flow controller 2780. With the gas heating mechanism 2782, a gas which is introduced to the deposition chamber 2706b can be heated to a temperature higher than or equal to 40° C. and lower than or equal to 400° C. Note that although the gas heating mechanism 2782, the mass flow controller 2780, and the refiner 2781 can be provided for each of a plurality of kinds of gases, only one gas heating mechanism 2782, one mass flow controller 2780, and one refiner 2781 are provided for easy understanding. As the gas introduced to the deposition chamber 2706b, a gas whose dew point is −80° C. or lower, preferably −100° C. or lower can be used; for example, an oxygen gas, a nitrogen gas, and a rare gas (e.g., an argon gas) are used.

In the case where the refiner is provided near a gas inlet, the length of a pipe between the refiner and the deposition chamber 2706b is less than or equal to 10 m, preferably less than or equal to 5 m, and further preferably less than or equal to 1 m. When the length of the pipe is less than or equal to 10 m, less than or equal to 5 m, or less than or equal to 1 m, the effect of the release of gas from the pipe can be reduced accordingly. As the pipe for the gas, a metal pipe the inside of which is covered with iron fluoride, aluminum oxide, chromium oxide, or the like can be used. With the above pipe, the amount of released gas containing impurities is made small and the entry of impurities into the gas can be reduced as compared with a SUS316L-EP pipe, for example. Furthermore, a high-performance ultra-compact metal gasket joint (UPG joint) may be used as a joint of the pipe. A structure where all the materials of the pipe are metals is preferable because the effect of the generated released gas or the external leakage can be reduced as compared with a structure where a resin or the like is used.

The deposition chamber 2706b is connected to a turbo molecular pump 2772 and the vacuum pump 2770 through valves.

In addition, the deposition chamber 2706b is provided with a cryotrap 2751.

The cryotrap 2751 is a mechanism which can adsorb a molecule (or an atom) having a relatively high melting point, such as water. The turbo molecular pump 2772 is capable of stably removing a large-sized molecule (or atom), needs low frequency of maintenance, and thus enables high productivity, whereas it has a low capability in removing hydrogen and water. Hence, the cryotrap 2751 is connected to the deposition chamber 2706b so as to have a high capability in removing water or the like. The temperature of a freezer of the cryotrap 2751 is set to be lower than or equal to 100 K, preferably lower than or equal to 80 K. In the case where the cryotrap 2751 includes a plurality of freezers, it is preferable to set the temperatures of the freezers at different temperatures because efficient exhaust is possible. For example, the temperature of a first-stage freezer may be set to be lower than or equal to 100 K and the temperature of a second-stage freezer may be set to be lower than or equal to 20 K. Note that when a titanium sublimation pump is used instead of the cryotrap, a higher vacuum can be achieved in some cases.

Using an ion pump instead of a cryopump or a turbo molecular pump can also achieve higher vacuum in some cases.

Note that the exhaust method of the deposition chamber 2706b is not limited to the above, and a structure similar to that in the exhaust method described above for the transfer chamber 2704 (the exhaust method using the cryopump and the vacuum pump) may be employed. Needless to say, the exhaust method of the transfer chamber 2704 may have a structure similar to that of the deposition chamber 2706b (the exhaust method using the turbo molecular pump and the vacuum pump).

Note that in each of the transfer chamber 2704, the substrate heating chamber 2705, and the deposition chamber 2706b which are described above, the back pressure (total pressure) and the partial pressure of each gas molecule (atom) are preferably set as follows. In particular, the back pressure and the partial pressure of each gas molecule (atom) in the deposition chamber 2706b need to be noted because impurities might enter a film to be formed.

In each of the above chambers, the back pressure (total pressure) is less than or equal to $1 \times 10^{-4}$ Pa, preferably less than or equal to $3 \times 10^{-5}$ Pa, and further preferably less than or equal to $1 \times 10^{-5}$ Pa. In each of the above chambers, the partial pressure of a gas molecule (atom) having a mass-to-charge ratio (m/z) of 18 is less than or equal to $3 \times 10^{-5}$ Pa, preferably less than or equal to $1 \times 10^{-5}$ Pa, and further preferably less than or equal to $3 \times 10^{-6}$ Pa. Moreover, in each of the above chambers, the partial pressure of a gas molecule (atom) having a mass-to-charge ratio (m/z) of 28 is less than or equal to $3 \times 10^{-5}$ Pa, preferably less than or equal to $1 \times 10^{-5}$ Pa, and further preferably less than or equal to $3 \times 10^{-6}$ Pa. Furthermore, in each of the above chambers, the partial pressure of a gas molecule (atom) having a mass-to-charge ratio (m/z) of 44 is less than or equal to $3 \times 10^{-5}$ Pa, preferably less than or equal to $1 \times 10^{-5}$ Pa, and further preferably less than or equal to $3 \times 10^{-6}$ Pa.

Note that a total pressure and a partial pressure in a vacuum chamber can be measured using a mass analyzer. For example, Qulee CGM-051, a quadrupole mass analyzer (also referred to as Q-mass) manufactured by ULVAC, Inc. may be used.

Moreover, the transfer chamber 2704, the substrate heating chamber 2705, and the deposition chamber 2706b which are described above preferably have a small amount of external leakage or internal leakage.

For example, in each of the transfer chamber 2704, the substrate heating chamber 2705, and the deposition chamber 2706b which are described above, the leakage rate is less than or equal to $3 \times 10^{-6}$ Pa·m³/s, and preferably less than or equal to $1 \times 10^{-6}$ Pa·m³/s. The leakage rate of a gas molecule (atom) having a mass-to-charge ratio (m/z) of 18 is less than or equal to $1 \times 10^{-7}$ Pa·m³/s, and preferably less than or equal to $3 \times 10^{-8}$ Pa·m³/s. The leakage rate of a gas molecule (atom) having a mass-to-charge ratio (m/z) of 28 is less than or equal to $1 \times 10^{-5}$ Pa·m³/s, and preferably less than or equal to $1 \times 10^{-6}$ Pa·m³/s. The leakage rate of a gas molecule (atom) having a mass-to-charge ratio (m/z) of 44 is less than or equal to $3 \times 10^{-6}$ Pa·m³/s, and preferably less than or equal to $1 \times 10^{-6}$ Pa·m³/s.

Note that a leakage rate can be derived from the total pressure and partial pressure measured using the mass analyzer.

The leakage rate depends on external leakage and internal leakage. The external leakage refers to inflow of gas from the outside of a vacuum system through a minute hole, a sealing defect, or the like. The internal leakage is due to leakage through a partition, such as a valve, in a vacuum system or due to released gas from an internal member. Measures need to be taken from both aspects of external leakage and internal leakage in order that the leakage rate can be set to be less than or equal to the above value.

For example, an open/close portion of the deposition chamber 2706b can be sealed with a metal gasket. For the metal gasket, metal covered with iron fluoride, aluminum oxide, or chromium oxide is preferably used. The metal gasket realizes higher adhesion than an O-ring, and can reduce the external leakage. Furthermore, with the use of the metal covered with iron fluoride, aluminum oxide, chromium oxide, or the like, which is in the passive state, the release of gas containing impurities released from the metal gasket is suppressed, so that the internal leakage can be reduced.

For a member of the deposition apparatus 2700, aluminum, chromium, titanium, zirconium, nickel, or vanadium, which releases a smaller amount of gas containing impurities, is used. Alternatively, for the above member, an alloy containing iron, chromium, nickel, and the like covered with the above material may be used. The alloy containing iron, chromium, nickel, and the like is rigid, resistant to heat, and suitable for processing. Here, when surface unevenness of the member is decreased by polishing or the like to reduce the surface area, the release of gas can be reduced.

Alternatively, the above member of the deposition apparatus 2700 may be covered with iron fluoride, aluminum oxide, chromium oxide, or the like.

The member of the deposition apparatus 2700 is preferably formed using only metal when possible. For example, in the case where a viewing window formed with quartz or the like is provided, it is preferable that the surface of the viewing window be thinly covered with iron fluoride, aluminum oxide, chromium oxide, or the like so as to suppress release of gas.

When an adsorbed substance is present in the deposition chamber, the adsorbed substance does not affect the pressure in the deposition chamber because it is adsorbed onto an inner wall or the like; however, the adsorbed substance causes gas to be released when the inside of the deposition chamber is evacuated. Therefore, although there is no correlation between the leakage rate and the exhaust rate, it is important that the adsorbed substance present in the deposition chamber be desorbed as much as possible and exhaust be performed in advance with the use of a pump with high exhaust capability. Note that the deposition chamber may be subjected to baking to promote desorption of the adsorbed substance. By the baking, the desorption rate of the adsorbed substance can be increased about tenfold. The baking can be performed at a temperature in the range of 100° C. to 450° C. At this time, when the adsorbed substance is removed while an inert gas is introduced to the deposition chamber, the desorption rate of water or the like, which is difficult to be desorbed simply by exhaust, can be further increased. Note that when the inert gas which is introduced is heated to substantially the same temperature as the baking temperature, the desorption rate of the adsorbed substance can be further increased. Here, a rare gas is preferably used as an inert gas. Depending on the kind of a film to be deposited, oxygen or the like may be used instead of an inert gas. For example, in deposition of an oxide, the use of oxygen which is the main component of the oxide is preferable in some cases. The baking is preferably performed using a lamp.

Alternatively, treatment for evacuating the inside of the deposition chamber is preferably performed a certain period of time after heated oxygen, a heated inert gas such as a heated rare gas, or the like is introduced to increase a pressure in the deposition chamber. The introduction of the heated gas can desorb the adsorbed substance in the deposition chamber, and the impurities present in the deposition chamber can be reduced. Note that an advantageous effect can be achieved when this treatment is repeated more than or equal to 2 times and less than or equal to 30 times, preferably more than or equal to 5 times and less than or equal to 15 times. Specifically, an inert gas, oxygen, or the like with a temperature higher than or equal to 40° C. and lower than or equal to 400° C., preferably higher than or equal to 50° C. and lower than or equal to 200° C. is introduced to the deposition chamber, so that the pressure therein can be kept to be greater than or equal to 0.1 Pa and less than or equal to 10 kPa, preferably greater than or equal to 1 Pa and less than or equal to 1 kPa, further preferably greater than or equal to 5 Pa and less than or equal to 100 Pa in the time range of 1 minute to 300 minutes, preferably 5 minutes to 120 minutes. After that, the inside of the deposition chamber is evacuated in the time range of 5 minutes to 300 minutes, preferably 10 minutes to 120 minutes.

The desorption rate of the adsorbed substance can be further increased also by dummy deposition. Here, the dummy deposition refers to deposition on a dummy substrate by a sputtering method or the like, in which a film is deposited on the dummy substrate and the inner wall of the deposition chamber so that impurities in the deposition chamber and an adsorbed substance on the inner wall of the deposition chamber are confined in the film. For a dummy substrate, a substrate which releases a smaller amount of gas is preferably used. By performing dummy deposition, the concentration of impurities in a film to be formed later can be reduced. Note that the dummy deposition may be performed at the same time as the baking of the deposition chamber.

Next, the details of the transfer chamber 2704 and the load lock chamber 2703a illustrated in FIG. 20B and the atmosphere-side substrate transfer chamber 2702 and the atmosphere-side substrate supply chamber 2701 illustrated in FIG. 20C are described. Note that FIG. 20C is a cross section of the atmosphere-side substrate transfer chamber 2702 and the atmosphere-side substrate supply chamber 2701.

For the transfer chamber 2704 illustrated in FIG. 20B, the description of the transfer chamber 2704 illustrated in FIG. 20A can be referred to.

The load lock chamber 2703a includes a substrate delivery stage 2752. When a pressure in the load lock chamber 2703a becomes atmospheric pressure by being increased from reduced pressure, the substrate delivery stage 2752 receives a substrate from the transfer robot 2763 provided in the atmosphere-side substrate transfer chamber 2702. After that, the load lock chamber 2703a is evacuated into vacuum so that the pressure therein becomes reduced pressure and then the transfer robot 2763 provided in the transfer chamber 2704 receives the substrate from the substrate delivery stage 2752.

Furthermore, the load lock chamber 2703a is connected to the vacuum pump 2770 and the cryopump 2771 through valves. For a method for connecting exhaust systems such as the vacuum pump 2770 and the cryopump 2771, the description of the method for connecting the transfer chamber 2704 can be referred to, and the description thereof is omitted here. Note that the unload lock chamber 2703b illustrated in FIG. 19 can have a structure similar to that in the load lock chamber 2703a.

The atmosphere-side substrate transfer chamber 2702 includes the transfer robot 2763. The transfer robot 2763 can deliver a substrate from the cassette port 2761 to the load lock chamber 2703a or deliver a substrate from the load lock chamber 2703a to the cassette port 2761. Furthermore, a mechanism for suppressing entry of dust or a particle, such as high efficiency particulate air (HEPA) filter, may be provided above the atmosphere-side substrate transfer chamber 2702 and the atmosphere-side substrate supply chamber 2701.

The atmosphere-side substrate supply chamber 2701 includes a plurality of cassette ports 2761. The cassette port 2761 can hold a plurality of substrates.

The surface temperature of the target is set to be lower than or equal to 100° C., preferably lower than or equal to 50° C., and further preferably about room temperature (typified by 25° C.). In a sputtering apparatus for a large substrate, a large target is often used. However, it is difficult to form a target for a large substrate without a juncture. In reality, a plurality of targets are tightly arranged to obtain a large target; however, a slight space inevitably exists. When the surface temperature of the target increases, in some cases, zinc or the like is volatilized from such a slight space and the space might gradually expand. When the space expands, a metal of a backing plate or a metal contained in a bonding agent used for adhesion of the backing plate to a target might be sputtered and might cause an increase in impurity concentration. Thus, it is preferable that the target be cooled sufficiently.

To efficiently cool the target, a metal having high conductivity and a high heat dissipation property (specifically copper) is used for the backing plate, or a sufficient amount of cooling water is made to flow through a water channel formed in the backing plate.

Note that in the case where the target contains zinc, plasma damage is alleviated by deposition in an oxygen gas atmosphere; thus, an oxide in which zinc is unlikely to be volatilized can be obtained.

The above-described deposition apparatus enables deposition of an oxide semiconductor whose hydrogen concentration measured by secondary ion mass spectrometry (SIMS) is lower than or equal to $2 \times 10^{20}$ atoms/cm$^3$, preferably lower than or equal to $5 \times 10^{19}$ atoms/cm$^3$, further preferably lower than or equal to $1 \times 10^{19}$ atoms/cm$^3$, and still further preferably lower than or equal to $5 \times 10^{18}$ atoms/cm$^3$.

Furthermore, an oxide semiconductor whose nitrogen concentration measured by SIMS is lower than $5 \times 10^{19}$ atoms/cm$^3$, preferably lower than or equal to $1 \times 10^{19}$ atoms/cm$^3$, further preferably lower than or equal to $5 \times 10^{18}$ atoms/cm$^3$, and still further preferably lower than or equal to $1 \times 10^{18}$ atoms/cm$^3$ can be deposited.

Moreover, an oxide semiconductor whose carbon concentration measured by SIMS is lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, and still further preferably lower than or equal to $5 \times 10^{17}$ atoms/cm$^3$ can be deposited.

The oxide semiconductor having small amounts of impurities and oxygen vacancies has low carrier density (specifically, lower than $8 \times 10^{11}$/cm$^3$, preferably lower than $1 \times 10^{11}$/cm$^3$, further preferably lower than $1 \times 10^{10}$/cm$^3$, and is higher than or equal to $1 \times 10^{-9}$/cm$^3$). Such an oxide semiconductor is referred to as a highly purified intrinsic or substantially highly purified intrinsic oxide semiconductor.

Furthermore, an oxide semiconductor can be deposited in which the released amount of each of the following gas molecules (atoms) measured by TDS is less than or equal to $1\times10^{19}/cm^3$ and preferably less than or equal to $1\times10^{18}/cm^3$: a gas molecule (atom) having a mass-to-charge ratio (m/z) of 2 (e.g., a hydrogen molecule), a gas molecule (atom) having a mass-to-charge ratio (m/z) of 18, a gas molecule (atom) having a mass-to-charge ratio (m/z) of 28, and a gas molecule (atom) having a mass-to-charge ratio (m/z) of 44.

With the above deposition apparatus, entry of impurities into the oxide semiconductor can be suppressed. Furthermore, when a film in contact with the oxide semiconductor is formed with the use of the above deposition apparatus, the entry of impurities into the oxide semiconductor from the film in contact therewith can be suppressed.

The insulator 136a can be deposited using the above-described sputtering apparatus. The insulator 136a is preferably deposited by a sputtering method, particularly by a sputtering method in an atmosphere containing oxygen. When the insulator 136a is deposited by a sputtering method, oxygen 135 might be added to a surface of the insulator 104 (interface between the insulator 106a and the insulator 104, after the deposition of the insulator 106a) and the vicinity thereof during the deposition. Although the oxygen 135 is added to the insulator 104 as an oxygen radical here, for example, the state of the oxygen 135 at the time of being added is not limited thereto. The oxygen 135 may be added to the insulator 104 as an oxygen atom, an oxygen ion, or the like.

A mixed region 134 might be formed in a region in the vicinity of the interface between the insulator 104 and the insulator 136a. The mixed region 134 contains a component of the insulator 104 and a component of the insulator 136a. Since the mixed region 134 is formed in the vicinity of the interface between the insulator 104 and the insulator 136a, the concentration of the oxygen 135 is higher in the mixed region 134 than in a layer below the mixed region 134.

Next, a semiconductor 136b to be the semiconductor 106b in a later step is deposited. For the semiconductor 136b, the above-described semiconductor that can be used for the semiconductor 106b can be used. The semiconductor 136b can be deposited by a sputtering method, a CVD method, an MBE method, a PLD method, an ALD method, or the like, or can be deposited by a PESP method or a VDSP method using the above-described sputtering apparatus. Note that the insulator 136a and the semiconductor 136b are successively deposited without being exposed to the air, in which case impurities can be prevented from entering the films and the interface therebetween.

Figure 9A:
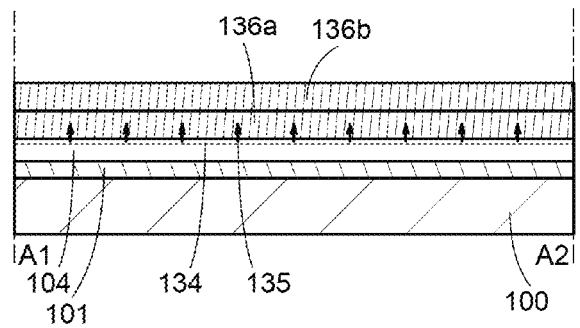
FIGS. 9A to 9F are cross-sectional views illustrating a method for manufacturing a transistor of one embodiment of the present invention.
Figure 9B:
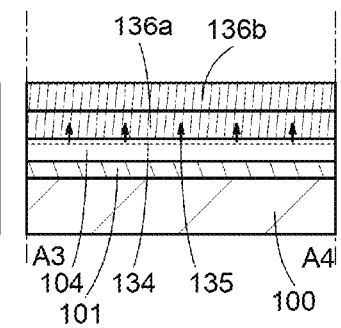

Then, heat treatment is preferably performed (see FIGS. 9A and 9B). The heat treatment can reduce the hydrogen concentration in the insulator 136a and the semiconductor 136b in some cases. The heat treatment can reduce oxygen vacancies in the insulator 136a and the semiconductor 136b in some cases. The heat treatment here is performed at a temperature higher than or equal to 250° C. and lower than or equal to 650° C. and preferably higher than or equal to 350° C. and lower than or equal to 450° C. The heat treatment is performed in an inert gas atmosphere or an atmosphere containing an oxidizing gas at 10 ppm or more, 1% or more, or 10% or more. The heat treatment may be performed under a reduced pressure. Alternatively, the heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate desorbed oxygen. The heat treatment can increase the crystallinity of the insulator 136a and the semiconductor 136b and can remove impurities, such as hydrogen and water, for example. For the heat treatment, lamp heating can be performed with the use of an RTA apparatus.

The oxygen 135 is supplied from the insulator 104 to the insulator 136a by the heat treatment (see FIGS. 9A and 9B). Owing to the heat treatment performed on the insulator 104, the oxygen 135 can be supplied to the insulator 136a very easily. In this manner, the oxygen 135 can be diffused into the insulator 136a from the insulator 104, mainly from the mixed region 134 with a high concentration of the oxygen 135.

Here, the insulator 101 is an insulator that transmits less oxygen than the insulator 104 and functions as a barrier film that blocks oxygen. The insulator 101 is provided below the insulator 104, thereby preventing the oxygen 131 diffused in the insulator 104 from being diffused below the insulator 104.

Oxygen is supplied to the insulator 136a to reduce oxygen vacancies in this manner, whereby a highly purified intrinsic or substantially highly purified intrinsic oxide semiconductor with a low density of defect states can be obtained.

Furthermore, high-density plasma treatment or the like may be performed. High-density plasma may be generated using microwaves. For the high-density plasma treatment, an oxidation gas such as oxygen or nitrous oxide may be used, for example. Alternatively, a mixed gas of an oxidation gas and a rare gas such as He, Ar, Kr, or Xe may be used. In the high-density plasma treatment, a bias may be applied to the substrate, in which case oxygen ions or the like in the plasma can be attracted to the substrate side. The high-density plasma treatment may be performed while the substrate is heated. In the case where the high-density plasma treatment is performed instead of the heat treatment, for example, an effect similar to that of the heat treatment can be obtained at lower temperatures. The high-density plasma treatment may be performed before the deposition of the insulator 136a, after the deposition of the insulator 112b, or after the deposition of the insulator 118.

Figure 9C:
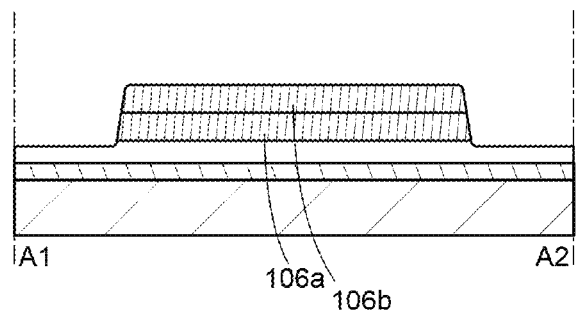
Figure 9D:
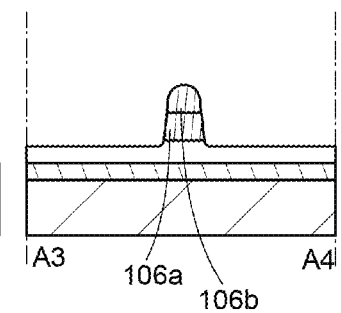

Next, a resist or the like is formed over the semiconductor 136b and processing is performed using the resist or the like, whereby the insulator 106a and the semiconductor 106b are formed (see FIGS. 9C and 9D). Note that the case where the resist is simply formed also includes the case where an anti-reflective layer is formed below the resist.

The resist or the like is removed after the object is processed by etching or the like. For the removal of the resist or the like, plasma treatment and/or wet etching are/is used. As the plasma treatment, plasma ashing is preferable. In the case where the removal of the resist or the like is not enough, the remaining resist or the like may be removed using ozone water and/or hydrofluoric acid at a concentration higher than or equal to 0.001 volume % and lower than or equal to 1 volume %, and the like.

Next, a conductor 108 to be the conductors 108a and 108b in a later step is deposited. For the conductor 108, the above-described conductor that can be used for the conductor 108a and the conductor 108b can be used. The conductor can be deposited by a sputtering method, a CVD method, an MBE method, a PLD method, an ALD method, or the like.

A low-resistance region 107 might be formed in a region where the insulator 106a or the semiconductor 106b is in contact with the conductor 108.

Figure 9E:
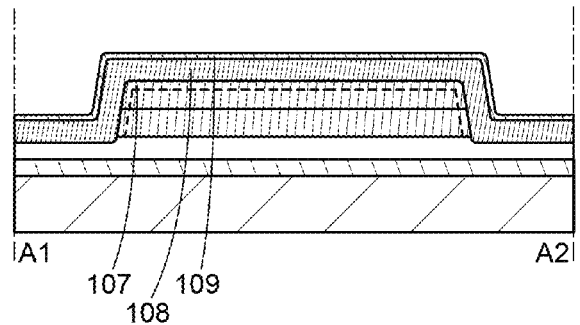
Figure 9F:
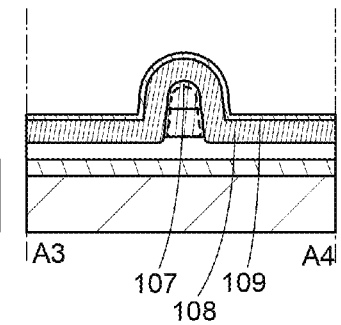

Then, a conductor 109 to be the conductors 109a and 109b in a later step is deposited (see FIGS. 9E and 9F). For the conductor 109, the above-described conductor that can be used for the conductor 109a and the conductor 109b can be used. The conductor can be deposited by a sputtering method, a CVD method, an MBE method, a PLD method, an ALD method, or the like.

Figure 10A:
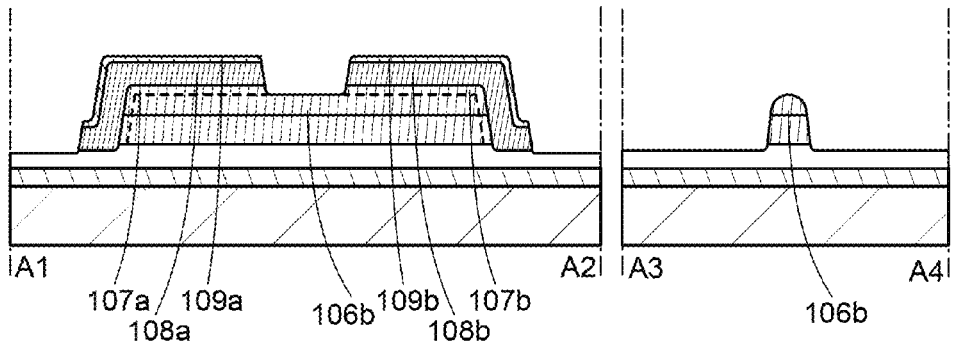
FIGS. 10A to 10F are cross-sectional views illustrating a method for manufacturing a transistor of one embodiment of the present invention.
Figure 10B:
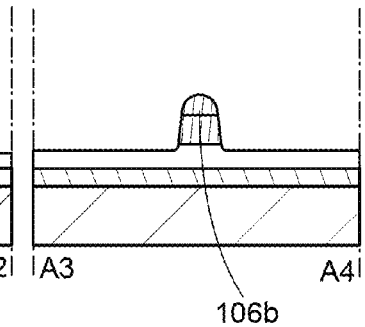

Next, a resist or the like is formed over the conductors and processing is performed using the resist or the like, whereby the conductor 108a, the conductor 108b, the conductor 109a, and the conductor 109b are formed (see FIGS. 10A and 10B). In the case where the low-resistance region 107 has been formed, the low-resistance region 107a and the low-resistance region 107b might be formed through the processing.

The semiconductor 106b might be formed might have, between the conductor 108a and the conductor 108b, a region thinner than regions overlapping with the conductor 108a and the conductor 108b. The thin region is formed because part of the top surface of the semiconductor 106b is removed during formation of the conductor 108a and the conductor 108b. The low-resistance region 107 formed in the part of the top surface is also removed, whereby the low-resistance region 107a and the low-resistance region 107b are formed.

Next, an insulator to be the insulator 112a in a later step is deposited. For the insulator to be the insulator 112a in the later step, the above-described insulator that can be used for the insulator 112a can be used. The insulator that can be used for the insulator 112a can be deposited by a sputtering method, a CVD method, an MBE method, a PLD method, an ALD method, or the like.

Next, an insulator to be the insulator 112b in a later step is deposited. For the insulator to be the insulator 112b in the later step, the above-described insulator that can be used for the insulator 112b can be used. The insulator that can be used for the insulator 112b can be deposited by a sputtering method, a CVD method, an MBE method, a PLD method, an ALD method, or the like.

The insulator 112b is deposited preferably by a sputtering method, especially preferably by a sputtering method in an atmosphere containing oxygen. When the insulator 112b is deposited by a sputtering method in an atmosphere containing oxygen as described above, oxygen can be added to the insulator 112a. In addition, the insulator 112b has a function of blocking oxygen; thus, oxygen in the insulator 112a can be prevented from being diffused above and thus can be effectively supplied to the insulator 106a and the semiconductor 106b by heat treatment described later.

Then, conductors to be the conductors 114a to 114c in a later step are deposited. For the conductors to be the conductors 114a to 114c in the later step, the above-described conductors that can be used for the conductors 114a to 114c can be used. The conductors that can be used for the conductors 114a to 114c can be deposited by a sputtering method, a CVD method, an MBE method, a PLD method, an ALD method, or the like.

Figure 10C:
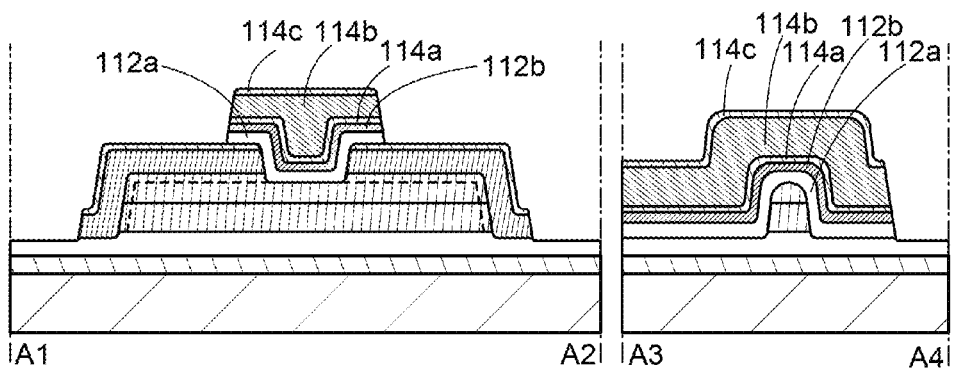
Figure 10D:
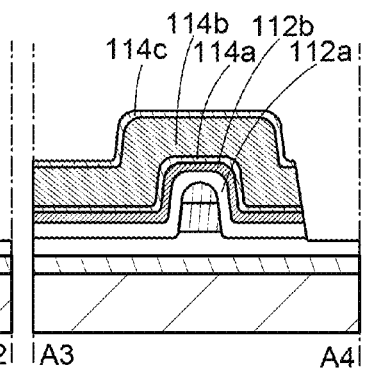

After that, a resist or the like is formed over the conductors that can be used for the conductors 114a to 114c and processing is performed using the resist or the like, whereby the insulators 112a and 112b and the conductors 114a to 114c are formed (see FIGS. 10C and 10D).

Figure 10E:
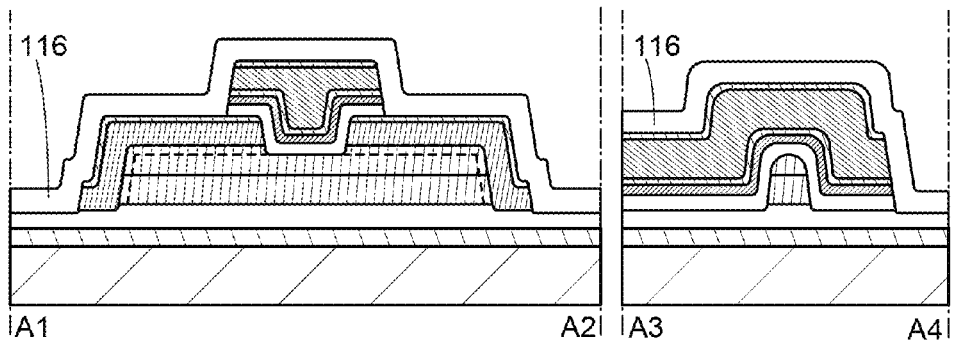
Figure 10F:
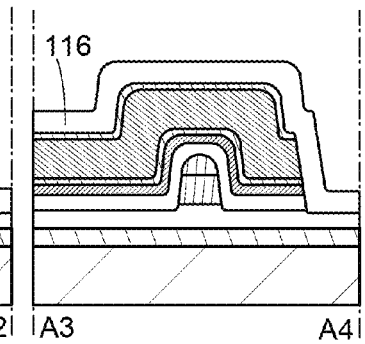

Next, the insulator 116 is deposited (see FIGS. 10E and 10F). Any of the above-described insulators can be used for the insulator 116. The insulator 116 can be deposited by a sputtering method, a CVD method, an MBE method, a PLD method, an ALD method, or the like. The insulator 116 is preferably formed using an insulator containing oxygen and silicon, e.g., silicon oxide ($SiO_x$) or silicon oxynitride.

Figure 11A:
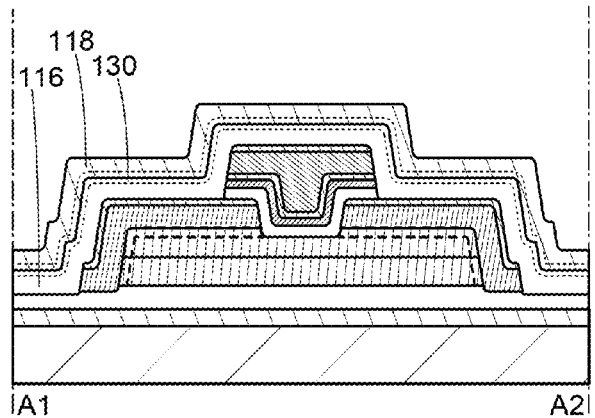
FIGS. 11A to 11D are cross-sectional views illustrating a method for manufacturing a transistor of one embodiment of the present invention.
Figure 11B:
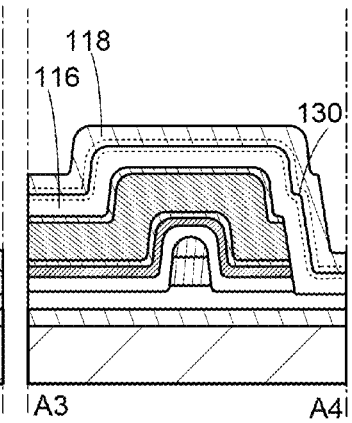

Subsequently, the insulator 118 is deposited (see FIGS. 11A and 11B). Any of the above-described insulators can be used for the insulator 118. The insulator 118 can be deposited by a sputtering method, a CVD method, an MBE method, a PLD method, an ALD method, or the like. The insulator 118 is preferably formed using an insulator containing oxygen and aluminum, e.g., aluminum oxide ($AlO_x$). The aluminum oxide has a blocking effect against oxygen, hydrogen, water, and the like.

The insulator 118 ($AlO_x$) is deposited preferably with the use of plasma, further preferably by a sputtering method, and still further preferably by a sputtering method in an atmosphere containing oxygen. In that case, the insulator 118 ($AlO_x$) is deposited using a deposition gas whose oxygen volume fraction is, for example, higher than or equal to 10 volume %, preferably higher than or equal to 20 volume %, and further preferably higher than or equal to 50 volume %.

As the sputtering method, a direct current (DC) sputtering method in which a direct-current power source is used as a sputtering power source, a DC sputtering method in which a pulsed bias is applied (i.e., a pulsed DC sputtering method), or a radio frequency (RF) sputtering method in which a high frequency power source is used as a sputtering power source may be used. Alternatively, a magnetron sputtering method using a magnet mechanism inside a chamber, a bias sputtering method in which voltage is also applied to a substrate during deposition, a reactive sputtering method performed in a reactive gas atmosphere, or the like may be used. Further alternatively, the above-described PESP or VDSP method may be used. The oxygen gas flow rate or deposition power for sputtering can be set as appropriate in accordance with the amount of oxygen to be added.

When the insulator 118 ($AlO_x$) is deposited by a sputtering method, the oxygen 131 is added to a surface of the insulator 116 ($SiO_x$) (interface between the insulator 116 ($SiO_x$) and the insulator 118 ($AlO_x$), after the deposition of the insulator 118 ($AlO_x$)) and the vicinity thereof during the deposition. Although the oxygen 131 is added to the insulator 116 ($SiO_x$) as an oxygen radical here, for example, the state of the oxygen 131 at the time of being added is not limited thereto. The oxygen 131 may be added to the insulator 116 ($SiO_x$) as an oxygen atom, an oxygen ion, or the like. Note that by addition of the oxygen 131, oxygen in excess of the stoichiometric composition is contained in the insulator 116 ($SiO_x$) in some cases, and the oxygen 131 in such a case can be called excess oxygen.

The mixed region 130 might be formed in a region in the vicinity of the interface between the insulator 116 ($SiO_x$) and the insulator 118 ($AlO_x$). Since the mixed region 130 is formed in a region in the vicinity of the interface between the insulator 116 ($SiO_x$) and the insulator 118 ($AlO_x$), the concentration of the oxygen 131 is higher in the mixed region 130 than in a layer below the mixed region 130.

In the case where the insulator 118 is deposited by a method other than a sputtering method, an oxygen ion or the like may be added to the insulator 116 through the insulator 118 after the deposition of the insulator 118. Oxygen ions can be added by an ion implantation method, an ion doping method, a plasma immersion ion implantation method, or the like.

The insulator 118 functions as at least a film that transmits less oxygen than the insulator 116, and the above-described oxide that can be used for the insulator 106a can also be used for the insulator 118. The insulator 118 is preferably formed using an oxide insulator containing In, such as an In—Al oxide, an In—Ga oxide, or an In—Ga—Zn oxide. When an oxide insulator containing In is deposited by a sputtering method or the like as the insulator 118, the oxygen 131 can be added to the insulator 116 as described above. An oxide insulator containing In is suitable for the insulator 118 because the number of particles generated at the time of the deposition by a sputtering method is small.

When the oxygen 131 is added by a sputtering method or the like as described above, the oxygen 131 may also be added to surfaces of the conductors 114b and 114c and the vicinity thereof on the insulator 116 side. In that case, the oxygen concentration at the surfaces of the conductors 114b and 114c and the vicinity thereof on the insulator 116 side might be higher than that at surfaces of the conductors 114a and 114b and the vicinity thereof on the insulator 112b side.

Figure 11C:
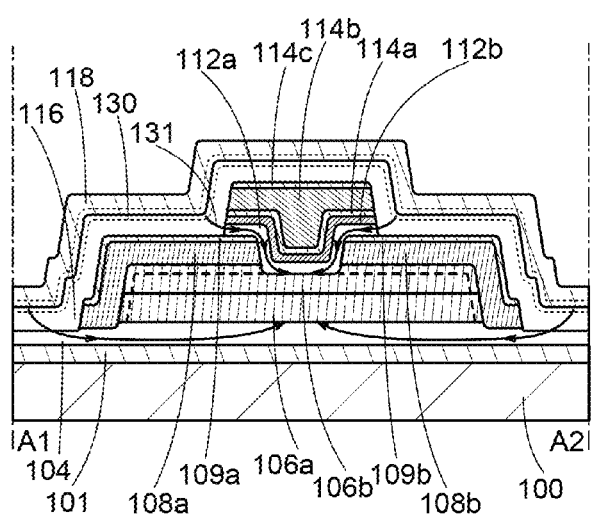
Figure 11D:
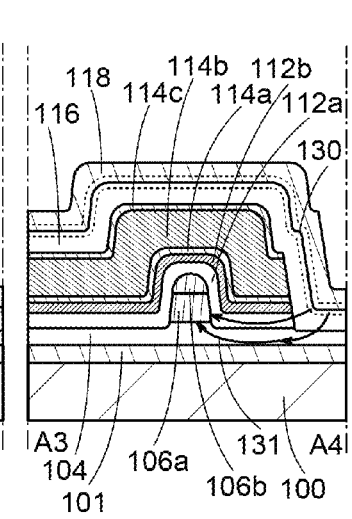

Then, heat treatment is preferably performed (see FIGS. 11C and 11D). The heat treatment allows the oxygen added to the insulator 116 to be diffused and supplied to the insulator 106a and the semiconductor 106b. The heat treatment here is performed at a temperature higher than or equal to 250° C. and lower than or equal to 650° C., and preferably higher than or equal to 350° C. and lower than or equal to 450° C. The heat treatment is performed in an inert gas atmosphere or an atmosphere containing an oxidizing gas at 10 ppm or more, 1% or more, or 10% or more. The heat treatment may be performed under a reduced pressure. For the heat treatment, lamp heating can be performed with the use of an RTA apparatus.

This heat treatment is preferably performed at a temperature lower than that of the heat treatment performed after formation of the semiconductor 136b. A temperature difference between the heat treatment and the heat treatment performed after formation of the semiconductor 136b is to be 20° C. or higher and 150° C. or lower, preferably 40° C. or higher and 100° C. or lower. Accordingly, superfluous release of excess oxygen (oxygen) from the insulator 104 and the like can be inhibited. Note that in the case where heating at the time of formation of the layers (e.g., heating at the time of formation of the insulator 118) doubles as the heat treatment after formation of the insulator 118, the heat treatment after formation of the insulator 118 is not necessarily performed.

The oxygen 131 is diffused in the insulator 116 ($SiO_x$) by the heat treatment (see FIGS. 11C and 11D). At least during the heat treatment, $SiO_x$ has a sufficiently large interatomic distance in terms of the diffusion of the oxygen 131 and thus can be regarded as being porous for the oxygen 131. For this reason, the oxygen 131 can be diffused very easily by the heat treatment performed on the insulator 116 ($SiO_x$). The oxygen 131 can be thus diffused in the insulator 116 ($SiO_x$), mainly in the mixed region 130, with a high concentration of the oxygen 131.

Here, the insulator 118 ($AlO_x$) is an insulator that transmits less oxygen than the insulator 116 ($SiO_x$) and functions as a barrier film that blocks oxygen. Owing to the insulator 118 ($AlO_x$) formed over the insulator 116 ($SiO_x$), the oxygen 131 diffused in the insulator 116 ($SiO_x$) is not diffused above the insulator 116 ($SiO_x$) but is diffused in the insulator 116 ($SiO_x$) mainly in the lateral direction or the downward direction.

The oxygen 131 diffused in the insulator 116 ($SiO_x$) is supplied to the semiconductor 106b through the insulator 112a (see FIGS. 11C and 11D). The insulator 112b and the conductor 114a having a function of blocking oxygen are provided between the conductor 114b and the insulator 112a, thereby preventing the oxygen 131 diffused in the insulator 112a from being extracted by the conductor 114b. Furthermore, the conductor 114c having functions of blocking oxygen is provided between the conductor 114b and the insulator 116, thereby preventing the oxygen 131 diffused in the insulator 116 from being extracted by the conductor 114b. Similarly, the conductors 109a and 109b having functions of blocking oxygen are provided between the conductors 108a and 108b and the insulators 116 ($SiO_x$) and 112a, thereby preventing the oxygen 131 from being extracted by the conductors 108a and 108b.

The oxygen 131 diffused in the insulator 116 ($SiO_x$) is supplied to the insulator 106a through the insulator 104 (see FIGS. 11C and 11D). The insulator 101 having a function of blocking oxygen is provided below the insulator 104, thereby preventing the oxygen 131 diffused in the insulator 104 from being diffused below the insulator 104.

Since the conductor 114b, the conductor 108a, and the conductor 108b do not inhibit the diffusion of the oxygen 131 as described above, the oxygen 131 can be effectively supplied to the insulator 106a and the semiconductor 106b, especially to a channel formation region in the semiconductor 106b. Oxygen is supplied to the insulator 106a and the semiconductor 106b to reduce oxygen vacancies in this manner, whereby a highly purified intrinsic or substantially highly purified intrinsic oxide semiconductor with a low density of defect states can be obtained.

In the case where the above-described oxide insulator containing In is used for the insulator 118, the oxide insulator containing In may be removed by etching or the like after the above heat treatment and another insulator 118 may be formed.

Through the above process, the transistor 10 of one embodiment of the present invention can be manufactured.

With such a structure, a transistor with stable electrical characteristics, a transistor with high frequency characteristics, a transistor having a high on-state current, a transistor with normally-off electrical characteristics, a transistor with a small subthreshold swing value, or a highly reliable transistor can be provided.

Here, a method for fabricating the conductor 102 functioning as the second gate electrode of the transistor 22 and components around the conductor 102 will be described with reference to FIGS. 12A to 12J.

First, the insulator 101 is deposited over the substrate 100, and the insulator 126 is deposited over the insulator 101. For the insulator 126, the above-described insulator that can be used for the insulator 104 can be used. The insulator 126 can be deposited by a sputtering method, a CVD method, an MBE method, a PLD method, an ALD method, or the like.

Figure 12A:
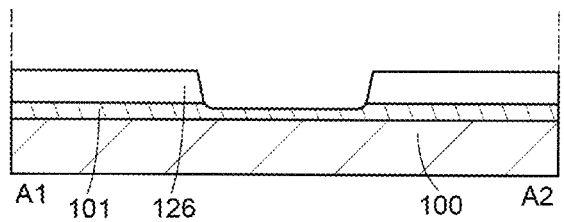
FIGS. 12A to 12J are cross-sectional views illustrating a method for manufacturing a transistor of one embodiment of the present invention.
Figure 12B:
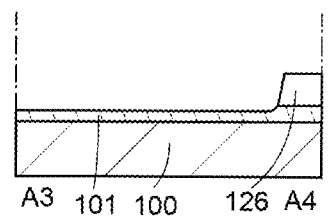

Next, an opening that reaches the insulator 101 is formed in the insulator 126 (see FIGS. 12A and 12B). In addition, a bottom portion of the opening is formed in the insulator 101. The opening can be formed by wet etching; however, dry etching is preferably for microfabrication. The insulator 101 is preferably an insulator that functions as an etching stopper film used in forming the opening by etching the insulator 126. For example, in the case where silicon oxide is used for the insulator 126 in which the opening is to be formed, the insulator 101 is preferably formed using silicon nitride or aluminum oxide.

After the opening is formed, a conductor 142 to be the conductor 122 in a later step is deposited. For the conductor 142, the above-described conductor that can be used for the conductor 122 can be used. The conductor 142 can be deposited by a sputtering method, a CVD method, an MBE method, a PLD method, an ALD method, or the like.

Figure 12C:
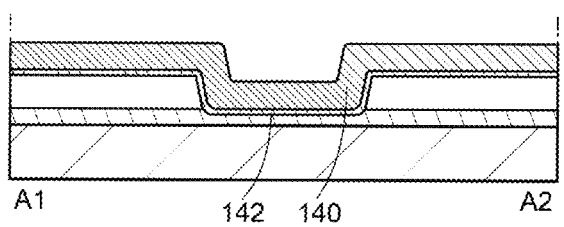
Figure 12D:
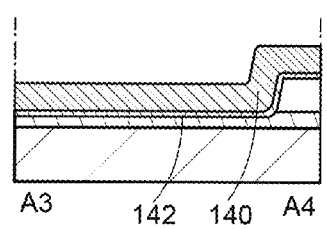
Figure 12E:
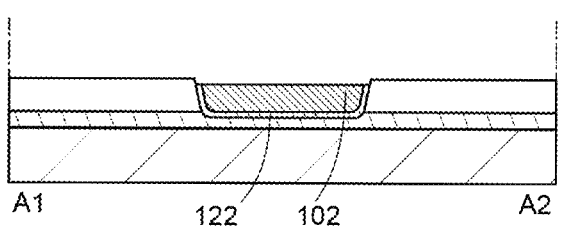
Figure 12F:
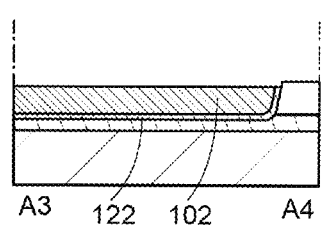

Then, a conductor 140 to be the conductor 102 in a later step is deposited over the conductor 142 (see FIGS. 12C and 12D). For the conductor 140, the above-described conductor that can be used for the conductor 102 can be used. The conductor 140 can be deposited by a sputtering method, a CVD method, an MBE method, a PLD method, an ALD method, or the like.

Next, parts of the conductors 140 and 142 over the insulator 126 are removed by CMP treatment. As a result, the conductors 102 and 122 are formed only in the opening formed in the insulators 126 and 101 (see FIGS. 12E and 12F).

An end portion of the conductor 122 is level with or below a top portion of the opening at an end portion of the opening. The top surface of the conductor 102 is level with or below the end portion of the conductor 122. This is because of a difference between polishing rates of the conductor 122 and the conductor 102 due to CMP characteristics.

Figure 12G:
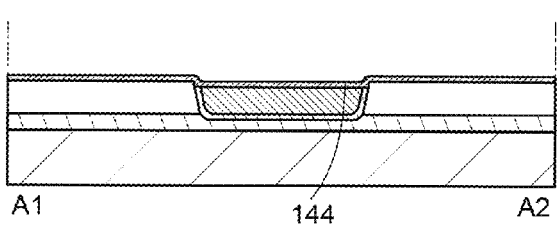
Figure 12H:
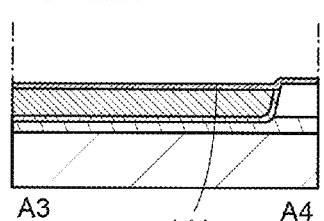

Then, an insulator 144 to be the insulator 124 in a later step is deposited over the conductor 102 (see FIGS. 12G and 12H). For the insulator 144, the above-described insulator that can be used for the insulator 124 can be used. The insulator 144 can be deposited by a sputtering method, a CVD method, an MBE method, a PLD method, an ALD method, or the like.

Next, part of the insulator 144 over the conductor 102 is removed by CMP treatment. As a result, the insulator 124 is formed only in the opening formed in the insulators 126 and 101 (see FIGS. 12I and 12J).

Figure 12I:
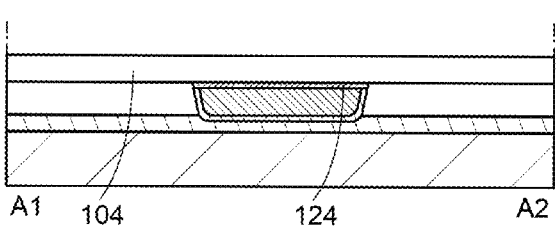
Figure 12J:
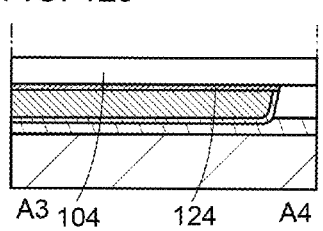

Lastly, the insulator 104 is deposited over the insulators 126 and 124 (see FIGS. 12I and 12J).

The structure and method described in this embodiment can be implemented by being combined as appropriate with any of the other structures and methods described in the other embodiments.

(Embodiment 3)

In this embodiment, the oxide semiconductor included in a semiconductor device of one embodiment of the present invention will be described in detail below.

<Structure of Oxide Semiconductor>

A structure of an oxide semiconductor will be described below.

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

It is known that an amorphous structure is generally defined as being metastable and unfixed, and being isotropic and having no non-uniform structure. In other words, an amorphous structure has a flexible bond angle and a short-range order but does not have a long-range order.

This means that an inherently stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. Note that an a-like OS has a periodic structure in a microscopic region, but at the same time has a void and has an unstable structure. For this reason, an a-like OS has physical properties similar to those of an amorphous oxide semiconductor.

<CAAC-OS>

First, a CAAC-OS is described.

A CAAC-OS is one of oxide semiconductors having a plurality of c-axis aligned crystal parts (also referred to as pellets).

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

Figure 24A:
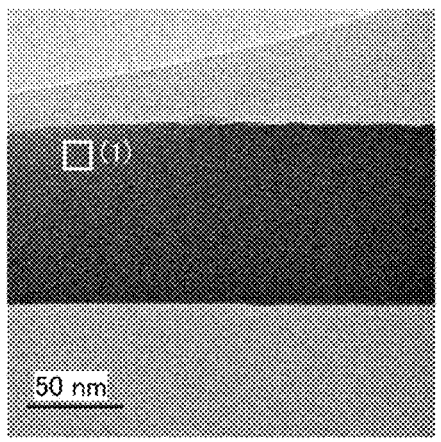
FIGS. 24A to 24D are Cs-corrected high-resolution TEM images of a cross section of a CAAC-OS and a cross-sectional schematic view of a CAAC-OS.

A CAAC-OS observed with TEM is described below. FIG. 24A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

Figure 24B:
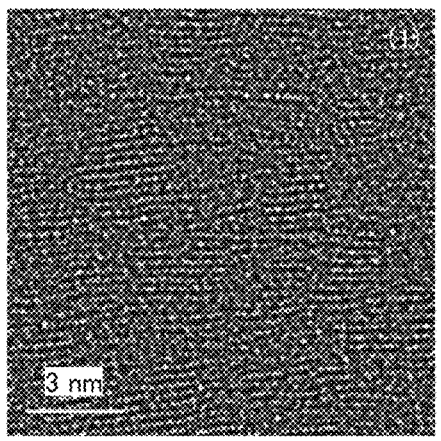

FIG. 24B is an enlarged Cs-corrected high-resolution TEM image of a region (1) in FIG. 24A. FIG. 24B shows that metal atoms are arranged in a layered manner in a pellet. Each metal atom layer has a configuration reflecting unevenness of a surface over which the CAAC-OS is formed (hereinafter, the surface is referred to as a formation surface) or a top surface of the CAAC-OS, and is arranged parallel to the formation surface or the top surface of the CAAC-OS.

Figure 24C:
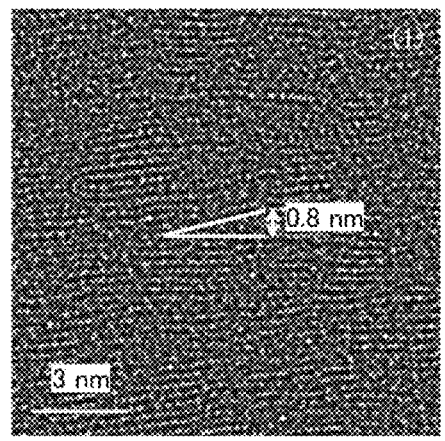

As shown in FIG. 24B, the CAAC-OS has a characteristic atomic arrangement. The characteristic atomic arrangement is denoted by an auxiliary line in FIG. 24C. FIGS. 24B and 24C prove that the size of a pellet is greater than or equal to 1 nm or greater than or equal to 3 nm, and the size of a space caused by tilt of the pellets is approximately 0.8 nm. Therefore, the pellet can also be referred to as a nanocrystal (nc). Furthermore, the CAAC-OS can also be referred to as an oxide semiconductor including c-axis aligned nanocrystals (CANC).

Figure 24D:
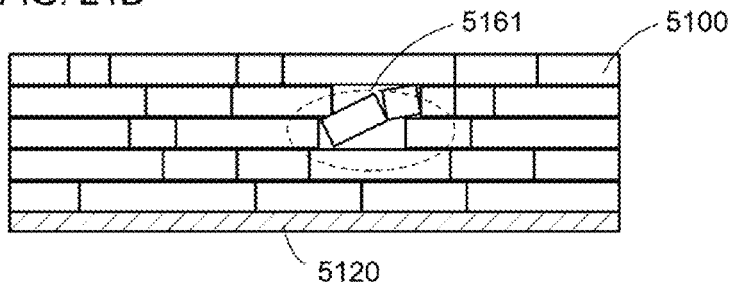

Here, according to the Cs-corrected high-resolution TEM images, the schematic arrangement of pellets 5100 of a CAAC-OS over a substrate 5120 is illustrated by such a structure in which bricks or blocks are stacked (see FIG. 24D). The part in which the pellets are tilted as observed in FIG. 24C corresponds to a region 5161 shown in FIG. 24D.

FIG. 25A shows a Cs-corrected high-resolution TEM image of a plane of the CAAC-OS observed from a direction substantially perpendicular to the sample surface. FIGS. 25B, 25C, and 25D are enlarged Cs-corrected high-resolution TEM images of regions (1), (2), and (3) in FIG. 25A, respectively. FIGS. 25B, 25C, and 25D indicate that metal atoms are arranged in a triangular, quadrangular, or hexagonal configuration in a pellet. However, there is no regularity of arrangement of metal atoms between different pellets.

Figure 26A:
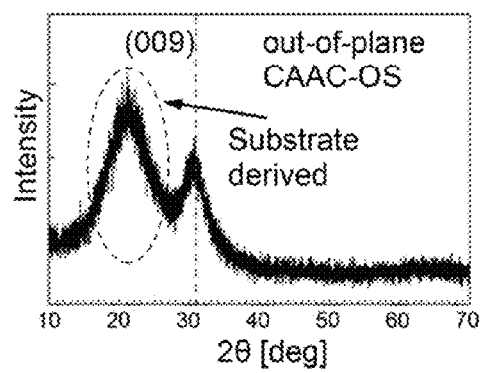
FIGS. 26A to 26C show structural analysis of a CAAC-OS and a single crystal oxide semiconductor by XRD.

Next, a CAAC-OS analyzed by X-ray diffraction (XRD) is described. For example, when the structure of a CAAC-OS including an $InGaZnO_4$ crystal is analyzed by an out-of-plane method, a peak appears at a diffraction angle ($2\theta$) of around 31° as shown in FIG. 26A. This peak is derived from the (009) plane of the $InGaZnO_4$ crystal, which indicates that crystals in the CAAC-OS have c-axis alignment, and that the c-axes are aligned in a direction substantially perpendicular to the formation surface or the top surface of the CAAC-OS.

Note that in structural analysis of the CAAC-OS by an out-of-plane method, another peak may appear when 2θ is around 36°, in addition to the peak at 2θ of around 31°. The peak at 2θ of around 36° indicates that a crystal having no c-axis alignment is included in part of the CAAC-OS. It is preferable that in the CAAC-OS analyzed by an out-of-plane method, a peak appear when 2θ is around 31° and that a peak not appear when 2θ is around 36°.

Figure 26B:
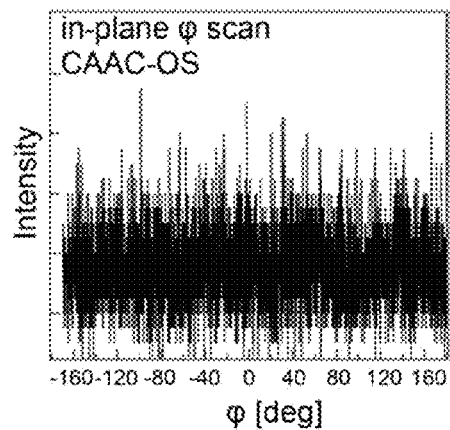
Figure 26C:
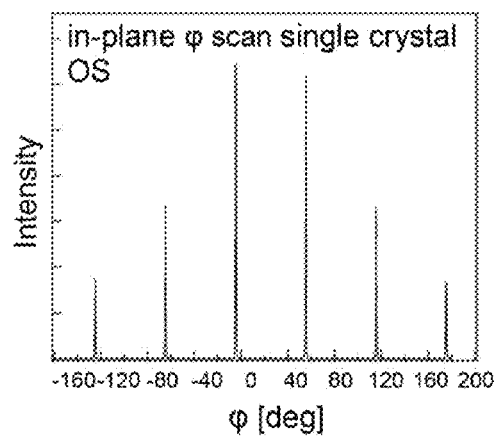

On the other hand, in structural analysis of the CAAC-OS by an in-plane method in which an X-ray beam is incident on a sample in a direction substantially perpendicular to the c-axis, a peak appears when 2θ is around 56°. This peak is attributed to the (110) plane of the InGaZnO$_4$ crystal. In the case of the CAAC-OS, when analysis (φ scan) is performed with 2θ fixed at around 56° and with the sample rotated using a normal vector of the sample surface as an axis (φ axis), as shown in FIG. 26B, a peak is not clearly observed. In contrast, in the case of a single crystal oxide semiconductor of InGaZnO$_4$, when φ scan is performed with 2θ fixed at around 56°, as shown in FIG. 26C, six peaks which are derived from crystal planes equivalent to the (110) plane are observed. Accordingly, the structural analysis using XRD shows that the directions of a-axes and b-axes are irregularly oriented in the CAAC-OS.

Next, a CAAC-OS analyzed by electron diffraction is described. For example, when an electron beam with a probe diameter of 300 nm is incident on a CAAC-OS including an InGaZnO$_4$ crystal in a direction parallel to the sample surface, a diffraction pattern (also referred to as a selected-area transmission electron diffraction pattern) shown in FIG. 27A can be obtained. In this diffraction pattern, spots derived from the (009) plane of an InGaZnO$_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 27B shows a diffraction pattern obtained in such a manner that an electron beam with a probe diameter of 300 nm is incident on the same sample in a direction perpendicular to the sample surface. As shown in FIG. 27B, a ring-like diffraction pattern is observed. Thus, the electron diffraction also indicates that the a-axes and b-axes of the pellets included in the CAAC-OS do not have regular alignment. The first ring in FIG. 27B is considered to be derived from the (010) plane, the (100) plane, and the like of the InGaZnO$_4$ crystal. The second ring in FIG. 27B is considered to be derived from the (110) plane and the like.

As described above, the CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities contained in the oxide semiconductor might serve as carrier traps or carrier generation sources, for example. Furthermore, oxygen vacancies in the oxide semiconductor serve as carrier traps or serve as carrier generation sources when hydrogen is captured therein.

The CAAC-OS having small amounts of impurities and oxygen vacancies is an oxide semiconductor with low carrier density (specifically, lower than $8\times10^{11}$/cm$^3$, preferably lower than $1\times10^{11}$/cm$^3$, further preferably lower than $1\times10^{10}$/cm$^3$, and is higher than or equal to $1\times10^{-9}$/cm$^3$). Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

<nc-OS>

Next, an nc-OS will be described.

An nc-OS has a region in which a crystal part is observed and a region in which a crystal part is not clearly observed in a high-resolution TEM image. In most cases, the size of a crystal part included in the nc-OS is greater than or equal to 1 nm and less than or equal to 10 nm, or greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an a-like OS or an amorphous oxide semiconductor, depending on an analysis method. For example, when the nc-OS is analyzed by an out-of-plane method using an X-ray beam having a diameter larger than the size of a pellet, a peak which shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a pellet. Meanwhile, spots appear in a nanobeam electron diffraction pattern of the nc-OS when an electron beam having a probe diameter close to or smaller than the size of a pellet is applied. Moreover, in a nanobeam electron diffraction pattern of the nc-OS, regions with high luminance in a circular (ring) pattern are shown in some cases. Also in a nanobeam electron diffraction pattern of the nc-OS, a plurality of spots is shown in a ring-like region in some cases.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<a-like OS>

An a-like OS has a structure intermediate between those of the nc-OS and the amorphous oxide semiconductor.

In a high-resolution TEM image of the a-like OS, a void may be observed. Furthermore, in the high-resolution TEM image, there are a region where a crystal part is clearly observed and a region where a crystal part is not observed.

The a-like OS has an unstable structure because it includes a void. To verify that an a-like OS has an unstable structure as compared with a CAAC-OS and an nc-OS, a change in structure caused by electron irradiation is described below.

An a-like OS (referred to as Sample A), an nc-OS (referred to as Sample B), and a CAAC-OS (referred to as Sample C) are prepared as samples subjected to electron irradiation. Each of the samples is an In—Ga—Zn oxide.

First, a high-resolution cross-sectional TEM image of each sample is obtained. The high-resolution cross-sectional TEM images show that all the samples have crystal parts.

Note that which part is regarded as a crystal part is determined as follows. It is known that a unit cell of an $InGaZnO_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 nm is regarded as a crystal part of $InGaZnO_4$. Each of lattice fringes corresponds to the a-b plane of the $InGaZnO_4$ crystal.

Figure 28:
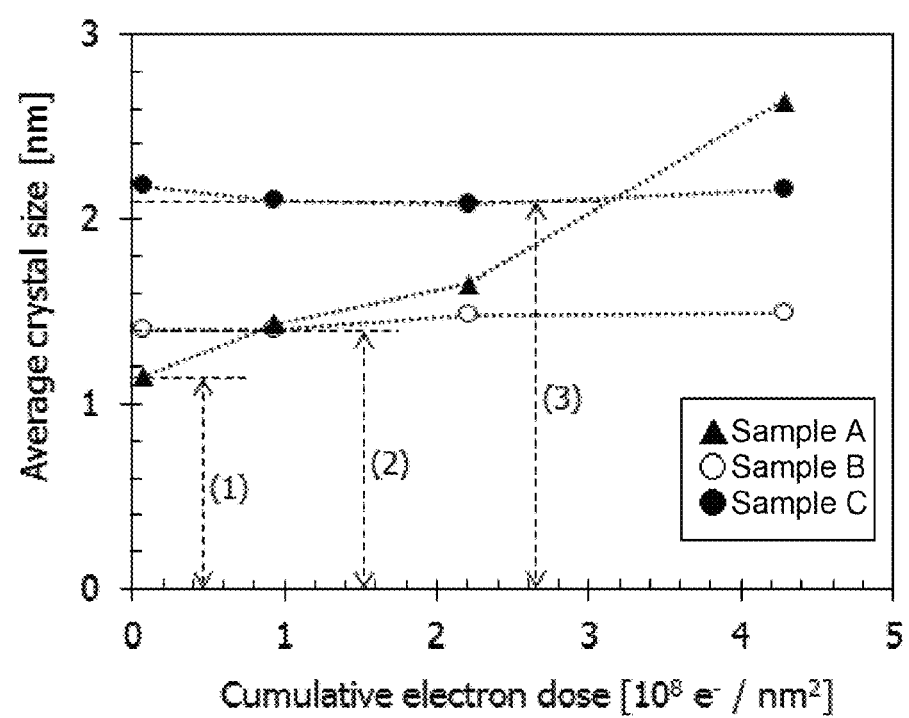
FIG. 28 shows a change of crystal parts of an In—Ga—Zn oxide due to electron irradiation.

FIG. 28 shows change in the average size of crystal parts (at 22 points to 45 points) in each sample. Note that the crystal part size corresponds to the length of a lattice fringe. FIG. 28 indicates that the crystal part size in the a-like OS increases with an increase in the cumulative electron dose. Specifically, as shown by (1) in FIG. 28, a crystal part of approximately 1.2 nm (also referred to as an initial nucleus) at the start of TEM observation grows to a size of approximately 2.6 nm at a cumulative electron dose of $4.2 \times 10^8$ $e^-/nm^2$. In contrast, the crystal part size in the nc-OS and the CAAC-OS shows little change from the start of electron irradiation to a cumulative electron dose of $4.2 \times 10^8$ $e^-/nm^2$. Specifically, as shown by (2) and (3) in FIG. 28, the average crystal sizes in an nc-OS and a CAAC-OS are approximately 1.4 nm and approximately 2.1 nm, respectively, regardless of the cumulative electron dose.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it includes a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal $InGaZnO_4$ with a rhombohedral crystal structure is 6.357 $g/cm^3$. Accordingly, in the case of the oxide semiconductor having an atomic ratio of In:Ga:Zn=1:1:1, the density of the a-like OS is higher than or equal to 5.0 $g/cm^3$ and lower than 5.9 $g/cm^3$. For example, in the case of the oxide semiconductor having an atomic ratio of In:Ga:Zn=1:1:1, the density of each of the nc-OS and the CAAC-OS is higher than or equal to 5.9 $g/cm^3$ and lower than 6.3 $g/cm^3$.

Note that there is a possibility that an oxide semiconductor having a certain composition cannot exist in a single crystal structure. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more of an amorphous oxide semiconductor, an a-like OS, an nc-OS, and a CAAC-OS, for example.

The structures and methods described in this embodiment can be implemented by being combined as appropriate with any of the other structures and methods described in the other embodiments.

(Embodiment 4)

In this embodiment, an example of a circuit of a semiconductor device including a transistor or the like of one embodiment of the present invention will be described.

<CMOS Inverter>

Figure 29A:
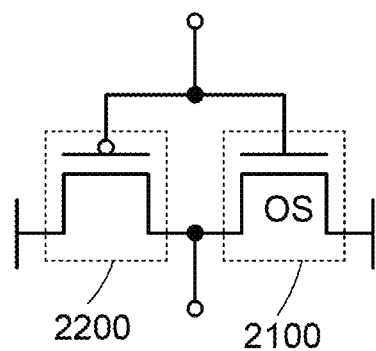
FIGS. 29A and 29B are circuit diagrams each illustrating a semiconductor device of one embodiment of the present invention.

A circuit diagram in FIG. 29A shows a configuration of what is called a CMOS inverter in which a p-channel transistor 2200 and an n-channel transistor 2100 are connected to each other in series and in which gates of them are connected to each other.

<Structure 1 of Semiconductor Device>

Figure 30:
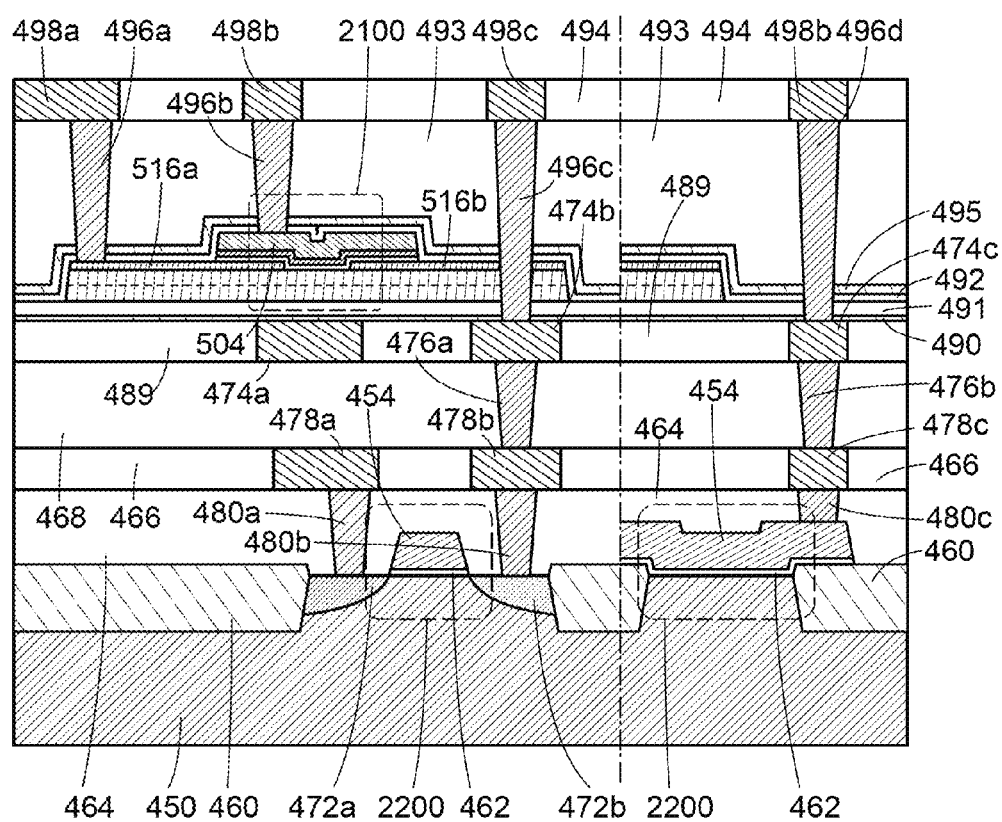
FIG. 30 is a cross-sectional view illustrating a semiconductor device of one embodiment of the present invention.

FIG. 30 is a cross-sectional view of the semiconductor device of FIG. 29A. The semiconductor device shown in FIG. 30 includes the transistor 2200 and the transistor 2100. The transistor 2100 is placed above the transistor 2200. Any of the transistors described in the above embodiments can be used as the transistor 2100. Thus, the description regarding the above-mentioned transistors can be referred to for the transistor 2100 as appropriate.

The transistor 2200 shown in FIG. 30 is a transistor using a semiconductor substrate 450. The transistor 2200 includes a region 472a in the semiconductor substrate 450, a region 472b in the semiconductor substrate 450, an insulator 462, and a conductor 454.

In the transistor 2200, the regions 472a and 472b have functions of a source region and a drain region. The insulator 462 has a function of a gate insulator. The conductor 454 has a function of a gate electrode. Thus, the resistance of a channel formation region can be controlled by a potential applied to the conductor 454. In other words, conduction or non-conduction between the region 472a and the region 472b can be controlled by the potential applied to the conductor 454.

For the semiconductor substrate 450, a single-material semiconductor substrate formed using silicon, germanium, or the like or a semiconductor substrate formed using silicon carbide, silicon germanium, gallium arsenide, indium phosphide, zinc oxide, gallium oxide, or the like may be used, for example. A single crystal silicon substrate is preferably used as the semiconductor substrate 450.

For the semiconductor substrate 450, a semiconductor substrate including impurities imparting n-type conductivity is used. However, a semiconductor substrate including impurities imparting p-type conductivity may be used as the semiconductor substrate 450. In that case, a well including impurities imparting the n-type conductivity may be provided in a region where the transistor 2200 is formed. Alternatively, the semiconductor substrate 450 may be an i-type semiconductor substrate.

The top surface of the semiconductor substrate 450 preferably has a (110) plane. Thus, on-state characteristics of the transistor 2200 can be improved.

The regions 472a and 472b are regions including impurities imparting the p-type conductivity. Accordingly, the transistor 2200 has a structure of a p-channel transistor.

Note that the transistor 2200 is apart from an adjacent transistor by a region 460 and the like. The region 460 is an insulating region.

The semiconductor device illustrated in FIG. 30 includes an insulator 464, an insulator 466, an insulator 468, a conductor 480a, a conductor 480b, a conductor 480c, a conductor 478a, a conductor 478b, a conductor 478c, a conductor 476a, a conductor 476b, a conductor 474a, a conductor 474b, a conductor 474c, a conductor 496a, a conductor 496b, a conductor 496c, a conductor 496d, a conductor 498a, a conductor 498b, a conductor 498c, an insulator 489, an insulator 490, an insulator 491, an insulator 492, an insulator 493, an insulator 494, and an insulator 495.

The insulator 464 is placed over the transistor 2200. The insulator 466 is placed over the insulator 464. The insulator 468 is placed over the insulator 466. The insulator 489 is placed over the insulator 468. The transistor 2100 is placed over the insulator 489. The insulator 493 is placed over the transistor 2100. The insulator 494 is placed over the insulator 493.

The insulator 464 includes an opening reaching the region 472a, an opening reaching the region 472b, and an opening reaching the conductor 454. In the openings, the conductor 480a, the conductor 480b, and the conductor 480c are embedded.

The insulator 466 includes an opening reaching the conductor 480a, an opening reaching the conductor 480b, and an opening reaching the conductor 480c. In the openings, the conductor 478a, the conductor 478b, and the conductor 478c are embedded.

The insulator 468 includes an opening reaching the conductor 478b and an opening reaching the conductor 478c. In the openings, the conductor 476a and the conductor 476b are embedded.

The insulator 489 includes an opening overlapping with a channel formation region of the transistor 2100, an opening reaching the conductor 476a, and an opening reaching the conductor 476b. In the openings, the conductor 474a, the conductor 474b, and the conductor 474c are embedded.

The conductor 474a may have a function of a gate electrode of the transistor 2100. The electrical characteristics of the transistor 2100, such as the threshold voltage, may be controlled by application of a predetermined potential to the conductor 474a, for example. The conductor 474a may be electrically connected to the conductor 504 having a function of the gate electrode of the transistor 2100, for example. In that case, on-state current of the transistor 2100 can be increased. Furthermore, a punch-through phenomenon can be suppressed; thus, the electrical characteristics of the transistor 2100 in a saturation region can be stable. Note that the conductor 474a corresponds to the conductor 102 in the above embodiment and thus, the description of the conductor 102 can be referred to for details about the conductor 474a.

The insulator 490 includes an opening reaching the conductor 474b and an opening reaching the conductor 474c. Note that the insulator 490 corresponds to the insulator 103 in the above embodiment and thus, the description of the insulator 103 can be referred to for details about the insulator 490. As described in the above embodiment, the insulator 490 is provided to cover the conductors 474a to 474c except for the openings, whereby extraction of oxygen from the insulator 491 by the conductors 474a to 474c can be prevented. Accordingly, oxygen can be effectively supplied from the insulator 491 to an oxide semiconductor of the transistor 2100.

The insulator 491 includes the opening reaching the conductor 474b and the opening reaching the conductor 474c. Note that the insulator 491 corresponds to the insulator 104 in the above embodiment and thus, the description of the insulator 104 can be referred to for details about the insulator 491.

The insulator 492 includes the opening reaching the conductor 474b through the conductor 516b that is one of a source electrode and a drain electrode of the transistor 2100, an opening reaching the conductor 516a that is the other of the source electrode and the drain electrode of the transistor 2100, an opening reaching the conductor 504 that is the gate electrode of the transistor 2100, and the opening reaching the conductor 474c. Note that the insulator 492 corresponds to the insulator 116 in the above embodiment and thus, the description of the insulator 116 can be referred to for details about the insulator 492.

The insulator 495 includes the opening reaching the conductor 474b through the conductor 516b that is one of the source electrode and the drain electrode of the transistor 2100, the opening reaching the conductor 516a that is the other of the source electrode and the drain electrode of the transistor 2100, the opening reaching the conductor 504 that is the gate electrode of the transistor 2100, and the opening reaching the conductor 474c. Note that the insulator 495 corresponds to the insulator 118 in the above embodiment and thus, the description of the insulator 118 can be referred to for details about the insulator 495.

The insulator 493 includes the opening reaching the conductor 474b through the conductor 516b that is one of the source electrode and the drain electrode of the transistor 2100, the opening reaching the conductor 516a that is the other of the source electrode and the drain electrode of the transistor 2100, the opening reaching the conductor 504 that is the gate electrode of the transistor 2100, and the opening reaching the conductor 474c. In the openings, the conductor 496a, the conductor 496b, the conductor 496c, and the conductor 496d are embedded. Note that in some cases, an opening provided in a component of the transistor 2100 or the like is positioned between openings provided in other components.

The insulator 494 includes an opening reaching the conductor 496a, an opening reaching the conductor 496b and the conductor 496d, and an opening reaching the conductor 496c. In the openings, the conductor 498a, the conductor 498b, and the conductor 498c are embedded.

The insulators 464, 466, 468, 489, 493, and 494 may each be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum.

The insulator that has a function of blocking oxygen and impurities such as hydrogen is preferably included in at least one of the insulators 464, 466, 468, 489, 493, and 494. When an insulator that has a function of blocking oxygen and impurities such as hydrogen is placed near the transistor 2100, the electrical characteristics of the transistor 2100 can be stable.

An insulator with a function of blocking oxygen and impurities such as hydrogen may be formed to have a single-layer structure or a stacked-layer structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum.

Each of the conductor 480a, the conductor 480b, the conductor 480c, the conductor 478a, the conductor 478b, the conductor 478c, the conductor 476a, the conductor 476b, the conductor 474a, the conductor 474b, the conductor 474c, the conductor 496a, the conductor 496b, the conductor 496c, the conductor 496d, the conductor 498a, the conductor 498b, and the conductor 498c may be formed to have, for example, a single-layer structure or a stacked-layer structure including a conductor containing one or more kinds selected from boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound containing the above element may be used, for example, and a conductor containing aluminum, a conductor containing copper and titanium, a conductor containing copper and manganese, a conductor containing indium, tin, and oxygen, a conductor containing titanium and nitrogen, or the like may be used.

Figure 31:
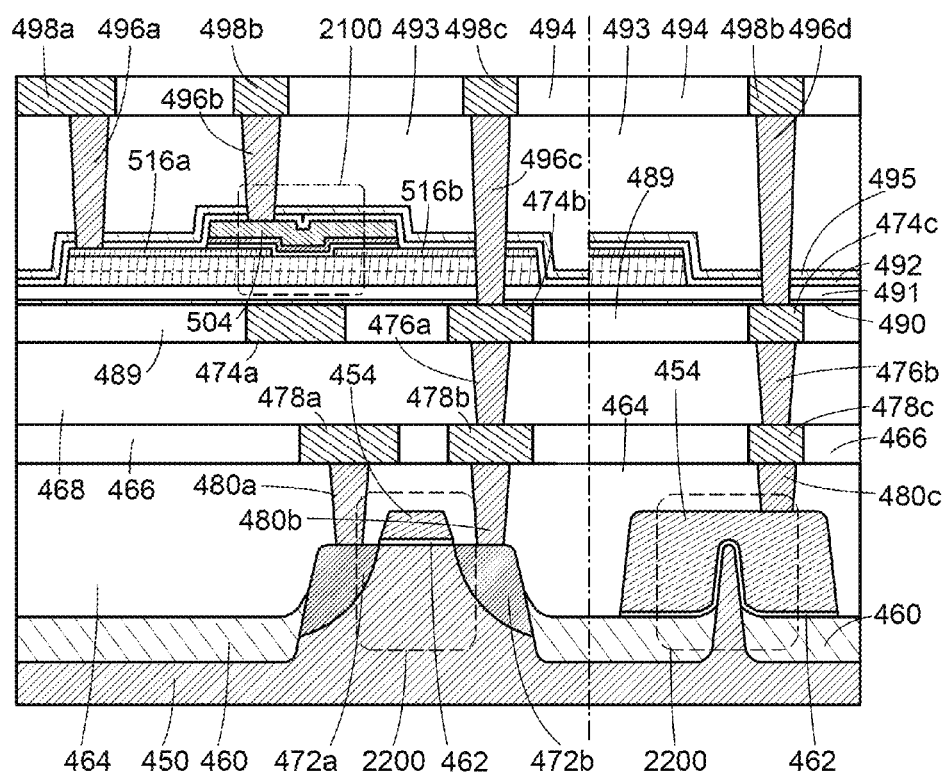
FIG. 31 is a cross-sectional view illustrating a semiconductor device of one embodiment of the present invention.

Note that a semiconductor device in FIG. 31 is the same as the semiconductor device in FIG. 30 except for the structure of the transistor 2200. Therefore, the description of the semiconductor device in FIG. 30 is referred to for the semiconductor device in FIG. 31. In the semiconductor device in FIG. 31, the transistor 2200 is a Fin-type transistor. The effective channel width is increased in the Fin-type transistor 2200, whereby the on-state characteristics of the transistor 2200 can be improved. In addition, since contribution of the electric field of the gate electrode can be increased, the off-state characteristics of the transistor 2200 can be improved.

Figure 32:
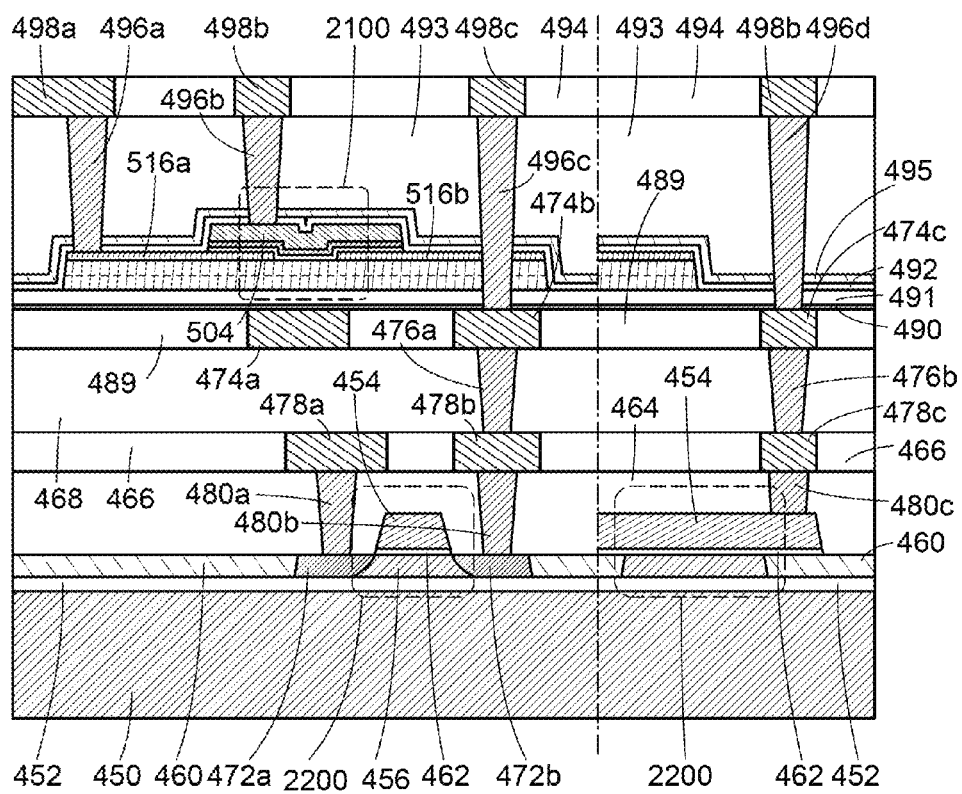
FIG. 32 is a cross-sectional view illustrating a semiconductor device of one embodiment of the present invention.

Note that a semiconductor device in FIG. 32 is the same as the semiconductor device in FIG. 30 except for the structure of the transistor 2200. Therefore, the description of the semiconductor device in FIG. 30 is referred to for the semiconductor device in FIG. 32. Specifically, in the semiconductor device in FIG. 32, the transistor 2200 is formed in the semiconductor substrate 450 that is an SOI substrate. In the structure in FIG. 32, a region 456 is apart from the semiconductor substrate 450 with an insulator 452 provided therebetween. Since the SOI substrate is used as the semiconductor substrate 450, a punch-through phenomenon and the like can be suppressed; thus, the off-state characteristics of the transistor 2200 can be improved. Note that the insulator 452 can be formed by turning the semiconductor substrate 450 into an insulator. For example, silicon oxide can be used as the insulator 452.

In each of the semiconductor devices shown in FIG. 30, FIG. 31, and FIG. 32, a p-channel transistor is formed utilizing a semiconductor substrate, and an n-channel transistor is formed above that; therefore, an occupation area of the element can be reduced. That is, the integration degree of the semiconductor device can be improved. In addition, the manufacturing process can be simplified compared to the case where an n-channel transistor and a p-channel transistor are formed utilizing the same semiconductor substrate; therefore, the productivity of the semiconductor device can be increased. Moreover, the yield of the semiconductor device can be improved. For the p-channel transistor, some complicated steps such as formation of lightly doped drain (LDD) regions, formation of a shallow trench structure, or distortion design can be omitted in some cases. Therefore, the productivity and yield of the semiconductor device can be increased in some cases, compared to a semiconductor device where an n-channel transistor is formed utilizing the semiconductor substrate.

<CMOS Analog Switch>

Figure 29B:
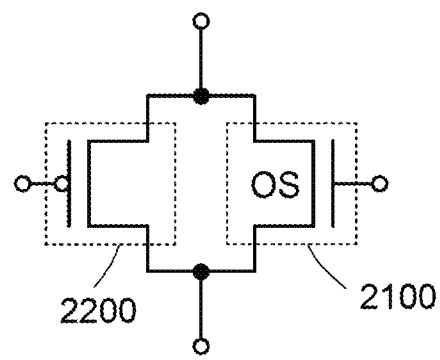

A circuit diagram in FIG. 29B shows a configuration in which sources of the transistors 2100 and 2200 are connected to each other and drains of the transistors 2100 and 2200 are connected to each other. With such a configuration, the transistors can function as what is called a CMOS analog switch.

<Memory Device 1>

Figure 33A:
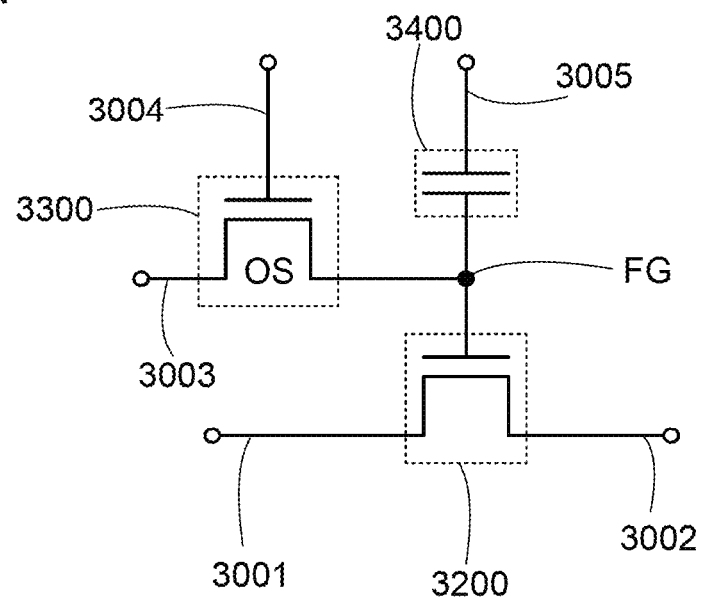
FIGS. 33A and 33B are circuit diagrams each illustrating a memory device of one embodiment of the present invention.
Figure 33B:
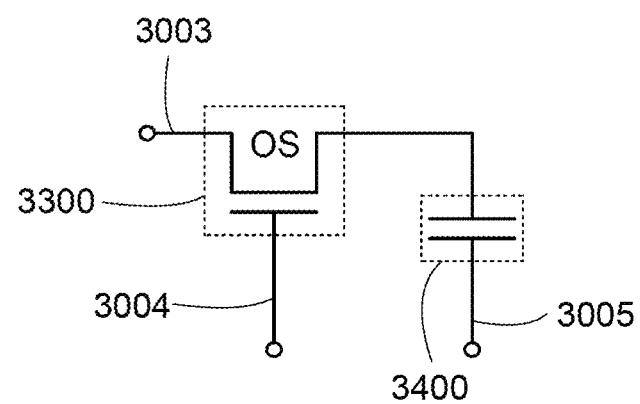

An example of a semiconductor device (memory device) which includes the transistor of one embodiment of the present invention, which can retain stored data even when not powered, and which has an unlimited number of write cycles is shown in FIGS. 33A and 33B.

The semiconductor device illustrated in FIG. 33A includes a transistor 3200 using a first semiconductor, a transistor 3300 using a second semiconductor, and a capacitor 3400. Note that a transistor similar to the transistor 2100 can be used as the transistor 3300.

Note that the transistor 3300 is preferably a transistor with a low off-state current. For example, a transistor using an oxide semiconductor can be used as the transistor 3300. Since the off-state current of the transistor 3300 is low, stored data can be retained for a long period at a predetermined node of the semiconductor device. In other words, power consumption of the semiconductor device can be reduced because refresh operation becomes unnecessary or the frequency of refresh operation can be extremely low.

In FIG. 33A, a first wiring 3001 is electrically connected to a source of the transistor 3200. A second wiring 3002 is electrically connected to a drain of the transistor 3200. A third wiring 3003 is electrically connected to one of a source and a drain of the transistor 3300. A fourth wiring 3004 is electrically connected to a gate of the transistor 3300. A gate of the transistor 3200 and the other of the source and the drain of the transistor 3300 are electrically connected to one electrode of the capacitor 3400. A fifth wiring 3005 is electrically connected to the other electrode of the capacitor 3400.

The semiconductor device in FIG. 33A has a feature that the potential of the gate of the transistor 3200 can be retained, and thus enables writing, retaining, and reading of data as follows.

Writing and retaining of data are described. First, the potential of the fourth wiring 3004 is set to a potential at which the transistor 3300 is on, so that the transistor 3300 is turned on. Accordingly, the potential of the third wiring 3003 is supplied to a node FG where the gate of the transistor 3200 and the one electrode of the capacitor 3400 are electrically connected to each other. That is, a predetermined electric charge is supplied to the gate of the transistor 3200 (writing). Here, one of two kinds of electric charges providing different potential levels (hereinafter referred to as a low-level electric charge and a high-level electric charge) is supplied. After that, the potential of the fourth wiring 3004 is set to a potential at which the transistor 3300 is off, so that the transistor 3300 is turned off. Thus, the electric charge is held at the node FG (retaining).

Since the off-state current of the transistor 3300 is low, the electric charge of the node FG is retained for a long time.

Next, reading of data is described. An appropriate potential (a reading potential) is supplied to the fifth wiring 3005 while a predetermined potential (a constant potential) is supplied to the first wiring 3001, whereby the potential of the second wiring 3002 varies depending on the amount of electric charge retained in the node FG. This is because in the case of using an n-channel transistor as the transistor 3200, an apparent threshold voltage $V_{th\_H}$ at the time when the high-level electric charge is given to the gate of the transistor 3200 is lower than an apparent threshold voltage $V_{th\_L}$ at the time when the low-level electric charge is given to the gate of the transistor 3200. Here, an apparent threshold voltage refers to the potential of the fifth wiring 3005 which is needed to make the transistor 3200 be in "on state." Thus, the potential of the fifth wiring 3005 is set to a potential $V_0$ which is between $V_{th\_H}$ and $V_{th\_L}$, whereby electric charge supplied to the node FG can be determined. For example, in the case where the high-level electric charge is supplied to the node FG in writing and the potential of the fifth wiring 3005 is $V_0$ ($>V_{th\_H}$), the transistor 3200 is brought into "on state." In the case where the low-level electric charge is supplied to the node FG in writing, even when the potential of the fifth wiring 3005 is $V_0$ ($<V_{th\_L}$), the transistor 3200 still remains in "off state." Thus, the data retained in the node FG can be read by determining the potential of the second wiring 3002.

Note that in the case where memory cells are arrayed, it is necessary that data of a desired memory cell be read in read operation. For example, a configuration in which only data of a desired memory cell can be read by supplying a potential at which the transistor 3200 is brought into an "off state" regardless of the charge supplied to the node FG, that is, a potential lower than $V_{th\_H}$ to the fifth wiring 3005 of memory cells from which data is not read may be employed. Alternatively, a configuration in which only data of a desired memory cell can be read by supplying a potential at which the transistor 3200 is brought into an "on state" regardless of the charge supplied to the node FG, that is, a potential higher than $V_{th\_L}$ to the fifth wiring 3005 of memory cells from which data is not read may be employed.

Although an example in which two kinds of electric charges are retained in the node FG, the semiconductor device of the present invention is not limited to this example. For example, a structure in which three or more kinds of electric charges can be retained in the node FG of the semiconductor device may be employed. With such a structure, the semiconductor device can be multi-valued and the storage capacity can be increased.

<Structure of Memory Device 1>

Figure 34:
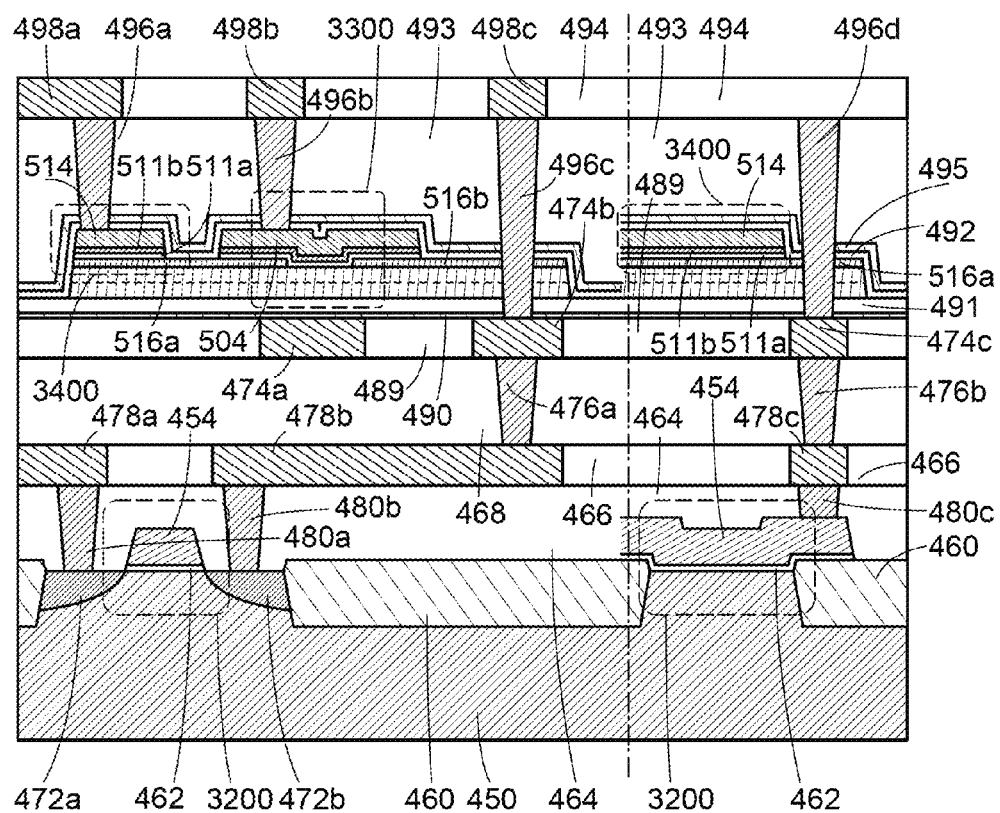
FIG. 34 is a cross-sectional view illustrating a semiconductor device of one embodiment of the present invention.

FIG. 34 is a cross-sectional view of the semiconductor device of FIG. 33A. The semiconductor device shown in FIG. 34 includes the transistor 3200, the transistor 3300, and the capacitor 3400. The transistor 3300 and the capacitor 3400 are placed above the transistor 3200. Note that for the transistor 3300, the description of the above transistor 2100 is referred to. Furthermore, for the transistor 3200, the description of the transistor 2200 in FIG. 30 is referred to. Note that although the transistor 2200 is illustrated as a p-channel transistor in FIG. 30, the transistor 3200 may be an n-channel transistor.

The transistor 3200 illustrated in FIG. 34 is a transistor using the semiconductor substrate 450. The transistor 3200 includes the region 472a in the semiconductor substrate 450, the region 472b in the semiconductor substrate 450, the insulator 462, and the conductor 454.

The semiconductor device illustrated in FIG. 34 includes the insulator 464, the insulator 466, the insulator 468, the conductor 480a, the conductor 480b, the conductor 480c, the conductor 478a, the conductor 478b, the conductor 478c, the conductor 476a, the conductor 476b, the conductor 474a, the conductor 474b, the conductor 474c, the conductor 496a, the conductor 496b, the conductor 496c, the conductor 496d, the conductor 498a, the conductor 498b, the conductor 498c, the insulator 489, the insulator 490, the insulator 491, the insulator 492, the insulator 493, the insulator 494, and the insulator 495.

The insulator 464 is provided over the transistor 3200. The insulator 466 is provided over the insulator 464. The insulator 468 is provided over the insulator 466. The insulator 489 is provided over the insulator 468. The transistor 3300 is provided over the insulator 489. The insulator 493 is provided over the transistor 3300. The insulator 494 is provided over the insulator 493.

The insulator 464 has an opening reaching the region 472a, an opening reaching the region 472b, and an opening reaching the conductor 454. In the openings, the conductor 480a, the conductor 480b, and the conductor 480c are embedded.

The insulator 466 includes an opening reaching the conductor 480a, an opening reaching the conductor 480b, and an opening reaching the conductor 480c. In the openings, the conductor 478a, the conductor 478b, and the conductor 478c are embedded.

The insulator 468 includes an opening reaching the conductor 478b and an opening reaching the conductor 478c. In the openings, the conductor 476a and the conductor 476b are embedded.

The insulator 489 includes an opening overlapping with a channel formation region of the transistor 3300, an opening reaching the conductor 476a, and an opening reaching the conductor 476b. In the openings, the conductor 474a, the conductor 474b, and the conductor 474c are embedded.

The conductor 474a may have a function of a bottom gate electrode of the transistor 3300. Alternatively, for example, electrical characteristics such as the threshold voltage of the transistor 3300 may be controlled by application of a constant potential to the conductor 474a. Further alternatively, for example, the conductor 474a and the conductor 504 that is a top gate electrode of the transistor 3300 may be electrically connected to each other. Thus, the on-state current of the transistor 3300 can be increased. A punch-through phenomenon can be suppressed; thus, stable electrical characteristics in a saturation region of the transistor 3300 can be obtained.

The insulator 490 includes an opening reaching the conductor 474b and an opening reaching the conductor 474c. Note that the insulator 490 corresponds to the insulator 103 in the above embodiment and thus, the description of the insulator 103 can be referred to for details about the insulator 490. As described in the above embodiment, the insulator 490 is provided to cover the conductors 474a to 474c except for the openings, whereby extraction of oxygen from the insulator 491 by the conductors 474a to 474c can be prevented. Accordingly, oxygen can be effectively supplied from the insulator 491 to an oxide semiconductor of the transistor 3300.

The insulator 491 includes the opening reaching the conductor 474b and the opening reaching the conductor 474c. Note that the insulator 491 corresponds to the insulator 104 in the above embodiment and thus, the description of the insulator 104 can be referred to for details about the insulator 491.

The insulator 492 includes the opening reaching the conductor 474b through the conductor 516b that is one of the source electrode and the drain electrode of the transistor 3300, an opening reaching the conductor 514 that overlaps with the conductor 516a that is the other of the source electrode and the drain electrode of the transistor 3300, with an insulator 511a and an insulator 511b positioned therebetween, an opening reaching the conductor 504 that is the gate electrode of the transistor 3300, and the opening reaching the conductor 474c through the conductor 516a that is the other of the source electrode and the drain electrode of the transistor 3300. Note that the insulator 492 corresponds to the insulator 116 in the above embodiment and thus, the description of the insulator 116 can be referred to for details about the insulator 492.

The insulator 495 includes the opening reaching the conductor 474b through the conductor 516b that is one of the source electrode and the drain electrode of the transistor 3300, the opening reaching the conductor 514 that overlaps with the conductor 516a that is the other of the source electrode and the drain electrode of the transistor 3300, with the insulator 511a and the insulator 511b positioned therebetween, the opening reaching the conductor 504 that is the gate electrode of the transistor 3300, and the opening reaching the conductor 474c through the conductor 516a that is the other of the source electrode and the drain electrode of the transistor 3300. Note that the insulator 495 corresponds to the insulator 118 in the above embodiment and thus, the description of the insulator 118 can be referred to for details about the insulator 495.

The insulator 493 includes the opening reaching the conductor 474b through the conductor 516b that is one of the source electrode and the drain electrode of the transistor 3300, the opening reaching the conductor 514 that overlaps with the conductor 516a that is the other of the source electrode and the drain electrode of the transistor 3300, with the insulator 511a and the insulator 511b positioned therebetween, the opening reaching the conductor 504 that is the gate electrode of the transistor 3300, and the opening reaching the conductor 474c through the conductor 516a that is the other of the source electrode and the drain electrode of the transistor 3300. In the openings, the conductor 496a, the conductor 496b, the conductor 496c, and the conductor 496d are embedded. Note that in some cases, an opening provided in a component of the transistor 3300 or the like is positioned between openings provided in other components.

The insulator 494 includes an opening reaching the conductor 496a, an opening reaching the conductor 496b, and an opening reaching the conductor 496c. In the openings, the conductors 498a, 498b, and 498c are embedded.

At least one of the insulators 464, 466, 468, 489, 493, and 494 preferably has a function of blocking oxygen and impurities such as hydrogen. When an insulator that has a function of blocking oxygen and impurities such as hydrogen is placed near the transistor 3300, the electrical characteristics of the transistor 3300 can be stable.

The source or drain of the transistor 3200 is electrically connected to the conductor 516b that is one of the source electrode and the drain electrode of the transistor 3300 through the conductor 480b, the conductor 478b, the conductor 476a, the conductor 474b, and the conductor 496c. The conductor 454 that is the gate electrode of the transistor 3200 is electrically connected to the conductor 516a that is the other of the source electrode and the drain electrode of the transistor 3300 through the conductor 480c, the conductor 478c, the conductor 476b, the conductor 474c, and the conductor 496d.

The capacitor 3400 includes the conductor 516a that is the other of the source electrode and the drain electrode of the transistor 3300, the conductor 514, and the insulator 511a and the insulator 511b. Because the insulator 511a and the insulator 511b can be formed by the same step as the insulator functioning as a gate insulator of the transistor 3300, productivity can be preferably increased in some cases. When a layer formed by the same step as the conductor 504 functioning as the gate electrode of the transistor 3300 is used as the conductor 514, productivity can be preferably increased in some cases.

For the structures of other components, the description of FIG. 30 and the like can be referred to as appropriate.

Figure 35:
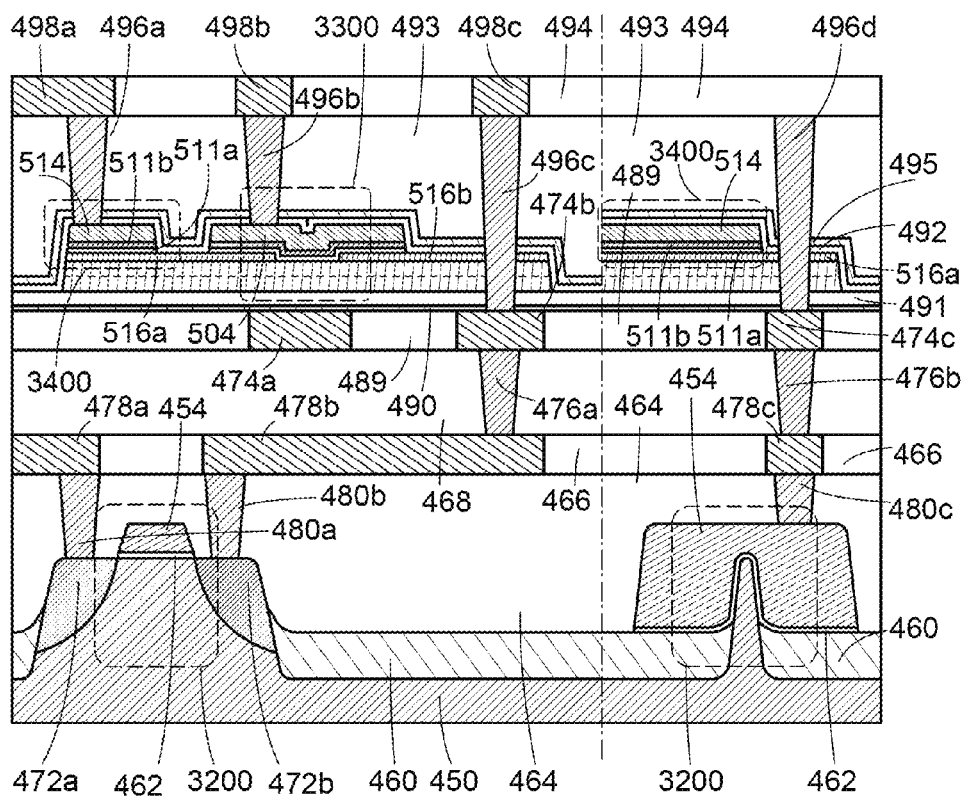
FIG. 35 is a cross-sectional view illustrating a semiconductor device of one embodiment of the present invention.

A semiconductor device in FIG. 35 is the same as the semiconductor device in FIG. 34 except for the structure of the transistor 3200. Therefore, the description of the semiconductor device in FIG. 34 is referred to for the semiconductor device in FIG. 35. Specifically, in the semiconductor device in FIG. 35, the transistor 3200 is a Fin-type transistor. For the Fin-type transistor 3200, the description of the transistor 2200 in FIG. 31 is referred to. Note that although the transistor 2200 is illustrated as a p-channel transistor in FIG. 31, the transistor 3200 may be an n-channel transistor.

Figure 36:
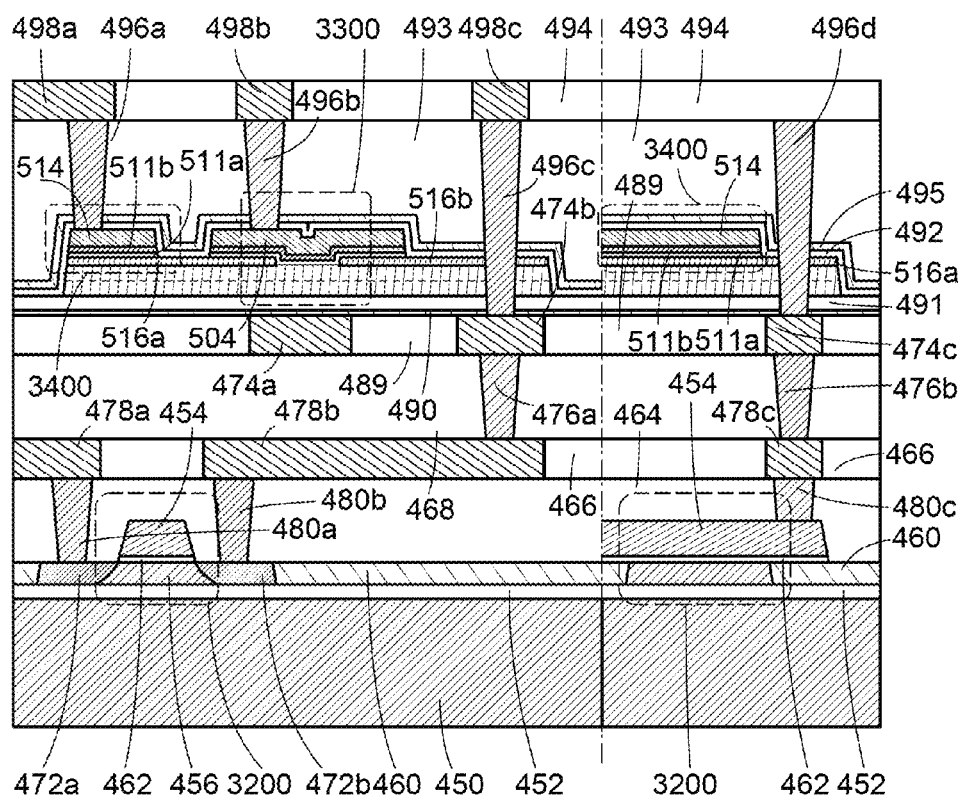
FIG. 36 is a cross-sectional view illustrating a semiconductor device of one embodiment of the present invention.

A semiconductor device in FIG. 36 is the same as the semiconductor device in FIG. 34 except for the structure of the transistor 3200. Therefore, the description of the semiconductor device in FIG. 34 is referred to for the semiconductor device in FIG. 36. Specifically, in the semiconductor device in FIG. 36, the transistor 3200 is provided in the semiconductor substrate 450 that is an SOI substrate. For the transistor 3200, which is provided in the semiconductor substrate 450 (SOI substrate), the description of the transistor 2200 in FIG. 32 is referred to. Note that although the transistor 2200 is illustrated as a p-channel transistor in FIG. 32, the transistor 3200 may be an n-channel transistor.

<Memory Device 2>

The semiconductor device in FIG. 33B is different from the semiconductor device in FIG. 33A in that the transistor 3200 is not provided. Also in this case, data can be written and retained in a manner similar to that of the semiconductor device in FIG. 33A.

Reading of data in the semiconductor device in FIG. 33B is described. When the transistor 3300 is brought into an on state, the third wiring 3003 which is in a floating state and the capacitor 3400 are brought into conduction, and the electric charge is redistributed between the third wiring 3003 and the capacitor 3400. As a result, the potential of the third wiring 3003 is changed. The amount of change in the potential of the third wiring 3003 varies depending on the potential of the one electrode of the capacitor 3400 (or the electric charge accumulated in the capacitor 3400).

For example, the potential of the third wiring 3003 after the charge redistribution is $(C_B \times V_{B0} + C \times V)/(C_B + C)$, where V is the potential of the one electrode of the capacitor 3400, C is the capacitance of the capacitor 3400, $C_B$ is the capacitance component of the third wiring 3003, and $V_{B0}$ is the potential of the third wiring 3003 before the charge redistribution. Thus, it can be found that, assuming that the memory cell is in either of two states in which the potential of the one electrode of the capacitor 3400 is $V_1$ and $V_0$ ($V_1 > V_0$), the potential of the third wiring 3003 in the case of retaining the potential $V_1$ ($=(C_B \times V_{B0} + C \times V_1)/(C_B + C)$) is higher than the potential of the third wiring 3003 in the case of retaining the potential $V_0$ ($=(C_B \times V_{B0} + C \times V_0)/(C_B + C)$).

Then, by comparing the potential of the third wiring 3003 with a predetermined potential, data can be read.

In this case, a transistor including the first semiconductor may be used for a driver circuit for driving a memory cell, and a transistor including the second semiconductor may be stacked over the driver circuit as the transistor 3300.

When including a transistor using an oxide semiconductor and having a low off-state current, the semiconductor device described above can retain stored data for a long time. In other words, power consumption of the semiconductor device can be reduced because refresh operation becomes unnecessary or the frequency of refresh operation can be extremely low. Moreover, stored data can be retained for a long time even when power is not supplied (note that a potential is preferably fixed).

In the semiconductor device, high voltage is not needed for writing data and deterioration of elements is less likely to occur. Unlike in a conventional nonvolatile memory, for example, it is not necessary to inject and extract electrons into and from a floating gate; thus, a problem such as deterioration of an insulator is not caused. That is, the semiconductor device of one embodiment of the present invention does not have a limit on the number of times data can be rewritten, which is a problem of a conventional nonvolatile memory, and the reliability thereof is drastically improved. Furthermore, data is written depending on the on/off state of the transistor, whereby high-speed operation can be achieved.

<Memory Device 3>

A modification example of the semiconductor device (memory device) illustrated in FIG. 33A will be described with reference to a circuit diagram in FIG. 37.

Figure 37:
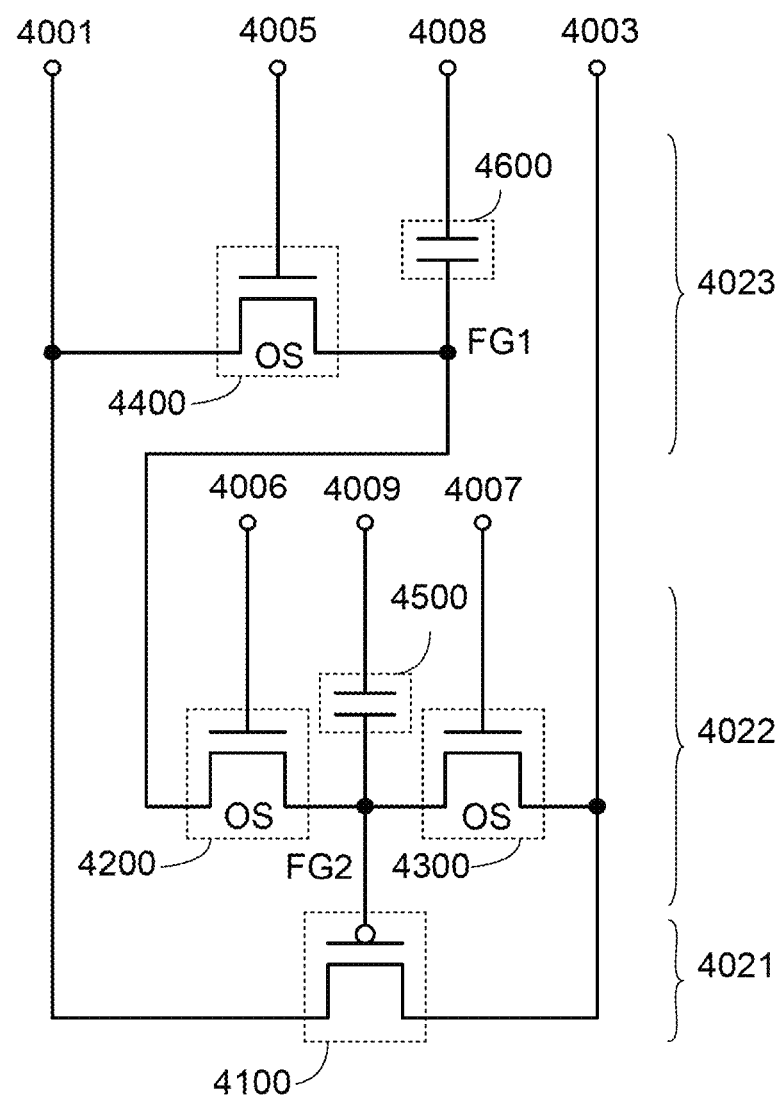
FIG. 37 is a circuit diagram illustrating a semiconductor device of one embodiment of the present invention.

The semiconductor device illustrated in FIG. 37 includes a transistor 4100, a transistor 4200, a transistor 4300, a transistor 4400, a capacitor 4500, and a capacitor 4600. Here, a transistor similar to the transistor 3200 can be used as the transistor 4100, and transistors similar to the transistor 3300 can be used as the transistors 4200, 4300, and 4400. Although not illustrated in FIG. 37, a plurality of semiconductor devices in FIG. 37 are provided in a matrix. The semiconductor devices in FIG. 37 can control writing and reading of a data voltage in accordance with a signal or a potential supplied to a wiring 4001, a wiring 4003, a wiring 4005, a wiring 4006, a wiring 4007, a wiring 4008, and a wiring 4009.

One of a source and a drain of the transistor 4100 is connected to the wiring 4003. The other of the source and the drain of the transistor 4100 is connected to the wiring 4001. Although the transistor 4100 is a p-channel transistor in FIG. 37, the transistor 4100 may be an n-channel transistor.

The semiconductor device in FIG. 37 includes two data retention portions. For example, a first data retention portion retains an electric charge between one of a source and a drain of the transistor 4400, one electrode of the capacitor 4600, and one of a source and a drain of the transistor 4200 which are connected to a node FG1. A second data retention portion retains an electric charge between a gate of the transistor 4100, the other of the source and the drain of the transistor 4200, one of a source and a drain of the transistor 4300, and one electrode of the capacitor 4500 which are connected to a node FG2.

The other of the source and the drain of the transistor 4300 is connected to the wiring 4003. The other of the source and the drain of the transistor 4400 is connected to the wiring 4001. A gate of the transistor 4400 is connected to the wiring 4005. A gate of the transistor 4200 is connected to the wiring 4006. A gate of the transistor 4300 is connected to the wiring 4007. The other electrode of the capacitor 4600 is connected to the wiring 4008. The other electrode of the capacitor 4500 is connected to the wiring 4009.

The transistors 4200, 4300, and 4400 each function as a switch for control of writing a data voltage and retaining an electric charge. Note that, as each of the transistors 4200, 4300, and 4400, it is preferable to use a transistor having a low current that flows between a source and a drain in an off state (low off-state current). As an example of the transistor with a low off-state current, a transistor including an oxide semiconductor in its channel formation region (an OS transistor) is preferably used. An OS transistor has a low off-state current and can be manufactured to overlap with a transistor including silicon, for example. Although the transistors 4200, 4300, and 4400 are n-channel transistors in FIG. 37, the transistors 4200, 4300, and 4400 may be p-channel transistors.

The transistors 4200 and 4300 and the transistor 4400 are preferably provided in different layers even when the transistors 4200, 4300, and 4400 are transistors including oxide semiconductors. In other words, the semiconductor device in FIG. 37 preferably includes, as illustrated in FIG. 37, a first layer 4021 where the transistor 4100 is provided, a second layer 4022 where the transistors 4200 and 4300 are provided, and a third layer 4023 where the transistor 4400 is provided. By stacking layers where transistors are provided, the circuit area can be reduced, so that the size of the semiconductor device can be reduced.

Next, operation of writing data to the semiconductor device illustrated in FIG. 37 is described.

First, operation of writing data voltage to the data retention portion connected to the node FG1 (hereinafter referred to as writing operation 1) is described. In the following description, data voltage written to the data retention portion connected to the node FG1 is VD1, and the threshold voltage of the transistor 4100 is $V_{th}$.

In the writing operation 1, the potential of the wiring 4003 is set at VD1, and after the potential of the wiring 4001 is set at a ground potential, the wiring 4001 is brought into an electrically floating state. The wirings 4005 and 4006 are set at a high level. The wirings 4007 to 4009 are set at a low level. Then, the potential of the node FG2 in the electrically floating state is increased, so that a current flows through the transistor 4100. The current flows through the transistor

4100, so that the potential of the wiring 4001 is increased. The transistors 4400 and 4200 are turned on. Thus, as the potential of the wiring 4001 is increased, the potentials of the nodes FG1 and FG2 are increased. When the potential of the node FG2 is increased and a voltage ($V_{gs}$) between the gate and the source of the transistor 4100 becomes the threshold voltage $V_{th}$ of the transistor 4100, the current flowing through the transistor 4100 is decreased. Accordingly, the potentials of the wiring 4001 and the nodes FG1 and FG2 stop increasing, so that the potentials of the nodes FG1 and FG2 are fixed at "$V_{D1}-V_{th}$" in which VD1 is decreased by $V_{th}$.

When a current flows through the transistor 4100, $V_{D1}$ supplied to the wiring 4003 is supplied to the wiring 4001, so that the potentials of the nodes FG1 and FG2 are increased. When the potential of the node FG2 becomes "$V_{D1}-V_{th}$" with the increase in the potentials, $V_{gs}$ of the transistor 4100 becomes $V_{th}$, so that the current flow is stopped.

Next, operation of writing data voltage to the data retention portion connected to the node FG2 (hereinafter referred to as writing operation 2) is described. In the following description, data voltage written to the data retention portion connected to the node FG2 is $V_{D2}$.

In the writing operation 2, the potential of the wiring 4001 is set at $V_{D2}$, and after the potential of the wiring 4003 is set at a ground potential, the wiring 4003 is brought into an electrically floating state. The wiring 4007 is set at the high level. The wirings 4005, 4006, 4008, and 4009 are set at the low level. The transistor 4300 is turned on, so that the wiring 4003 is set at the low level. Thus, the potential of the node FG2 is decreased to the low level, so that the current flows through the transistor 4100. By the current flow, the potential of the wiring 4003 is increased. The transistor 4300 is turned on. Thus, as the potential of the wiring 4003 is increased, the potential of the node FG2 is increased. When the potential of the node FG2 is increased and $V_{gs}$ of the transistor 4100 becomes $V_{th}$ of the transistor 4100, the current flowing through the transistor 4100 is decreased. Accordingly, an increase in the potentials of the wiring 4003 and the node FG2 is stopped, so that the potential of the node FG2 is fixed at "$V_{D2}-V_{th}$" in which $V_{D2}$ is decreased by $V_{th}$.

In other words, when a current flows through the transistor 4100, $V_{D2}$ supplied to the wiring 4001 is supplied to the wiring 4003, so that the potential of the node FG2 is increased. When the potential of the node FG2 becomes "$V_{D2}-V_{th}$" with the increase in the potential, $V_{gs}$ of the transistor 4100 becomes $V_{th}$, so that the current flow is stopped. At this time, the transistors 4200 and 4400 are off and the potential of the node FG1 remains at "$V_{D1}-V_{th}$" written in the writing operation 1.

In the semiconductor device in FIG. 37, after data voltages are written to the plurality of data retention portions, the wiring 4009 is set at the high level, so that the potentials of the nodes FG1 and FG2 are increased. Then, the transistors are turned off to stop movement of electric charges; thus, the written data voltages are retained.

By the above-described writing operation of the data voltage to the nodes FG1 and FG2, the data voltages can be retained in the plurality of data retention portions. Although examples where "$V_{D1}-V_{th}$" and "$V_{D2}-V_{th}$" are used as the written potentials are described, they are data voltages corresponding to multilevel data. Therefore, in the case where the data retention portions each retain 4-bit data, 16-value "$V_{D1}-V_{th}$" and 16-value "$V_{D2}-V_{th}$" can be obtained.

Next, operation of reading data from the semiconductor device illustrated in FIG. 37 is described.

First, operation of reading data voltage to the data retention portion connected to the node FG2 (hereinafter referred to as reading operation 1) is described.

In the reading operation 1, after precharge is performed, the wiring 4003 in an electrically floating state is discharged. The wirings 4005 to 4008 are set low. When the wiring 4009 is set low, the potential of the node FG2 which is electrically floating is set at "$V_{D2}-V_{th}$." The potential of the node FG2 is decreased, so that a current flows through the transistor 4100. By the current flow, the potential of the wiring 4003 which is electrically floating is decreased. As the potential of the wiring 4003 is decreased, $V_{gs}$ of the transistor 4100 is decreased. When $V_{gs}$ of the transistor 4100 becomes $V_{th}$ of the transistor 4100, the current flowing through the transistor 4100 is decreased. In other words, the potential of the wiring 4003 becomes "$V_{D2}$" which is larger than the potential of the node FG2, "$V_{D2}-V_{th}$," by $V_{th}$. The potential of the wiring 4003 corresponds to the data voltage of the data retention portion connected to the node FG2. The data voltage of the read analog value is subjected to A/D conversion, so that data of the data retention portion connected to the node FG2 is obtained.

In other words, the wiring 4003 after precharge is brought into a floating state and the potential of the wiring 4009 is changed from high to low, whereby a current flows through the transistor 4100. When the current flows, the potential of the wiring 4003 which is in a floating state is decreased to be "$V_{D2}$." In the transistor 4100, $V_{gs}$ between "$V_{D2}-V_{th}$" of the node FG2 and "$V_{D2}$" of the wiring 4003 becomes $V_{th}$, so that the current stops. Then, "$V_{D2}$" written in the writing operation 2 is read to the wiring 4003.

After data in the data retention portion connected to the node FG2 is obtained, the transistor 4300 is turned on to discharge "$V_{D2}-V_{th}$" of the node FG2.

Then, the electric charges retained in the node FG1 are distributed between the node FG1 and the node FG2, data voltage in the data retention portion connected to the node FG1 is transferred to the data retention portion connected to the node FG2. The wirings 4001 and 4003 are set low. The wiring 4006 is set high. The wiring 4005 and the wirings 4007 to 4009 are set low. When the transistor 4200 is turned on, the electric charges in the node FG1 are distributed between the node FG1 and the node FG2.

Here, the potential after the electric charge distribution is decreased from the written potential, "$V_{D1}-V_{th}$." Thus, the capacitance of the capacitor 4600 is preferably larger than the capacitance of the capacitor 4500. Alternatively, the potential written to the node FG1, "$V_{D1}-V_{th}$," is preferably larger than the potential corresponding to the same data, "$V_{D2}-V_{th}$." By changing the ratio of the capacitances and setting the written potential larger in advance as described above, a decrease in potential after the electric charge distribution can be suppressed. The change in potential due to the electric charge distribution is described later.

Next, operation of reading data voltage to the data retention portion connected to the node FG1 (hereinafter referred to as reading operation 2) is described.

In the reading operation 2, the wiring 4003 which is brought into an electrically floating state after precharge is discharged. The wirings 4005 to 4008 are set low. The wiring 4009 is set high at the time of precharge and then, set low. When the wiring 4009 is set low, the potential of the node FG2 which is electrically floating is set at "$V_{D1}-V_{th}$." The potential of the node FG2 is decreased, so that a current flows through the transistor 4100. The current flows, so that the potential of the wiring 4003 which is electrically floating is decreased. As the potential of the wiring 4003 is decreased, $V_{gs}$ of the transistor 4100 is decreased. When $V_{gs}$ of the transistor 4100 becomes $V_{th}$ of the transistor 4100, the current flowing through the transistor 4100 is decreased. In other words, the potential of the wiring 4003 becomes "$V_{D1}$" which is larger than the potential of the node FG2, "$V_{D1}$-$V_{th}$," by $V_{th}$. The potential of the wiring 4003 corresponds to the data voltage of the data retention portion connected to the node FG1. The data voltage of the read analog value is subjected to A/D conversion, so that data of the data retention portion connected to the node FG1 is obtained. The above is the reading operation of the data voltage of the data retention portion connected to the node FG1.

In other words, the wiring 4003 after precharge is brought into a floating state and the potential of the wiring 4009 is changed from high to low, whereby a current flows through the transistor 4100. When the current flows, the potential of the wiring 4003 which is in a floating state is decreased to be "$V_{D1}$." In the transistor 4100, $V_{gs}$ between "$V_{D1}$-$V_{th}$" of the node FG2 and "$V_{D1}$" of the wiring 4003 becomes $V_{th}$, so that the current stops. Then, "$V_{D1}$" written in the writing operation 1 is read to the wiring 4003.

In the above-described reading operation of data voltages from the nodes FG1 and FG2, the data voltages can be read from the plurality of data retention portions. For example, 4-bit (16-level) data is retained in each of the node FG1 and the node FG2, whereby 8-bit (256-level) data can be retained in total. Although the first to third layers 4021 to 4023 are provided in the structure illustrated in FIG. 37, the storage capacity can be increased by adding layers without increasing the area of the semiconductor device.

The read potential can be read as a voltage larger than the written data voltage by $V_{th}$. Therefore, $V_{th}$ of "$V_{D1}$-$V_{th}$" and $V_{th}$ of "$V_{D2}$-$V_{th}$" written in the writing operation can be canceled to be read. As a result, the memory capacity per memory cell can be improved and read data can be close to accurate data; thus, the data reliability becomes excellent.

Figure 38:
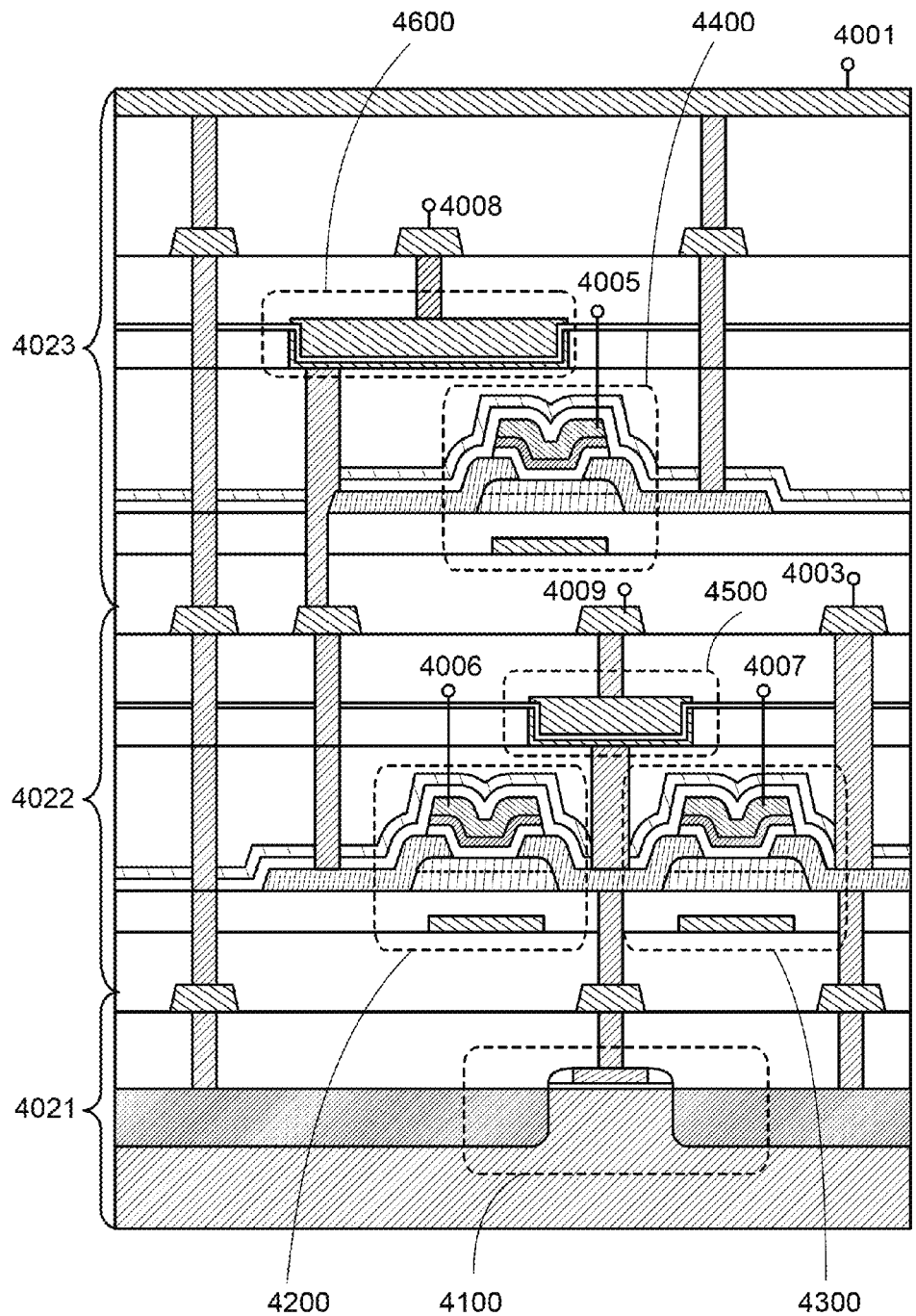
FIG. 38 is a cross-sectional view illustrating a semiconductor device of one embodiment of the present invention.

FIG. 38 is a cross-sectional view of a semiconductor device that corresponds to FIG. 37. The semiconductor device illustrated in FIG. 38 includes the transistors 4100, 4200, 4300, and 4400 and the capacitors 4500 and 4600. Here, the transistor 4100 is formed in the first layer 4021, the transistors 4200 and 4300 and the capacitor 4500 are formed in the second layer 4022, and the transistor 4400 and the capacitor 4600 are formed in the third layer 4023.

Here, the description of the transistor 3300 can be referred to for the transistors 4200, 4200, 4300, and 4400, and the description of the transistor 3200 can be referred to for the transistor 4100. The description made with reference to FIG. 34 can be appropriately referred to for other wirings, other insulators, and the like.

Note that the capacitors 4500 and 4600 are formed by including the conductive layers each having a trench-like shape, while the conductive layer of the capacitor 3400 in the semiconductor device in FIG. 34 is parallel to the substrate. With this structure, a larger capacity can be obtained without increasing the occupation area.

The structures described in this embodiment can be used in appropriate combination with any of the structures described in the other embodiments.

(Embodiment 5)

In this embodiment, an example of an imaging device including the transistor or the like of one embodiment of the present invention will be described.

<Configuration of Imaging Device>

Figure 39A:
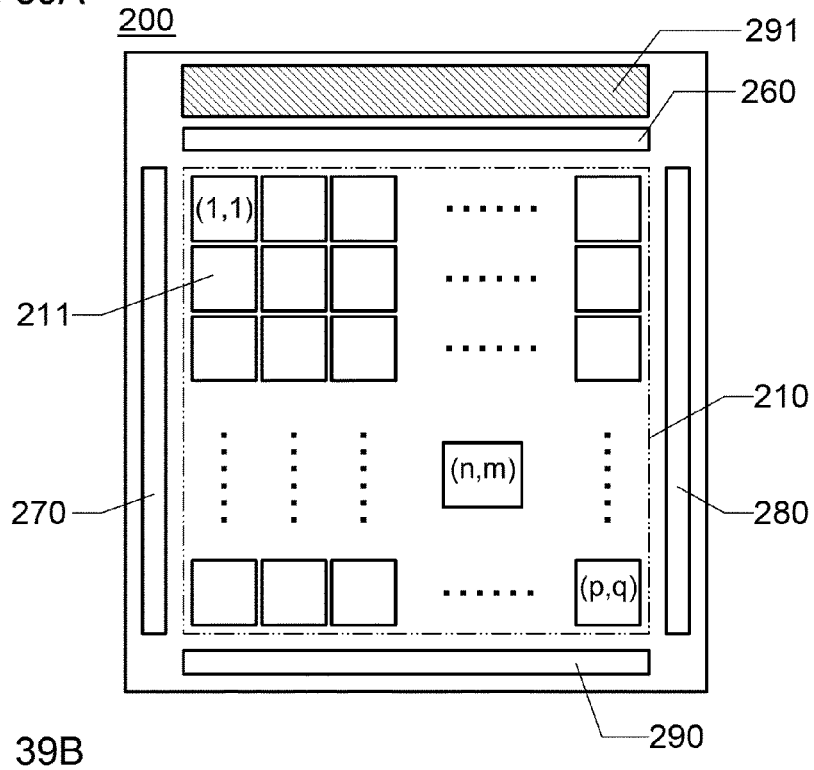
FIGS. 39A and 39B are top views each illustrating a semiconductor device of one embodiment of the present invention.

FIG. 39A is a plan view illustrating an example of an imaging device 200 of one embodiment of the present invention. The imaging device 200 includes a pixel portion 210 and peripheral circuits for driving the pixel portion 210 (a peripheral circuit 260, a peripheral circuit 270, a peripheral circuit 280, and a peripheral circuit 290). The pixel portion 210 includes a plurality of pixels 211 arranged in a matrix with p rows and q columns (p and q are each an integer of 2 or more). The peripheral circuit 260, the peripheral circuit 270, the peripheral circuit 280, and the peripheral circuit 290 are each connected to the plurality of pixels 211, and a signal for driving the plurality of pixels 211 is supplied. In this specification and the like, in some cases, a "peripheral circuit" or a "driver circuit" indicate all of the peripheral circuits 260, 270, 280, and 290. For example, the peripheral circuit 260 can be regarded as part of the peripheral circuit.

The imaging device 200 preferably includes a light source 291. The light source 291 can emit detection light P1.

The peripheral circuit includes at least one of a logic circuit, a switch, a buffer, an amplifier circuit, and a converter circuit. The peripheral circuit may be formed over a substrate where the pixel portion 210 is formed. A semiconductor device such as an IC chip may be used as part or the whole of the peripheral circuit. Note that as the peripheral circuit, one or more of the peripheral circuits 260, 270, 280, and 290 may be omitted.

Figure 39B:
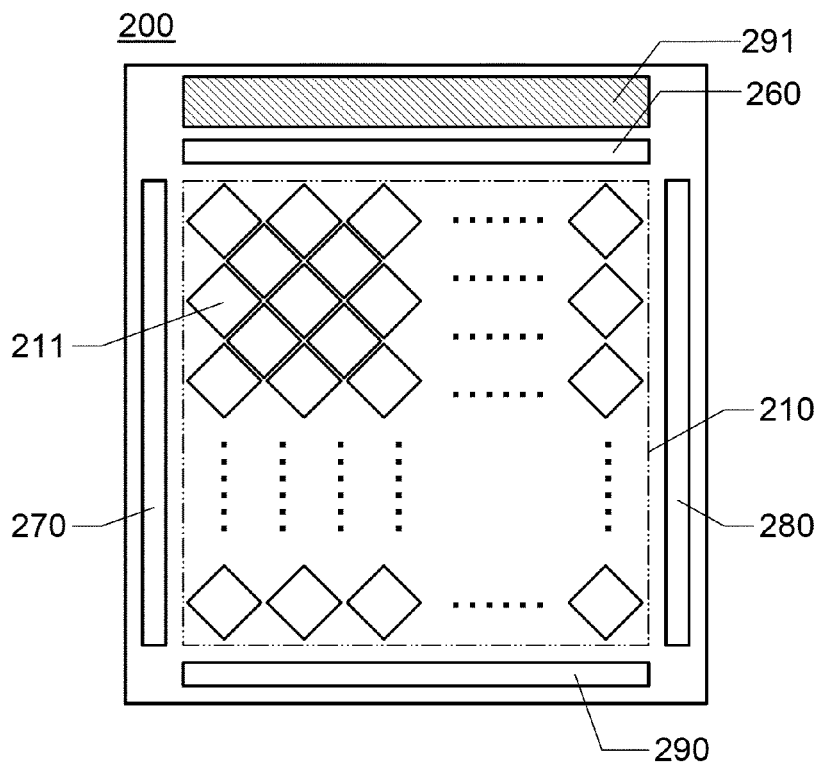

As illustrated in FIG. 39B, the pixels 211 may be provided to be inclined in the pixel portion 210 included in the imaging device 200. When the pixels 211 are obliquely arranged, the distance between pixels (pitch) can be shortened in the row direction and the column direction. Accordingly, the quality of an image taken with the imaging device 200 can be improved.

<Configuration Example 1 of Pixel>

The pixel 211 included in the imaging device 200 is formed with a plurality of subpixels 212, and each subpixel 212 is combined with a filter (color filter) which transmits light in a specific wavelength range, whereby data for achieving color image display can be obtained.

Figure 40A:
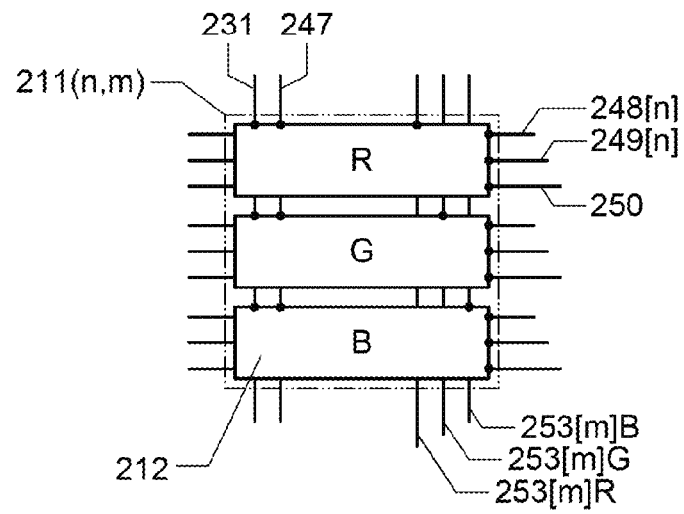
FIGS. 40A and 40B are block diagrams each illustrating a semiconductor device of one embodiment of the present invention.

FIG. 40A is a top view showing an example of the pixel 211 with which a color image is obtained. The pixel 211 illustrated in FIG. 40A includes a subpixel 212 provided with a color filter that transmits light in a red (R) wavelength range (also referred to as a subpixel 212R), a subpixel 212 provided with a color filter that transmits light in a green (G) wavelength range (also referred to as a subpixel 212G), and a subpixel 212 provided with a color filter that transmits light in a blue (B) wavelength range (also referred to as a subpixel 212B). The subpixel 212 can function as a photosensor.

The subpixel 212 (the subpixel 212R, the subpixel 212G, and the subpixel 212B) is electrically connected to a wiring 231, a wiring 247, a wiring 248, a wiring 249, and a wiring 250. In addition, the subpixel 212R, the subpixel 212G, and the subpixel 212B are connected to respective wirings 253 which are independently provided. In this specification and the like, for example, the wiring 248 and the wiring 249 that are connected to the pixel 211 in the n-th row are referred to as a wiring 248[n] and a wiring 249[n]. For example, the wiring 253 connected to the pixel 211 in the m-th column is referred to as a wiring 253[m]. Note that in FIG. 40A, the wirings 253 connected to the subpixel 212R, the subpixel 212G, and the subpixel 212B in the pixel 211 in the m-th column are referred to as a wiring 253[m]R, a wiring 253[*m*]G, and a wiring 253[*m*]B. The subpixels 212 are electrically connected to the peripheral circuit through the above wirings.

Figure 40B:
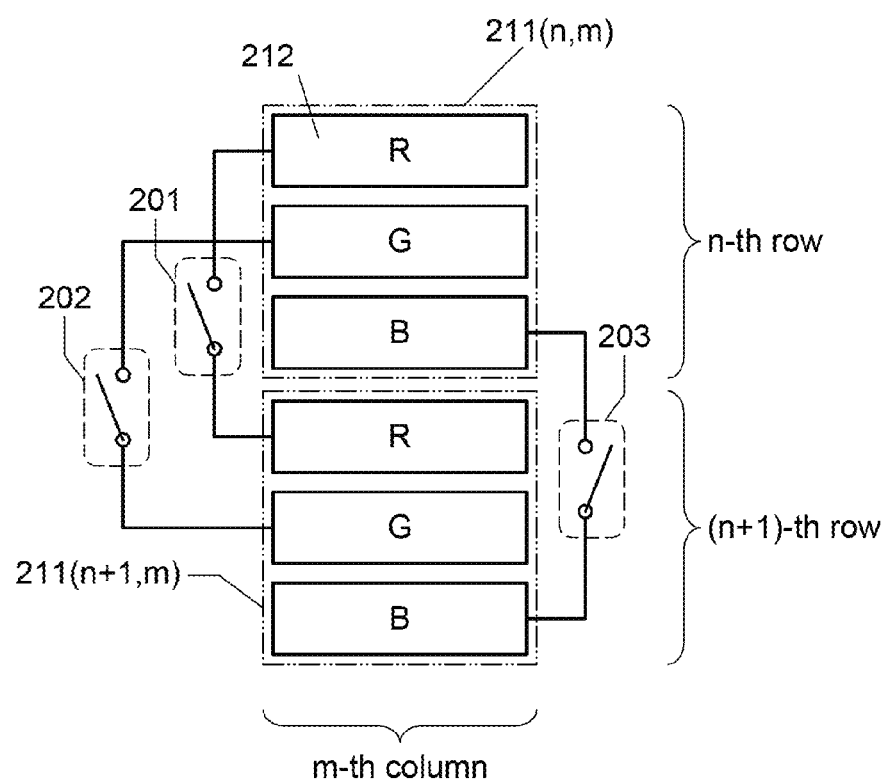

The imaging device 200 has a structure in which the subpixel 212 is electrically connected to the subpixel 212 in an adjacent pixel 211 which is provided with a color filter transmitting light with the same wavelength range as the subpixel 212, via a switch. FIG. 40B shows a connection example of the subpixels 212: the subpixel 212 in the pixel 211 arranged in the n-th (n is an integer greater than or equal to 1 and less than or equal to p) row and the m-th (m is an integer greater than or equal to 1 and less than or equal to q) column and the subpixel 212 in the adjacent pixel 211 arranged in an (n+1)-th row and the m-th column. In FIG. 40B, the subpixel 212R arranged in the n-th row and the m-th column and the subpixel 212R arranged in the (n+1)-th row and the m-th column are connected to each other via a switch 201. The subpixel 212G arranged in the n-th row and the m-th column and the subpixel 212G arranged in the (n+1)-th row and the m-th column are connected to each other via a switch 202. The subpixel 212B arranged in the n-th row and the m-th column and the subpixel 212B arranged in the (n+1)-th row and the m-th column are connected to each other via a switch 203.

The color filter used in the subpixel 212 is not limited to red (R), green (G), and blue (B) color filters, and color filters that transmit light of cyan (C), yellow (Y), and magenta (M) may be used. By provision of the subpixels 212 that sense light in three different wavelength ranges in one pixel 211, a full-color image can be obtained.

The pixel 211 including the subpixel 212 provided with a color filter transmitting yellow (Y) light may be provided, in addition to the subpixels 212 provided with the color filters transmitting red (R), green (G), and blue (B) light. The pixel 211 including the subpixel 212 provided with a color filter transmitting blue (B) light may be provided, in addition to the subpixels 212 provided with the color filters transmitting cyan (C), yellow (Y), and magenta (M) light. When the subpixels 212 sensing light in four different wavelength ranges are provided in one pixel 211, the reproducibility of colors of an obtained image can be increased.

For example, in FIG. 40A, in regard to the subpixel 212 sensing light in a red wavelength range, the subpixel 212 sensing light in a green wavelength range, and the subpixel 212 sensing light in a blue wavelength range, the pixel number ratio (or the light receiving area ratio) thereof is not necessarily 1:1:1. For example, the Bayer arrangement in which the pixel number ratio (the light receiving area ratio) is set at red:green:blue=1:2:1 may be employed. Alternatively, the pixel number ratio (the light receiving area ratio) of red and green to blue may be 1:6:1.

Although the number of subpixels 212 provided in the pixel 211 may be one, two or more subpixels are preferably provided. For example, when two or more subpixels 212 sensing light in the same wavelength range are provided, the redundancy is increased, and the reliability of the imaging device 200 can be increased.

When an infrared (IR) filter that transmits infrared light and absorbs or reflects visible light is used as the filter, the imaging device 200 that senses infrared light can be achieved.

Furthermore, when a neutral density (ND) filter (dark filter) is used, output saturation which occurs when a large amount of light enters a photoelectric conversion element (light-receiving element) can be prevented. With a combination of ND filters with different dimming capabilities, the dynamic range of the imaging device can be increased.

Besides the above-described filter, the pixel 211 may be provided with a lens. An arrangement example of the pixel 211, a filter 254, and a lens 255 is described with cross-sectional views in FIGS. 41A and 41B. With the lens 255, the photoelectric conversion element can receive incident light efficiently. Specifically, as illustrated in FIG. 41A, light 256 enters a photoelectric conversion element 220 through the lens 255, the filter 254 (a filter 254R, a filter 254G, and a filter 254B), a pixel circuit 230, and the like which are provided in the pixel 211.

As indicated by a region surrounded with dashed double-dotted lines, however, part of the light 256 indicated by arrows might be blocked by some wirings 257. Thus, a preferable structure is such that the lens 255 and the filter 254 are provided on the photoelectric conversion element 220 side as illustrated in FIG. 41B, whereby the photoelectric conversion element 220 can efficiently receive the light 256. When the light 256 enters the photoelectric conversion element 220 from the photoelectric conversion element 220 side, the imaging device 200 with high sensitivity can be provided.

Figure 41A:
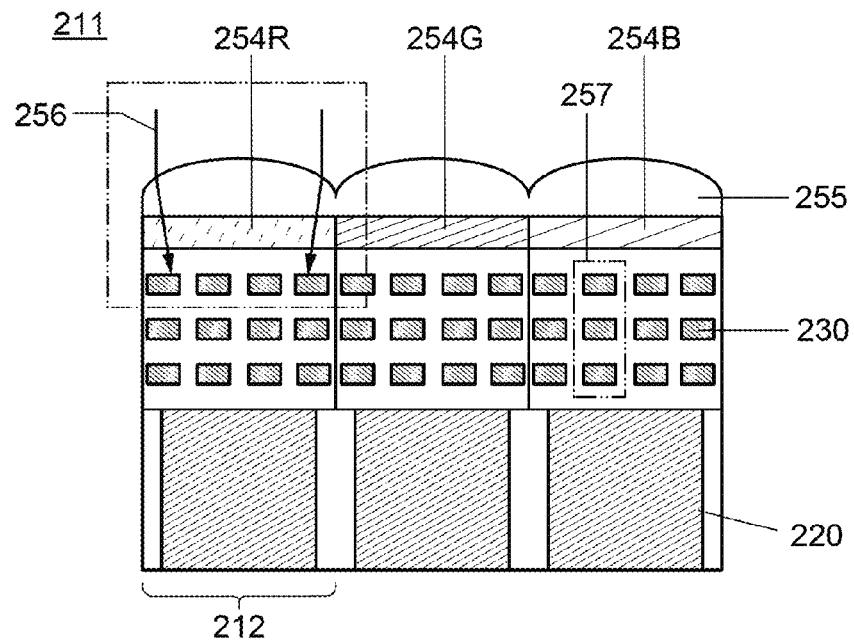
FIGS. 41A and 41B are cross-sectional views each illustrating a semiconductor device of one embodiment of the present invention.
Figure 41B:
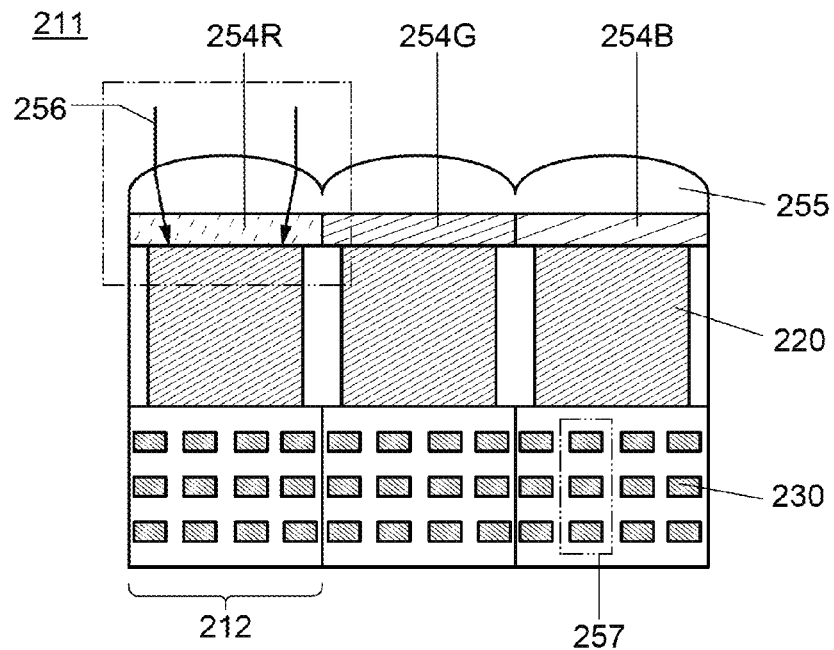

As the photoelectric conversion element 220 illustrated in FIGS. 41A and 41B, a photoelectric conversion element in which a p-n junction or a p-i-n junction is formed may be used.

The photoelectric conversion element 220 may be formed using a substance that has a function of absorbing a radiation and generating electric charges. Examples of the substance that has a function of absorbing a radiation and generating electric charges include selenium, lead iodide, mercury iodide, gallium arsenide, cadmium telluride, and cadmium zinc alloy.

For example, when selenium is used for the photoelectric conversion element 220, the photoelectric conversion element 220 can have a light absorption coefficient in a wide wavelength range, such as visible light, ultraviolet light, infrared light, X-rays, and gamma rays.

One pixel 211 included in the imaging device 200 may include the subpixel 212 with a first filter in addition to the subpixel 212 illustrated in FIGS. 40A and 40B.

<Configuration Example 2 of Pixel>

An example of a pixel including a transistor using silicon and a transistor using an oxide semiconductor will be described below.

Figure 42A:
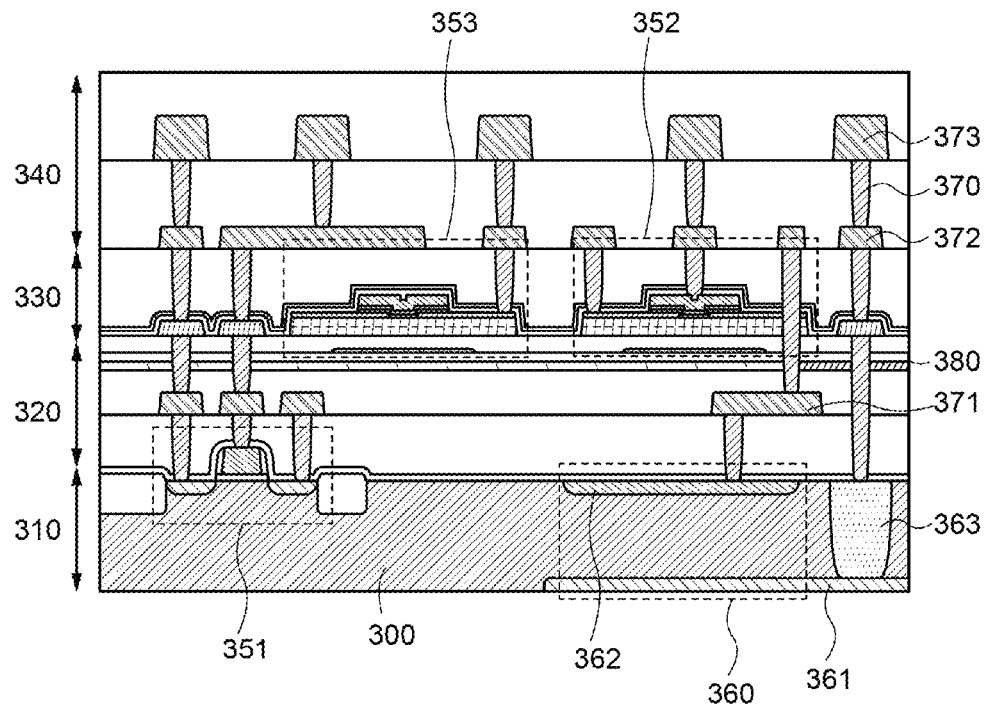
FIGS. 42A and 42B are cross-sectional views each illustrating a semiconductor device of one embodiment of the present invention.
Figure 42B:
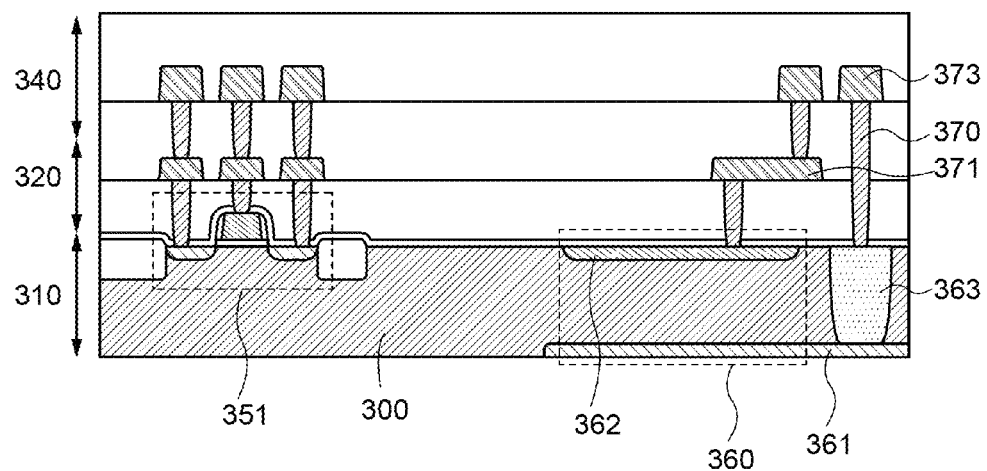

FIGS. 42A and 42B are each a cross-sectional view of an element included in an imaging device. The imaging device illustrated in FIG. 42A includes a transistor 351 including silicon over a silicon substrate 300, transistors 352 and 353 which include an oxide semiconductor and are stacked over the transistor 351, and a photodiode 360 provided in a silicon substrate 300. The transistors and the photodiode 360 are electrically connected to various plugs 370 and wirings 371. In addition, an anode 361 of the photodiode 360 is electrically connected to the plug 370 through a low-resistance region 363.

The imaging device includes a layer 310 including the transistor 351 provided on the silicon substrate 300 and the photodiode 360 provided in the silicon substrate 300, a layer 320 which is in contact with the layer 310 and includes the wirings 371, a layer 330 which is in contact with the layer 320 and includes the transistors 352 and 353, and a layer 340 which is in contact with the layer 330 and includes a wiring 372 and a wiring 373.

In the example of cross-sectional view in FIG. 42A, a light-receiving surface of the photodiode 360 is provided on the side opposite to a surface of the silicon substrate 300 where the transistor 351 is formed. With this structure, a light path can be secured without an influence of the transistors and the wirings. Thus, a pixel with a high aperture ratio can be formed. Note that the light-receiving surface of the photodiode 360 can be the same as the surface where the transistor 351 is formed.

In the case where a pixel is formed with use of only transistors using an oxide semiconductor, the layer 310 may include the transistor using an oxide semiconductor. Alternatively, the layer 310 may be omitted, and the pixel may include only transistors using an oxide semiconductor.

In the case where a pixel is formed with use of only transistors using silicon, the layer 330 may be omitted. An example of a cross-sectional view in which the layer 330 is not provided is shown in FIG. 42B.

Note that the silicon substrate 300 may be an SOI substrate. Furthermore, the silicon substrate 300 can be replaced with a substrate made of germanium, silicon germanium, silicon carbide, gallium arsenide, aluminum gallium arsenide, indium phosphide, gallium nitride, or an organic semiconductor.

Here, an insulator 380 is provided between the layer 310 including the transistor 351 and the photodiode 360 and the layer 330 including the transistors 352 and 353. However, there is no limitation on the position of the insulator 380.

Hydrogen in an insulator provided in the vicinity of a channel formation region of the transistor 351 terminates dangling bonds of silicon; accordingly, the reliability of the transistor 351 can be improved. In contrast, hydrogen in the insulator provided in the vicinity of the transistor 352, the transistor 353, and the like becomes one of factors generating a carrier in the oxide semiconductor. Thus, the hydrogen may cause a reduction of the reliability of the transistor 352, the transistor 353, and the like. Therefore, in the case where the transistor using an oxide semiconductor is provided over the transistor using a silicon-based semiconductor, it is preferable that the insulator 380 having a function of blocking hydrogen be provided between the transistors. When the hydrogen is confined below the insulator 380, the reliability of the transistor 351 can be improved. In addition, the hydrogen can be prevented from being diffused from a part below the insulator 380 to a part above the insulator 380; thus, the reliability of the transistor 352, the transistor 353, and the like can be increased.

As the insulator 380, an insulator having a function of blocking oxygen or hydrogen is used, for example.

In the cross-sectional view in FIG. 42A, the photodiode 360 in the layer 310 and the transistor in the layer 330 can be formed so as to overlap with each other. Thus, the degree of integration of pixels can be increased. In other words, the resolution of the imaging device can be increased.

As illustrated in FIG. 43A1 and FIG. 43B1, part or the whole of the imaging device can be bent. FIG. 43A1 illustrates a state in which the imaging device is bent in the direction of a dashed-dotted line X1-X2. FIG. 43A2 is a cross-sectional view illustrating a portion indicated by the dashed-dotted line X1-X2 in FIG. 43A1. FIG. 43A3 is a cross-sectional view illustrating a portion indicated by a dashed-dotted line Y1-Y2 in FIG. 43A1.

FIG. 43B 1 illustrates a state where the imaging device is bent in the direction of a dashed-dotted line X3-X4 and the direction of a dashed-dotted line Y3-Y4. FIG. 43B2 is a cross-sectional view illustrating a portion indicated by the dashed-dotted line X3-X4 in FIG. 43B1. FIG. 43B3 is a cross-sectional view illustrating a portion indicated by the dashed-dotted line Y3-Y4 in FIG. 43B1.

The bent imaging device enables the curvature of field and astigmatism to be reduced. Thus, the optical design of lens and the like, which is used in combination of the imaging device, can be facilitated. For example, the number of lenses used for aberration correction can be reduced; accordingly, a reduction of size or weight of electronic devices using the imaging device, and the like, can be achieved. In addition, the quality of a captured image can be improved.

The structures described in this embodiment can be used in appropriate combination with any of the structures described in the other embodiments.

(Embodiment 6)

In this embodiment, examples of CPUs including semiconductor devices such as the transistor of one embodiment of the present invention and the above-described memory device will be described.

<Configuration of CPU>

Figure 44:
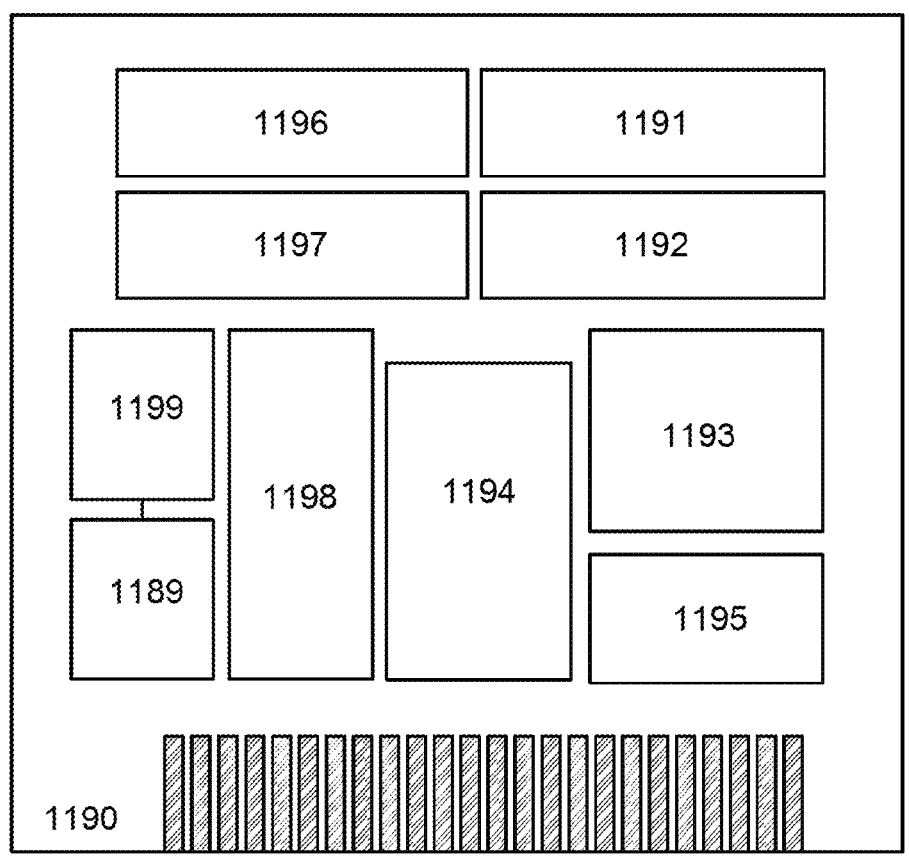
FIG. 44 is a block diagram illustrating a semiconductor device of one embodiment of the present invention.

FIG. 44 is a block diagram illustrating a configuration example of a CPU including any of the above-described transistors as a component.

The CPU illustrated in FIG. 44 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface 1198, a rewritable ROM 1199, and a ROM interface 1189. A semiconductor substrate, an SOI substrate, a glass substrate, or the like is used as the substrate 1190. The ROM 1199 and the ROM interface 1189 may be provided over a separate chip. Needless to say, the CPU in FIG. 44 is just an example in which the configuration has been simplified, and an actual CPU may have a variety of configurations depending on the application. For example, the CPU may have the following configuration: a structure including the CPU illustrated in FIG. 44 or an arithmetic circuit is considered as one core; a plurality of such cores are included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal based on a reference clock signal, and supplies the internal clock signal to the above circuits.

In the CPU illustrated in FIG. 44, a memory cell is provided in the register 1196. For the memory cell of the register 1196, any of the above-described transistors, the above-described memory device, or the like can be used.

In the CPU illustrated in FIG. 44, the register controller 1197 selects operation of retaining data in the register 1196 in accordance with an instruction from the ALU 1191. That is, the register controller 1197 selects whether data is retained by a flip-flop or by a capacitor in the memory cell included in the register 1196. When data retention by the flip-flop is selected, a power supply voltage is supplied to the memory cell in the register 1196. When data retention by the capacitor is selected, the data is rewritten in the capacitor, and supply of a power supply voltage to the memory cell in the register 1196 can be stopped.

Figure 45:
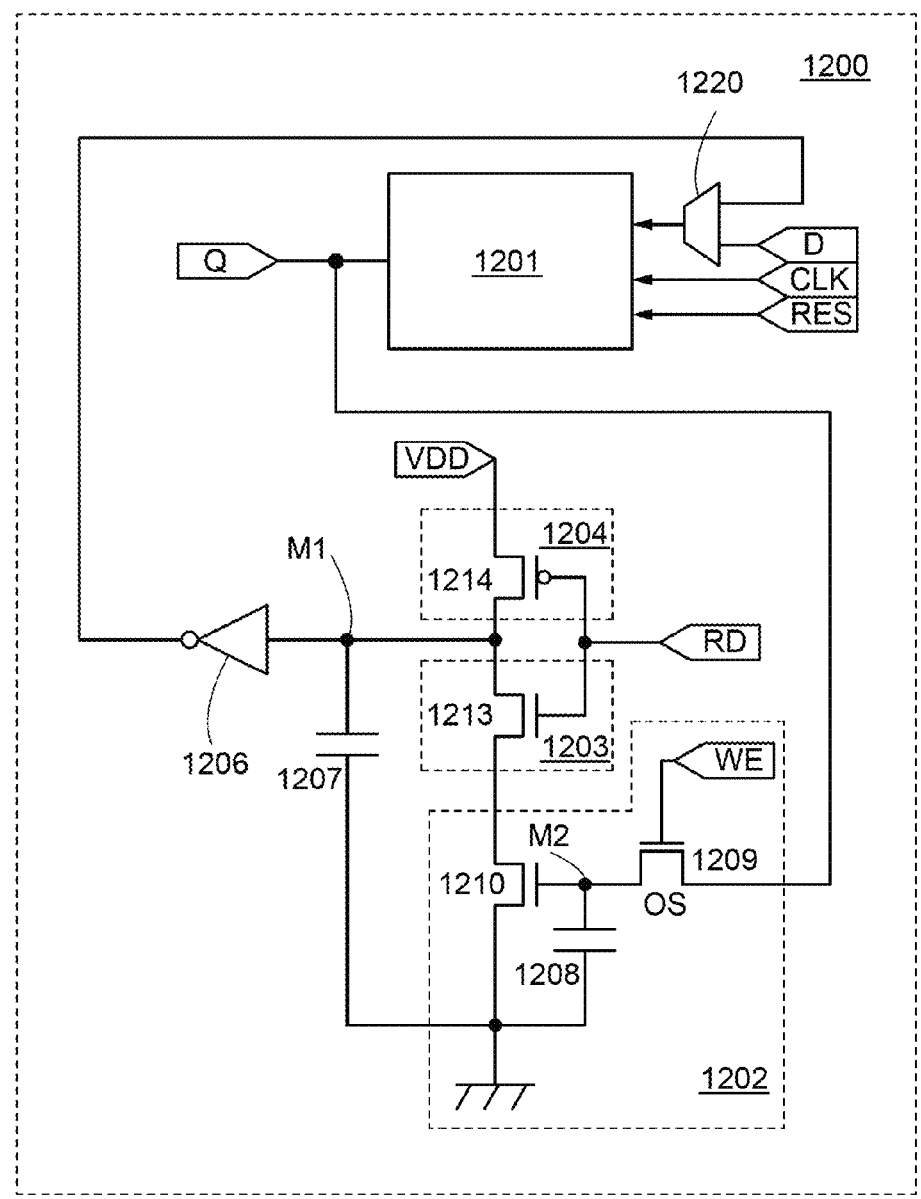
FIG. 45 is a circuit diagram illustrating a semiconductor device of one embodiment of the present invention.

FIG. 45 is an example of a circuit diagram of a memory element 1200 that can be used as the register 1196. The memory element 1200 includes a circuit 1201 in which stored data is volatile when power supply is stopped, a circuit 1202 in which stored data is nonvolatile even when power supply is stopped, a switch 1203, a switch 1204, a logic element 1206, a capacitor 1207, and a circuit 1220 having a selecting function. The circuit 1202 includes a capacitor 1208, a transistor 1209, and a transistor 1210. Note that the memory element 1200 may further include another element such as a diode, a resistor, or an inductor, as needed.

Here, the above-described memory device can be used as the circuit 1202. When supply of a power supply voltage to the memory element 1200 is stopped, GND (0 V) or a potential at which the transistor 1209 in the circuit 1202 is turned off continues to be input to a gate of the transistor 1209. For example, the gate of the transistor 1209 is grounded through a load such as a resistor.

Shown here is an example in which the switch 1203 is a transistor 1213 having one conductivity type (e.g., an n-channel transistor) and the switch 1204 is a transistor 1214 having a conductivity type opposite to the one conductivity type (e.g., a p-channel transistor). A first terminal of the switch 1203 corresponds to one of a source and a drain of the transistor 1213, a second terminal of the switch 1203 corresponds to the other of the source and the drain of the transistor 1213, and conduction or non-conduction between the first terminal and the second terminal of the switch 1203 (i.e., the on/off state of the transistor 1213) is selected by a control signal RD input to a gate of the transistor 1213. A first terminal of the switch 1204 corresponds to one of a source and a drain of the transistor 1214, a second terminal of the switch 1204 corresponds to the other of the source and the drain of the transistor 1214, and conduction or non-conduction between the first terminal and the second terminal of the switch 1204 (i.e., the on/off state of the transistor 1214) is selected by the control signal RD input to a gate of the transistor 1214.

One of a source and a drain of the transistor 1209 is electrically connected to one of a pair of electrodes of the capacitor 1208 and a gate of the transistor 1210. Here, the connection portion is referred to as a node M2. One of a source and a drain of the transistor 1210 is electrically connected to a line which can supply a low power supply potential (e.g., a GND line), and the other thereof is electrically connected to the first terminal of the switch 1203 (the one of the source and the drain of the transistor 1213). The second terminal of the switch 1203 (the other of the source and the drain of the transistor 1213) is electrically connected to the first terminal of the switch 1204 (the one of the source and the drain of the transistor 1214). The second terminal of the switch 1204 (the other of the source and the drain of the transistor 1214) is electrically connected to a line which can supply a power supply potential VDD. The second terminal of the switch 1203 (the other of the source and the drain of the transistor 1213), the first terminal of the switch 1204 (the one of the source and the drain of the transistor 1214), an input terminal of the logic element 1206, and one of a pair of electrodes of the capacitor 1207 are electrically connected to each other. Here, the connection portion is referred to as a node M1. The other of the pair of electrodes of the capacitor 1207 can be supplied with a constant potential. For example, the other of the pair of electrodes of the capacitor 1207 can be supplied with a low power supply potential (e.g., GND) or a high power supply potential (e.g., VDD). The other of the pair of electrodes of the capacitor 1207 is electrically connected to the line which can supply a low power supply potential (e.g., a GND line). The other of the pair of electrodes of the capacitor 1208 can be supplied with a constant potential. For example, the other of the pair of electrodes of the capacitor 1208 can be supplied with the low power supply potential (e.g., GND) or the high power supply potential (e.g., VDD). The other of the pair of electrodes of the capacitor 1208 is electrically connected to the line which can supply a low power supply potential (e.g., a GND line).

The capacitor 1207 and the capacitor 1208 are not necessarily provided as long as the parasitic capacitance of the transistor, the wiring, or the like is actively utilized.

A control signal WE is input to the gate of the transistor 1209. As for each of the switch 1203 and the switch 1204, a conduction state or a non-conduction state between the first terminal and the second terminal is selected by the control signal RD which is different from the control signal WE. When the first terminal and the second terminal of one of the switches are in the conduction state, the first terminal and the second terminal of the other of the switches are in the non-conduction state.

A signal corresponding to data retained in the circuit 1201 is input to the other of the source and the drain of the transistor 1209. FIG. 45 illustrates an example in which a signal output from the circuit 1201 is input to the other of the source and the drain of the transistor 1209. The logic value of a signal output from the second terminal of the switch 1203 (the other of the source and the drain of the transistor 1213) is inverted by the logic element 1206, and the inverted signal is input to the circuit 1201 through the circuit 1220.

In the example of FIG. 45, a signal output from the second terminal of the switch 1203 (the other of the source and the drain of the transistor 1213) is input to the circuit 1201 through the logic element 1206 and the circuit 1220; however, one embodiment of the present invention is not limited thereto. The signal output from the second terminal of the switch 1203 (the other of the source and the drain of the transistor 1213) may be input to the circuit 1201 without its logic value being inverted. For example, in the case where the circuit 1201 includes a node in which a signal obtained by inversion of the logic value of a signal input from the input terminal is retained, the signal output from the second terminal of the switch 1203 (the other of the source and the drain of the transistor 1213) can be input to the node.

In FIG. 45, the transistors included in the memory element 1200 except the transistor 1209 can each be a transistor in which a channel is formed in a film formed using a semiconductor other than an oxide semiconductor or in the substrate 1190. For example, the transistor can be a transistor whose channel is formed in a silicon film or a silicon substrate. Alternatively, all the transistors in the memory element 1200 may be a transistor in which a channel is formed in an oxide semiconductor. Further alternatively, in the memory element 1200, a transistor in which a channel is formed in an oxide semiconductor may be included besides the transistor 1209, and a transistor in which a channel is formed in a layer formed using a semiconductor other than an oxide semiconductor or in the substrate 1190 can be used for the rest of the transistors.

As the circuit 1201 in FIG. 45, for example, a flip-flop circuit can be used. As the logic element 1206, for example, an inverter or a clocked inverter can be used.

In a period during which the memory element 1200 is not supplied with the power supply voltage, the semiconductor device of one embodiment of the present invention can retain data stored in the circuit 1201 by the capacitor 1208 which is provided in the circuit 1202.

The off-state current of a transistor in which a channel is formed in an oxide semiconductor is extremely low. For example, the off-state current of a transistor in which a channel is formed in an oxide semiconductor is significantly lower than that of a transistor in which a channel is formed in silicon having crystallinity. Thus, when the transistor is used as the transistor 1209, a signal held in the capacitor 1208 is retained for a long time also in a period during which the power supply voltage is not supplied to the memory element 1200. The memory element 1200 can accordingly retain the stored content (data) also in a period during which the supply of the power supply voltage is stopped.

Since the above-described memory element performs pre-charge operation with the switch 1203 and the switch 1204, the time required for the circuit 1201 to retain original data again after the supply of the power supply voltage is restarted can be shortened.

In the circuit 1202, a signal retained by the capacitor 1208 is input to the gate of the transistor 1210. Therefore, after supply of the power supply voltage to the memory element 1200 is restarted, the signal retained by the capacitor 1208 can be converted into the one corresponding to the state (the on state or the off state) of the transistor 1210 to be read from the circuit 1202. Consequently, an original signal can be accurately read even when a potential corresponding to the signal retained by the capacitor 1208 varies to some degree.

By applying the above-described memory element 1200 to a memory device such as a register or a cache memory included in a processor, data in the memory device can be prevented from being lost owing to the stop of the supply of the power supply voltage.

Furthermore, shortly after the supply of the power supply voltage is restarted, the memory device can be returned to the same state as that before the power supply is stopped. Therefore, the power supply can be stopped even for a short time in the processor or one or a plurality of logic circuits included in the processor, resulting in lower power consumption.

Although the memory element 1200 is used in a CPU, the memory element 1200 can also be used in an LSI such as a digital signal processor (DSP) or a custom LSI, and a radio frequency (RF) device. The memory element 1200 can also be used in an LSI such as a programmable logic circuit including a field programmable gate array (FPGA) or a complex programmable logic device (CPLD).

The structures described in this embodiment can be used in appropriate combination with any of the structures described in the other embodiments.

(Embodiment 7)

In this embodiment, display devices each including the transistor or the like of one embodiment of the present invention will be described with reference to FIGS. 46A to 46C and FIGS. 47A and 47B.

<Configuration of Display Device>

Examples of a display element provided in the display device include a liquid crystal element (also referred to as a liquid crystal display element) and a light-emitting element (also referred to as a light-emitting display element). The light-emitting element includes, in its category, an element whose luminance is controlled by a current or voltage, and specifically includes, in its category, an inorganic electroluminescent (EL) element, an organic EL element, and the like. A display device including an EL element (EL display device) and a display device including a liquid crystal element (liquid crystal display device) are described below as examples of the display device.

Note that the display device described below includes in its category a panel in which a display element is sealed and a module in which an IC such as a controller is mounted on the panel.

The display device described below refers to an image display device or a light source (including a lighting device). The display device includes any of the following modules: a module provided with a connector such as an FPC or TCP; a module in which a printed wiring board is provided at the end of TCP; and a module in which an integrated circuit (IC) is mounted directly on a display element by a COG method.

Figure 46A:
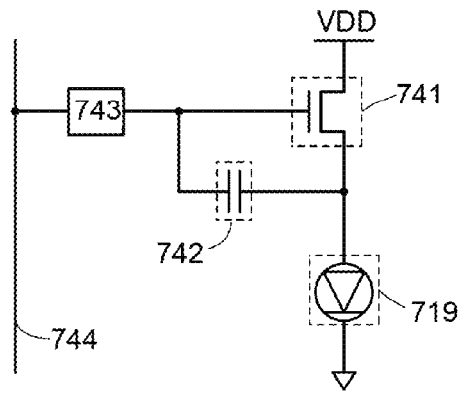
FIGS. 46A to 46C are a circuit diagram, a top view, and a cross-sectional view illustrating a semiconductor device of one embodiment of the present invention.
Figure 46B:
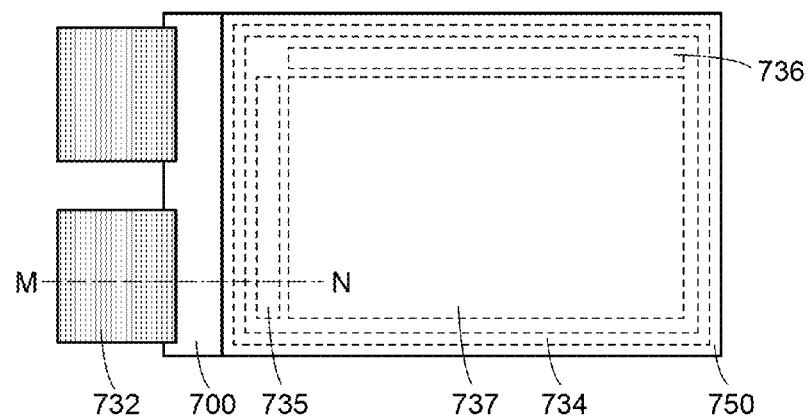
Figure 46C:
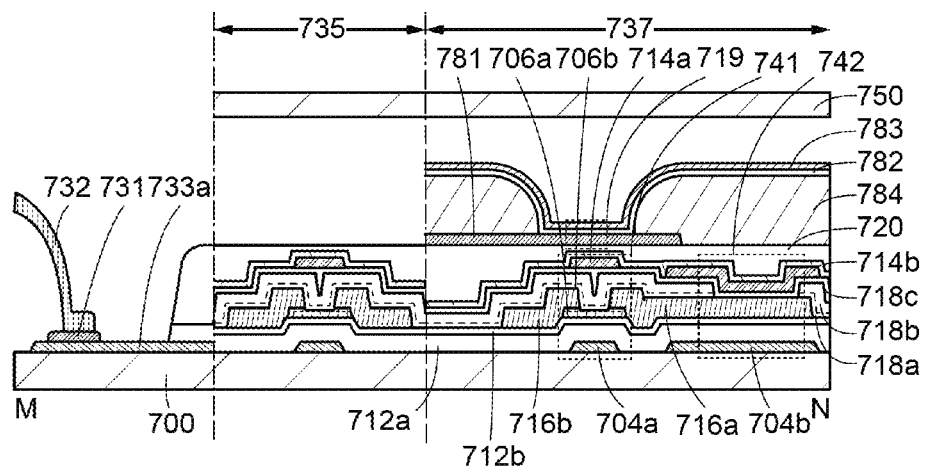

FIGS. 46A to 46C illustrate an example of an EL display device of one embodiment of the present invention. FIG. 46A is a circuit diagram of a pixel in an EL display device. FIG. 46B is a plan view showing the whole of the EL display device. FIG. 46C is a cross-sectional view taken along part of dashed-dotted line M-N in FIG. 46B.

FIG. 46A illustrates an example of a circuit diagram of a pixel used in an EL display device.

Note that in this specification and the like, it might be possible for those skilled in the art to constitute one embodiment of the invention even when portions to which all the terminals of an active element (e.g., a transistor or a diode), a passive element (e.g., a capacitor or a resistor), or the like are connected are not specified. In other words, one embodiment of the invention can be clear even when connection portions are not specified. Furthermore, in the case where a connection portion is disclosed in this specification and the like, it can be determined that one embodiment of the invention in which a connection portion is not specified is disclosed in this specification and the like, in some cases. Particularly in the case where the number of portions to which a terminal is connected might be more than one, it is not necessary to specify the portions to which the terminal is connected. Therefore, it might be possible to constitute one embodiment of the invention by specifying only portions to which some of terminals of an active element (e.g., a transistor or a diode), a passive element (e.g., a capacitor or a resistor), or the like are connected.

Note that in this specification and the like, it might be possible for those skilled in the art to specify the invention when at least the connection portion of a circuit is specified. Alternatively, it might be possible for those skilled in the art to specify the invention when at least a function of a circuit is specified. In other words, when a function of a circuit is specified, one embodiment of the present invention can be clear. Furthermore, it can be determined that one embodiment of the present invention whose function is specified is disclosed in this specification and the like in some cases. Therefore, when a connection portion of a circuit is specified, the circuit is disclosed as one embodiment of the invention even when a function is not specified, and one embodiment of the invention can be constituted. Alternatively, when a function of a circuit is specified, the circuit is disclosed as one embodiment of the invention even when a connection portion is not specified, and one embodiment of the invention can be constituted.

The EL display device illustrated in FIG. 46A includes a switching element 743, a transistor 741, a capacitor 742, and a light-emitting element 719.

Note that FIG. 46A and the like each illustrate an example of a circuit structure; therefore, a transistor can be provided additionally. In contrast, for each node in FIG. 46A, it is possible not to provide an additional transistor, switch, passive element, or the like.

A gate of the transistor 741 is electrically connected to one terminal of the switching element 743 and one electrode of the capacitor 742. A source of the transistor 741 is electrically connected to the other electrode of the capacitor 742 and one electrode of the light-emitting element 719. A drain of the transistor 741 is supplied with a power supply potential VDD. The other terminal of the switching element 743 is electrically connected to a signal line 744. A constant potential is supplied to the other electrode of the light-emitting element 719. The constant potential is a ground potential GND or a potential lower than the ground potential GND.

It is preferable to use a transistor as the switching element 743. When the transistor is used as the switching element, the area of a pixel can be reduced, so that the EL display device can have high resolution. As the switching element 743, a transistor formed through the same step as the transistor 741 can be used, so that EL display devices can be manufactured with high productivity. Note that as the transistor 741 and/or the switching element 743, any of the above-described transistors can be used, for example.

FIG. 46B is a plan view of the EL display device. The EL display device includes a substrate 700, a substrate 750, a sealant 734, a driver circuit 735, a driver circuit 736, a pixel 737, and an FPC 732. The sealant 734 is provided between the substrate 700 and the substrate 750 so as to surround the pixel 737, the driver circuit 735, and the driver circuit 736. Note that the driver circuit 735 and/or the driver circuit 736 may be provided outside the sealant 734.

FIG. 46C is a cross-sectional view of the EL display device taken along part of dashed-dotted line M-N in FIG. 46B.

FIG. 46C illustrates a structure of the transistor 741 including a conductor 704a over the substrate 700; an insulator 712a over the conductor 704a; an insulator 712b over the insulator 712a; a semiconductor 706a and a semiconductor 706b that are over the insulator 712b and overlap with the conductor 704a; a conductor 716a and a conductor 716b in contact with the semiconductors 706a and 706b; an insulator 718a over the semiconductor 706b, the conductor 716a, and the conductor 716b; an insulator 718b over the insulator 718a; an insulator 718c over the insulator 718b; and a conductor 714a that is over the insulator 718c and overlaps with the semiconductor 706b. Note that the structure of the transistor 741 is just an example; the transistor 741 may have a structure different from that illustrated in FIG. 46C.

Thus, in the transistor 741 illustrated in FIG. 46C, the conductor 704a functions as a gate electrode, the insulator 712a and the insulator 712b function as a gate insulator, the conductor 716a functions as a source electrode, the conductor 716b functions as a drain electrode, the insulator 718a, the insulator 718b, and the insulator 718c function as a gate insulator, and the conductor 714a functions as a gate electrode. Note that in some cases, electrical characteristics of the semiconductors 706a and 706b change if light enters the semiconductors 706a and 706b. To prevent this, it is preferable that one or more of the conductor 704a, the conductor 716a, the conductor 716b, and the conductor 714a have a light-blocking property.

Note that the interface between the insulator 718a and the insulator 718b is indicated by a broken line. This means that the boundary between them is not clear in some cases. For example, in the case where the insulator 718a and the insulator 718b are formed using insulators of the same kind, the insulator 718a and the insulator 718b are not distinguished from each other in some cases depending on an observation method.

FIG. 46C illustrates a structure of the capacitor 742 including a conductor 704b over the substrate; the insulator 712a over the conductor 704b; the insulator 712b over the insulator 712a; the conductor 716a that is over the insulator 712b and overlaps with the conductor 704b; the insulator 718a over the conductor 716a; the insulator 718b over the insulator 718a; the insulator 718c over the insulator 718b; and a conductor 714b that is over the insulator 718c and overlaps with the conductor 716a. In this structure, part of the insulator 718a and part of the insulator 718b are removed in a region where the conductor 716a and the conductor 714b overlap with each other.

In the capacitor 742, each of the conductor 704b and the conductor 714b functions as one electrode, and the conductor 716a functions as the other electrode.

Thus, the capacitor 742 can be formed using a film of the transistor 741. The conductor 704a and the conductor 704b are preferably conductors of the same kind, in which case the conductor 704a and the conductor 704b can be formed through the same step. Furthermore, the conductor 714a and the conductor 714b are preferably conductors of the same kind, in which case the conductor 714a and the conductor 714b can be formed through the same step.

The capacitor 742 illustrated in FIG. 46C has a large capacitance per area occupied by the capacitor. Therefore, the EL display device illustrated in FIG. 46C has high display quality. Note that although the capacitor 742 illustrated in FIG. 46C has the structure in which the part of the insulator 718a and the part of the insulator 718b are removed to reduce the thickness of the region where the conductor 716a and the conductor 714b overlap with each other, the structure of the capacitor according to one embodiment of the present invention is not limited to the structure. For example, a structure in which part of the insulator 718c is removed to reduce the thickness of the region where the conductor 716a and the conductor 714b overlap with each other may be used.

An insulator 720 is provided over the transistor 741 and the capacitor 742. Here, the insulator 720 may have an opening reaching the conductor 716a that functions as the source electrode of the transistor 741. A conductor 781 is provided over the insulator 720. The conductor 781 may be electrically connected to the transistor 741 through the opening in the insulator 720.

A partition wall 784 having an opening reaching the conductor 781 is provided over the conductor 781. A light-emitting layer 782 in contact with the conductor 781 through the opening provided in the partition wall 784 is provided over the partition wall 784. A conductor 783 is provided over the light-emitting layer 782. A region where the conductor 781, the light-emitting layer 782, and the conductor 783 overlap with one another functions as the light-emitting element 719.

So far, examples of the EL display device are described. Next, an example of a liquid crystal display device is described.

Figure 47A:
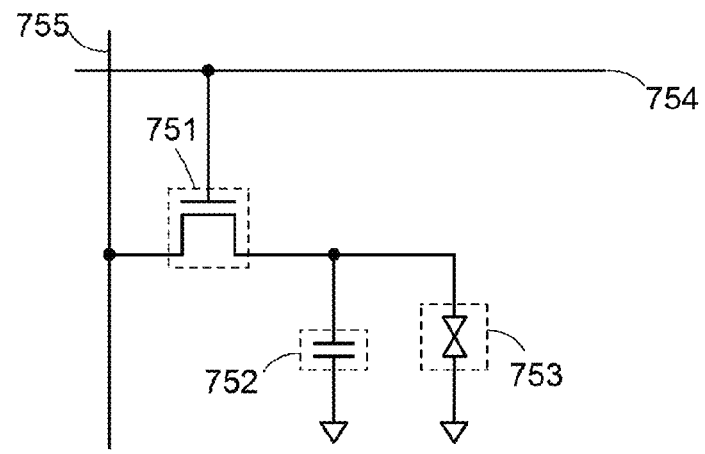
FIGS. 47A and 47B are a circuit diagram and a cross-sectional view illustrating a semiconductor device of one embodiment of the present invention.

FIG. 47A is a circuit diagram illustrating a configuration example of a pixel of a liquid crystal display device. A pixel shown in FIGS. 47A and 47B includes a transistor 751, a capacitor 752, and an element (liquid crystal element) 753 in which a space between a pair of electrodes is filled with a liquid crystal.

One of a source and a drain of the transistor 751 is electrically connected to a signal line 755, and a gate of the transistor 751 is electrically connected to a scan line 754.

One electrode of the capacitor 752 is electrically connected to the other of the source and the drain of the transistor 751, and the other electrode of the capacitor 752 is electrically connected to a wiring to which a common potential is supplied.

One electrode of the liquid crystal element 753 is electrically connected to the other of the source and the drain of the transistor 751, and the other electrode of the liquid crystal element 753 is electrically connected to a wiring to which a common potential is supplied. The common potential supplied to the wiring electrically connected to the other electrode of the capacitor 752 may be different from that supplied to the other electrode of the liquid crystal element 753.

Figure 47B:
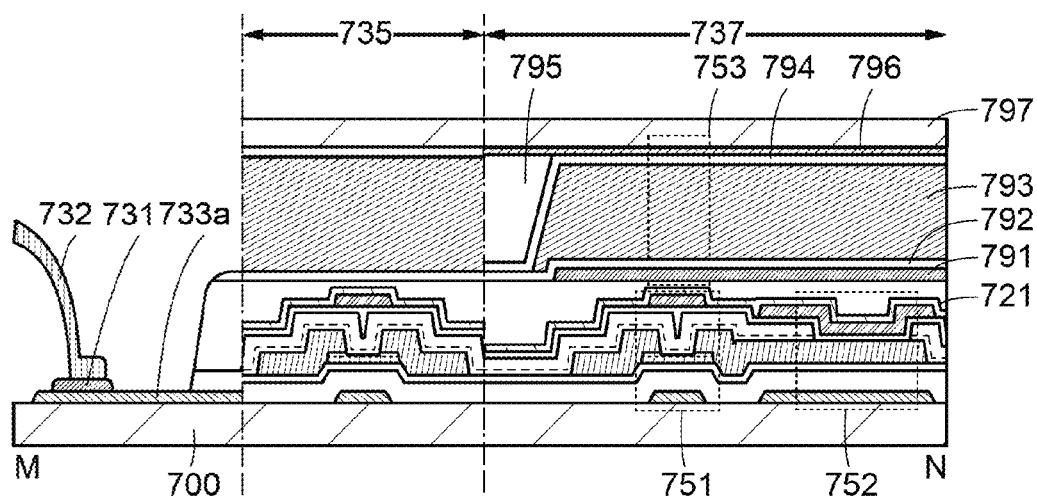

Note that the description of the liquid crystal display device is made on the assumption that the plan view of the liquid crystal display device is similar to that of the EL display device. FIG. 47B is a cross-sectional view of the liquid crystal display device taken along dashed-dotted line M-N in FIG. 46B. In FIG. 47B, the FPC 732 is connected to the wiring 733a via the terminal 731. Note that the wiring 733a may be formed using the same kind of conductor as the conductor of the transistor 751 or using the same kind of semiconductor as the semiconductor of the transistor 751.

For the transistor 751, the description of the transistor 741 is referred to. For the capacitor 752, the description of the capacitor 742 is referred to. Note that the structure of the capacitor 752 in FIG. 47B corresponds to, but is not limited to, the structure of the capacitor 742 in FIG. 46C.

Note that in the case where an oxide semiconductor is used as the semiconductor of the transistor 751, the off-state current of the transistor 751 can be extremely small. Therefore, an electric charge held in the capacitor 752 is unlikely to leak, so that the voltage applied to the liquid crystal element 753 can be maintained for a long time. Accordingly, the transistor 751 can be kept off during a period in which moving images with few motions or a still image are/is displayed, whereby power for the operation of the transistor 751 can be saved in that period; accordingly a liquid crystal display device with low power consumption can be provided. Furthermore, the area occupied by the capacitor 752 can be reduced; thus, a liquid crystal display device with a high aperture ratio or a high-resolution liquid crystal display device can be provided.

An insulator 721 is provided over the transistor 751 and the capacitor 752. The insulator 721 has an opening reaching the transistor 751. A conductor 791 is provided over the insulator 721. The conductor 791 is electrically connected to the transistor 751 through the opening in the insulator 721.

An insulator 792 functioning as an alignment film is provided over the conductor 791. A liquid crystal layer 793 is provided over the insulator 792. An insulator 794 functioning as an alignment film is provided over the liquid crystal layer 793. A spacer 795 is provided over the insulator 794. A conductor 796 is provided over the spacer 795 and the insulator 794. A substrate 797 is provided over the conductor 796.

Note that the following methods can be employed for driving the liquid crystal: a twisted nematic (TN) mode, a super twisted nematic (STN) mode, an in-plane-switching (IPS) mode, a fringe field switching (FFS) mode, a multi-domain vertical alignment (MVA) mode, a patterned vertical alignment (PVA) mode, an advanced super view (ASV) mode, an axially symmetric aligned microcell (ASM) mode, an optically compensated birefringence (OCB) mode, an electrically controlled birefringence (ECB) mode, an ferro-electric liquid crystal (FLC) mode, an anti-ferroelectric liquid crystal (AFLC) mode, a polymer dispersed liquid crystal (PDLC) mode, a guest-host mode, and a blue phase mode. Note that the present invention is not limited to these examples, and various driving methods can be used.

Owing to the above-described structure, a display device including a capacitor occupying a small area, a display device with high display quality, or a high-resolution display device can be provided.

For example, in this specification and the like, a display element, a display device which is a device including a display element, a light-emitting element, and a light-emitting device which is a device including a light-emitting element can employ various modes or can include various elements. For example, the display element, the display device, the light-emitting element, or the light-emitting device includes at least one of a light-emitting diode (LED) for white, red, green, blue, or the like, a transistor (a transistor that emits light depending on current), an electron emitter, a liquid crystal element, electronic ink, an electrophoretic element, a grating light valve (GLV), a plasma display panel (PDP), a display element using micro electro mechanical systems (MEMS), a digital micromirror device (DMD), a digital micro shutter (DMS), an interferometric modulator display (IMOD) element, a MEMS shutter display element, an optical-interference-type MEMS display element, an electrowetting element, a piezoelectric ceramic display, and a display element including a carbon nanotube. Display media whose contrast, luminance, reflectivity, transmittance, or the like is changed by electrical or magnetic effect may be included.

Note that examples of display devices having EL elements include an EL display. Examples of a display device including an electron emitter include a field emission display (FED), an SED-type flat panel display (SED: surface-conduction electron-emitter display), and the like. Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples of a display device including electronic ink, or an electrophoretic element include electronic paper. In the case of a transflective liquid crystal display or a reflective liquid crystal display, some of or all of pixel electrodes function as reflective electrodes. For example, some or all of pixel electrodes are formed to contain aluminum, silver, or the like. In such a case, a memory circuit such as an SRAM can be provided under the reflective electrodes. Thus, the power consumption can be further reduced.

Note that in the case of using an LED, graphene or graphite may be provided under an electrode or a nitride semiconductor of the LED. Graphene or graphite may be a multilayer film in which a plurality of layers are stacked. As described above, provision of graphene or graphite enables easy formation of a nitride semiconductor thereover, such as an n-type GaN semiconductor including crystals. Furthermore, a p-type GaN semiconductor including crystals or the like can be provided thereover, and thus the LED can be formed. Note that an AlN layer may be provided between the n-type GaN semiconductor including crystals and graphene or graphite. The GaN semiconductors included in the LED may be formed by MOCVD. Note that when the graphene is provided, the GaN semiconductors included in the LED can also be formed by a sputtering method.

The structures described in this embodiment can be used in appropriate combination with any of the structures described in the other embodiments.

(Embodiment 8)

In this embodiment, electronic devices each including the transistor or the like of one embodiment of the present invention will be described.

<Electronic Device>

The semiconductor device of one embodiment of the present invention can be used for display devices, personal computers, or image reproducing devices provided with recording media (typically, devices which reproduce the content of recording media such as digital versatile discs (DVDs) and have displays for displaying the reproduced images). Other examples of electronic devices that can be equipped with the semiconductor device of one embodiment of the present invention are mobile phones, game machines including portable game consoles, portable data terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 48A to 48F illustrate specific examples of these electronic devices.

Figure 48A:
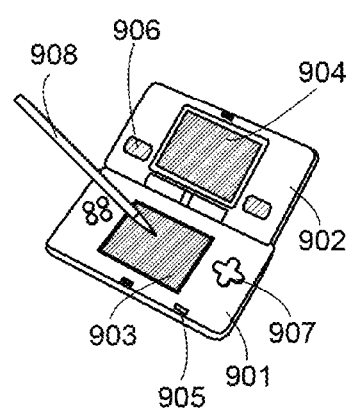
FIGS. 48A to 48F are perspective views each illustrating an electronic device of one embodiment of the present invention.

FIG. 48A illustrates a portable game console including a housing 901, a housing 902, a display portion 903, a display portion 904, a microphone 905, a speaker 906, an operation key 907, a stylus 908, and the like. Although the portable game console in FIG. 48A has the two display portions 903 and 904, the number of display portions included in a portable game console is not limited to this.

Figure 48B:
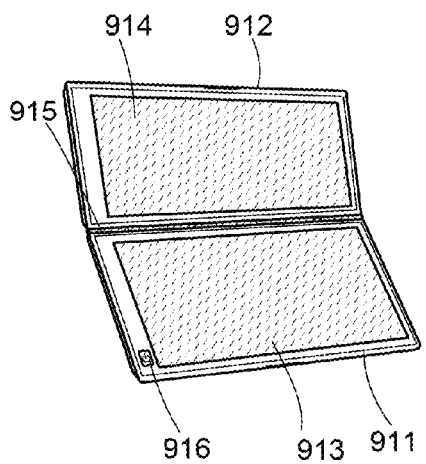

FIG. 48B illustrates a portable data terminal including a first housing 911, a second housing 912, a first display portion 913, a second display portion 914, a joint 915, an operation key 916, and the like. The first display portion 913 is provided in the first housing 911, and the second display portion 914 is provided in the second housing 912. The first housing 911 and the second housing 912 are connected to each other with the joint 915, and the angle between the first housing 911 and the second housing 912 can be changed with the joint 915. An image on the first display portion 913 may be switched in accordance with the angle at the joint 915 between the first housing 911 and the second housing 912. A display device with a position input function may be used as at least one of the first display portion 913 and the second display portion 914. Note that the position input function can be added by providing a touch panel in a display device. Alternatively, the position input function can be added by providing a photoelectric conversion element called a photosensor in a pixel portion of a display device.

Figure 48C:
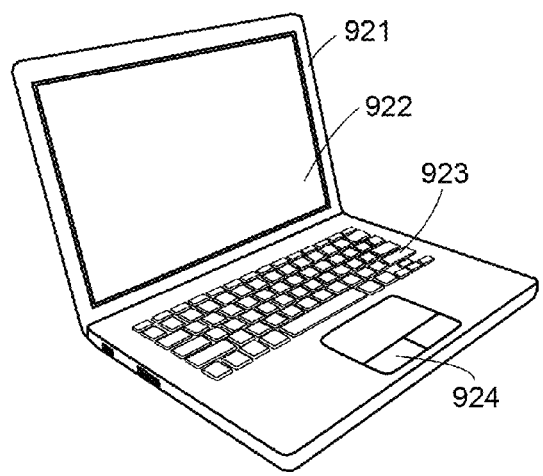

FIG. 48C illustrates a notebook personal computer, which includes a housing 921, a display portion 922, a keyboard 923, a pointing device 924, and the like.

Figure 48D:
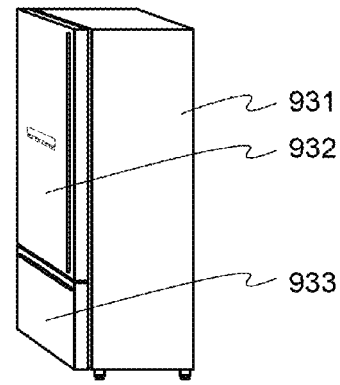

FIG. 48D illustrates an electric refrigerator-freezer, which includes a housing 931, a door for a refrigerator 932, a door for a freezer 933, and the like.

Figure 48E:
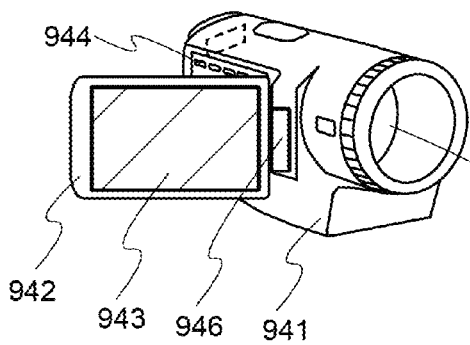

FIG. 48E illustrates a video camera, which includes a first housing 941, a second housing 942, a display portion 943, operation keys 944, a lens 945, a joint 946, and the like. The operation keys 944 and the lens 945 are provided for the first housing 941, and the display portion 943 is provided for the second housing 942. The first housing 941 and the second housing 942 are connected to each other with the joint 946, and the angle between the first housing 941 and the second housing 942 can be changed with the joint 946. Images displayed on the display portion 943 may be switched in accordance with the angle at the joint 946 between the first housing 941 and the second housing 942.

Figure 48F:
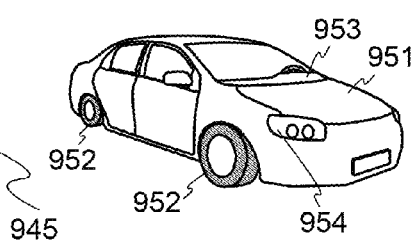

FIG. 48F illustrates a car including a car body 951, wheels 952, a dashboard 953, lights 954, and the like.

The structures described in this embodiment can be used in appropriate combination with any of the structures described in the other embodiments.

Embodiments of the present invention have been described in the above embodiments. Note that one embodiment of the present invention is not limited thereto. That is, various embodiments of the invention are described in this embodiment and the like, and one embodiment of the present invention is not limited to a particular embodiment. For example, an example in which a channel formation region, source and drain regions, and the like of a transistor include an oxide semiconductor is described as one embodiment of the present invention; however, one embodiment of the present invention is not limited to this example. Alternatively, depending on circumstances or conditions, various semiconductors may be included in various transistors, a channel formation region of a transistor, a source region or a drain region of a transistor, or the like of one embodiment of the present invention. Depending on circumstances or conditions, at least one of silicon, germanium, silicon germanium, silicon carbide, gallium arsenide, aluminum gallium arsenide, indium phosphide, gallium nitride, an organic semiconductor, and the like may be included in various transistors, a channel formation region of a transistor, a source region or a drain region of a transistor, or the like of one embodiment of the present invention. Alternatively, depending on circumstances or conditions, an oxide semiconductor is not necessarily included in various transistors, a channel formation region of a transistor, a source region or a drain region of a transistor, or the like of one embodiment of the present invention, for example.

Example 1

In this example, TDS analysis results of aluminum oxide films deposited by an RF sputtering method will be described. The following samples were used in the TDS analysis: Sample 1A in which an aluminum oxide film was not deposited; Sample 1B in which an aluminum oxide film was deposited by an RF sputtering method; Sample 1C in which an aluminum oxide film was deposited by an RF sputtering method and then was removed; and Sample 1D in which an aluminum oxide film was deposited by an RF sputtering method, heat treatment was performed in an oxygen atmosphere, and the aluminum oxide film was then removed. In addition, Sample 1E and Sample 1F in each of which an aluminum oxide film was deposited not by an RF sputtering method but by an ALD method were fabricated. Sample 1E and Sample 1F were fabricated by the same methods as Sample 1C and Sample 1D, respectively, except that the aluminum oxide films were deposited by an ALD method.

First, by thermal oxidation of a silicon wafer, a 100-nm-thick silicon oxide film was formed on a surface of the silicon wafer. The thermal oxidation was performed at 950° C. in an oxygen atmosphere containing HCl at 3 volume % for four hours.

Next, for Samples 1B to 1D, a 20-nm-thick aluminum oxide film was deposited over the silicon oxide film by an RF sputtering method. Note that aluminum oxide ($Al_2O_3$) was used as a target, oxygen at a flow rate of 25 sccm and argon at a flow rate of 25 sccm ($O_2$=50 volume % and Ar=50 volume %) were used as the deposition gases, the deposition pressure was 0.4 Pa, the deposition power was 2500 W, the substrate temperature was 250° C., and the target-substrate distance was 60 mm.

For Samples 1E and 1F, a 20-nm-thick aluminum oxide film was deposited over the silicon oxide film by an ALD method. Note that trimethyl aluminum (TMA) was used as a precursor, ozone was used as an oxidizer, and the substrate temperature was 250° C.

For Samples 1D and 1F, heat treatment was performed at 400° C. in an oxygen atmosphere for one hour.

Next, for Samples 1C to 1F, wet etching was performed at 85° C. to remove the aluminum oxide film. For the wet etching, a mixed acid aluminum solution (aqueous solution containing 2.0 weight % nitric acid, 9.8 weight % acetic acid, and 72.3 weight % phosphoric acid) produced by Wako Pure Chemical Industries, Ltd. was used.

FIGS. 49A to 49F show the TDS analysis results of Samples 1A to 1F fabricated in the above manner. In each of FIGS. 49A to 49F, the lateral axis represents the substrate temperature (Sub. Temp.) [° C.], and the longitudinal axis represents the current intensity (Intensity) [A] proportional to the amount of a released gas with a mass-to-charge ratio M/z Of 32. Note that in the TDS analysis, the amount of a released gas with a mass-to-charge ratio M/z of 32, which corresponds to an oxygen molecule, was measured. For the TDS analysis, a thermal desorption spectrometer EMD-WA1000S/W manufactured by ESCO, Ltd. was used.

Figure 49A:
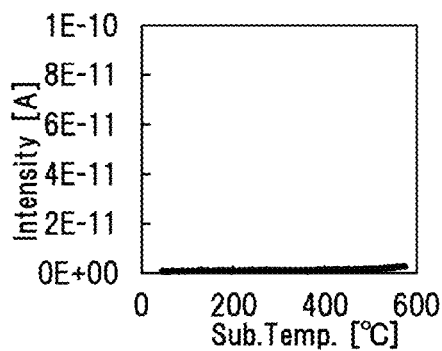
FIGS. 49A to 49F are graphs showing TDS analysis results in Example.
Figure 49B:
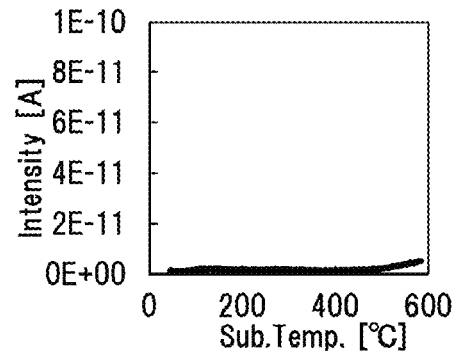
Figure 49C:
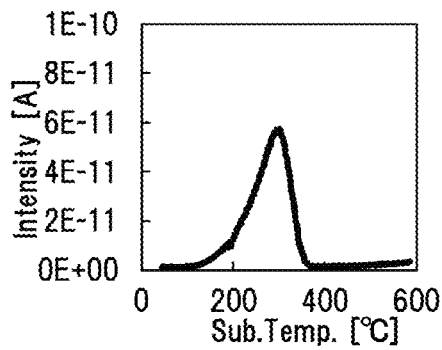
Figure 49D:
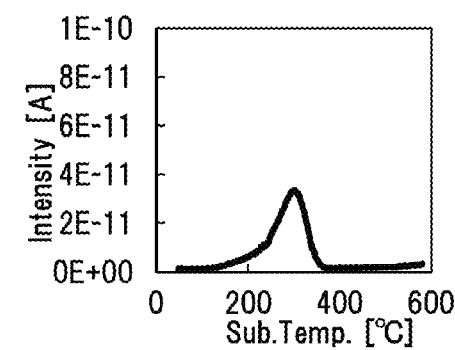
Figure 49E:
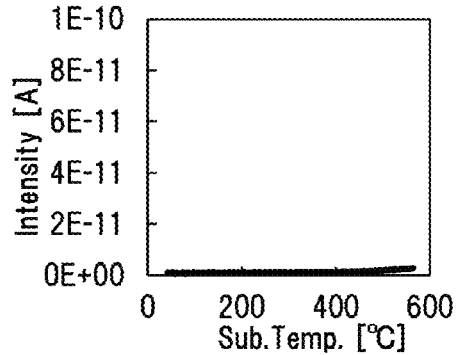
Figure 49F:
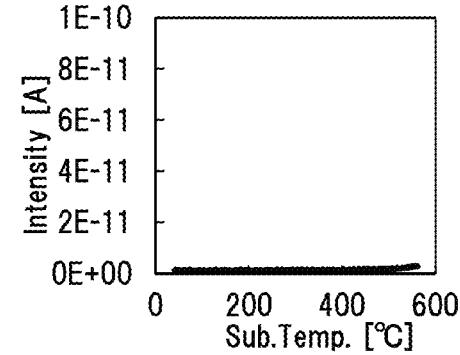

As shown in FIGS. 49A and 49B, oxygen molecules were hardly released from Sample 1A in which an aluminum oxide film was not deposited and Sample 1B in which an aluminum oxide film was deposited but not removed. In contrast, oxygen molecules were definitely released from Sample 1C and Sample 1D in each of which an aluminum oxide film was deposited and then removed. The number of oxygen molecules released from Sample 1C was $2.2 \times 10^{15}$ molecules/$cm^2$, and the number of oxygen molecules released from Sample 1D was $1.3 \times 10^{15}$ molecules/$cm^2$. Note that oxygen molecules were hardly released from Sample 1E and Sample 1F in each of which an aluminum oxide film was deposited by an ALD method.

The TDS analysis results of Sample 1A and Sample 1C suggest that the deposition of an aluminum oxide film over a silicon oxide film by a sputtering method allows oxygen addition to the silicon oxide film. Furthermore, the TDS analysis results of Sample 1B and Sample 1C suggest that an aluminum oxide film prevents the outward diffusion of oxygen added to a silicon oxide film, or that an aluminum oxide film has a function of blocking oxygen.

The results of Sample 1C and Sample 1D suggest that oxygen is added to a silicon oxide film, and the number of oxygen molecules released from the silicon oxide film in contact with an aluminum oxide film is within a range of $1.0 \times 10^{14}$ molecules/$cm^2$ to $1.0 \times 10^{16}$ molecules/$cm^2$, and within a range of $1.0 \times 10^{15}$ molecules/$cm^2$ to $5.0 \times 10^{15}$ molecules/$cm^2$ in TDS analysis, as described in the above embodiment.

Oxygen molecules were also released in Sample 1D in which the heat treatment was performed at 400° C. in an oxygen atmosphere after the deposition of the aluminum oxide film. This indicates that outward diffusion of oxygen is blocked by an aluminum oxide film even when heat treatment is performed.

Almost no release of oxygen molecules from Sample 1E infers that oxygen is not added to a silicon oxide film in principle when an aluminum oxide film is deposited by an ALD method. The result of Sample 1F in which an aluminum oxide film was deposited by an ALD method and heat treatment was then performed infers the same.

The above results suggest that, to add oxygen to a silicon oxide film, an aluminum oxide film is deposited preferably with the use of plasma, especially preferably by a sputtering method.

Example 2

In this example, the oxygen volume fraction (oxygen flow rate) dependence of the amount of oxygen added to an aluminum oxide film deposited by an RF sputtering method was analyzed by TDS. In this example, seven samples Sample 2A to Sample 2G were fabricated. Aluminum oxide films were deposited at oxygen volume fractions of 0 volume %, 4 volume %, 10 volume %, 20 volume %, 50 volume %, 80 volume %, and 100 volume %.

Methods for fabricating Samples 2A to 2G will be described below.

First, by thermal oxidation of a silicon wafer, a 100-nm-thick silicon oxide film was formed on a surface of the silicon wafer. The thermal oxidation was performed at 950° C. in an oxygen atmosphere containing HCl at 3 volume % for four hours.

Next, a 70-nm-thick aluminum oxide film was deposited over the silicon oxide film by an RF sputtering method. Note that aluminum oxide ($Al_2O_3$) was used as a target, the deposition pressure was 0.4 Pa, the deposition power was 2500 W, the substrate temperature was 250° C., and the target-substrate distance was 60 mm. The flow rate of the deposition gas was as follows: the oxygen flow rate was 0 sccm and the argon flow rate was 50 sccm ($O_2$=0 volume % and Ar=100 volume %) in Sample 2A; the oxygen flow rate was 2 sccm and the argon flow rate was 48 sccm ($O_2$=4 volume % and Ar=96 volume %) in Sample 2B; the oxygen flow rate was 5 sccm and the argon flow rate was 45 sccm ($O_2$=10 volume % and Ar=90 volume %) in Sample 2C; the oxygen flow rate was 10 sccm and the argon flow rate was 40 sccm ($O_2$=20 volume % and Ar=80 volume %) in Sample 2D; the oxygen flow rate was 25 sccm and the argon flow rate was 25 sccm ($O_2$=50 volume % and Ar=50 volume %) in Sample 2E; the oxygen flow rate was 40 sccm and the argon flow rate was 10 sccm ($O_2$=80 volume % and Ar=20 volume %) in Sample 2F; and the oxygen flow rate was 50 sccm and the argon flow rate was 0 sccm ($O_2$=100 volume % and Ar=0 volume %) in Sample 2G.

Next, wet etching was performed at 85° C. to remove the aluminum oxide film. For the wet etching, a mixed acid aluminum solution (aqueous solution containing 2.0 weight % nitric acid, 9.8 weight % acetic acid, and 72.3 weight % phosphoric acid) produced by Wako Pure Chemical Industries, Ltd. was used.

FIGS. 50A to 50G show the TDS analysis results of Samples 2A to 2G fabricated in the above manner. In each of FIGS. 50A to 50G, the lateral axis represents the substrate temperature (Sub. Temp.) [° C.], and the longitudinal axis represents the current intensity (Intensity) [A] proportional to the amount of a released gas with a mass-to-charge ratio M/z of 32. Note that in the TDS analysis, the amount of a released gas with a mass-to-charge ratio M/z of 32, which corresponds to an oxygen molecule, was measured. For the TDS analysis, a thermal desorption spectrometer EMD-WA1000S/W manufactured by ESCO, Ltd. was used.

FIGS. 50A to 50G show that oxygen molecules were hardly released from Sample 2A, whereas oxygen molecules were released from Samples 2B to 2G. The number of oxygen molecules released from Sample 2B was $8.1 \times 10^{14}$ molecules/cm$^2$, the number of oxygen molecules released from Sample 2C was $1.3 \times 10^{15}$ molecules/cm$^2$, the number of oxygen molecules released from Sample 2D was $1.8 \times 10^{15}$ molecules/cm$^2$, the number of oxygen molecules released from Sample 2E was $1.9 \times 10^{15}$ molecules/cm$^2$, the number of oxygen molecules released from Sample 2F was $2.2 \times 10^{15}$ molecules/cm$^2$, and the number of oxygen molecules released from Sample 2G was $2.1 \times 10^{15}$ molecules/cm$^2$.

The TDS analysis results of Samples 2A to 2G indicate that the amount of oxygen added to a silicon oxide film tends to increase as the oxygen volume fraction at the time of the deposition of an aluminum oxide film becomes larger. It is also found that the amount of oxygen added to a silicon oxide film tends to be saturated at an oxygen volume fraction of 20 volume % or more, and that oxygen is hardly added to a silicon oxide film when the oxygen volume fraction is 0 volume %.

According to the above, to add oxygen to a silicon oxide film, an aluminum oxide film is preferably deposited in an atmosphere containing oxygen. Note that the amount of oxygen added tends to be saturated as the oxygen volume fraction becomes larger. To add a large amount of oxygen to a silicon oxide film, an aluminum oxide film is deposited at an oxygen volume fraction of, for example, 10 volume % or more, preferably 20 volume % or more, and further preferably 50 volume % or more. However, when the oxygen volume fraction is too large in sputtering, the deposition rate tends to be low; thus, an aluminum oxide film is deposited at an oxygen volume fraction of, for example, 10 volume % or more and 80 volume % or less, and preferably 20 volume % or more and 50 volume % or less.

Example 3

In this example, the thickness dependence of the amount of oxygen added to an aluminum oxide film deposited by an RF sputtering method was analyzed by TDS. In this example, six samples Sample 3A to Sample 3F were fabricated. The thicknesses of aluminum oxide films were 1.4 nm, 4.0 nm, 5.4 nm, 11.4 nm, 21.8 nm, and 67.2 nm.

Methods for fabricating Samples 3A to 3F will be described below.

First, by thermal oxidation of a silicon wafer, a 100-nm-thick silicon oxide film was formed on a surface of the silicon wafer. The thermal oxidation was performed at 950° C. in an oxygen atmosphere containing HCl at 3 volume % for four hours.

Next, an aluminum oxide film was deposited over the silicon oxide film by an RF sputtering method. Note that aluminum oxide ($Al_2O_3$) was used as a target, oxygen at a flow rate of 25 sccm and argon at a flow rate of 25 sccm ($O_2$=50 volume % and Ar=50 volume %) were used as the deposition gases, the deposition pressure was 0.4 Pa, the deposition power was 2500 W, the substrate temperature was 250° C., and the target-substrate distance was 60 mm. The thicknesses of aluminum oxide films were 1.4 nm in Sample 3A, 4.0 nm in Sample 3B, 5.4 nm in Sample 3C, 11.4 nm in Sample 3D, 21.8 nm in Sample 3E, and 67.2 nm in Sample 3F.

Then, heat treatment was performed at 400° C. in an oxygen atmosphere for one hour.

After that, wet etching was performed at 85° C. to remove the aluminum oxide film. For the wet etching, a mixed acid aluminum oxide solution (aqueous solution containing 2.0 weight % nitric acid, 9.8 weight % acetic acid, and 72.3 weight % phosphoric acid) produced by Wako Pure Chemical Industries, Ltd. was used.

FIGS. 51A to 51F show the TDS analysis results of Samples 3A to 3F fabricated in the above manner. In each of FIGS. 51A to 51F, the lateral axis represents the substrate temperature (Sub. Temp.) [° C.], and the longitudinal axis represents the current intensity (Intensity) [A] proportional to the amount of a released gas with a mass-to-charge ratio M/z of 32. Note that in the TDS analysis, the amount of a released gas with a mass-to-charge ratio M/z of 32, which corresponds to an oxygen molecule, was measured. For the TDS analysis, a thermal desorption spectrometer EMD-WA1000S/W manufactured by ESCO, Ltd. was used.

FIGS. 51A to 51F show that oxygen molecules were hardly released from Sample 3A, whereas oxygen molecules were released from Samples 3B to 3F. The number of oxygen molecules released from Sample 3B was $1.3 \times 10^{15}$ molecules/cm$^2$, the number of oxygen molecules released from Sample 3C was $1.8 \times 10^{15}$ molecules/cm$^2$, the number of oxygen molecules released from Sample 3D was $2.2 \times 10^{15}$ molecules/cm$^2$, the number of oxygen molecules released from Sample 3E was $2.5 \times 10^{15}$ molecules/cm$^2$, and the number of oxygen molecules released from Sample 3F was $2.5 \times 10^{15}$ molecules/cm$^2$.

The TDS analysis results of Samples 3A to 3F indicate that the amount of oxygen added to a silicon oxide film tends to increase as the thickness of an aluminum oxide film becomes larger. It is also found that the amount of oxygen added to a silicon oxide film tends to be saturated when the thickness of an aluminum oxide film is approximately 20 nm or more, and that oxygen is hardly added to a silicon oxide film when the thickness of an aluminum oxide film is approximately 2 nm or less.

According to the above, to add oxygen to a silicon oxide film, an aluminum oxide film is preferably deposited thick. Note that the amount of oxygen added tends to be saturated as the thickness of an aluminum oxide film becomes larger. To add a large amount of oxygen to a silicon oxide film, the thickness of an aluminum oxide film is, for example, greater than or equal to 5 nm, preferably greater than or equal to 10 nm, and further preferably greater than or equal to 20 nm.

Example 4

In this example, oxygen vacancies in steps included in a process of depositing an oxide semiconductor film, a silicon oxynitride film, and an aluminum oxide film in this order were quantified. The steps correspond to those in the method for manufacturing a transistor described in the above embodiment. Sample 4A to Sample 4F were each fabricated through the process up to a given step and subjected to electron spin resonance (ESR) analysis.

Methods for fabricating Samples 4A to 4F will be described below.

To fabricate Sample 4A, a 50-nm-thick In—Ga—Zn oxide was deposited over a quartz substrate by a DC sputtering method. The deposition of the In—Ga—Zn oxide was performed under the following conditions: a target having an atomic ratio of In:Ga:Zn=1:1:1 was used, an argon gas at 30 sccm and an oxygen gas at 15 sccm were used as the deposition gases, the deposition pressure was 0.7 Pa (measured by Miniature Gauge MG-2 manufactured by CANON ANELVA CORPORATION), the deposition power was 500 W, the substrate temperature was 300° C., and the target-substrate distance was 60 mm. This step corresponds to the step of forming the oxide semiconductor of the transistor in the above embodiment.

To fabricate Sample 4B, a sample fabricated through the same steps as Sample 4A was subjected to heat treatment at 450° C. in a nitrogen atmosphere for one hour, and then subjected to heat treatment at 450° C. in an oxygen atmosphere for one hour.

To fabricate Sample 4C, a 5-nm-thick In—Ga—Zn oxide was deposited by a DC sputtering method over a sample fabricated through the same steps as Sample 4B. The deposition of the In—Ga—Zn oxide was performed under the following conditions: a target having an atomic ratio of In:Ga:Zn=1:3:2 was used, an argon gas at 30 sccm and an oxygen gas at 15 sccm were used as the deposition gases, the deposition pressure was 0.4 Pa (measured by B-A Gauge BRG-1B manufactured by CANON ANELVA CORPORATION), the deposition power was 500 W, the substrate temperature was 200° C., and the target-substrate distance was 60 mm. This step corresponds to the step of forming the insulator between the gate insulating film and the oxide semiconductor of the transistor in FIGS. 3A and 3B described in the above embodiment.

To fabricate Sample 4D, a 13-nm-thick silicon oxynitride was deposited by a PECVD method over a sample fabricated through the same steps as Sample 4C. Note that 1 sccm of silane and 800 sccm of nitrous oxide were used as the deposition gases, the deposition pressure was 200 Pa, the deposition power (RF, 60 MHz) was 150 W, the substrate temperature was 350° C., and the distance between electrodes was 28 mm. This step corresponds to the step of forming the gate insulating film of the transistor in the above embodiment.

To fabricate Sample 4E, a 40-nm-thick aluminum oxide was deposited by an RF sputtering method over a sample fabricated through the same steps as Sample 4D. The deposition of the aluminum oxide was performed under the following conditions: an $Al_2O_3$ target was used, an argon gas at 25 sccm and an oxygen gas at 25 sccm were used as the deposition gases, the deposition pressure was 0.4 Pa (measured by B-A Gauge BRG-1B manufactured by CANON ANELVA CORPORATION), the deposition power was 2500 W, the substrate temperature was 250° C., and the target-substrate distance was 60 mm. This step corresponds to the step of forming the protective insulating film of the transistor in the above embodiment.

To fabricate Sample 4F, a sample fabricated through the same steps as Sample 4E was subjected to heat treatment at 400° C. in an oxygen atmosphere for one hour.

Figure 52:
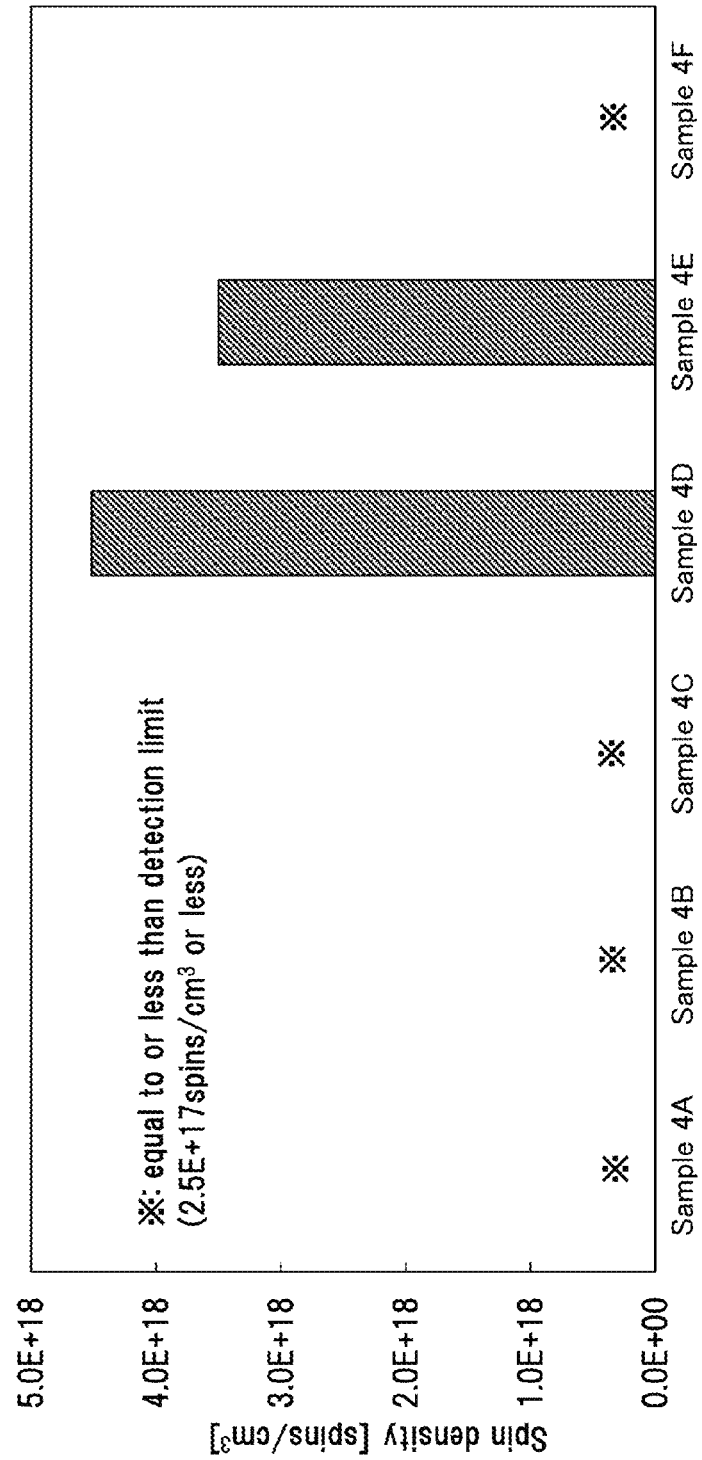
FIG. 52 is a graph showing ESR analysis results in Example.

Samples 4A to 4F fabricated in the above manner were each subjected to ESR analysis, and the spin density corresponding to an ESR signal at g=1.93 was calculated. FIG. 52 shows the calculation results. The lateral axis and the longitudinal axis in FIG. 52 represent the samples and the spin density [spins/$cm^3$], respectively. Note that the ESR signal at g=1.93 originates from conduction electrons in the In—Ga—Zn oxide deposited using the target having an atomic ratio of In:Ga:Zn=1:1:1. The conduction electrons are generated due to hydrogen trapped (hereinafter also referred to as $V_O(H)$) in oxygen vacancies in the In—Ga—Zn oxide. Thus, large spin density when g is 1.93 means that the sample contains a large amount of $V_O(H)$ in the In—Ga—Zn oxide.

As shown in FIG. 52, the spin density is lower than or equal to the lower limit of detection (2.5×$10^{17}$ spins/$cm^3$) in Samples 4A to 4C, 4.5×$10^{18}$ spins/$cm^3$ in Sample 4D, 3.5×$10^{18}$ spins/$cm^3$ in Sample 4E, and lower than or equal to the lower limit of detection in Sample 4F. The results indicate that, in the samples in this example, the amount of $V_O(H)$ in the In—Ga—Zn oxide is increased in the case of depositing silicon oxynitride, the amount of $V_O(H)$ is reduced in the case of depositing aluminum oxide, and the amount of $V_O(H)$ is reduced to lower than or equal to the lower limit of detection in the case of performing heat treatment.

A reduction in the amount of $V_O(H)$ in the In—Ga—Zn oxide means a reduction in oxygen vacancies that cause $V_O(H)$. This suggests that the deposition of aluminum oxide performed in the fabrication of Sample 4E and the heat treatment performed in the fabrication of Sample 4F reduced oxygen vacancies in the In—Ga—Zn oxide.

The above infers that, as described in the above embodiment, the deposition of aluminum oxide (protective insulating film) by a sputtering method causes oxygen addition to silicon oxynitride (protective insulating film, gate insulating film, or base insulating film) in contact with the aluminum oxide (protective insulating film) and the oxygen is supplied to an oxide semiconductor, resulting in a reduction in oxygen vacancies in the oxide semiconductor. It is also inferred that more oxygen is supplied to the oxide semiconductor owing to heat treatment performed after the deposition of the aluminum oxide (protective insulating film), resulting in a further reduction in oxygen vacancies in the oxide semiconductor.

Example 5

In this example, oxygen diffusion into samples in each of which an aluminum oxide film was deposited over a silicon oxynitride film was analyzed by SIMS. In this example, two samples Sample 5A and Sample 5B were fabricated. An aluminum oxide film was deposited over a silicon oxynitride film to fabricate Sample 5A, and heat treatment was performed thereon to fabricate Sample 5B. For the SIMS analysis, substrate side depth profile secondary ion mass spectrometry (SSDP-SIMS) in which measurement is performed from the substrate side was used.

Methods for fabricating Samples 5A and 5B will be described below.

First, by thermal oxidation of a silicon wafer, a 100-nm-thick silicon oxide film was formed on a surface of the silicon wafer. The thermal oxidation was performed at 950° C. in an oxygen atmosphere containing HCl at 3 volume % for four hours.

Then, a 300-nm-thick silicon oxynitride film was deposited by a PECVD method. Note that 2.3 sccm of silane and 800 sccm of nitrous oxide were used as the deposition gases, the deposition pressure was 40 Pa, the deposition power (RF, 27 MHz) was 50 W, and the substrate temperature was 400° C.

After that, heat treatment was performed in a vacuum at 450° C. for one hour.

Next, a 70-nm-thick aluminum oxide film was deposited over the silicon oxynitride film by an RF sputtering method. Note that aluminum oxide ($Al_2O_3$) was used as a target, oxygen at a flow rate of 25 sccm and argon at a flow rate of 25 sccm ($O_2$=50 volume % and Ar=50 volume %) were used as the deposition gases, the deposition pressure was 0.4 Pa, the deposition power was 2500 W, the substrate temperature was 250° C., and the target-substrate distance was 60 mm.

Note that as the oxygen gas used as the sputtering gas, an oxygen gas whose oxygen molecule ($^{18}O_2$) includes oxygen atoms having a mass number of 18 was used.

For Sample 5B, heat treatment was performed at 400° C. in an oxygen atmosphere for one hour.

Figure 53A:
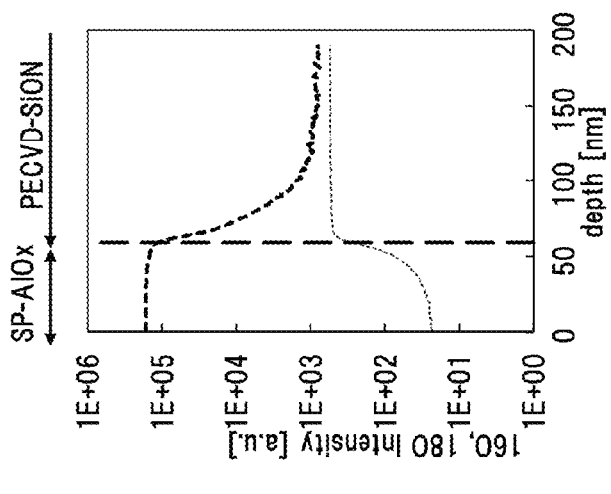
FIGS. 53A to 53C are graphs showing SSDP-SIMS analysis results in Example.

FIG. 53A shows $^{18}O$ detected in the SSDP-SIMS analysis performed on Samples 5A and 5B fabricated in the above manner. In FIG. 53A, the lateral axis represents the depth (from a surface of the aluminum oxide film) [nm] and the longitudinal axis represents the $^{18}O$ concentration [atoms/cm$^3$]. Note that the SIMS analysis was performed by using an ADEPT-1010 quadrupole mass spectrometry instrument manufactured by ULVAC-PHI, Inc.

FIG. 53A shows that oxygen is diffused into the silicon oxynitride film from the aluminum oxide film at a surface of each of Sample 5A and Sample 5B. In Sample 5B in which heat treatment was performed after the deposition of the aluminum oxide film, the $^{18}O$ concentration is higher than that in Sample 5A at a deep region (100 nm or more away from the surface of the aluminum oxide film) in the silicon oxynitride film.

Figure 53B:
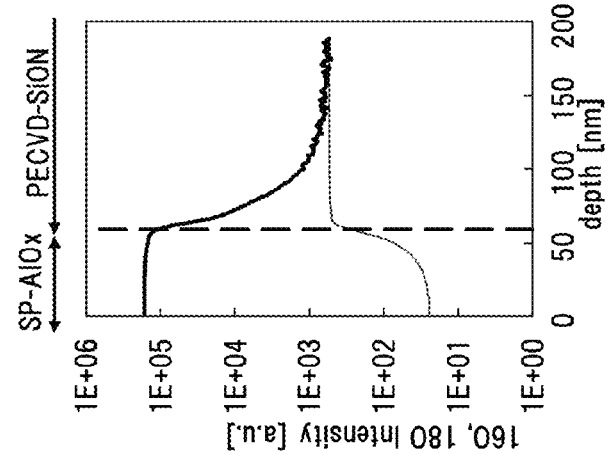
Figure 53C:
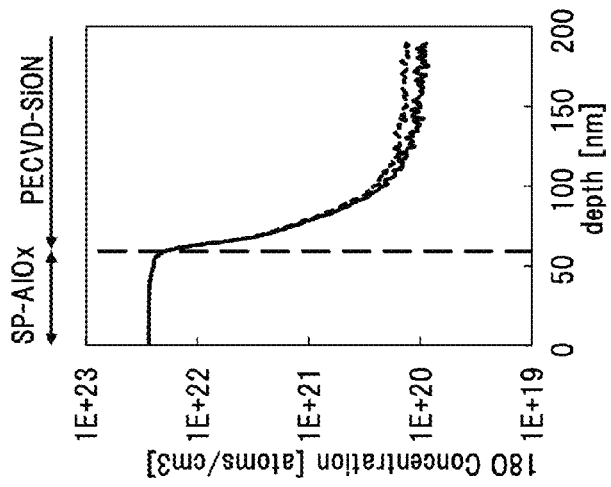

Each of Sample 5A and Sample 5B was also subjected to SIMS analysis to detect $^{16}O$. Note that the ion intensities of $^{16}O$ and $^{18}O$ were converted using their respective natural isotope fractions ($^{16}O$: 99.757%, $^{18}O$: 0.205%). FIGS. 53B and 53C show the profiles of $^{16}O$ and $^{18}O$ converted such that they overlap with each other when $^{16}O$ and $^{18}O$ exist at the natural isotope fractions. FIG. 53B shows the results of Sample 5A and FIG. 53C shows the results of Sample 5B. In each of FIGS. 53B and 53C, the lateral axis represents the depth (from the surface of the aluminum oxide film) [nm] and the longitudinal axis represents the intensity (arbitrary intensity) [a.u.].

FIG. 53B shows that the profiles of $^{16}O$ and $^{18}O$ in Sample 5A start to coincide with each other at a depth of approximately 100 nm from the interface between the aluminum oxide film and the silicon oxynitride film. This indicates that oxygen added at the time of the deposition of the aluminum oxide film in Sample 5A is diffused to a depth of approximately 100 nm from the interface between the aluminum oxide film and the silicon oxynitride film.

FIG. 53C shows that the profiles of $^{16}O$ and $^{18}O$ in Sample 5B does not coincide with each other even at a depth of approximately 150 nm or more from the interface between the aluminum oxide film and the silicon oxynitride film. This indicates that oxygen added at the time of the deposition of the aluminum oxide film in Sample 5B is diffused to a depth of approximately 150 nm or more from the interface between the aluminum oxide film and the silicon oxynitride film by the heat treatment performed after the deposition.

The above results indicate that the deposition of an aluminum oxide film over a silicon oxynitride film by a sputtering method allows oxygen addition into the silicon oxynitride film. It is also indicated that heat treatment performed after the deposition of the aluminum oxide film allows oxygen diffusion in a wide area in the silicon oxynitride film.

Example 6

In this example, in samples in each of which an aluminum oxide film was deposited over a silicon oxide film, a mixed region formed in the vicinity of the interface between the silicon oxide film and the aluminum oxide film was analyzed by SIMS. For the SIMS analysis, time-of-flight secondary ion mass spectrometry (ToF-SIMS) was used.

In this example, two samples Sample 6A and Sample 6B were fabricated. To fabricate Sample 6A, an aluminum oxide film was deposited by an RF sputtering method, and to fabricate Sample 6B, an aluminum oxide film was deposited by an ALD method.

As described in Example 1, oxygen is hardly added to a silicon oxide film when an aluminum oxide film is deposited by an ALD method. From this experimental result and the ALD deposition principle, almost no mixed region is considered to be formed at the interface between the aluminum oxide film deposited by an ALD method and the silicon oxide film. Thus, Sample 6B is used as a comparative example, which has almost no mixed region, of Sample 6A in which a mixed region is formed.

Methods for fabricating Samples 6A and 6B will be described below.

First, by thermal oxidation of a silicon wafer, a 100-nm-thick silicon oxide film was formed on a surface of the silicon wafer. The thermal oxidation was performed at 950° C. in an oxygen atmosphere containing HCl at 3 volume % for four hours.

Next, for Sample 6A, a 50-nm-thick aluminum oxide film was deposited over the silicon oxide film by an RF sputtering method. Note that aluminum oxide ($Al_2O_3$) was used as a target, oxygen at a flow rate of 25 sccm and argon at a flow rate of 25 sccm ($O_2$=50 volume % and Ar=50 volume %) were used as the deposition gases, the deposition pressure was 0.4 Pa, the deposition power was 2500 W, the substrate temperature was 250° C., and the target-substrate distance was 60 mm.

For Sample 6B, a 50-nm-thick aluminum oxide film was deposited over the silicon oxide film by an ALD method. Note that trimethyl aluminum (TMA) was used as a precursor, ozone was used as an oxidizer, and the substrate temperature was 250° C.

The TOF-SIMS analysis was performed on Sample 6A and Sample 6B fabricated in the above manner to measure the secondary ion intensity. Note that negative ions and positive ions were detected as the secondary ions; Si and $AlSiO_4$ were detected as the negative ions and Si and AlSiO were detected as the positive ions. For the TOF-SIMS analysis, TOF.SIMS 5 manufactured by ION-TOF GmbH was used, Bi was used as a primary ion source, and fullerene ($C_{60}$) was used as a sputtering ion source.

FIGS. 54A and 54B and FIGS. 55A and 55B show the TOF-SIMS analysis results.

Figure 54B:
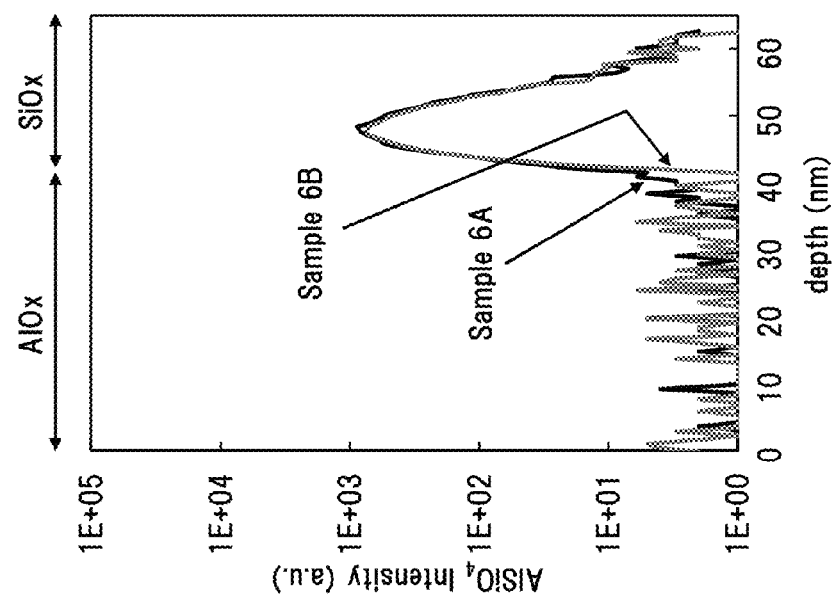
FIGS. 54A and 54B are graphs showing TOF-SIMS analysis results in Example.
Figure 54A:
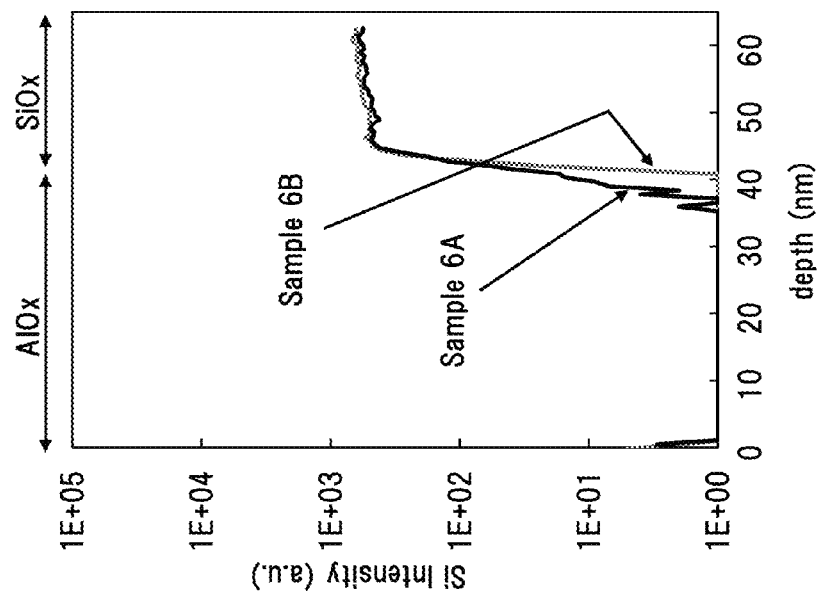
Figure 55B:
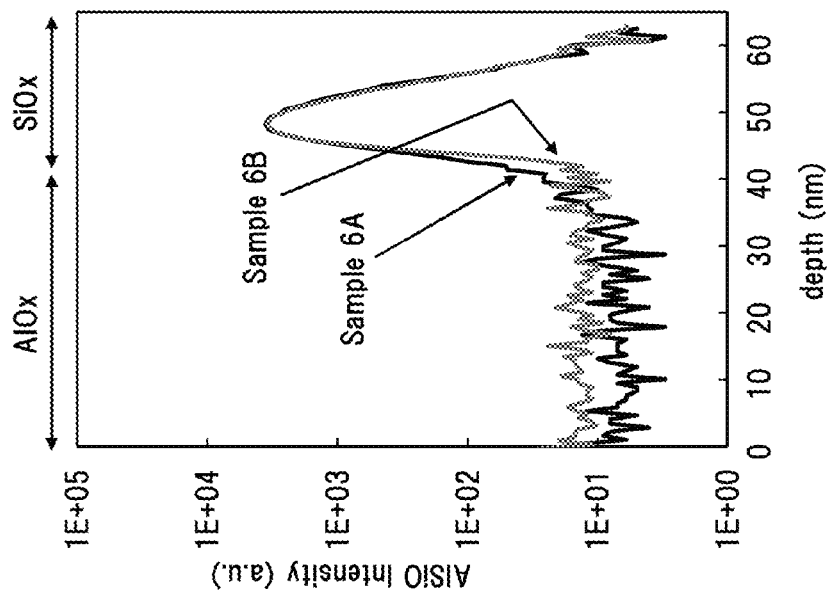
FIGS. 55A and 55B are graphs showing TOF-SIMS analysis results in Example.
Figure 55A:
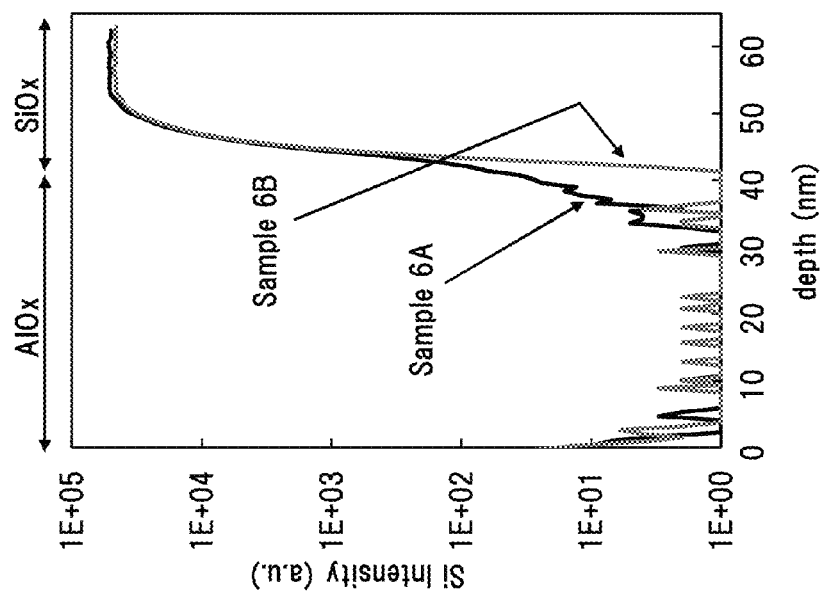

FIG. 54A shows the profile of the negative Si ions, FIG. 54B shows the profile of the negative $AlSiO_4$ ions, FIG. 55A shows the profile of the positive Si ions, and FIG. 55B shows the profile of the positive AlSiO ions. In each of FIGS. 54A and 54B and FIGS. 55A and 55B, the lateral axis represents the depth (converted such that the peak top of the AlSiO profile becomes approximately 50 nm) [nm], and the longitudinal axis represents the ion intensity (arbitrary intensity) [a.u.].

As shown in FIGS. 54A and 54B and FIGS. 55A and 55B, in all the four kinds of detected ions, the profile for Sample 6A has a tail toward the aluminum oxide film side in the vicinity of the interface between the aluminum oxide film and the silicon oxide film unlike the profile for Sample 6B. The profiles of the negative Si ions and the positive Si ions shown in FIG. 54A and FIG. 55A have particularly long tails. The difference between the profiles of Sample 6A and Sample 6B in the vicinity of the interface between the aluminum oxide film and the silicon oxide film appears to be greater than or equal to approximately 3 nm and less than or equal to approximately 10 nm, for example, approximately 5 nm.

As already mentioned, almost no mixed region may be formed in Sample 6B fabricated by an ALD method. In other words, the tailed region of the profile for Sample 6A toward the aluminum oxide film side, which the profile for Sample 6B does not have, is probably the mixed region formed in Sample 6A. Thus, the thickness of the mixed region of aluminum oxide and silicon oxide formed in Sample 6A can be assumed to be greater than or equal to approximately 3 nm and less than or equal to approximately 10 nm, for example, approximately 5 nm.

The comparison between Sample 1C and Sample 1D and between Sample 1E and Sample 1F in Example 1 indicates that oxygen can be added when an aluminum oxide film is deposited by a sputtering method while oxygen is hardly added when an aluminum oxide film is deposited by an ALD method. It is thus suggested that the deposition of an aluminum oxide film over a silicon oxide film by a sputtering method and the formation of a mixed region of aluminum oxide and silicon oxide promote oxygen addition.

Furthermore, in this example, the profiles for Sample 6A shown in FIG. 54A and FIG. 55A have particularly long tails on the aluminum oxide film side of the interface between the aluminum oxide film and the silicon oxide film. This means that the mixed region in Sample 6A contains silicon on the aluminum oxide film side of the interface between the aluminum oxide film and the silicon oxide film. It is thus suggested that a region where the aluminum concentration is higher than the silicon concentration is likely to be formed in the mixed region of aluminum oxide and silicon oxide in Sample 6A.

This application is based on Japanese Patent Application serial No. 2015-039085 filed with Japan Patent Office on Feb. 27, 2015, the entire contents of which are hereby incorporated by reference.

What is claimed is:

1. A semiconductor device comprising:
an oxide semiconductor over a substrate;
a first conductor in contact with at least part of a top surface of the oxide semiconductor;
a second conductor in contact with at least part of the top surface of the oxide semiconductor;
a first insulator over the first conductor and the second conductor, and in contact with at least part of the top surface of the oxide semiconductor;
a second insulator over the first insulator;
a third conductor over the second insulator; and
a third insulator over the third conductor,
wherein the third conductor overlaps with at least part of the first conductor with the first insulator and the second insulator positioned therebetween, and overlaps with at least part of the second conductor with the first insulator and the second insulator positioned therebetween,
wherein the first insulator contains oxygen,
wherein the second insulator transmits less oxygen than the first insulator,
wherein the third insulator transmits less oxygen than the first insulator, and
wherein the second insulator contains gallium and oxygen.

2. The semiconductor device according to claim 1, wherein the third insulator contains aluminum and oxygen.

3. The semiconductor device according to claim 1, wherein the third insulator is deposited by a sputtering method in an atmosphere containing oxygen.

4. The semiconductor device according to claim 1, wherein the first insulator contains silicon and oxygen.

5. The semiconductor device according to claim 1,
wherein the oxide semiconductor contains indium, an element M, zinc, and oxygen, and
wherein the element M is any one of Ti, Ga, Y, Zr, La, Ce, Nd, Sn, and Hf.

6. A semiconductor device comprising:
a first insulator over a substrate;
an oxide insulator over the first insulator;
an oxide semiconductor in contact with at least part of a top surface of the oxide insulator;
a first conductor in contact with at least part of a top surface of the oxide semiconductor;
a second conductor in contact with at least part of the top surface of the oxide semiconductor;
a second insulator over the first conductor and the second conductor, and in contact with at least part of the top surface of the oxide semiconductor;
a third insulator over the second insulator;
a third conductor over the third insulator;
a fourth insulator over the third conductor and in contact with at least part of the first insulator or the second insulator; and
a fifth insulator over the fourth insulator,
wherein the third conductor overlaps with at least part of the first conductor with the second insulator and the third insulator positioned therebetween, and overlaps with at least part of the second conductor with the second insulator and the third insulator positioned therebetween,
wherein a conduction band minimum of the oxide insulator is closer to a vacuum level than a conduction band minimum of the oxide semiconductor is,
wherein the first insulator, the second insulator, and the fourth insulator contain oxygen,
wherein the third insulator transmits less oxygen than the second insulator, and
wherein the fifth insulator transmits less oxygen than the fourth insulator.

7. The semiconductor device according to claim 6, wherein the third insulator contains gallium and oxygen.

8. The semiconductor device according to claim 6, wherein the fifth insulator contains aluminum and oxygen.

9. The semiconductor device according to claim 6, wherein the fifth insulator is deposited by a sputtering method in an atmosphere containing oxygen.

10. The semiconductor device according to claim 6, wherein the first insulator, the second insulator, and the fourth insulator contain silicon and oxygen.

11. The semiconductor device according to claim 6,
wherein the oxide semiconductor contains indium, an element M, zinc, and oxygen, and
wherein the element M is any one of Ti, Ga, Y, Zr, La, Ce, Nd, Sn, and Hf.

12. A semiconductor device comprising:
a first insulator over a substrate;
a first oxide insulator over the first insulator;
an oxide semiconductor in contact with at least part of a top surface of the first oxide insulator;
a first conductor in contact with at least part of a top surface of the oxide semiconductor;
a second conductor in contact with at least part of the top surface of the oxide semiconductor;

a second oxide insulator over the first conductor and the second conductor, and in contact with at least part of the top surface of the oxide semiconductor;
a second insulator over the second oxide insulator;
a third insulator over the second insulator;
a third conductor over the third insulator;
a fourth insulator over the third conductor and in contact with at least part of the first insulator or the second insulator; and
a fifth insulator over the fourth insulator,
wherein the third conductor overlaps with at least part of the first conductor with the second insulator and the third insulator positioned therebetween, and overlaps with at least part of the second conductor with the second insulator and the third insulator positioned therebetween,
wherein a conduction band minimum of the first oxide insulator is closer to a vacuum level than a conduction band minimum of the oxide semiconductor is, wherein a conduction band minimum of the second oxide insulator is closer to the vacuum level than the conduction band minimum of the oxide semiconductor is,
wherein the first insulator, the second insulator, and the fourth insulator contain oxygen,
wherein the third insulator transmits less oxygen than the second insulator, and
wherein the fifth insulator transmits less oxygen than the fourth insulator.

13. The semiconductor device according to claim 12, wherein the third insulator contains gallium and oxygen.

14. The semiconductor device according to claim 12, wherein the fifth insulator contains aluminum and oxygen.

15. The semiconductor device according to claim 12, wherein the fifth insulator is deposited by a sputtering method in an atmosphere containing oxygen.

16. The semiconductor device according to claim 12, wherein the first insulator, the second insulator, and the fourth insulator contain silicon and oxygen.

17. The semiconductor device according to claim 12,
wherein the oxide semiconductor contains indium, an element M, zinc, and oxygen, and
wherein the element M is any one of Ti, Ga, Y, Zr, La, Ce, Nd, Sn, and Hf.

18. A semiconductor device comprising:
a first insulator over a substrate;
an oxide insulator over the first insulator;
an oxide semiconductor in contact with at least part of a top surface of the oxide insulator;
a first conductor in contact with at least part of a top surface of the oxide semiconductor;
a second insulator over the first conductor;
a second conductor in contact with at least part of the top surface of the oxide semiconductor;
a third insulator over the second conductor;
a fourth insulator in contact with at least part of top surfaces of the second insulator and the third insulator, and in contact with at least part of the top surface of the oxide semiconductor;
a fifth insulator over the fourth insulator;
a third conductor over the fifth insulator; and
a sixth insulator over the third conductor,
wherein the third conductor overlaps with at least part of the first conductor with the second insulator, the fourth insulator, and the fifth insulator positioned therebetween, and overlaps with at least part of the second conductor with the third insulator, the fourth insulator, and the fifth insulator positioned therebetween,
wherein a conduction band minimum of the oxide insulator is closer to a vacuum level than a conduction band minimum of the oxide semiconductor is,
wherein the sixth insulator is in contact with part of the top surface of the first insulator, part of a top surface of the second insulator, and part of the top surface of the third insulator,
wherein the first insulator, the second insulator, the third insulator, and the fourth insulator contain oxygen,
wherein the fifth insulator transmits less oxygen than the fourth insulator, and
wherein the sixth insulator transmits less oxygen than the first insulator, the second insulator, the third insulator, and the fourth insulator.

19. The semiconductor device according to claim 18, wherein the fifth insulator contains gallium and oxygen.

20. The semiconductor device according to claim 18, wherein the sixth insulator contains aluminum and oxygen.

21. The semiconductor device according to claim 18, wherein the sixth insulator is deposited by a sputtering method in an atmosphere containing oxygen.

22. The semiconductor device according to claim 18, wherein the first insulator, the second insulator, the third insulator, and the fourth insulator contain silicon and oxygen.

23. The semiconductor device according to claim 18,
wherein the oxide semiconductor contains indium, an element M, zinc, and oxygen, and
wherein the element M is any one of Ti, Ga, Y, Zr, La, Ce, Nd, Sn, and Hf.

* * * * *